US012514119B2

(12) United States Patent
Kim et al.

(10) Patent No.: US 12,514,119 B2
(45) Date of Patent: *Dec. 30, 2025

(54) HETEROCYCLIC COMPOUND AND ORGANIC LIGHT-EMITTING DEVICE COMPRISING SAME

(71) Applicant: LT MATERIALS CO., LTD., Yongin (KR)

(72) Inventors: Ji-Young Kim, Yongin-si (KR); Jun-Tae Mo, Yongin-si (KR); Dong-Jun Kim, Yongin-si (KR)

(73) Assignee: LT MATERIALS CO., LTD., Yongin (KR)

( * ) Notice: Subject to any disclaimer, the term of this patent is extended or adjusted under 35 U.S.C. 154(b) by 952 days.

This patent is subject to a terminal disclaimer.

(21) Appl. No.: 17/610,271

(22) PCT Filed: Sep. 24, 2020

(86) PCT No.: PCT/KR2020/012945

§ 371 (c)(1),
(2) Date: Nov. 10, 2021

(87) PCT Pub. No.: WO2021/060865

PCT Pub. Date: Apr. 1, 2021

(65) Prior Publication Data

US 2022/0231235 A1 Jul. 21, 2022

(30) Foreign Application Priority Data

Sep. 27, 2019 (KR) ........................ 10-2019-0119670

(51) Int. Cl.

*H01L 51/00* (2006.01)
*H10K 85/60* (2023.01)

(Continued)

(52) U.S. Cl.

CPC ....... *H10K 85/6574* (2023.02); *H10K 85/636* (2023.02); *H10K 85/654* (2023.02);

(Continued)

(58) Field of Classification Search

CPC ............. H10K 85/6574; H10K 85/654; H10K 85/6572; H10K 85/631

See application file for complete search history.

(56) References Cited

U.S. PATENT DOCUMENTS

2016/0211459 A1* 7/2016 Ito ........................ H10K 85/631
2017/0125689 A1 5/2017 Lee et al.

(Continued)

FOREIGN PATENT DOCUMENTS

CN 104650029 A 5/2015
CN 113227081 A 8/2021

(Continued)

OTHER PUBLICATIONS

International Search Report (PCT/ISA/210) issued in PCT/KR2020/012945 mailed on Jan. 22, 2021.

(Continued)

*Primary Examiner* — Michael M Dollinger

(74) *Attorney, Agent, or Firm* — Birch, Stewart, Kolasch & Birch, LLP

(57) ABSTRACT

The present specification relates to a heterocyclic compound represented by Chemical Formula 1, and an organic light emitting device including the same.

10 Claims, 1 Drawing Sheet

(51) Int. Cl.

| | |
|---|---|
| *H10K 50/11* | (2023.01) |
| *H10K 50/12* | (2023.01) |
| *H10K 101/10* | (2023.01) |
| *H10K 101/30* | (2023.01) |
| *H10K 101/40* | (2023.01) |

(52) U.S. Cl.
CPC ..... *H10K 85/6572* (2023.02); *H10K 85/6576* (2023.02); *H10K 50/11* (2023.02); *H10K 50/12* (2023.02); *H10K 2101/10* (2023.02); *H10K 2101/30* (2023.02); *H10K 2101/40* (2023.02)

(56) References Cited

U.S. PATENT DOCUMENTS

| | | | | |
|---|---|---|---|---|
| 2017/0170403 | A1* | 6/2017 | Cho | C09K 11/025 |
| 2017/0179416 | A1* | 6/2017 | Lim | C09K 11/06 |
| 2018/0037546 | A1 | 2/2018 | Sugino et al. | |
| 2018/0261774 | A1 | 9/2018 | Park et al. | |
| 2019/0047992 | A1 | 2/2019 | Park et al. | |
| 2019/0241548 | A1 | 8/2019 | Park et al. | |
| 2019/0296244 | A1 | 9/2019 | Mun et al. | |
| 2020/0203623 | A1 | 6/2020 | Lee et al. | |
| 2020/0231581 | A1 | 7/2020 | Chae et al. | |
| 2020/0266355 | A1 | 8/2020 | Park et al. | |
| 2021/0020849 | A1 | 1/2021 | Kim et al. | |
| 2021/0242408 | A1 | 8/2021 | Park et al. | |
| 2022/0029110 | A1 | 1/2022 | Kim et al. | |
| 2022/0102646 | A1 | 3/2022 | Kim et al. | |
| 2022/0109114 | A1 | 4/2022 | Kim et al. | |
| 2022/0246863 | A1 | 8/2022 | Lee et al. | |

FOREIGN PATENT DOCUMENTS

| | | | |
|---|---|---|---|
| EP | 3 828 180 | A1 | 6/2021 |
| JP | 2022-544344 | A | 10/2022 |
| JP | 2018-529629 | A | 8/2025 |
| JP | 2021-15988 | A | 8/2025 |
| KR | 10-2015-0145033 | A | 12/2015 |
| KR | 10-2017-0096769 | A | 8/2017 |
| KR | 10-2017-0102000 | A | 9/2017 |
| KR | 10-2019-0030963 | A | 3/2019 |
| KR | 10-2019-0038246 | A | 4/2019 |
| KR | 10-2019-0097577 | A | 8/2019 |
| KR | 10-2021294 | B1 | 8/2025 |
| WO | WO 2016/122150 | A2 | 8/2016 |
| WO | WO 2017/080919 | A1 | 6/2017 |
| WO | WO 2017/090918 | A1 | 6/2017 |
| WO | WO 2017/204557 | A1 | 11/2017 |
| WO | WO 2020/185028 | A1 | 9/2020 |
| WO | WO 2020/222569 | A1 | 11/2020 |

OTHER PUBLICATIONS

Extended European Search Report for European Application No. 20868287.2, dated Sep. 20, 2023.

* cited by examiner

【FIG. 1】
【FIG. 2】
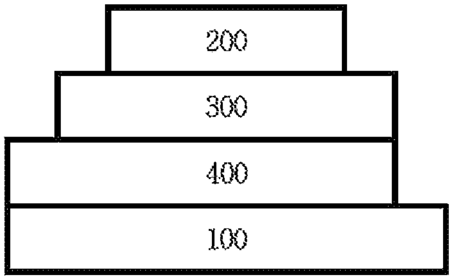
【FIG. 3】
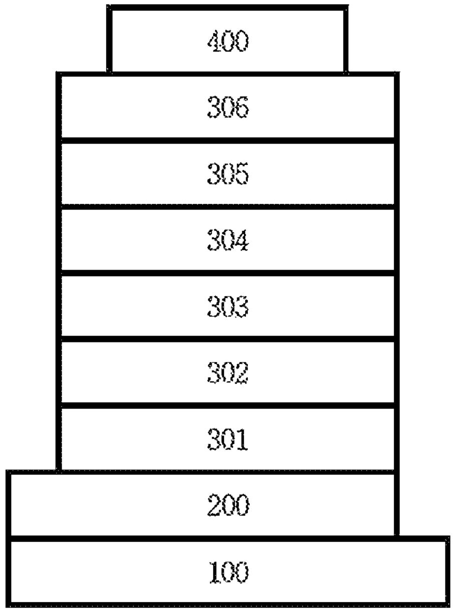

HETEROCYCLIC COMPOUND AND ORGANIC LIGHT-EMITTING DEVICE COMPRISING SAME

TECHNICAL FIELD

The present specification relates to a heterocyclic compound, and an organic light emitting device including the same.

This application claims priority to and the benefits of Korean Patent Application No. 10-2019-0119670, filed with the Korean Intellectual Property Office on Sep. 27, 2019, the entire contents of which are incorporated herein by reference.

BACKGROUND ART

An electroluminescent device is one type of self-emissive display devices, and has an advantage of having a wide viewing angle, and a high response speed as well as having an excellent contrast.

An organic light emitting device has a structure disposing an organic thin film between two electrodes. When a voltage is applied to an organic light emitting device having such a structure, electrons and holes injected from the two electrodes bind and pair in the organic thin film, and light emits as these annihilate. The organic thin film may be formed in a single layer or a multilayer as necessary.

A material of the organic thin film may have a light emitting function as necessary. For example, as a material of the organic thin film, compounds capable of forming a light emitting layer themselves alone may be used, or compounds capable of performing a role of a host or a dopant of a host-dopant-based light emitting layer may also be used. In addition thereto, compounds capable of performing roles of hole injection, hole transfer, electron blocking, hole blocking, electron transfer, electron injection and the like may also be used as a material of the organic thin film.

Development of an organic thin film material has been continuously required for enhancing performance, lifetime or efficiency of an organic light emitting device.

DISCLOSURE

Technical Problem

The present specification is directed to providing a heterocyclic compound, and an organic light emitting device including the same.

Technical Solution

One embodiment of the present specification provides a heterocyclic compound represented by the following Chemical Formula 1.

[Chemical Formula 1]

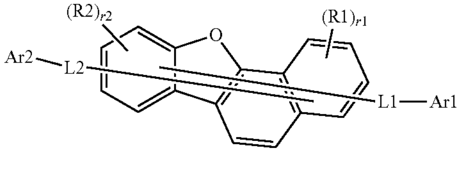

In Chemical Formula 1,

L1 and L2 are each independently a direct bond; a substituted or unsubstituted C6 to C60 arylene group; or a substituted or unsubstituted divalent C2 to C60 heterocyclic group, Ar1 is a substituted or unsubstituted C2 to C60 heterocyclic group including N, Ar2 is —N(R106)(R107); or a substituted or unsubstituted C2 to C60 heterocyclic group, R1 and R2 are each independently hydrogen; deuterium; a halogen group; a substituted or unsubstituted C1 to C60 alkyl group; a substituted or unsubstituted C3 to C60 cycloalkyl group; a substituted or unsubstituted C6 to C60 aryl group; or a substituted or unsubstituted C2 to C60 heterocyclic group, R106 and R107 are each independently hydrogen; deuterium; a halogen group; an alkyl group; an alkenyl group; an alkoxy group; a cycloalkyl group; an aryl group; or a heterocyclic group, r1 and r2 are each an integer of 1 to 4, and when r1 and r2 are each 2 or greater, substituents in the parentheses are the same as or different from each other.

Another embodiment of the present application provides an organic light emitting device including a first electrode; a second electrode provided opposite to the first electrode; and an organic material layer provided between the first electrode and the second electrode, wherein the organic material layer includes one or more types of the heterocyclic compound represented by Chemical Formula 1.

Advantageous Effects

A compound described in the present specification can be used as a material of an organic material layer of an organic light emitting device. The compound is capable of performing a role of a hole injection material, a hole transfer material, a light emitting material, an electron transfer material, an electron injection material or the like in the organic light emitting device. Particularly, the compound can be used as a light emitting layer material of an organic light emitting device. For example, the compound can be used alone as a light emitting material, or can be used as a host material of a light emitting layer.

By Chemical Formula 1 having a structure in which naphthobenzofuran is disubstituted with an amine group or a heterocyclic group including nitrogen, the HOMO level is delocalized helping with electron and hole transfers. Accordingly, Chemical Formula 1 is readily used as a host, and effects of increasing efficiency and lifetime are obtained depending on the substituted position of the naphthobenzofuran.

By introducing various substituents to the naphthobenzofuran of Chemical Formula 1, a hole transfer ability of the central structure increases, and the expanded conjugation structure can stabilize homo energy. This forms proper energy level and band gap as a host material resulting in an increase in the excitons in the light emitting area, and effects of increasing driving voltage and efficiency of the device are obtained.

Specifically, when using the compound represented by Chemical Formula 1 in an organic material layer, a driving voltage of the device can be lowered, light efficiency can be enhanced, and lifetime properties of the device can be enhanced.

DESCRIPTION OF DRAWINGS

FIG. 1 to FIG. 3 are diagrams each illustrating a lamination structure of an organic light emitting device according to one embodiment of the present specification.

100: Substrate
200: Anode
300: Organic Material Layer
301: Hole Injection Layer
302: Hole Transfer Layer
303: Light Emitting Layer
304: Hole Blocking Layer
305: Electron Transfer Layer
306: Electron Injection Layer
400: Cathode

MODE FOR DISCLOSURE

Hereinafter, the present specification will be described in more detail.

In the present specification, a certain part "including" certain constituents means capable of further including other constituents, and does not exclude other constituents unless particularly stated on the contrary.

The term "substitution" means a hydrogen atom bonding to a carbon atom of a compound being changed to another substituent, and the position of substitution is not limited as long as it is a position at which the hydrogen atom is substituted, that is, a position at which a substituent can substitute, and when two or more substituents substitute, the two or more substituents may be the same as or different from each other.

In the present specification,

means a substituted position.

In the present specification, "substituted or unsubstituted" means being substituted with one or more substituents selected from the group consisting of a C1 to C60 linear or branched alkyl group; a C2 to C60 linear or branched alkenyl group; a C2 to C60 linear or branched alkynyl group; a C3 to C60 monocyclic or polycyclic cycloalkyl group; a C2 to C60 monocyclic or polycyclic heterocycloalkyl group; a C6 to C60 monocyclic or polycyclic aryl group; a C2 to C60 monocyclic or polycyclic heterocyclic group; a silyl group; a phosphine oxide group; and an amine group, or being unsubstituted, or being substituted with a substituent linking two or more substituents selected from among the substituents illustrated above, or being unsubstituted.

In the present specification, a "case of a substituent being not indicated in a chemical formula or compound structure" means that a hydrogen atom bonds to a carbon atom. However, since deuterium ($^2H$) is an isotope of hydrogen, some hydrogen atoms may be deuterium.

In one embodiment of the present application, a "case of a substituent being not indicated in a chemical formula or compound structure" may mean that positions that may come as a substituent may all be hydrogen or deuterium. In other words, since deuterium is an isotope of hydrogen, some hydrogen atoms may be deuterium that is an isotope, and herein, a content of the deuterium may be from 0% to 100%.

In one embodiment of the present application, in a "case of a substituent being not indicated in a chemical formula or compound structure", hydrogen and deuterium may be mixed in compounds when deuterium is not explicitly excluded such as a deuterium content being 0%, a hydrogen content being 100% or substituents being all hydrogen.

In one embodiment of the present application, deuterium is one of isotopes of hydrogen, is an element having deuteron formed with one proton and one neutron as a nucleus, and may be expressed as hydrogen-2, and the elemental symbol may also be written as D or $^2H$.

In one embodiment of the present application, an isotope means an atom with the same atomic number (Z) but with a different mass number (A), and may also be interpreted as an element with the same number of protons but with a different number of neutrons.

In one embodiment of the present application, a meaning of a content T % of a specific substituent may be defined as T2/T1×100=T % when the total number of substituents that a basic compound may have is defined as T1, and the number of specific substituents among these is defined as T2.

In other words, in one example, having a deuterium content of 20% in a phenyl group represented by

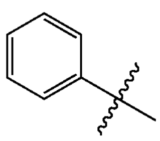 [SMILES: *c1ccccc1]

means that the total number of substituents that the phenyl group may have is 5 (T1 in the formula), and the number of deuterium among these is 1 (T2 in the formula). In other words, having a deuterium content of 20% in a phenyl group may be represented by the following structural formulae.

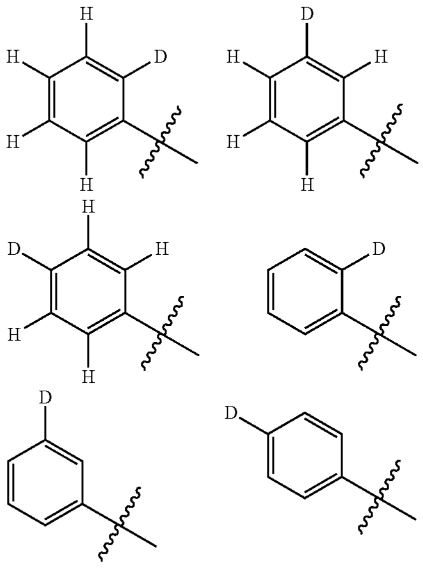

In addition, in one embodiment of the present application, "a phenyl group having a deuterium content of 0%" may mean a phenyl group that does not include a deuterium atom, that is, a phenyl group that has 5 hydrogen atoms.

In the present specification, the halogen may be fluorine, chlorine, bromine or iodine.

In the present specification, the alkyl group includes linear or branched having 1 to 60 carbon atoms, and may be further substituted with other substituents. The number of carbon atoms of the alkyl group may be from 1 to 60, specifically from 1 to 40 and more specifically from 1 to 20. Specific examples thereof may include a methyl group, an ethyl group, a propyl group, an n-propyl group, an isopropyl group, a butyl group, an n-butyl group, an isobutyl group, a tert-butyl group, a sec-butyl group, a 1-methyl-butyl group, a 1-ethyl-butyl group, a pentyl group, an n-pentyl group, an isopentyl group, a neopentyl group, a tert-pentyl group, a hexyl group, an n-hexyl group, a 1-methylpentyl group, a 2-methylpentyl group, a 4-methyl-2-pentyl group, a 3,3-dimethylbutyl group, a 2-ethylbutyl group, a heptyl group, an n-heptyl group, a 1-methylhexyl group, a cyclopentylmethyl group, a cyclohexylmethyl group, an octyl group, an n-octyl group, a tert-octyl group, a 1-methylheptyl group, a 2-ethylhexyl group, a 2-propylpentyl group, an n-nonyl group, a 2,2-dimethylheptyl group, a 1-ethyl-propyl group, a 1,1-dimethyl-propyl group, an isohexyl group, a 4-methylhexyl group, a 5-methylhexyl group and the like, but are not limited thereto.

In the present specification, the alkenyl group includes linear or branched having 2 to 60 carbon atoms, and may be further substituted with other substituents. The number of carbon atoms of the alkenyl group may be from 2 to 60, specifically from 2 to 40 and more specifically from 2 to 20. Specific examples thereof may include a vinyl group, a 1-propenyl group, an isopropenyl group, a 1-butenyl group, a 2-butenyl group, a 3-butenyl group, a 1-pentenyl group, a 2-pentenyl group, a 3-pentenyl group, a 3-methyl-1-butenyl group, a 1,3-butadienyl group, an allyl group, a 1-phenylvinyl-1-yl group, a 2-phenylvinyl-1-yl group, a 2,2-diphenylvinyl-1-yl group, a 2-phenyl-2-(naphthyl-1-yl)vinyl-1-yl group, a 2,2-bis(diphenyl-1-yl)vinyl-1-yl group, a stilbenyl group, a styrenyl group and the like, but are not limited thereto.

In the present specification, the alkynyl group includes linear or branched having 2 to 60 carbon atoms, and may be further substituted with other substituents. The number of carbon atoms of the alkynyl group may be from 2 to 60, specifically from 2 to 40 and more specifically from 2 to 20.

In the present specification, the cycloalkyl group includes monocyclic or polycyclic having 3 to 60 carbon atoms, and may be further substituted with other substituents. Herein, the polycyclic means a group in which the cycloalkyl group is directly linked to or fused with other cyclic groups. Herein, the other cyclic groups may be a cycloalkyl group, but may also be different types of cyclic groups such as a heterocycloalkyl group, an aryl group and a heteroaryl group. The number of carbon atoms of the cycloalkyl group may be from 3 to 60, specifically from 3 to 40 and more specifically from 5 to 20. Specific examples thereof may include a cyclopropyl group, a cyclobutyl group, a cyclopentyl group, a 3-methylcyclopentyl group, a 2,3-dimethylcyclopentyl group, a cyclohexyl group, a 3-methylcyclohexyl group, a 4-methylcyclohexyl group, a 2,3-dimethylcyclohexyl group, a 3,4,5-trimethylcyclohexyl group, a 4-tert-butylcyclohexyl group, a cycloheptyl group, a cyclooctyl group and the like, but are not limited thereto.

In the present specification, the heterocycloalkyl group includes O, S, Se, N or Si as a heteroatom, includes monocyclic or polycyclic having 2 to 60 carbon atoms, and may be further substituted with other substituents. Herein, the polycyclic means a group in which the heterocycloalkyl group is directly linked to or fused with other cyclic groups. Herein, the other cyclic groups may be a heterocycloalkyl group, but may also be different types of cyclic groups such as a cycloalkyl group, an aryl group and a heterocyclic group. The number of carbon atoms of the heterocycloalkyl group may be from 2 to 60, specifically from 2 to 40 and more specifically from 3 to 20.

In the present specification, the aryl group includes monocyclic or polycyclic having 6 to 60 carbon atoms, and may be further substituted with other substituents. Herein, the polycyclic means a group in which the aryl group is directly linked to or fused with other cyclic groups. Herein, the other cyclic groups may be an aryl group, but may also be different types of cyclic groups such as a cycloalkyl group, a heterocycloalkyl group and a heteroaryl group. The aryl group includes a spiro group. The number of carbon atoms of the aryl group may be from 6 to 60, specifically from 6 to 40 and more specifically from 6 to 25. Specific examples of the aryl group may include a phenyl group, a biphenyl group, a triphenyl group, a naphthyl group, an anthryl group, a chrysenyl group, a phenanthrenyl group, a perylenyl group, a fluoranthenyl group, a triphenylenyl group, a phenalenyl group, a pyrenyl group, a tetracenyl group, a pentacenyl group, a fluorenyl group, an indenyl group, an acenaphthylenyl group, a benzofluorenyl group, a spirobifluorenyl group, a 2,3-dihydro-1H-indenyl group, a fused cyclic group thereof, and the like, but are not limited thereto.

In the present specification, the structures illustrated as the aryl group described above may be applied to the arylene group except that it is not a monovalent group.

In the present specification, the silyl group is a substituent including Si, having the Si atom directly linked as a radical, and is represented by —Si(R101)(R102)(R103). R101 to R103 are the same as or different from each other, and may be each independently a substituent formed with at least one of hydrogen; deuterium; a halogen group; an alkyl group; an alkenyl group; an alkoxy group; a cycloalkyl group; an aryl group; and a heterocyclic group. Specific examples of the silyl group may include a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group and the like, but are not limited thereto.

In the present specification, the fluorenyl group may be substituted, and adjacent substituents may bond to each other to form a ring.

When the fluorenyl group is substituted,

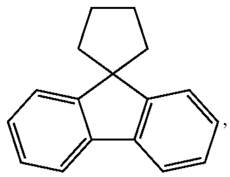
,
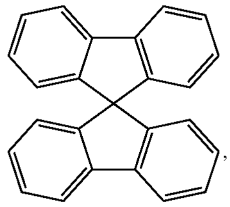
,
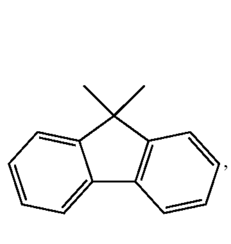
,
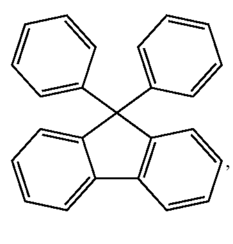
,

-continued

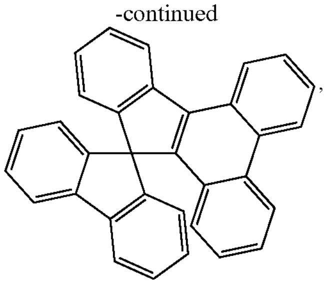

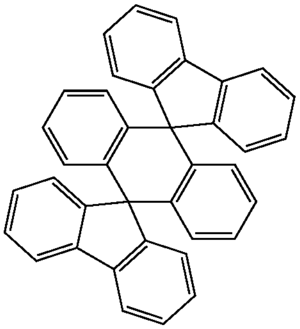

and the like may be included, however, the structure is not limited thereto.

In the present specification, the heterocyclic group includes S, O, Se, N or Si as a heteroatom, includes monocyclic or polycyclic having 2 to 60 carbon atoms, and may be further substituted with other substituents. Herein, the polycyclic means a group in which the heterocyclic group is directly linked to or fused with other cyclic groups. Herein, the other cyclic groups may be a heterocyclic group, but may also be different types of cyclic groups such as a cycloalkyl group, a heterocycloalkyl group and an aryl group. The number of carbon atoms of the heterocyclic group may be from 2 to 60, specifically from 2 to 40 and more specifically from 3 to 25. Specific examples of the heterocyclic group may include a pyridyl group, a pyrrolyl group, a pyrimidyl group, a pyridazinyl group, a furanyl group, a thiophene group, an imidazolyl group, a pyrazolyl group, an oxazolyl group, an isoxazolyl group, a thiazolyl group, an isothiazolyl group, a triazolyl group, a furazanyl group, an oxadiazolyl group, a thiadiazolyl group, a dithiazolyl group, a tetrazolyl group, a pyranyl group, a thiopyranyl group, a diazinyl group, an oxazinyl group, a thiazinyl group, a dioxynyl group, a triazinyl group, a tetrazinyl group, a quinolyl group, an isoquinolyl group, a quinazolinyl group, an isoquinazolinyl group, a qninozolinyl group, a naphthyridyl group, an acridinyl group, a phenanthridinyl group, an imidazopyridinyl group, a diazanaphthalenyl group, a triazaindene group, an indolyl group, an indolizinyl group, a benzothiazolyl group, a benzoxazolyl group, a benzimidazolyl group, a benzothiophene group, a benzofuran group, a dibenzothiophene group, a dibenzofuran group, a carbazolyl group, a benzocarbazolyl group, a dibenzocarbazolyl group, a phenazinyl group, a dibenzosilole group, spirobi(dibenzosilole), a dihydrophenazinyl group, a phenoxazinyl group, a phenanthridyl group, an imidazopyridinyl group, a thienyl group, an indolo[2,3-a]carbazolyl group, an indolo[2,3-b]carbazolyl group, an indolinyl group, a 10,11-dihydro-dibenzo[b,f]azepine group, a 9,10-dihydroacridinyl group, a phenanthrazinyl group, a phenothiathiazinyl group, a phthalazinyl group, a naphthylidinyl group, a phenanthrolinyl group, a benzo[c][1,2,5]thiadiazolyl group, a 5,10-dihydrobenzo[b,e][1,4]azasilinyl group, a pyrazolo[1,5-c]quinazolinyl group, a pyrido[1,2-b]indazolyl group, a pyrido[1,2-a]imidazo[1,2-e]indolinyl group, a 5,11-dihydroindeno[1,2-b]carbazolyl group and the like, but are not limited thereto.

In the present specification, examples of the heterocyclic group described above may be applied to the heteroaryl group except that it is aromatic.

In the present specification, the phosphine oxide group is represented by —P(═O)(R104)(R105), and R104 and R105 are the same as or different from each other and may be each independently a substituent formed with at least one of hydrogen; deuterium; a halogen group; an alkyl group; an alkenyl group; an alkoxy group; a cycloalkyl group; an aryl group; and a heterocyclic group. Specifically, the phosphine oxide group may be substituted with an aryl group, and as the aryl group, the examples described above may be applied. Examples of the phosphine oxide group may include a diphenylphosphine oxide group, a dinaphthylphosphine oxide group and the like, but are not limited thereto.

In the present specification, the amine group is represented by —N(R106)(R107), and R106 and R107 are the same as or different from each other and may be each independently a substituent formed with at least one of hydrogen; deuterium; a halogen group; an alkyl group; an alkenyl group; an alkoxy group; a cycloalkyl group; an aryl group; and a heterocyclic group. The amine group may be selected from the group consisting of $—NH_2$; a monoalkylamine group; a monoarylamine group; a monoheteroarylamine group; a dialkylamine group; a diarylamine group; a diheteroarylamine group; an alkylarylamine group; an alkylheteroarylamine group; and an arylheteroarylamine group, and although not particularly limited thereto, the number of carbon atoms is preferably from 1 to 30. Specific examples of the amine group may include a methylamine group, a dimethylamine group, an ethylamine group, a diethylamine group, a phenylamine group, a naphthylamine group, a biphenylamine group, a dibiphenylamine group, an anthracenylamine group, a 9-methyl-anthracenylamine group, a diphenylamine group, a phenylnaphthylamine group, a ditolylamine group, a phenyltolylamine group, a triphenylamine group, a biphenylnaphthylamine group, a phenylbiphenylamine group, a biphenylfluorenylamine group, a phenyltriphenylenylamine group, a biphenyltriphenylenylamine group and the like, but are not limited thereto.

In the present specification, an "adjacent" group may mean a substituent substituting an atom directly linked to an atom substituted by the corresponding substituent, a substituent sterically most closely positioned to the corresponding substituent, or another substituent substituting an atom substituted by the corresponding substituent. For example, two substituents substituting ortho positions in a benzene ring, and two substituents substituting the same carbon in an aliphatic ring may be interpreted as groups "adjacent" to each other.

As the aliphatic hydrocarbon ring, the aliphatic heteroring, the aromatic hydrocarbon ring or the aromatic heteroring that the adjacent groups may form, the structures illustrated as the cycloalkyl group, the heterocycloalkyl group, the aryl group and the heterocyclic group described above may be applied except for those that are not a monovalent group.

One embodiment of the present specification provides a heterocyclic compound represented by Chemical Formula 1.

By introducing various substituents to naphthobenzofuran of Chemical Formula 1, a hole transfer ability of the central structure increases, and the expanded conjugation structure may stabilize homo energy. This forms proper energy level and band gap as a host material resulting in an increase in the excitons in the light emitting area, and effects of increasing driving voltage and efficiency of a device are obtained.

In one embodiment of the present specification, Chemical Formula 1 may be represented by the following Chemical Formula 1-1 or 1-2.

[Chemical Formula 1-1]

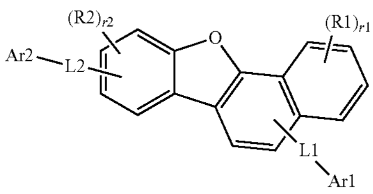

[Chemical Formula 1-2]

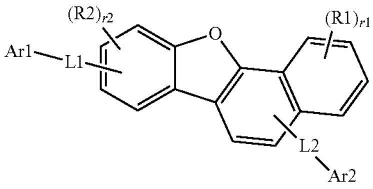

In Chemical Formulae 1-1 and 1-2,

R1, R2, Ar1, Ar2, L1, L2 and r1 have the same definitions as in Chemical Formula 1, r2 is an integer of 1 to 3, and when r2 is 2 or greater, a plurality of R2s are the same as or different from each other.

In one embodiment of the present specification, Chemical Formula 1 may be represented by any one of the following Chemical Formulae 1-1-1 to 1-1-8 and 1-2-1 to 1-2-8.

[Chemical Formula 1-1-1]

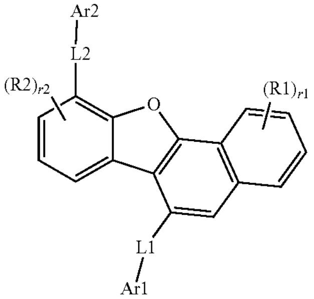

[Chemical Formula 1-1-2]

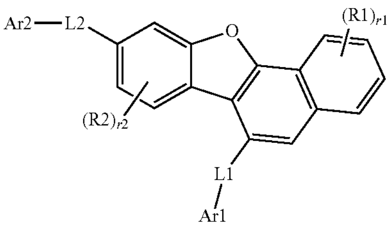

-continued

[Chemical Formula 1-1-3]

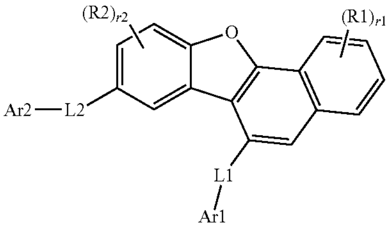

[Chemical Formula 1-1-4]

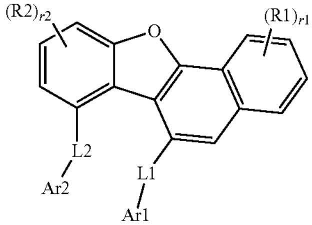

[Chemical Formula 1-1-5]

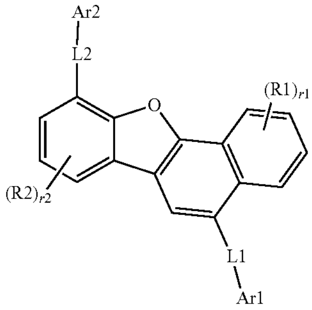

[Chemical Formula 1-1-6]

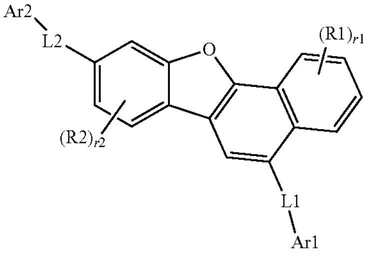

[Chemical Formula 1-1-7]

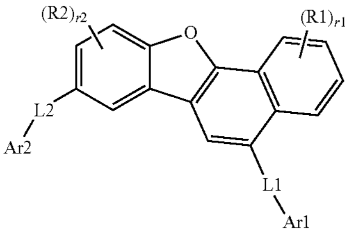

[Chemical Formula 1-1-8]

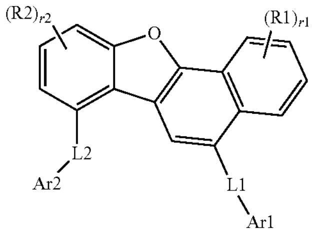

-continued

[Chemical Formula 1-2-1]

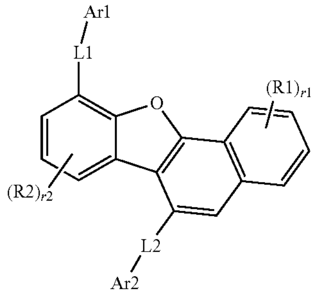

[Chemical Formula 1-2-2]

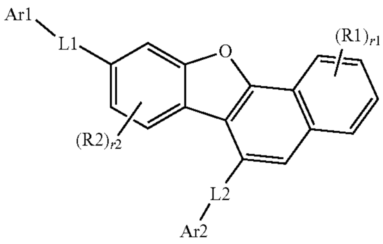

[Chemical Formula 1-2-3]

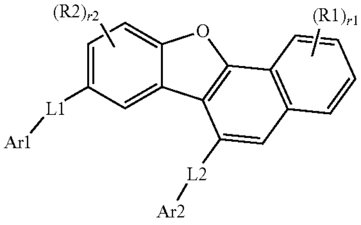

[Chemical Formula 1-2-4]

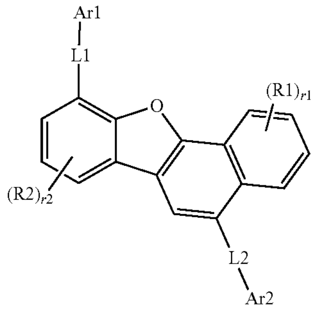

[Chemical Formula 1-2-5]

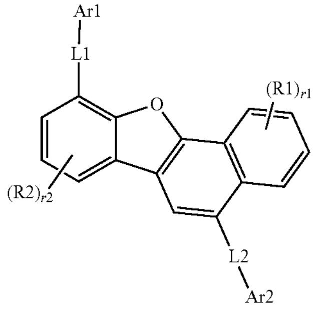

-continued

[Chemical Formula 1-2-6]

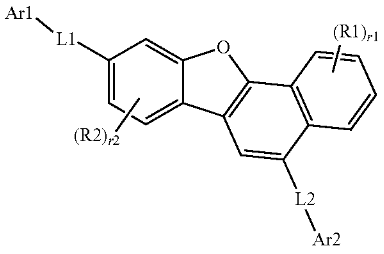

[Chemical Formula 1-2-7]

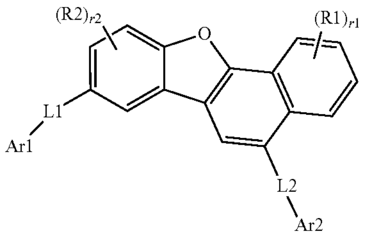

[Chemical Formula 1-2-8]

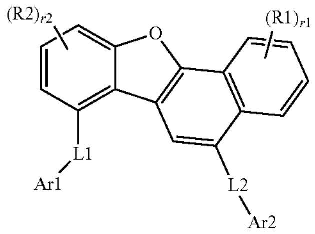

In Chemical Formulae 1-1-1 to 1-1-8 and 1-2-1 to 1-2-8, R1, R2, Ar1, Ar2, L1, L2 and r1 have the same definitions as in Chemical Formula 1, r2 is an integer of 1 to 3, and when r2 is 2 or greater, a plurality of R2s are the same as or different from each other.

In one embodiment of the present specification, L1 and L2 are each independently a direct bond; a substituted or unsubstituted C6 to C60 arylene group; or a substituted or unsubstituted divalent C2 to C60 heterocyclic group.

In one embodiment of the present specification, L1 and L2 are each independently a direct bond; a substituted or unsubstituted C6 to C40 arylene group; or a substituted or unsubstituted divalent C2 to C40 heterocyclic group.

In one embodiment of the present specification, L1 and L2 are each independently a direct bond; a substituted or unsubstituted C6 to C20 arylene group; or a substituted or unsubstituted divalent C2 to C20 heterocyclic group.

In one embodiment of the present specification, L1 and L2 are each independently a direct bond; or a substituted or unsubstituted C6 to C20 arylene group.

In one embodiment of the present specification, L1 and L2 are each independently a direct bond; or a substituted or unsubstituted phenylene group.

In one embodiment of the present specification, L1 and L2 are each independently a direct bond; or a phenylene group.

In one embodiment of the present specification, Ar1 is a substituted or unsubstituted C2 to C60 heterocyclic group including N.

In one embodiment of the present specification, Ar1 is represented by the following Chemical Formula 2 or 3.

[Chemical Formula 2]

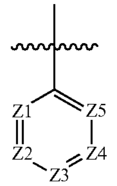

[Chemical Formula 3]

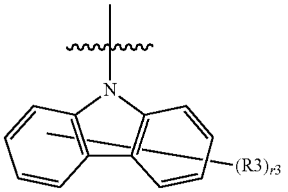

In Chemical Formulae 2 and 3,

Z1 to Z5 are each CR or N, and at least one thereof is N,

R and R3 are each independently hydrogen; deuterium; a halogen group; a substituted or unsubstituted C1 to C60 alkyl group; a substituted or unsubstituted C3 to C60 cycloalkyl group; a substituted or unsubstituted C6 to C60 aryl group; or a substituted or unsubstituted C2 to C60 heterocyclic group, or two or more groups adjacent to each other bond to each other to form a substituted or unsubstituted C3 to C60 aliphatic hydrocarbon ring; a substituted or unsubstituted C6 to C60 aromatic hydrocarbon ring; or a substituted or unsubstituted C2 to C60 heteroring, r3 is an integer of 1 to 8, and when r3 is 2 or greater, substituents in the parentheses are the same as or different from each other.

In one embodiment of the present specification, Ar1 may be selected from among the following structural formulae.

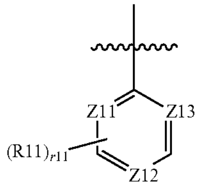

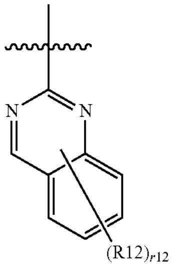

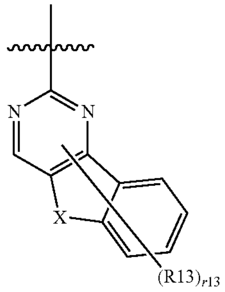

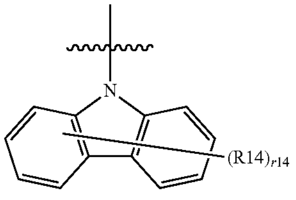

In the structural formulae,

X is O; S; or NR,

Z11 to Z13 are each independently CR' or N, and at least two thereof are N,

R, R' and R11 to R13 are each independently hydrogen; deuterium; a halogen group; a substituted or unsubstituted C1 to C60 alkyl group; a substituted or unsubstituted C3 to C60 cycloalkyl group; a substituted or unsubstituted C6 to C60 aryl group; or a substituted or unsubstituted C2 to C60 heterocyclic group, R14 is hydrogen; deuterium; a substituted or unsubstituted C1 to C60 alkyl group; a substituted or unsubstituted C3 to C60 cycloalkyl group; a substituted or unsubstituted C6 to C60 aryl group; or a substituted or unsubstituted C2 to C60 heterocyclic group, or two or more groups adjacent to each other bond to each other to form a substituted or unsubstituted C6 to C60 aromatic hydrocarbon ring, r11 is 1 or 2, r12 and r13 are each independently an integer of 1 to 5, r14 is an integer of 1 to 8, and when r11 is 2 and r12 to r14 are each an integer of 2 or greater, substituents in the parentheses are the same as or different from each other.

In one embodiment of the present specification, X is O; S; or NR.

In one embodiment of the present specification, X is O.

In another embodiment, X is S.

In another embodiment, X is NR, and R is a substituted or unsubstituted aryl group.

In another embodiment, X is NR, and R is a substituted or unsubstituted phenyl group.

In one embodiment of the present specification, Z11 and Z12 are N, Z13 is CR', and R' is hydrogen.

In one embodiment of the present specification, Z11 and Z13 are N, Z12 is CR', and R' is hydrogen.

In one embodiment of the present specification, Z11 to Z13 are N.

In one embodiment of the present specification, R11 to R13 are each independently hydrogen; deuterium; a halogen group; a substituted or unsubstituted C1 to C60 alkyl group; a substituted or unsubstituted C3 to C60 cycloalkyl group; a substituted or unsubstituted C6 to C60 aryl group; or a substituted or unsubstituted C2 to C60 heterocyclic group.

In one embodiment of the present specification, R11 to R13 are each independently hydrogen; deuterium; a substituted or unsubstituted C6 to C60 aryl group; or a substituted or unsubstituted C2 to C60 heterocyclic group.

In one embodiment of the present specification, R11 to R13 are each independently hydrogen; deuterium; a substituted or unsubstituted C6 to C40 aryl group; or a substituted or unsubstituted C2 to C40 heterocyclic group.

In one embodiment of the present specification, R11 to R13 are each independently hydrogen; deuterium; a substituted or unsubstituted C6 to C20 aryl group; or a substituted or unsubstituted C2 to C20 heterocyclic group.

In one embodiment of the present specification, R11 is hydrogen; deuterium; a substituted or unsubstituted C6 to C20 aryl group; or a substituted or unsubstituted C2 to C20 heterocyclic group.

In one embodiment of the present specification, R11 is hydrogen; deuterium; a substituted or unsubstituted phenyl group; a substituted or unsubstituted biphenyl group; a substituted or unsubstituted naphthyl group; a substituted or unsubstituted fluorenyl group; a substituted or unsubstituted dibenzofuran group; or a substituted or unsubstituted dibenzothiophene group.

In one embodiment of the present specification, R11 is hydrogen; deuterium; a phenyl group substituted with an aryl group; a biphenyl group; a naphthyl group; a fluorenyl group substituted with an alkyl group; a dibenzofuran group; or a dibenzothiophene group.

In one embodiment of the present specification, R12 and R13 are each independently hydrogen; deuterium; or a substituted or unsubstituted C6 to C20 aryl group.

In one embodiment of the present specification, R12 and R13 are each independently hydrogen; deuterium; a substituted or unsubstituted phenyl group; a substituted or unsubstituted biphenyl group; or a substituted or unsubstituted naphthyl group.

In one embodiment of the present specification, R12 and R13 are each independently hydrogen; deuterium; a phenyl group; a biphenyl group; or a naphthyl group.

In one embodiment of the present specification, R14 is hydrogen; deuterium; a substituted or unsubstituted C1 to C60 alkyl group; a substituted or unsubstituted C3 to C60 cycloalkyl group; a substituted or unsubstituted C6 to C60 aryl group; or a substituted or unsubstituted C2 to C60 heterocyclic group, or two or more groups adjacent to each other bond to each other to form a substituted or unsubstituted C6 to C60 aromatic hydrocarbon ring.

In one embodiment of the present specification, R14 is hydrogen; deuterium; a substituted or unsubstituted C6 to C60 aryl group; or a substituted or unsubstituted C2 to C60 heterocyclic group, or two or more groups adjacent to each other bond to each other to form a substituted or unsubstituted C6 to C60 aromatic hydrocarbon ring.

In one embodiment of the present specification, R14 is hydrogen; deuterium; a substituted or unsubstituted C6 to C60 aryl group; or a substituted or unsubstituted C2 to C60 heterocyclic group, or two or more groups adjacent to each other bond to each other to form a C6 to C60 aromatic hydrocarbon ring.

In one embodiment of the present specification, R14 is hydrogen; deuterium; a substituted or unsubstituted C6 to C60 aryl group; or a substituted or unsubstituted C2 to C60 heterocyclic group, or two or more groups adjacent to each other bond to each other to form a benzene ring.

In one embodiment of the present specification, Ar2 is —N(R106)(R107); or a substituted or unsubstituted C2 to C60 heterocyclic group.

In one embodiment of the present specification, Ar2 is —N(R106)(R107); or a substituted or unsubstituted C2 to C60 heterocyclic group including N.

In one embodiment of the present specification, Ar2 is —N(R106)(R107); or a tricyclic or higher substituted or unsubstituted C12 to C60 heterocyclic group including N.

In one embodiment of the present specification, Ar2 is —N(R106)(R107); or represented by the following Chemical Formula 4.

[Chemical Formula 4]

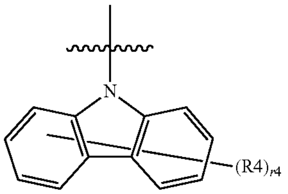

In Chemical Formula 4,

R4 is hydrogen; deuterium; a halogen group; a substituted or unsubstituted C1 to C60 alkyl group; a substituted or unsubstituted C3 to C60 cycloalkyl group; a substituted or unsubstituted C6 to C60 aryl group; or a substituted or unsubstituted C2 to C60 heterocyclic group, or two or more groups adjacent to each other bond to each other to form a substituted or unsubstituted C3 to C60 aliphatic hydrocarbon ring; a substituted or unsubstituted C6 to C60 aromatic hydrocarbon ring; or a C2 to C60 heteroring, r4 is an integer of 1 to 8, and when r4 is 2 or greater, substituents in the parentheses are the same as or different from each other.

In one embodiment of the present specification, Chemical Formula 4 may be represented by any one of the following Chemical Formulae 4-1 to 4-5.

[Chemical Formula 4-1]

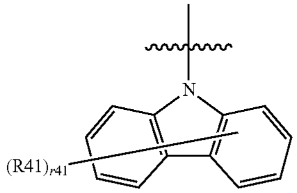

[Chemical Formula 4-2]

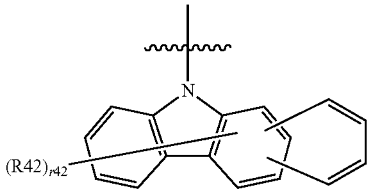

[Chemical Formula 4-3]

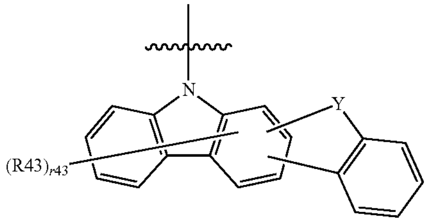

[Chemical Formula 4-4]

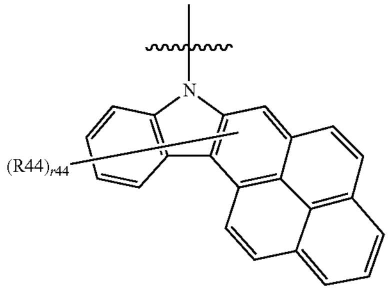

[Chemical Formula 4-5]

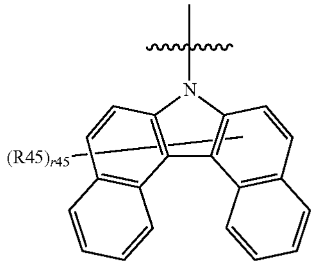

In Chemical Formulae 4-1 to 4-5,

Y is O; S; NR' or CR' R",

R', R" and R41 to R45 are each independently hydrogen; deuterium; a substituted or unsubstituted C1 to C60 alkyl group; a substituted or unsubstituted C6 to C60 aryl group; or a substituted or unsubstituted C2 to C60 heterocyclic group, r41 is an integer of 1 to 8, r42 and r43 are each an integer of 1 to 6, r44 is an integer of 1 to 5, r45 is an integer of 1 to 4, and when r41 to r45 are each 2 or greater, substituents in the parentheses are the same as or different from each other.

In one embodiment of the present specification, Y is O; S; NR' or CR'R".

In one embodiment of the present specification, Y is O.

In another embodiment, Y is S.

In another embodiment, Y is NR', and R' is a substituted or unsubstituted C6 to C60 aryl group.

In another embodiment, Y is NR', and R' is a C6 to C60 aryl group.

In another embodiment, Y is NR', and R' is a phenyl group.

In another embodiment, Y is CR'R", and R' and R" are each independently a substituted or unsubstituted C1 to C60 alkyl group.

In another embodiment, Y is CR'R", and R' and R" are each independently a C1 to C20 alkyl group.

In another embodiment, Y is CR'R", and R' and R" are each independently a methyl group.

In one embodiment of the present specification, R41 to R45 are each independently hydrogen; deuterium; a substituted or unsubstituted C1 to C60 alkyl group; a substituted or unsubstituted C6 to C60 aryl group; or a substituted or unsubstituted C2 to C60 heterocyclic group.

In one embodiment of the present specification, R41 to R45 are each independently hydrogen; deuterium; or a substituted or unsubstituted C6 to C60 aryl group.

In one embodiment of the present specification, R41 to R45 are each independently hydrogen; deuterium; or a substituted or unsubstituted C6 to C30 aryl group.

In one embodiment of the present specification, R41 to R45 are each independently hydrogen; deuterium; or a substituted or unsubstituted phenyl group.

In one embodiment of the present specification, R41 to R45 are each independently hydrogen; deuterium; or a phenyl group.

In one embodiment of the present specification, Ar2 is —N(R106)(R107), and R106 and R107 are each independently an aryl group or a heterocyclic group.

In one embodiment of the present specification, Ar2 is —N(R106)(R107), and R106 and R107 are each independently a phenyl group substituted with a heterocyclic group, a biphenyl group, a naphthyl group, a dimethylfluorenyl group, a dibenzofuran group or a dibenzothiophene group.

In one embodiment of the present specification, Chemical Formula 1 may be represented by any one of the following compounds, but is not limited thereto.

1

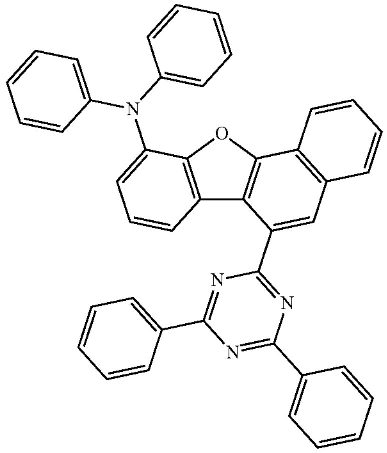

2

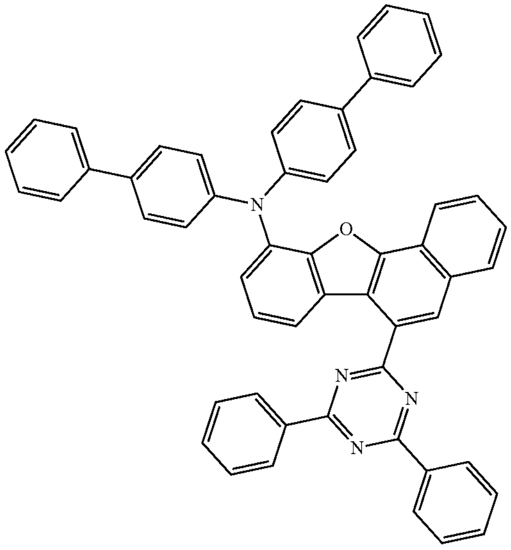

3

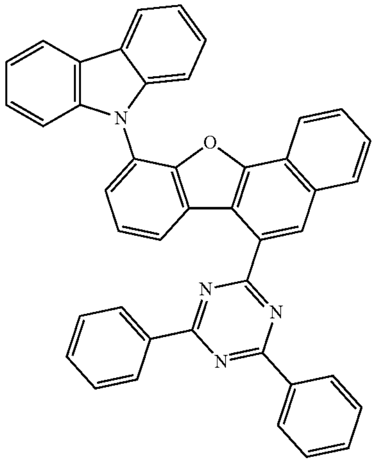

-continued
4
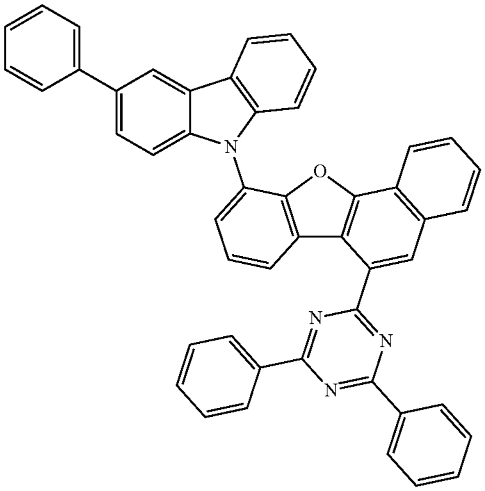
5
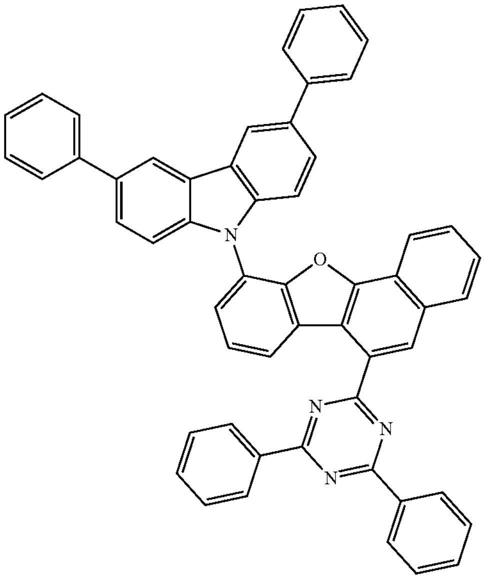
6
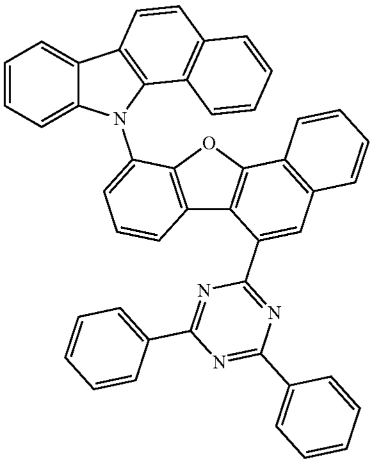
-continued
7
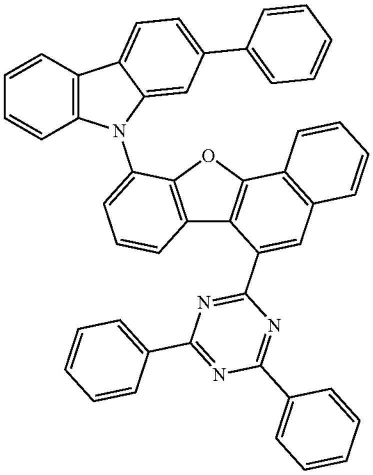
8
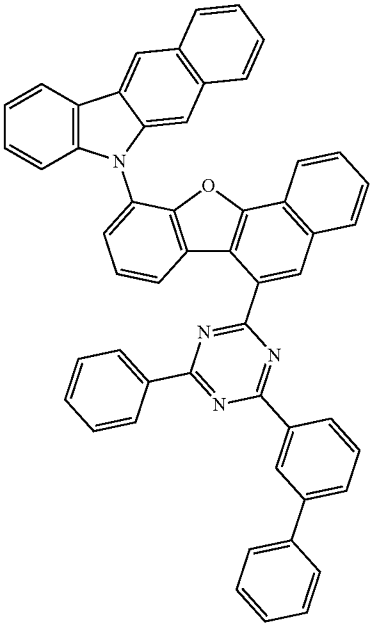
9
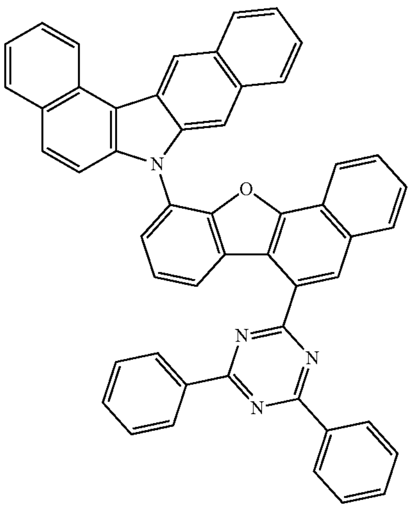

-continued
10
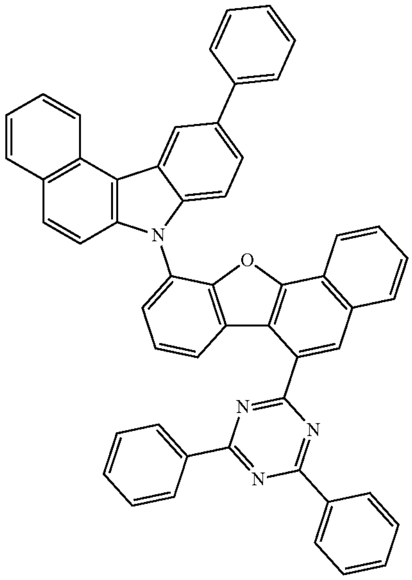
11
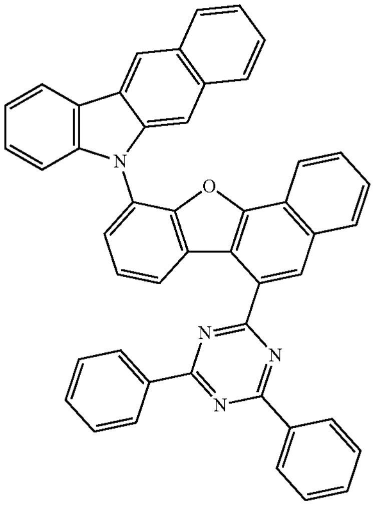
12
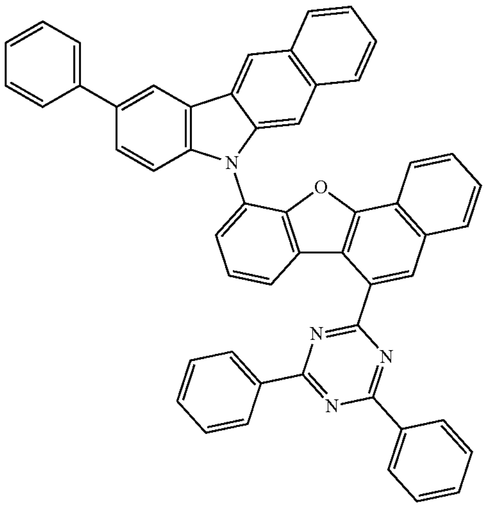
-continued
13
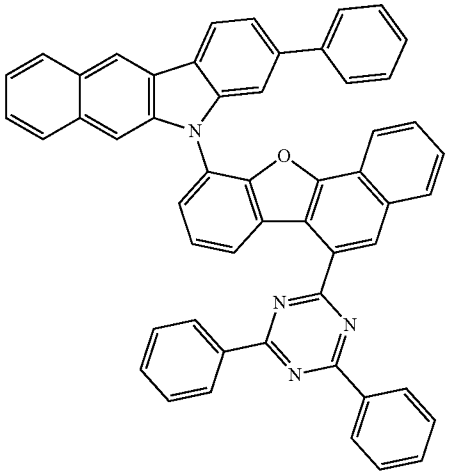
14
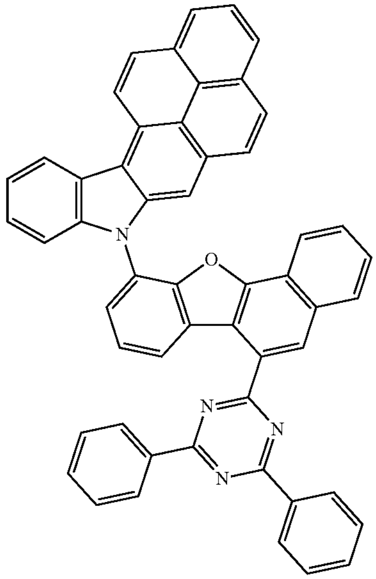
15
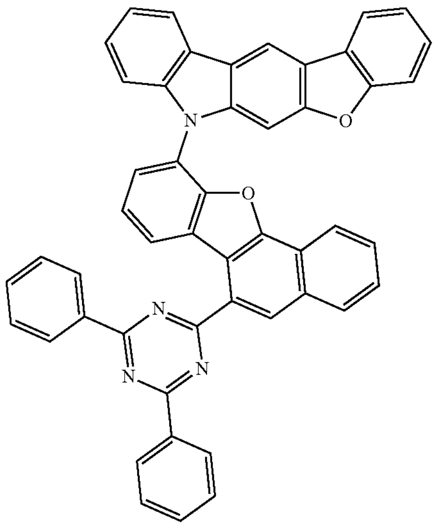

-continued
16
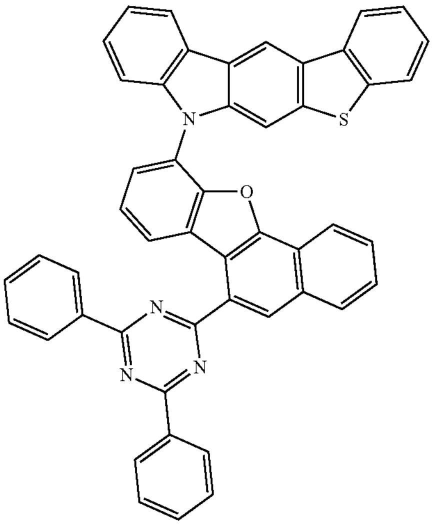
17
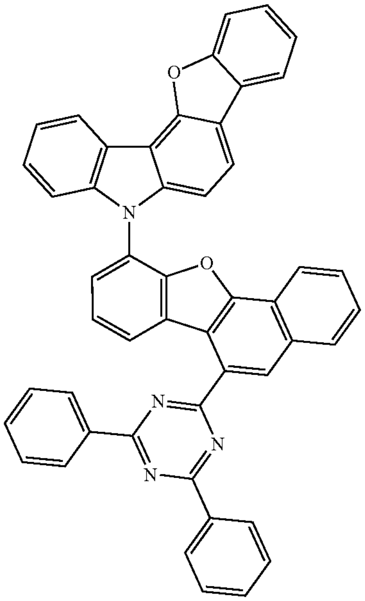
-continued
18
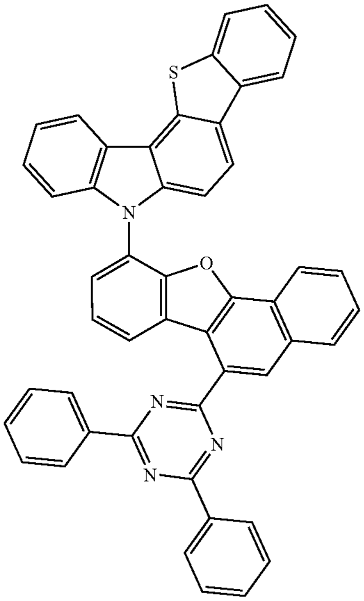
19
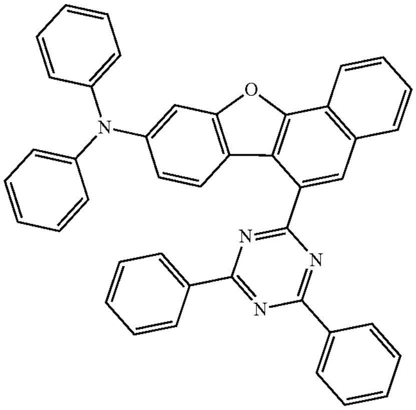
20
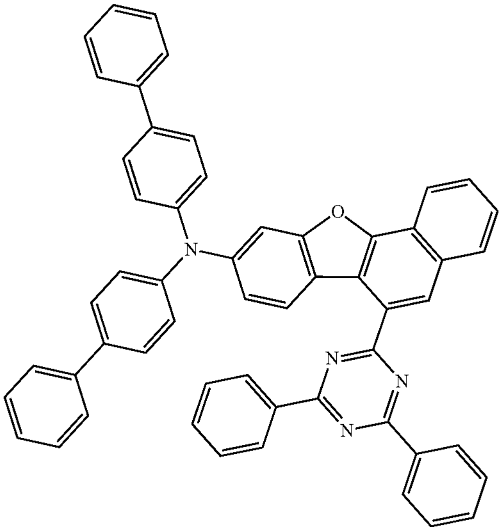

-continued
21
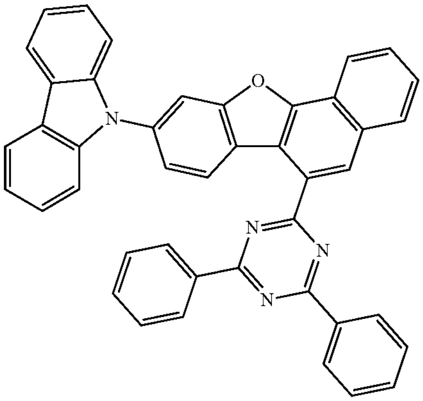
22
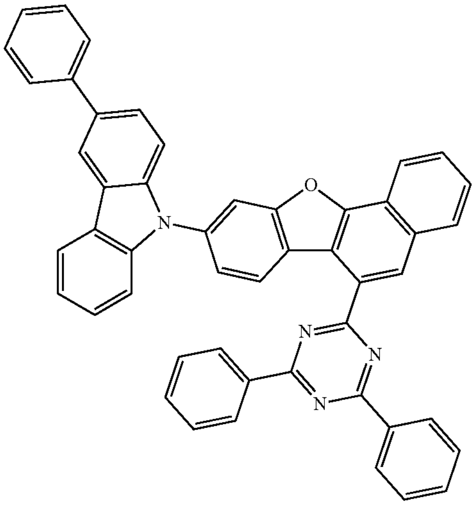
23
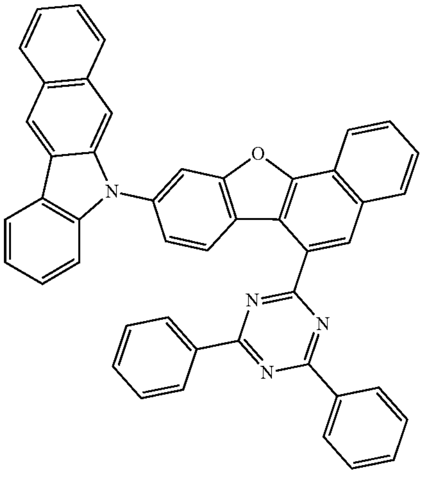
-continued
24
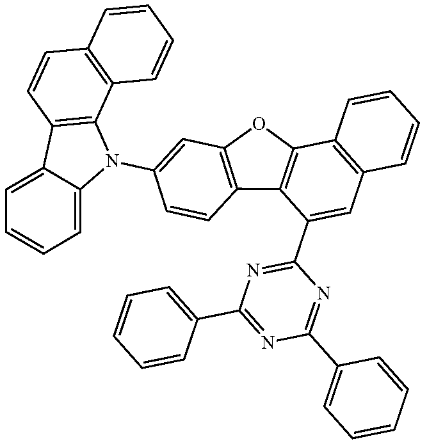
25
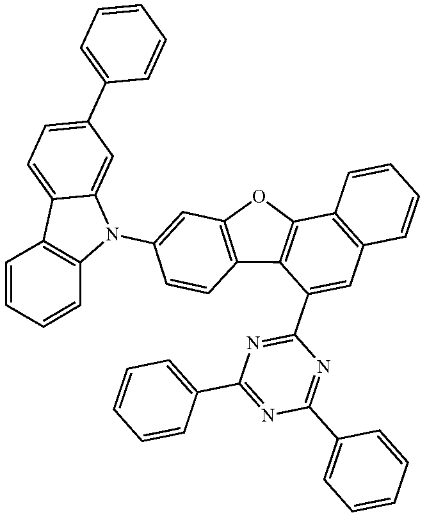
26
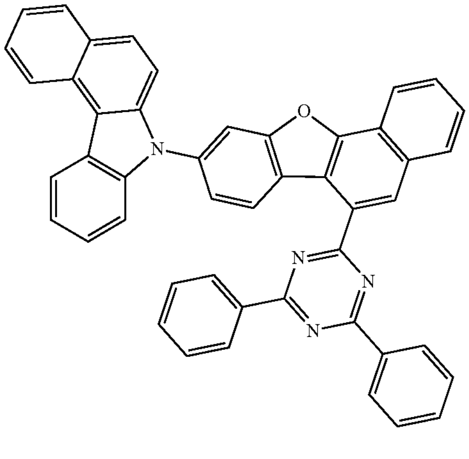

27
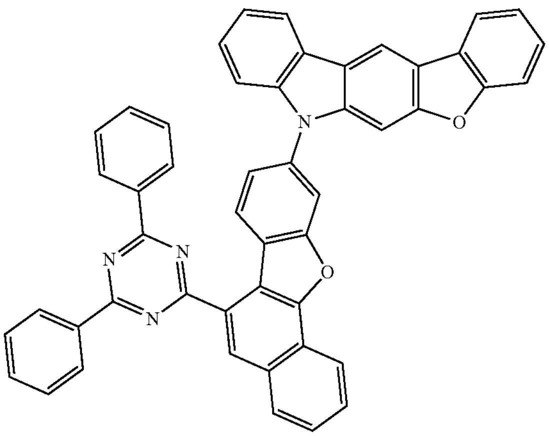
28
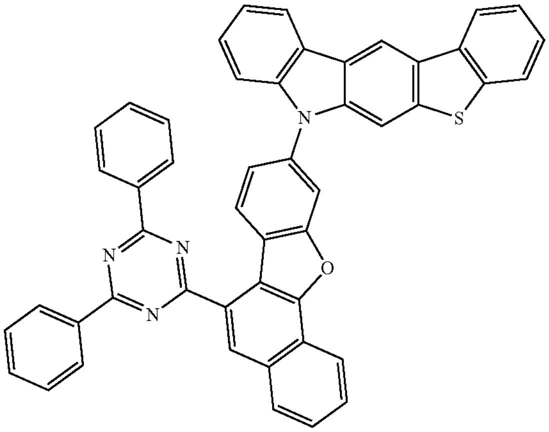
29
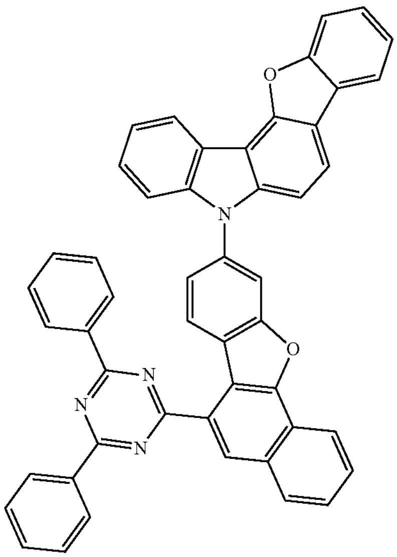
30
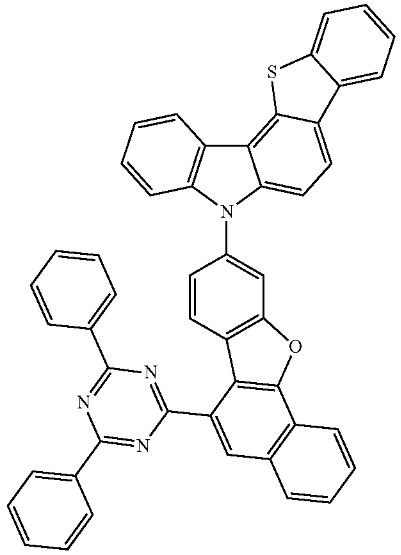
31
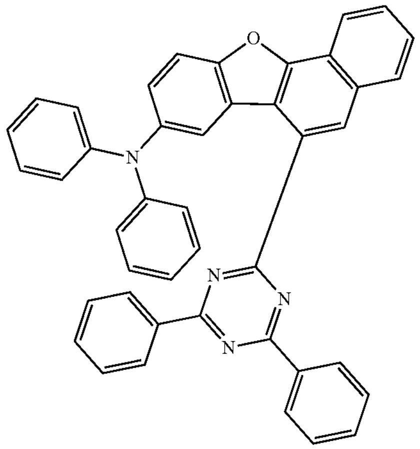
32
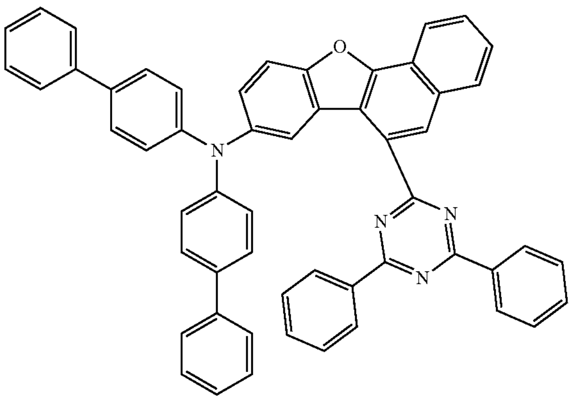

-continued
33
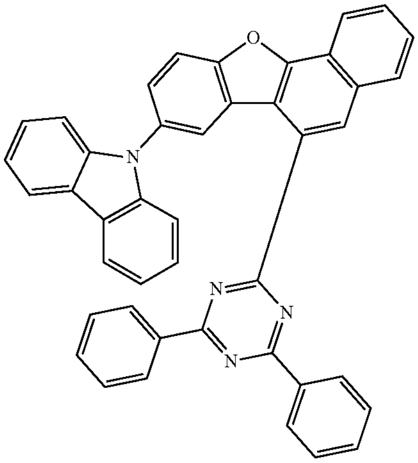
34
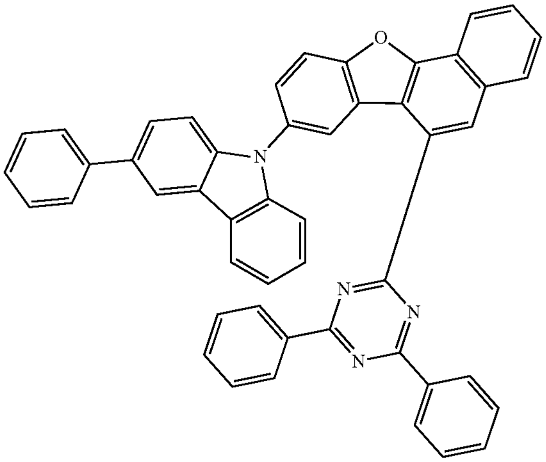
35
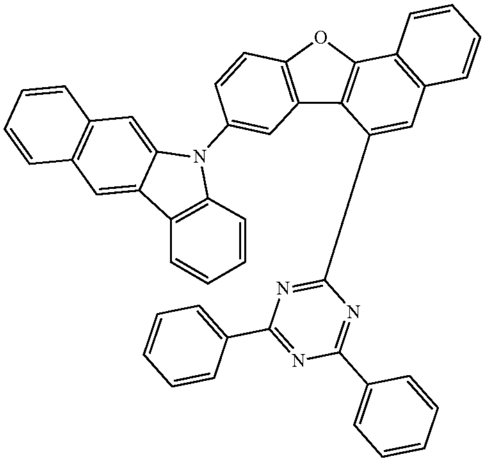
-continued
36
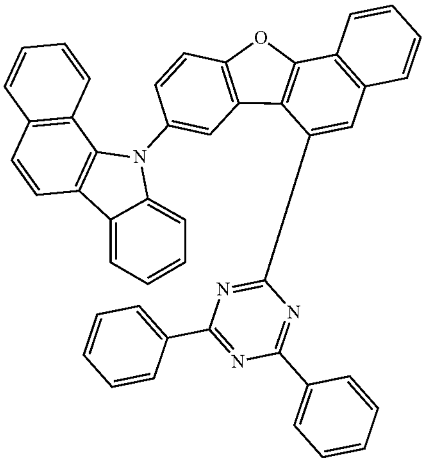
37
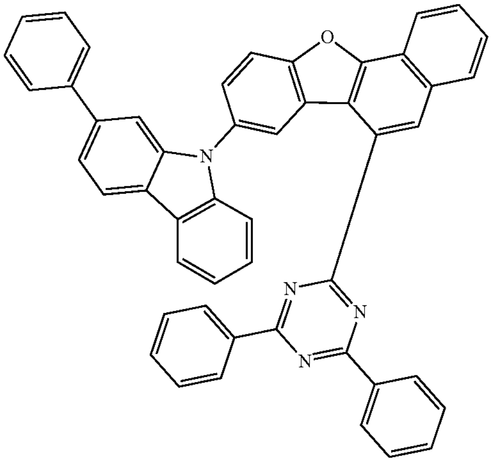
38
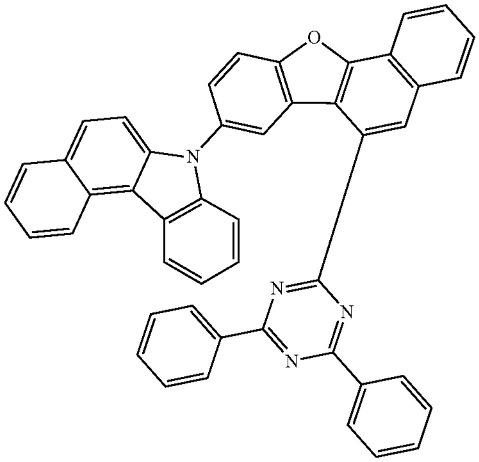

-continued
39
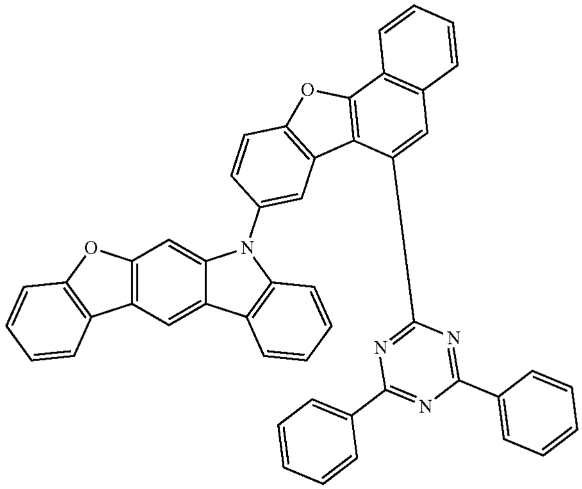
40
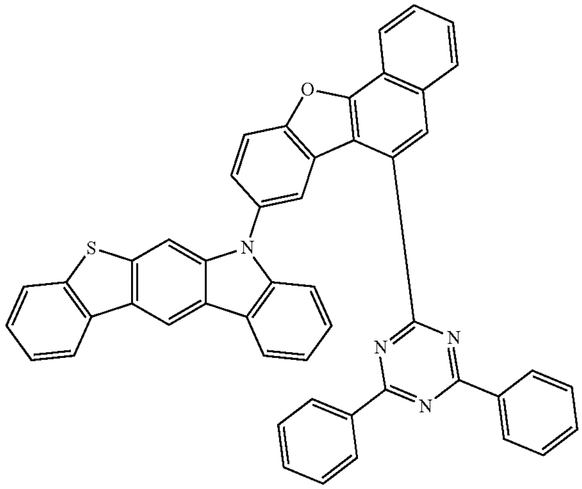
41
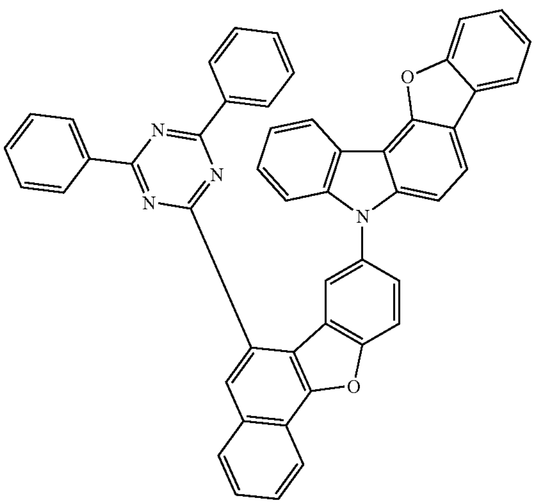
-continued
42
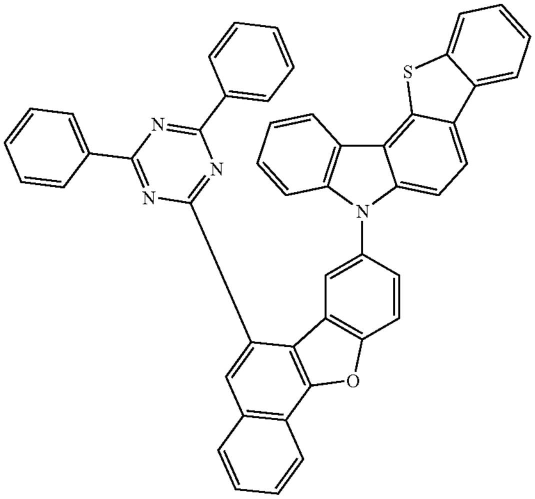
43
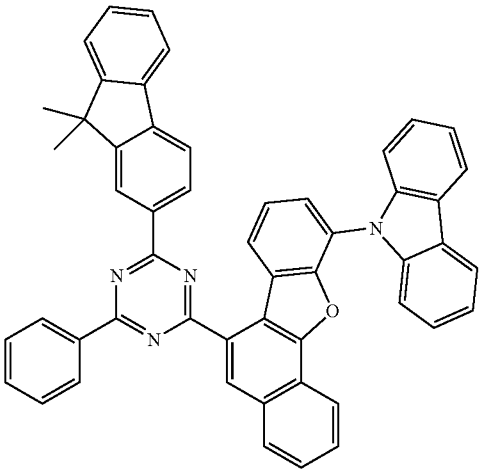
44
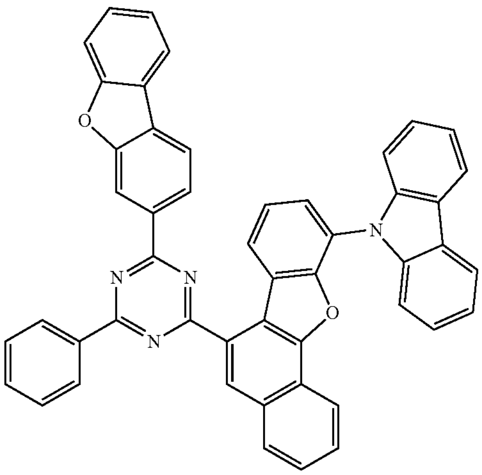

-continued
45
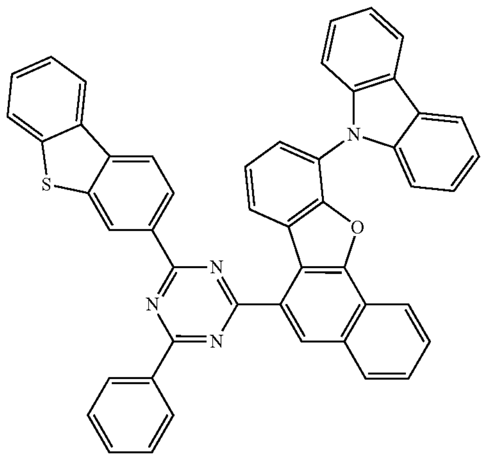
46
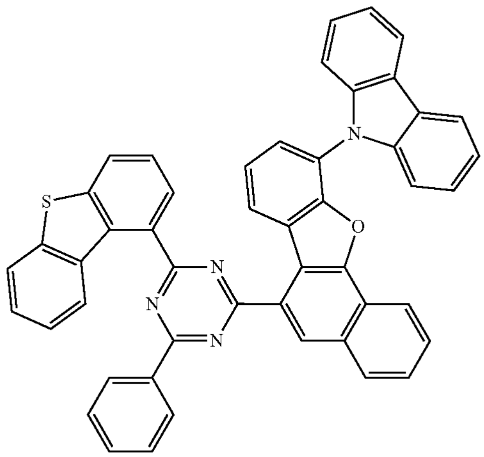
47
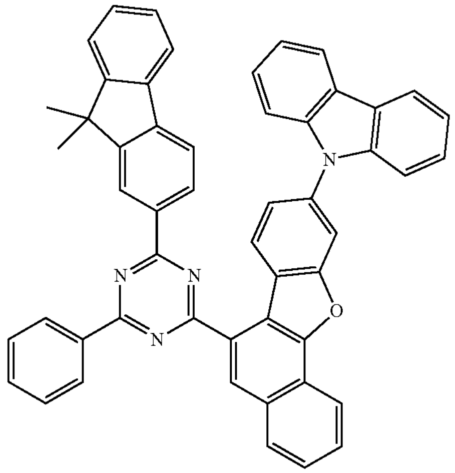
-continued
48
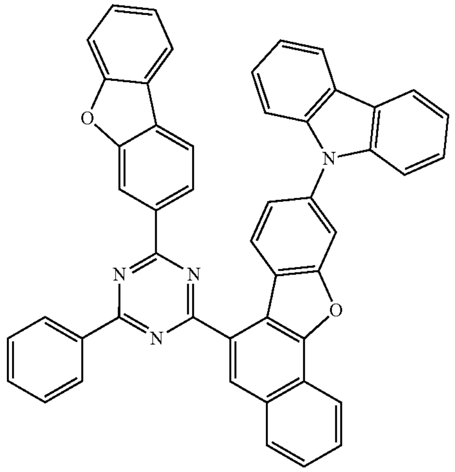
49
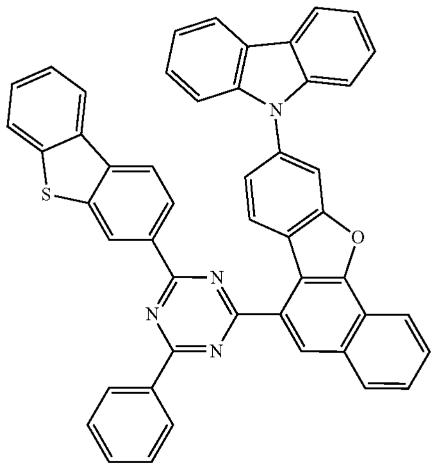
50
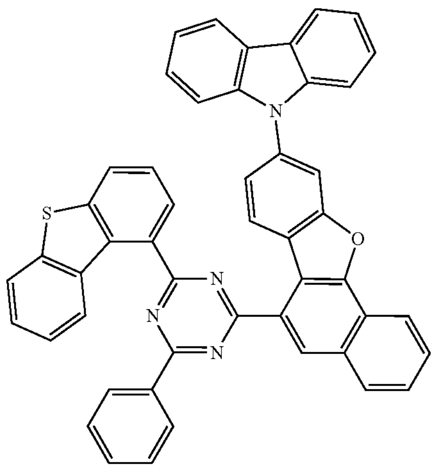

-continued
51
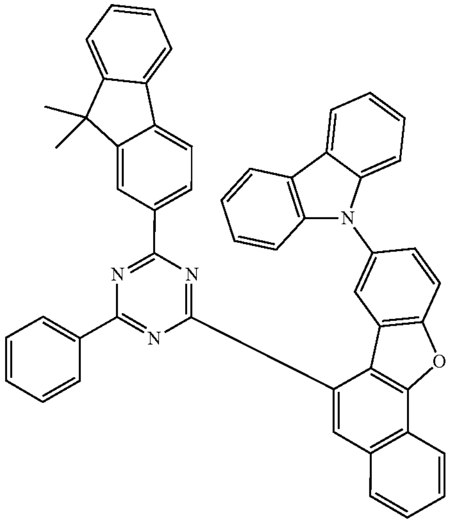
52
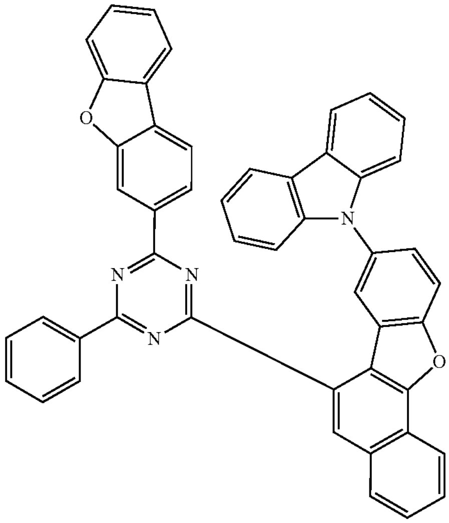
53
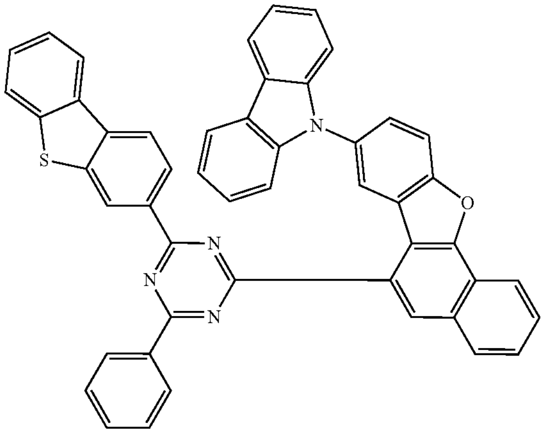
-continued
54
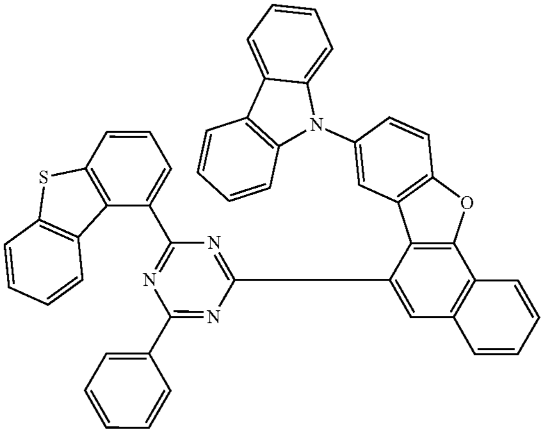
55
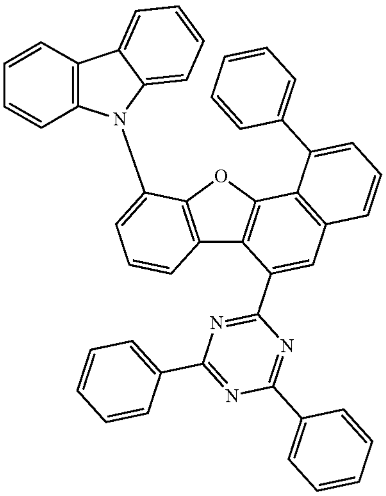
56
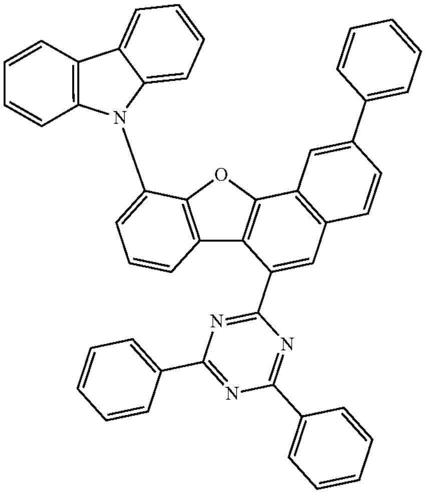

-continued
57
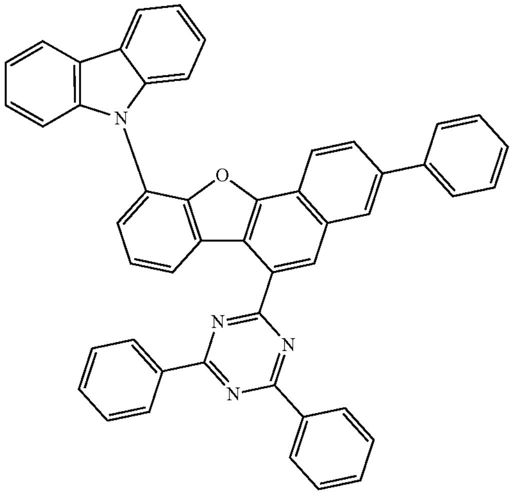
58
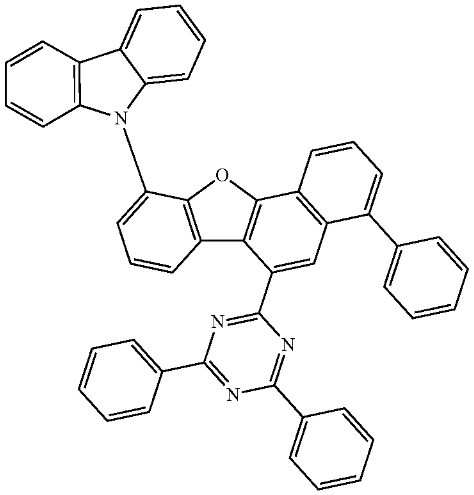
59
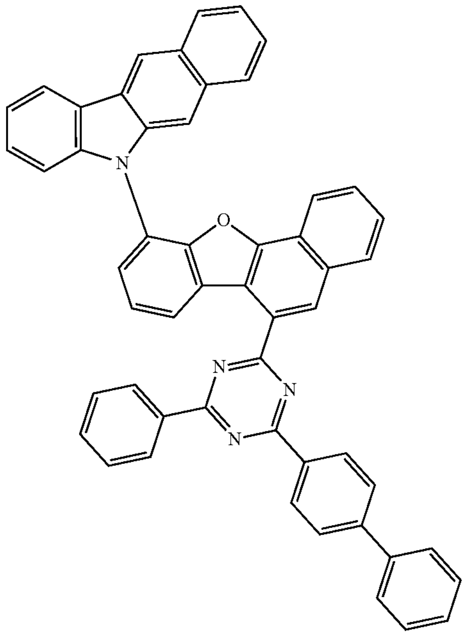
-continued
60
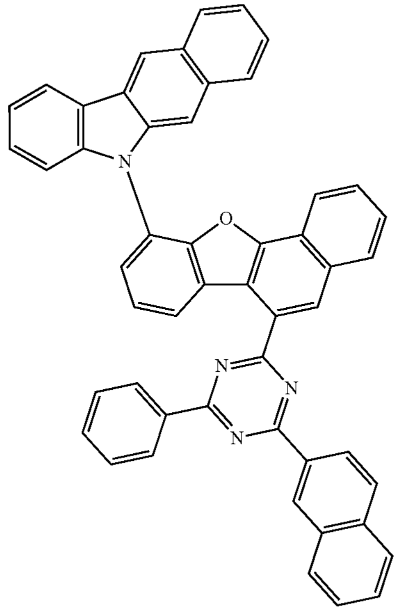
61
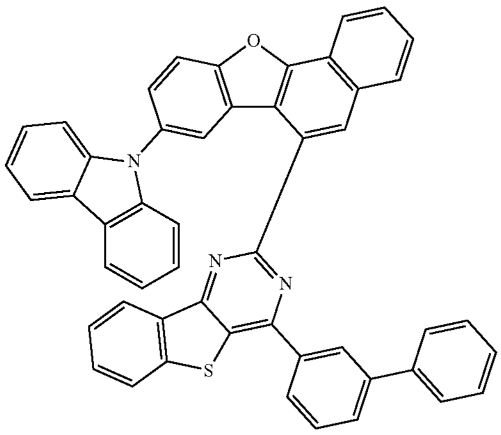
62
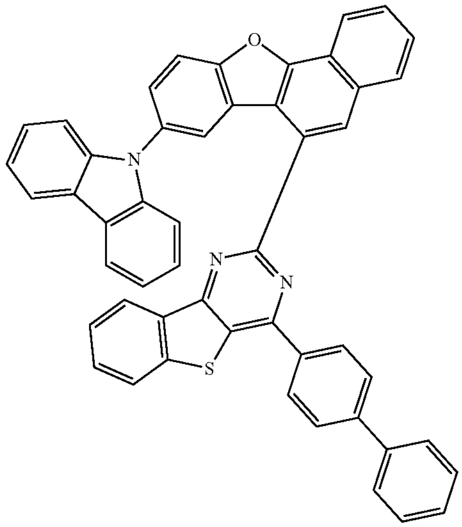

-continued
63
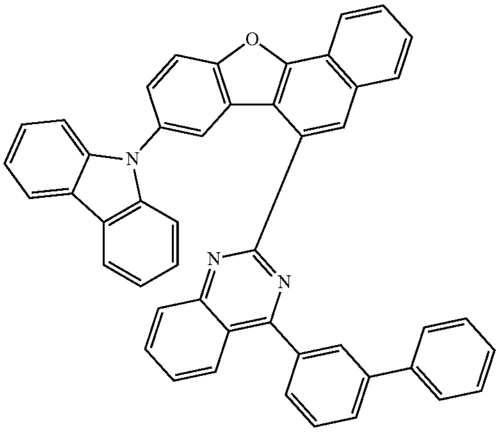
64
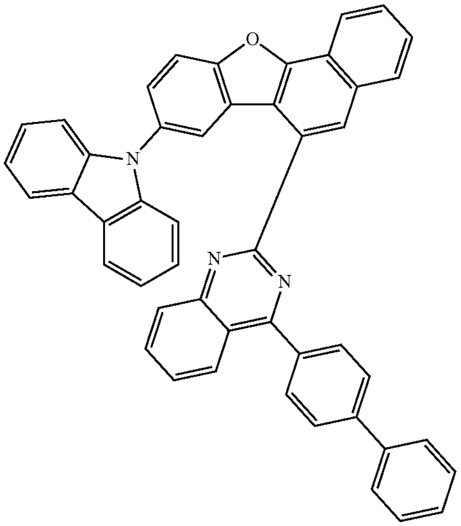
65
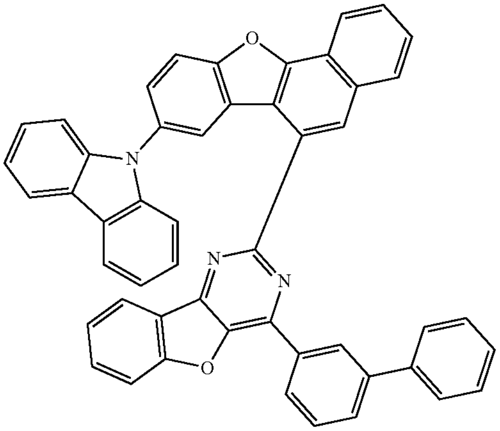
-continued
66
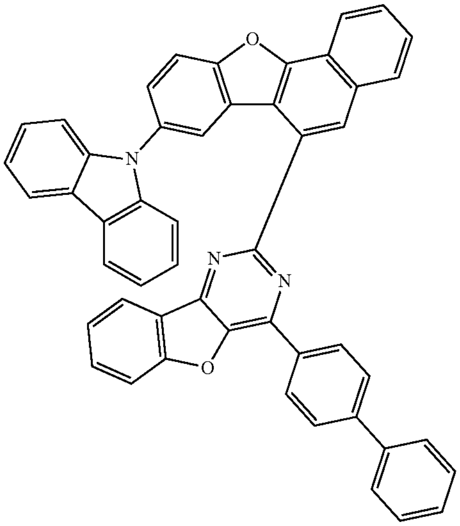
67
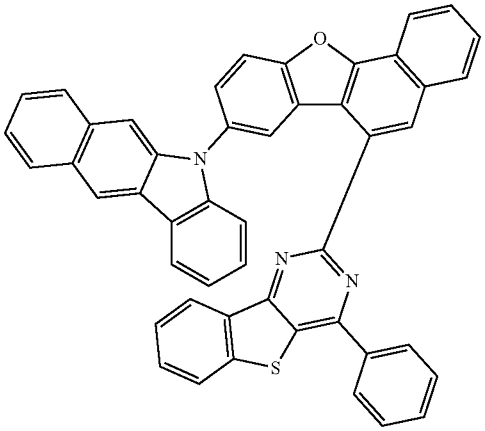
68
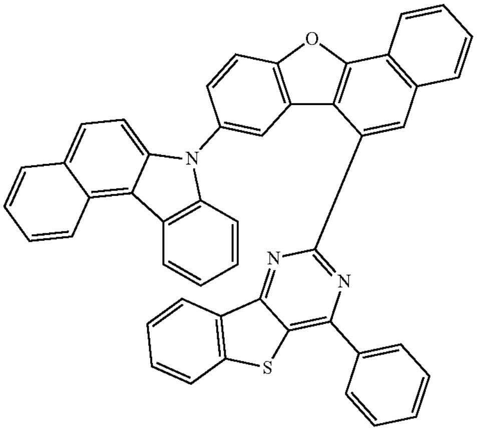

-continued
69
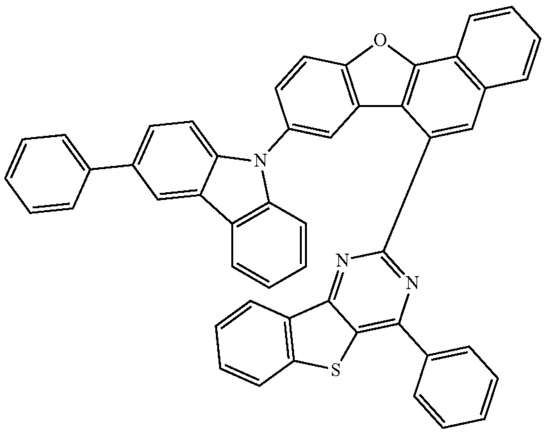
70
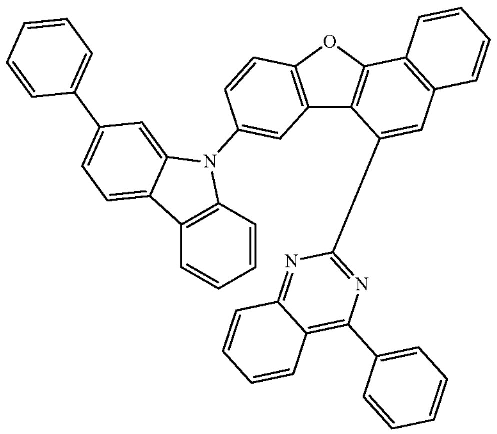
71
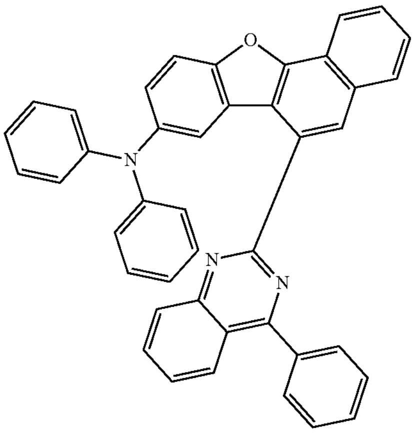
-continued
72
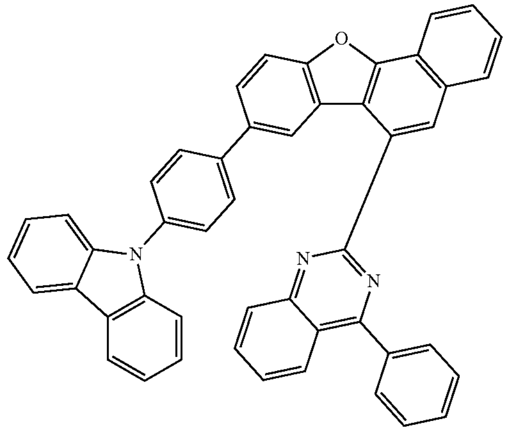
73
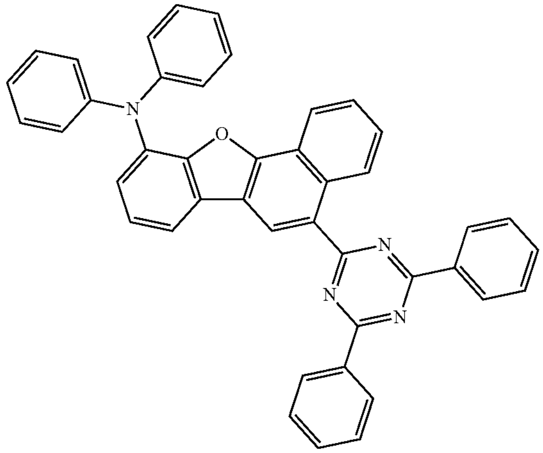
74
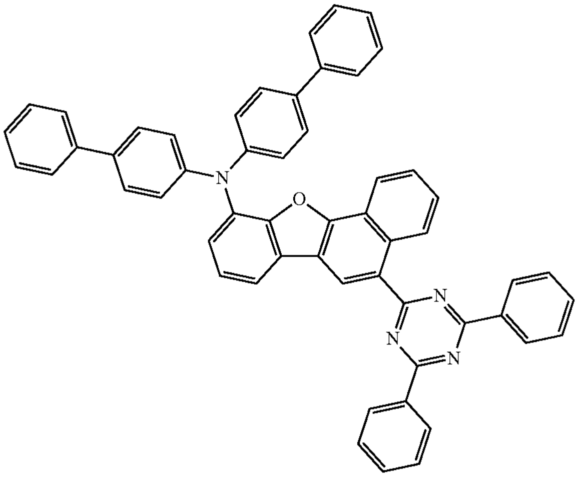

-continued
75
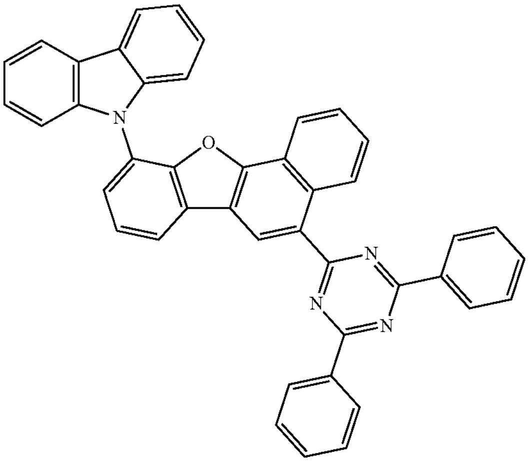
76
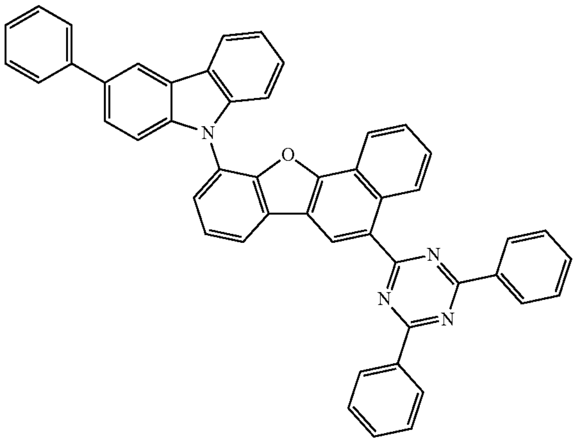
77
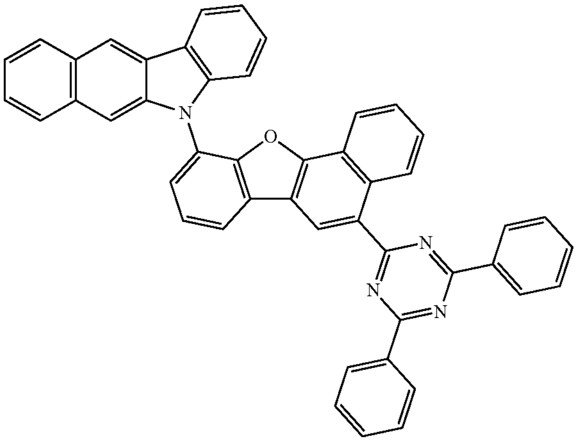
-continued
78
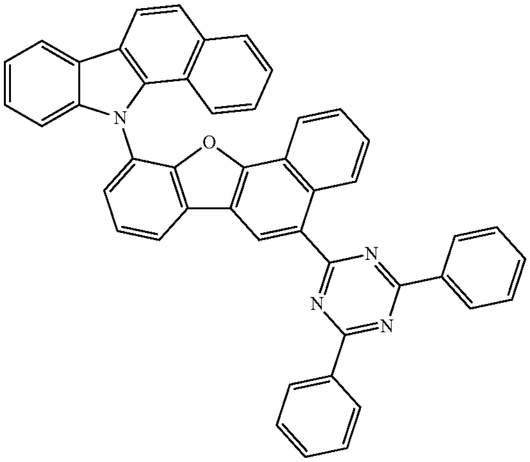
79
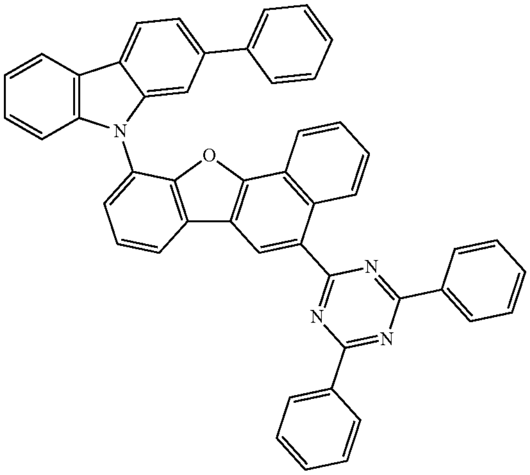
80
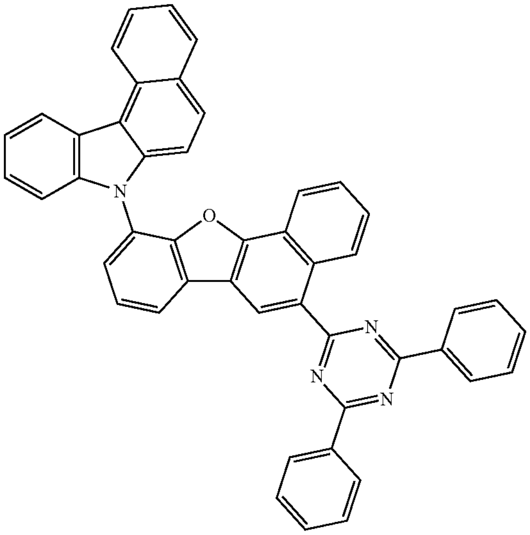

-continued
81
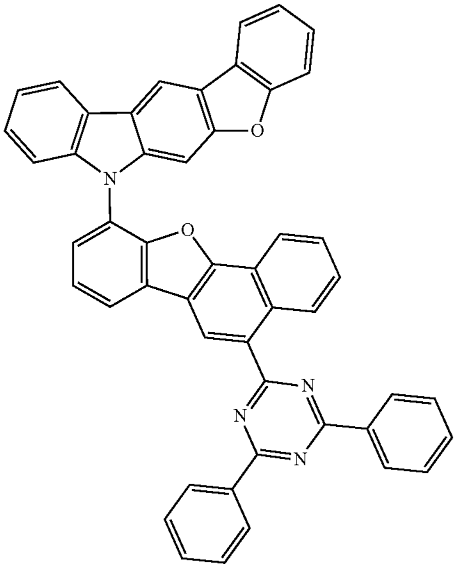
82
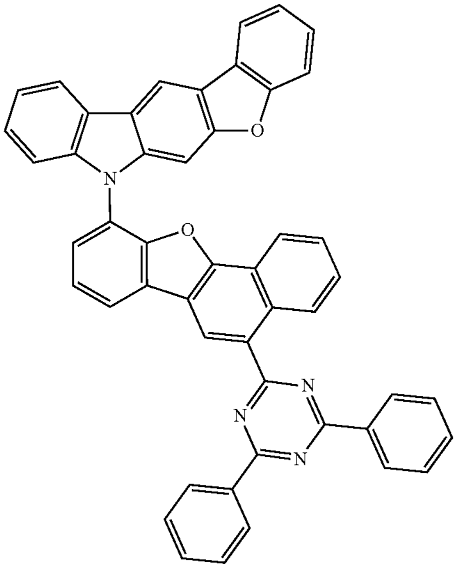
-continued
83
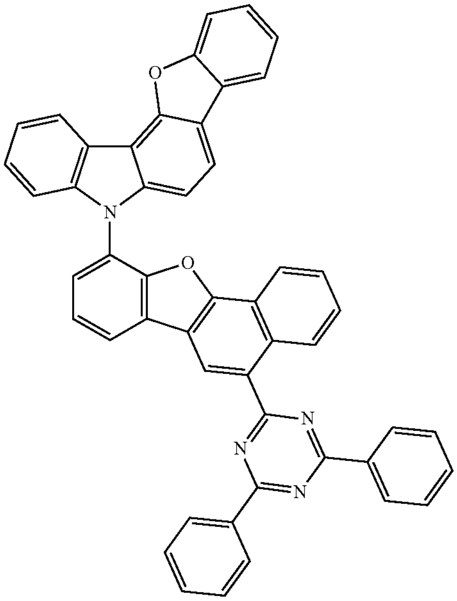
84
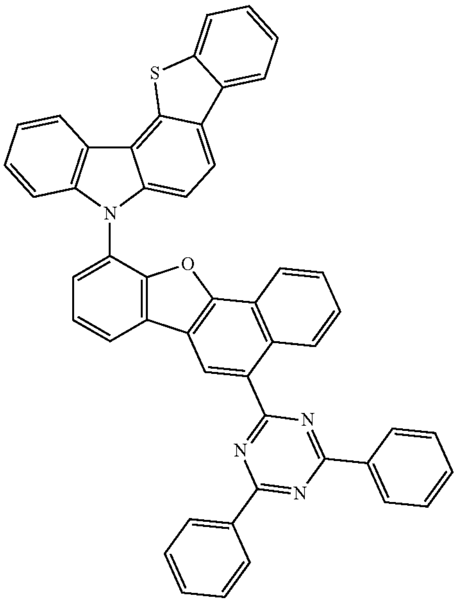

-continued
85
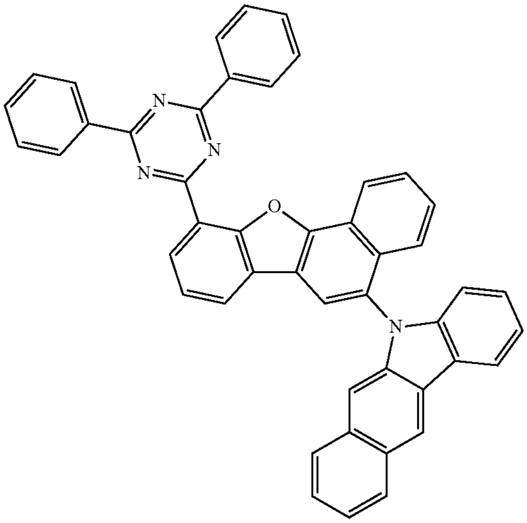
86
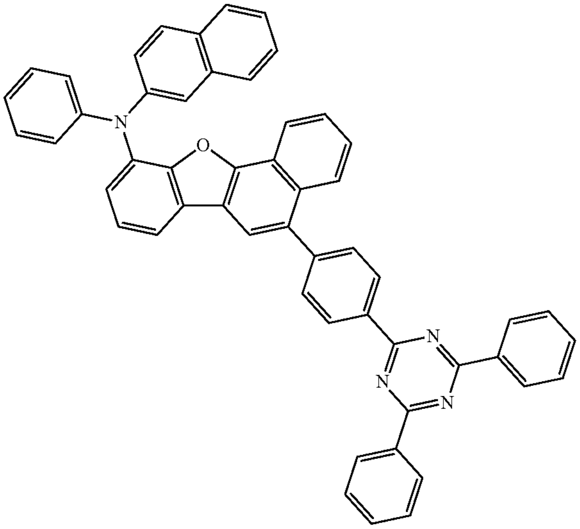
87
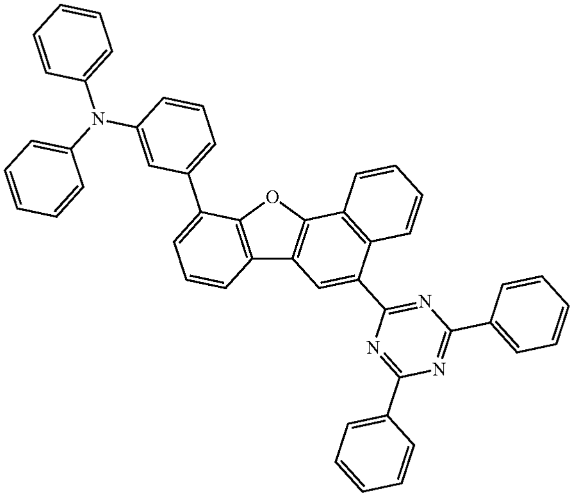
-continued
88
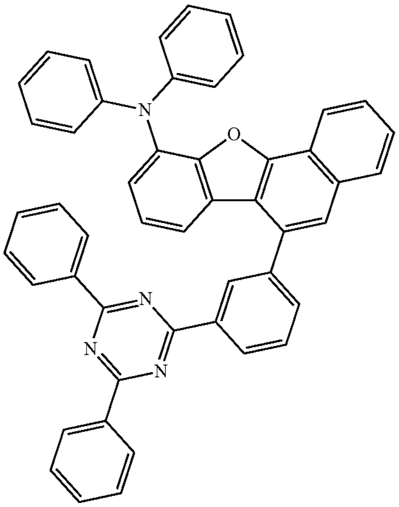
89
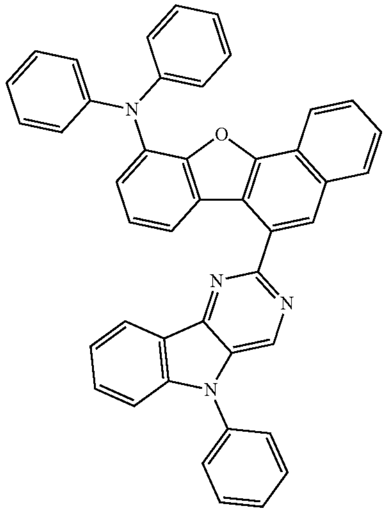
90
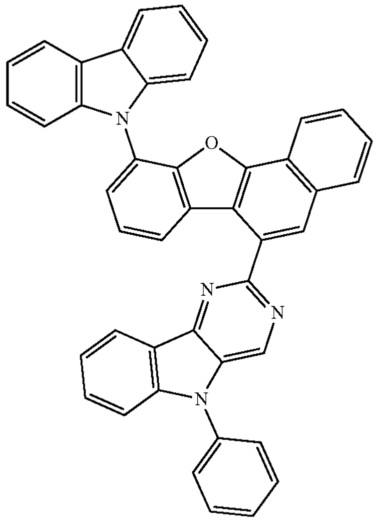

-continued
91
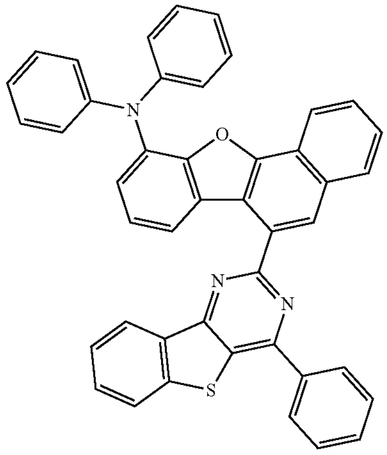
92
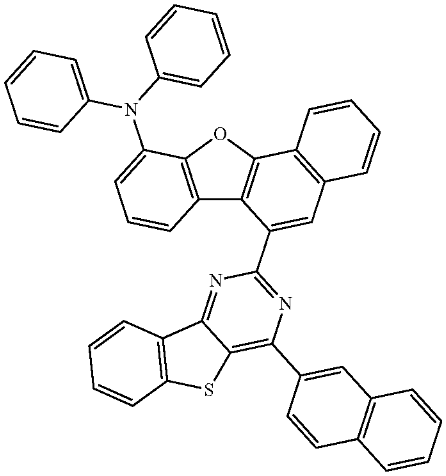
93
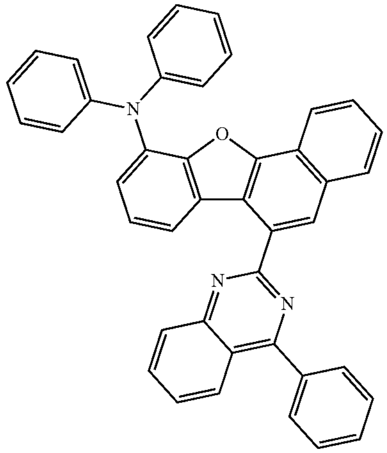
-continued
94
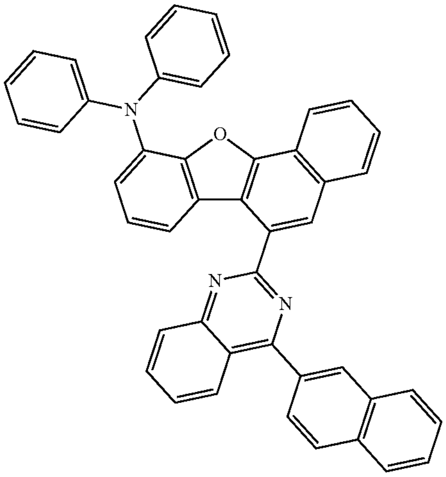
95
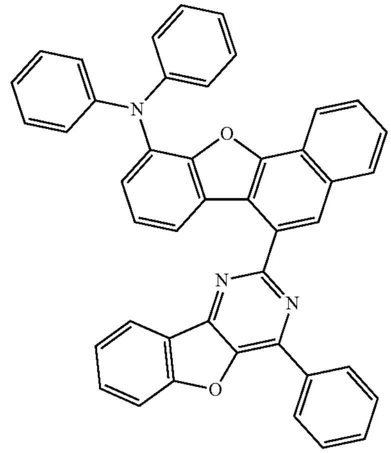
96
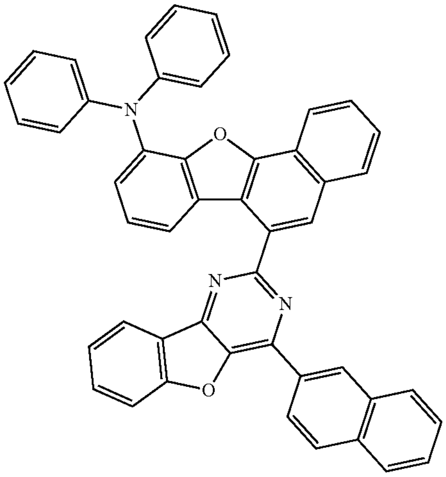

-continued
97
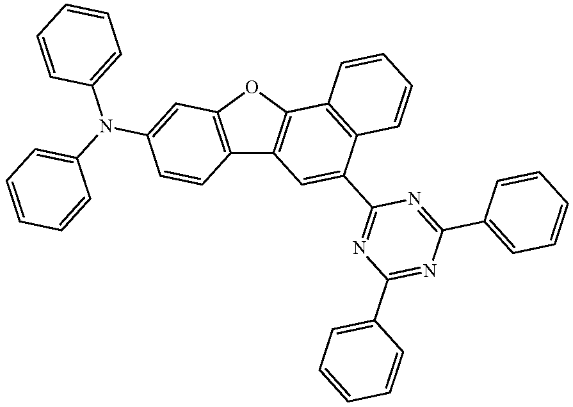
98
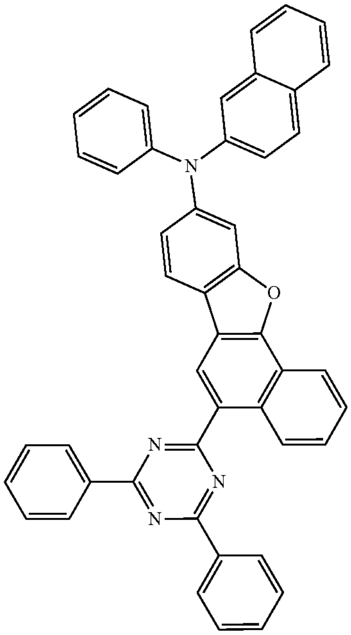
99
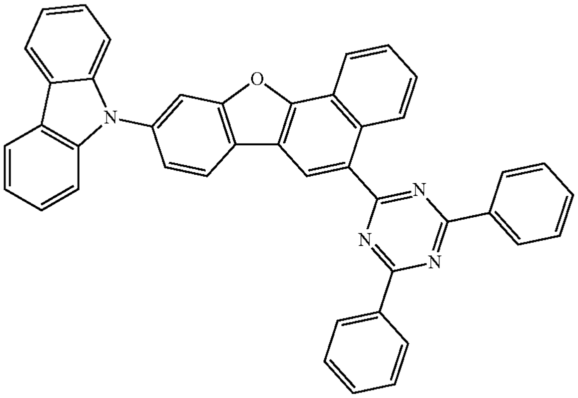
-continued
100
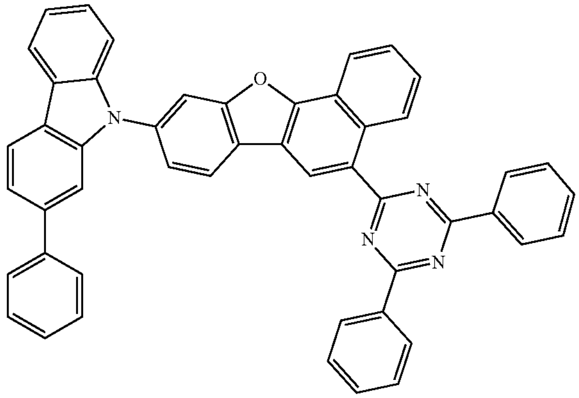
101
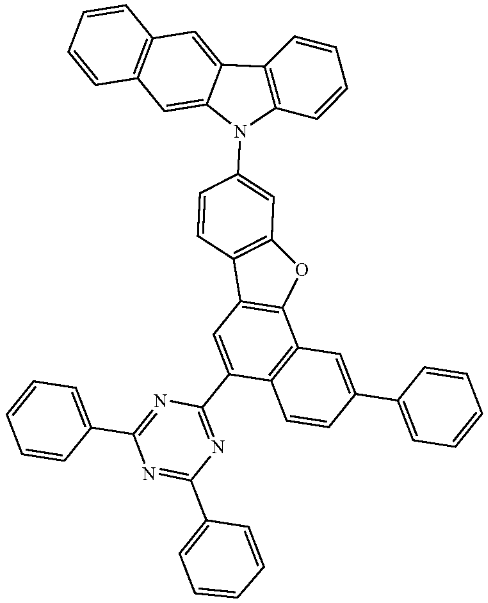
102
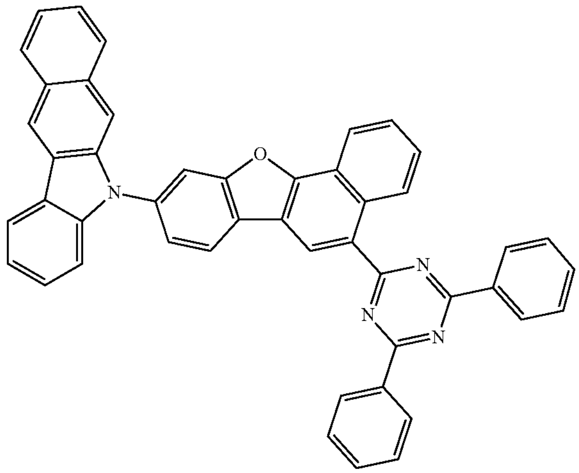

-continued
103
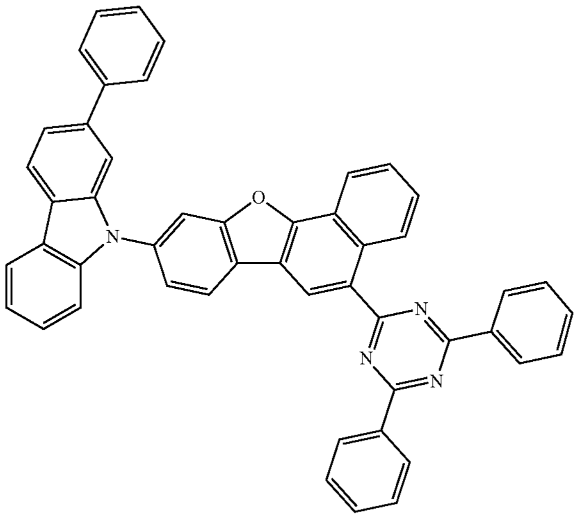
104
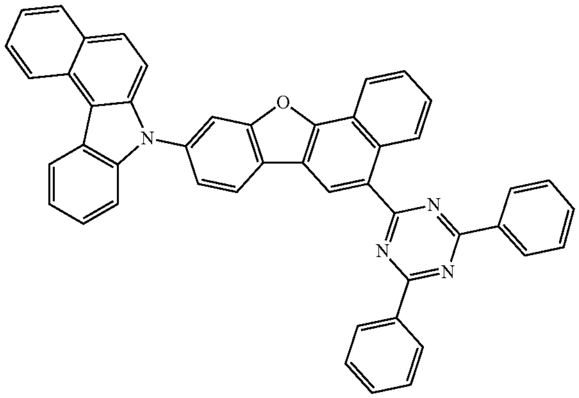
105
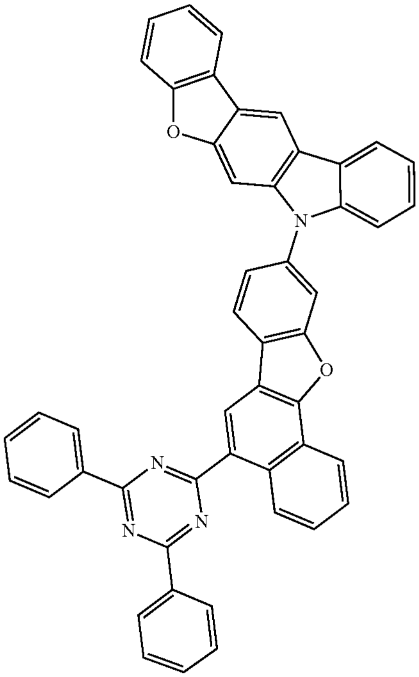
-continued
106
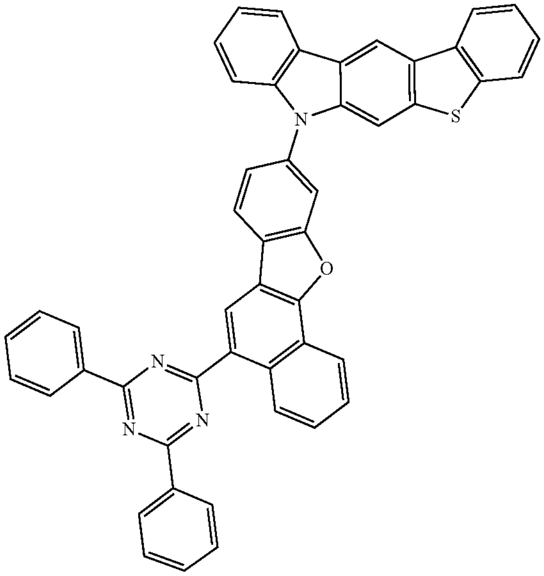
107
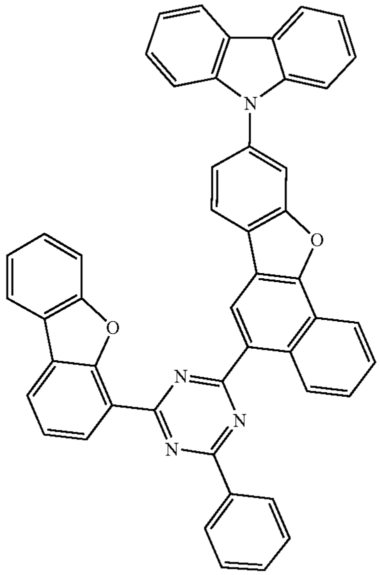

-continued
108
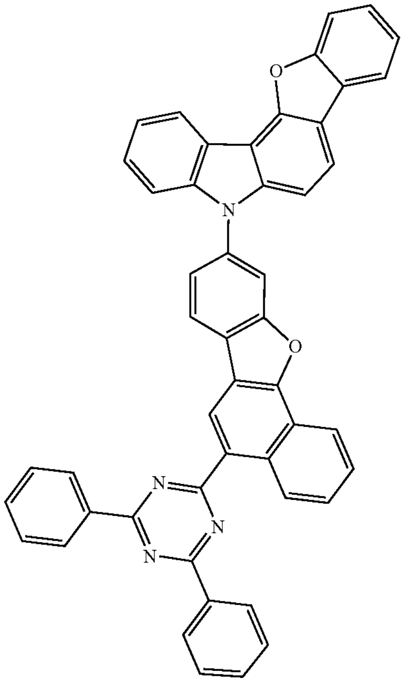
109
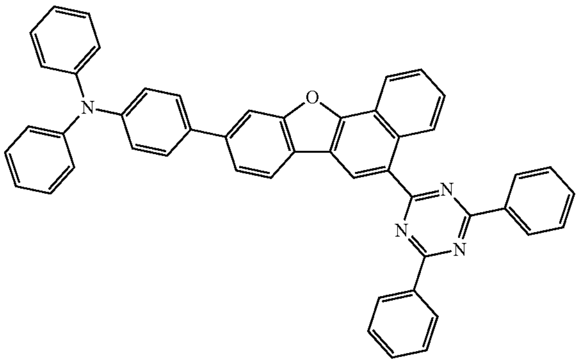
-continued
110
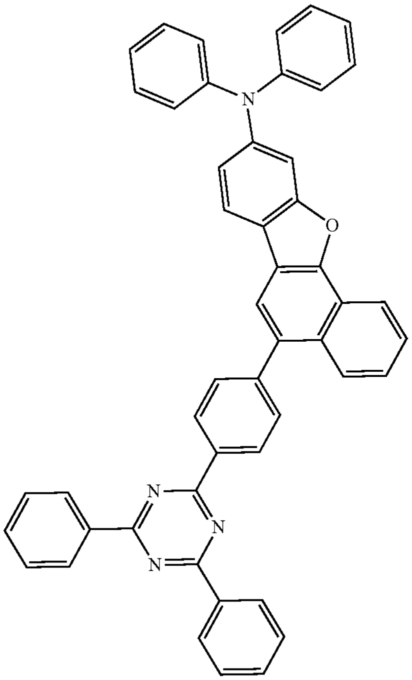
111
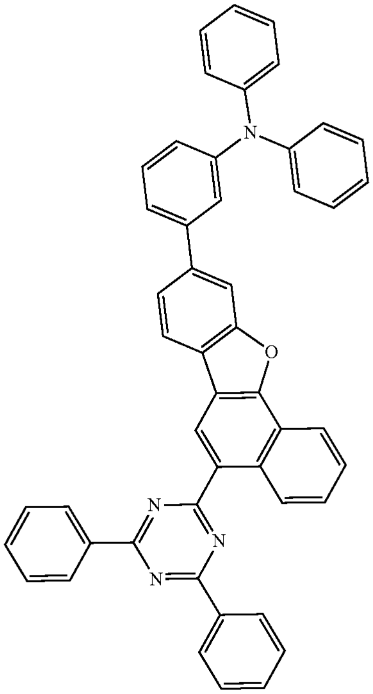

-continued
112
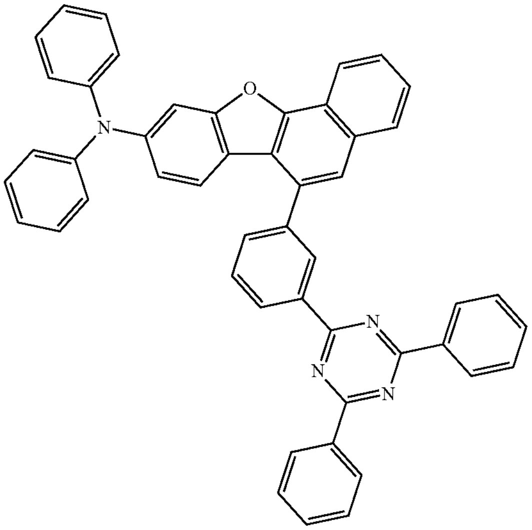
113
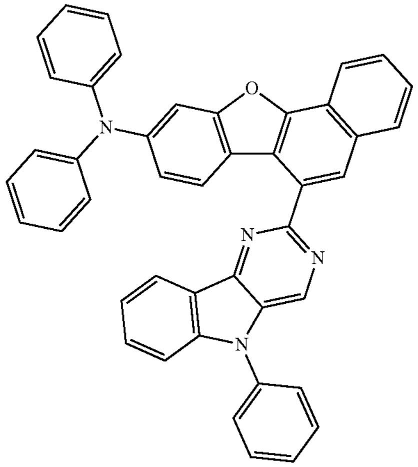
114
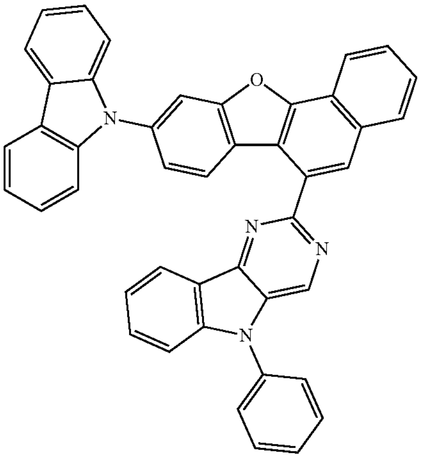
-continued
115
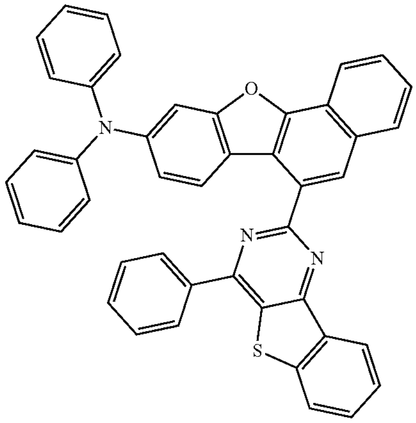
116
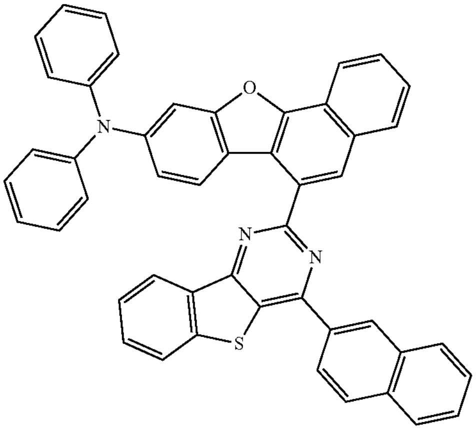
117
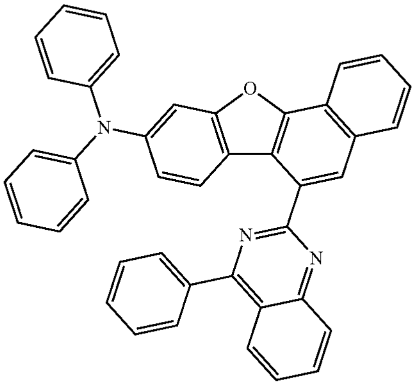

-continued
118
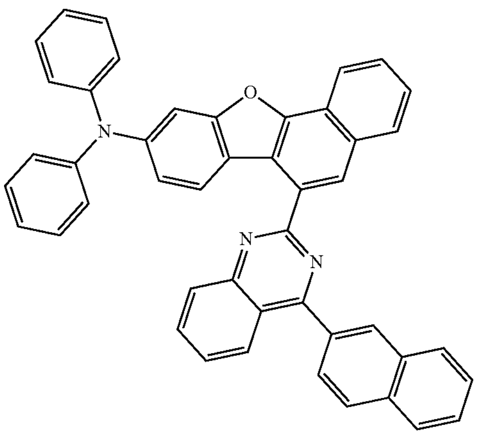
119
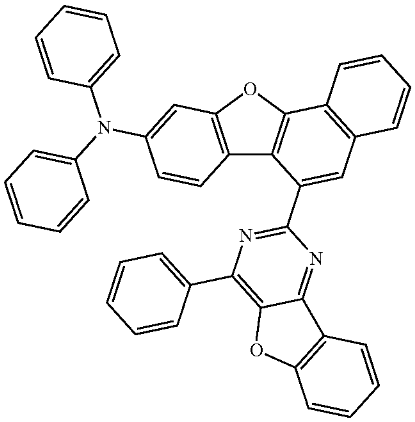
120
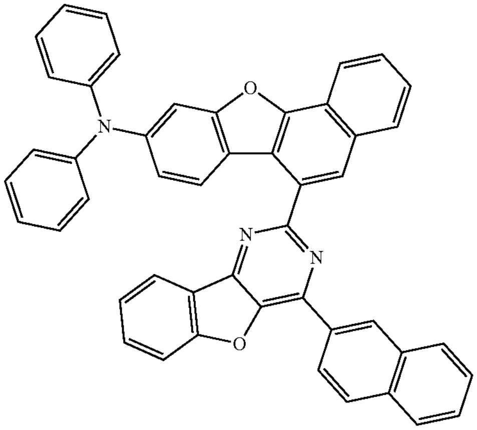
-continued
121
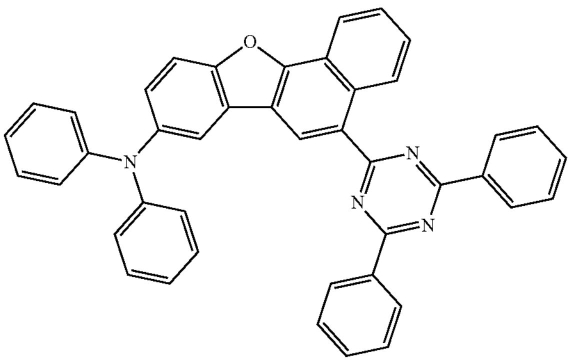
122
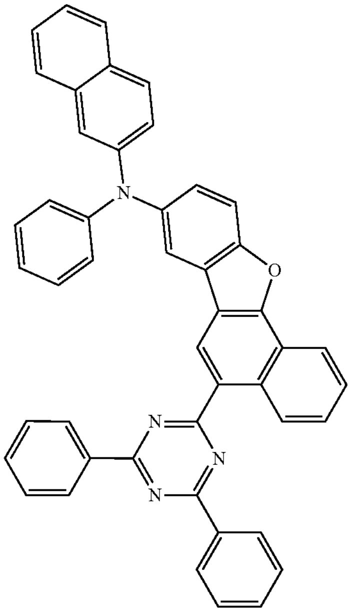
123
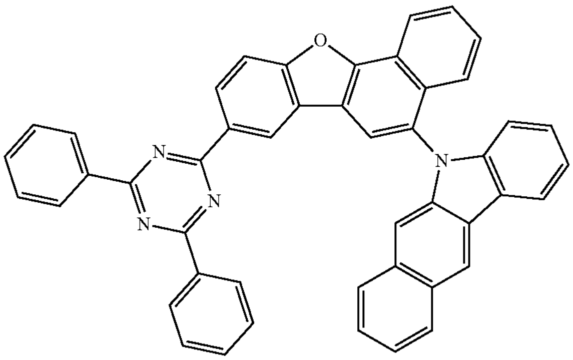

-continued
124
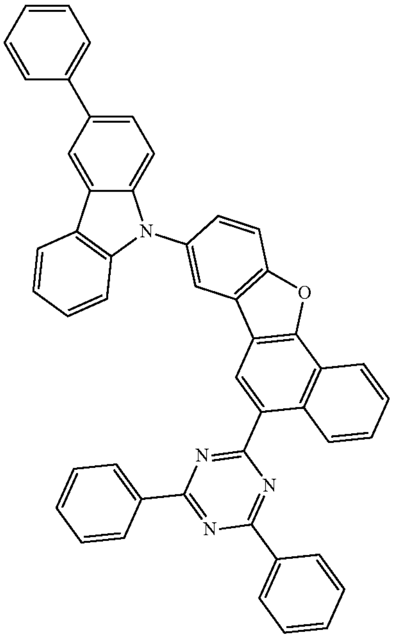
125
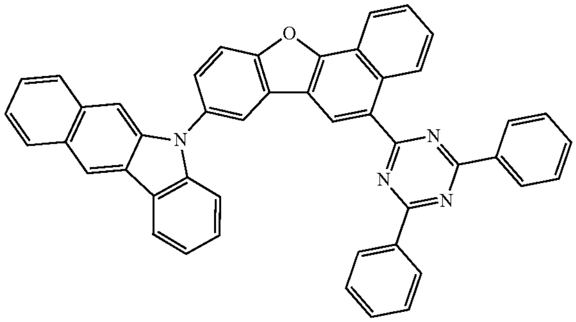
126
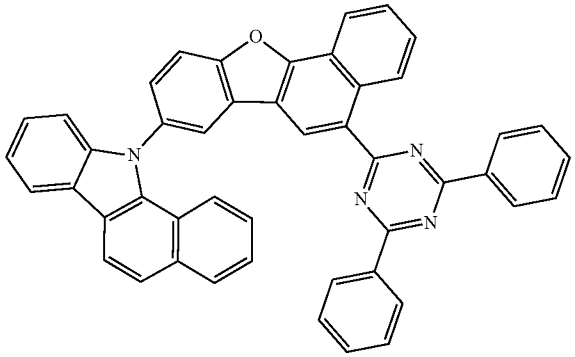
127
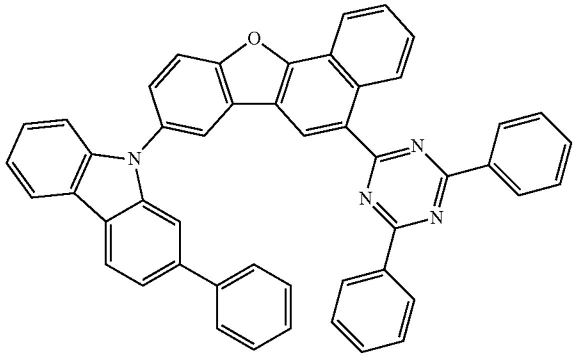
128
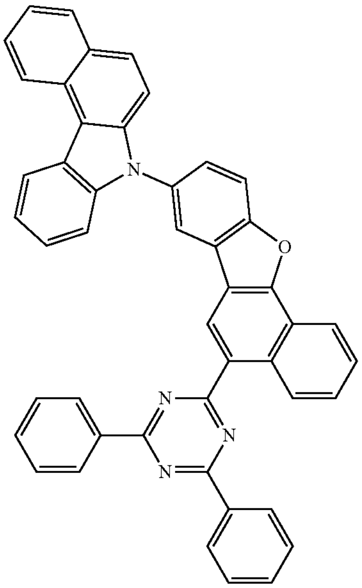
129
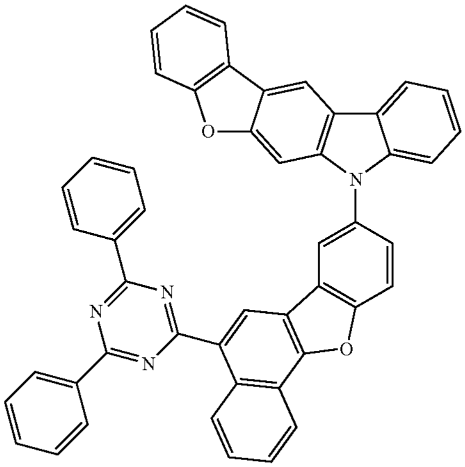

130
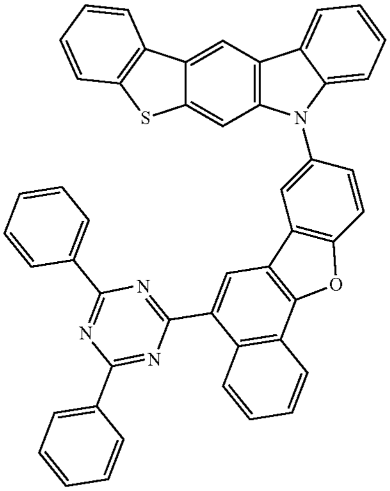
131
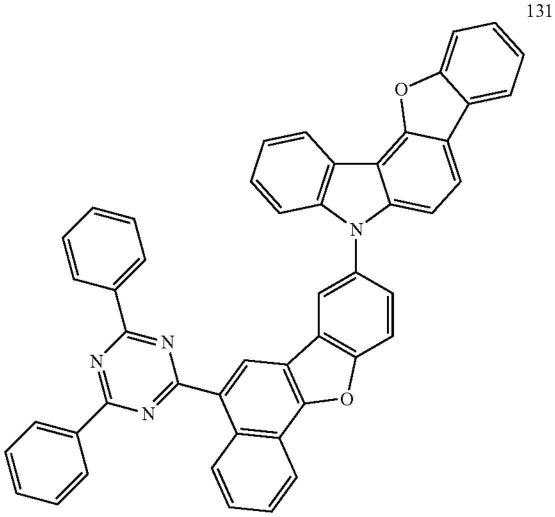
132
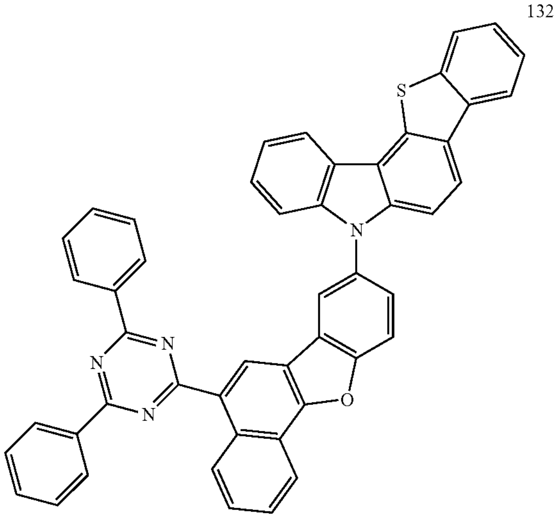
133
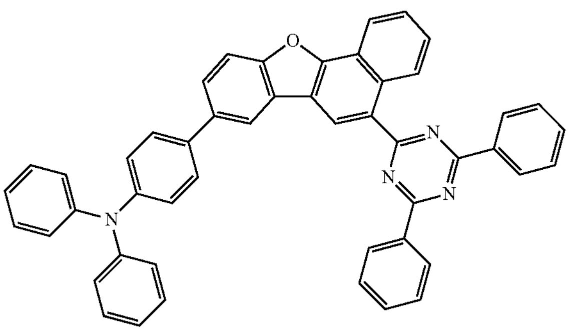
134
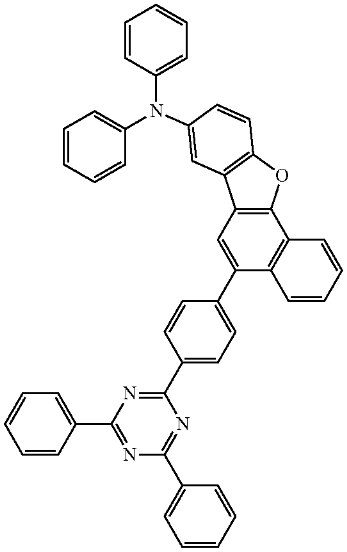
135
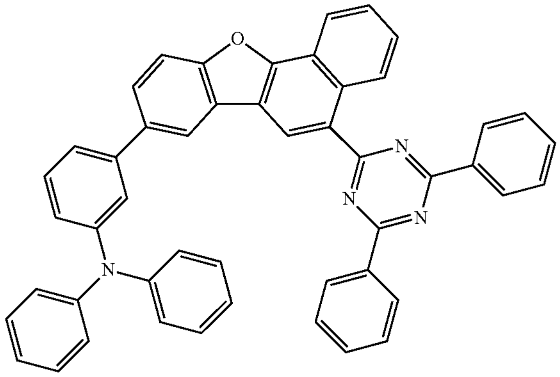

-continued
136
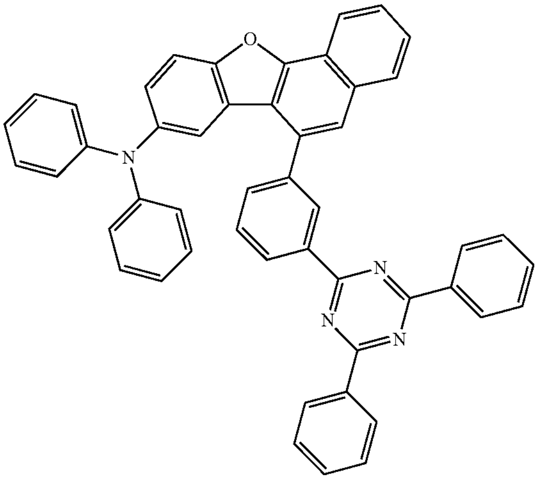
137
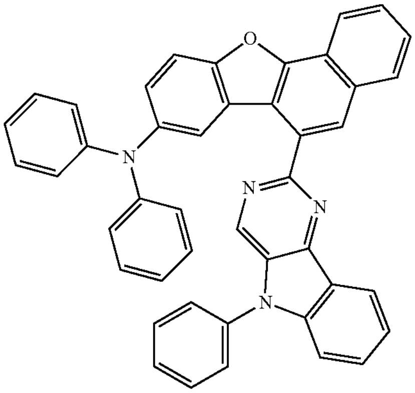
138
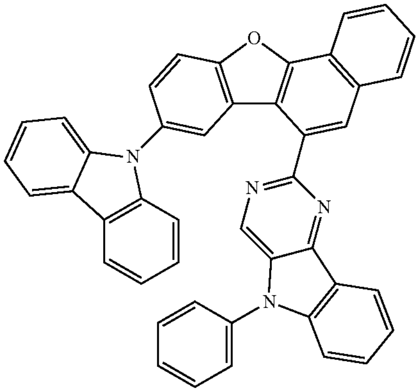
-continued
139
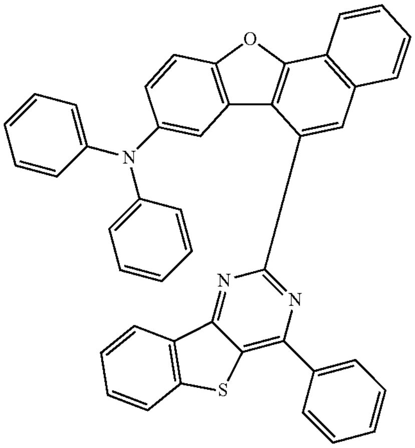
140
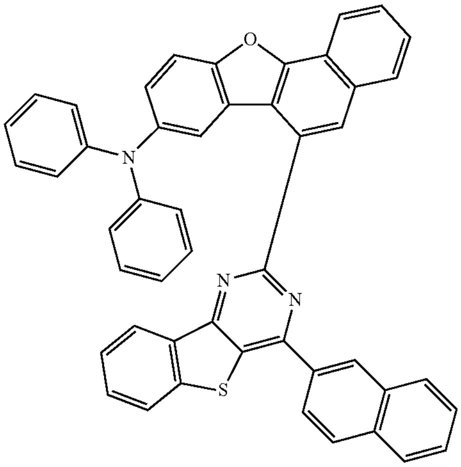
141
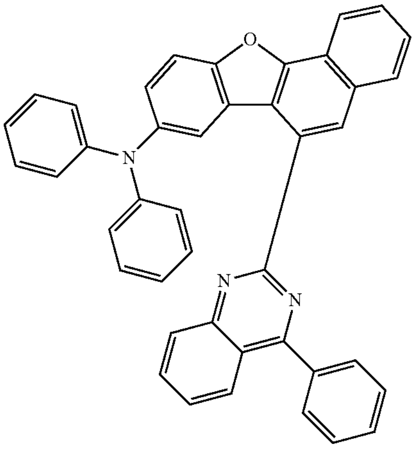

-continued
142
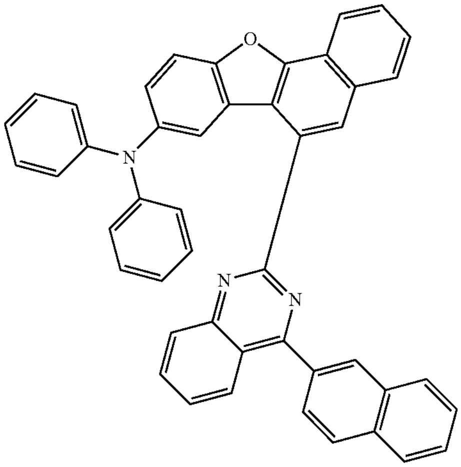
143
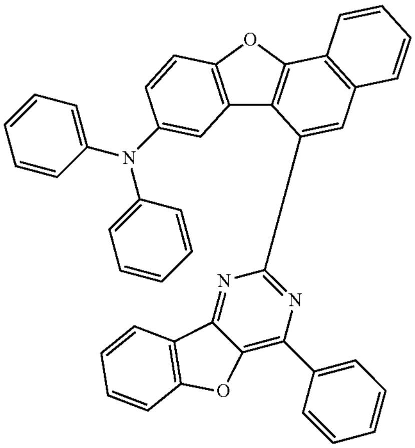
144
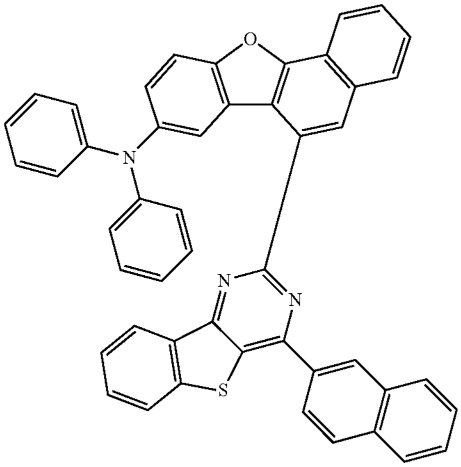
-continued
145
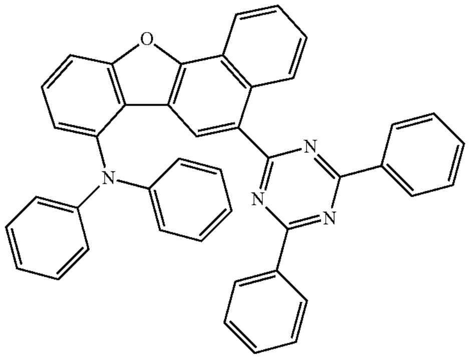
146
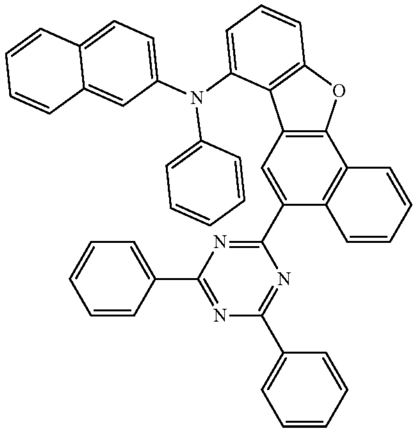
147
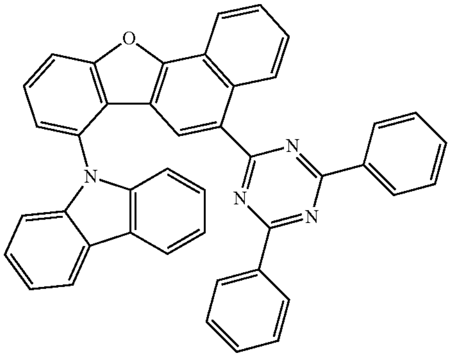
148
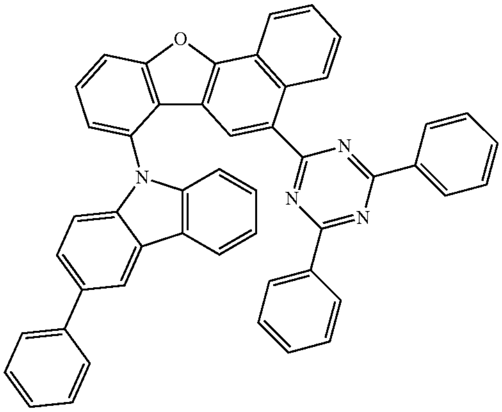

-continued
149
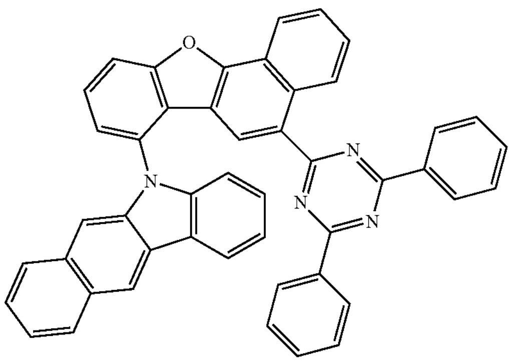
150
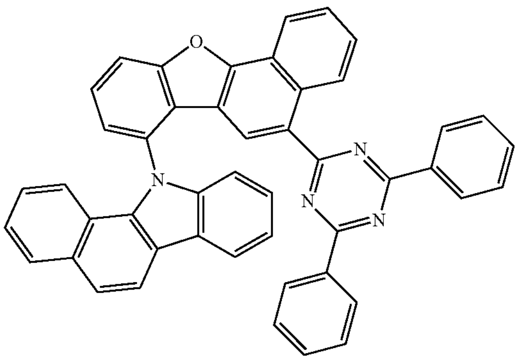
151
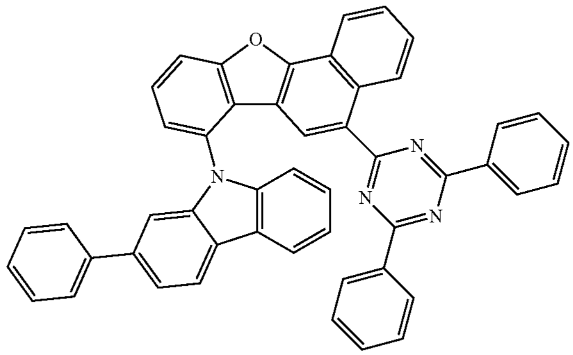
152
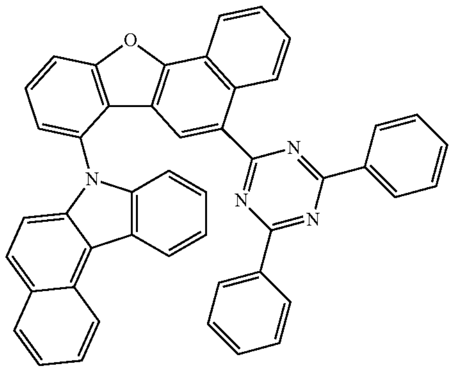
-continued
153
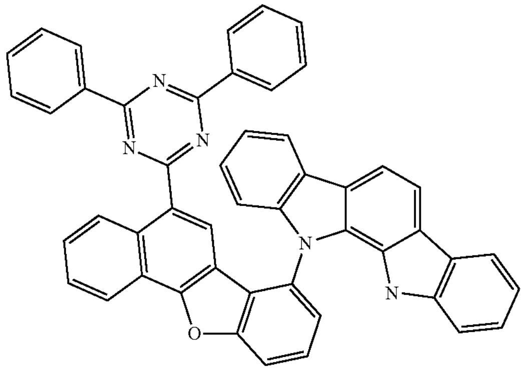
154
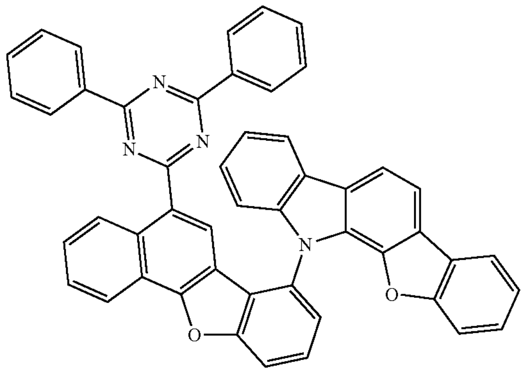
155
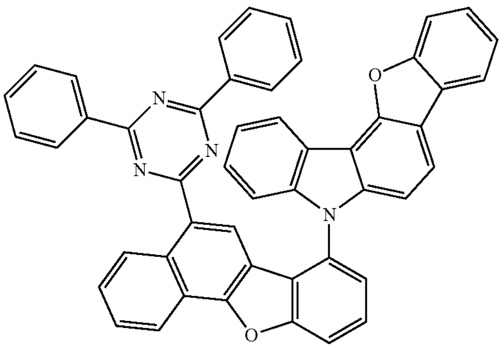
156
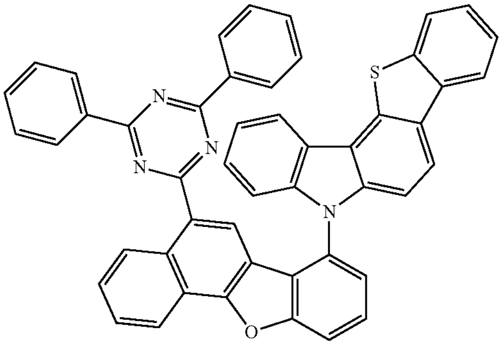

157
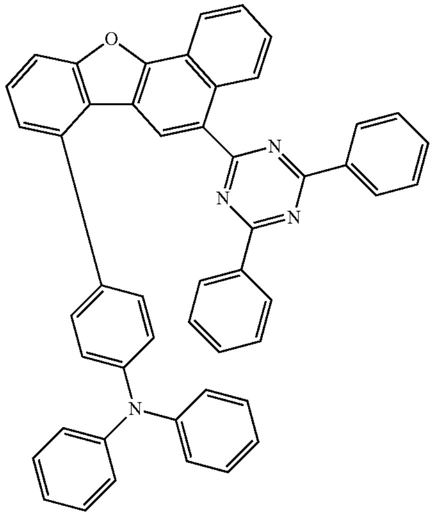
158
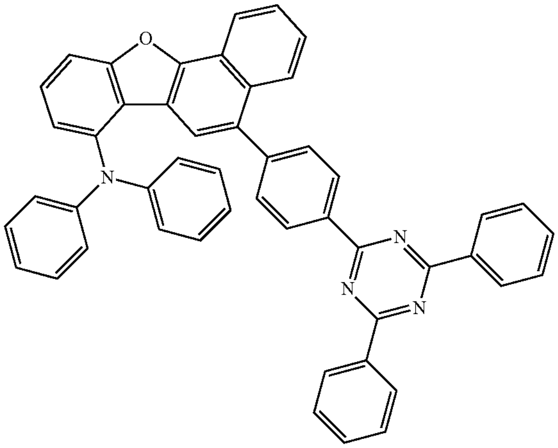
159
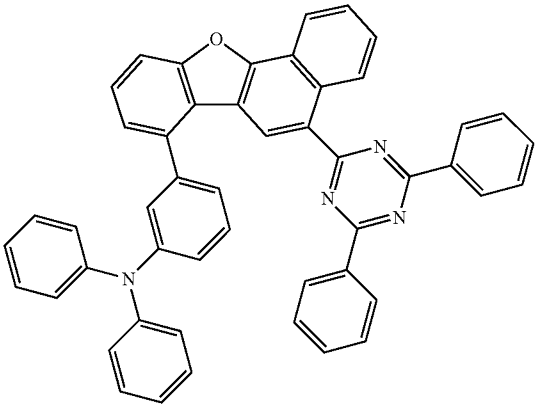
160
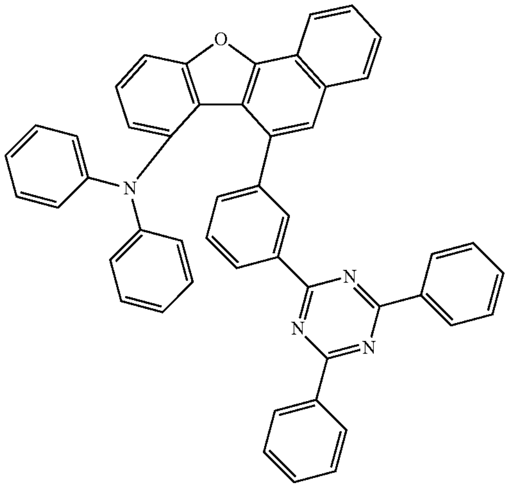
161
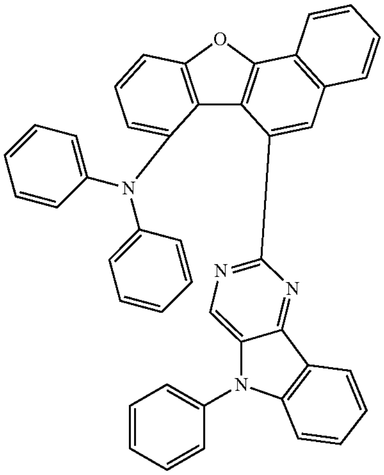
162
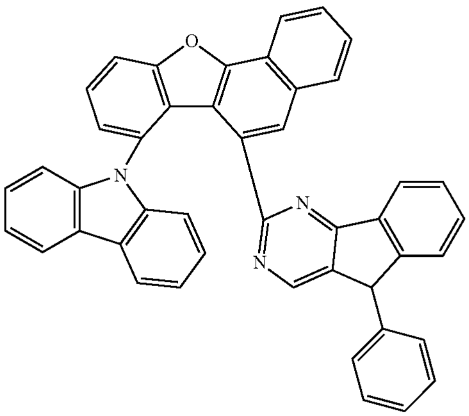

-continued
163
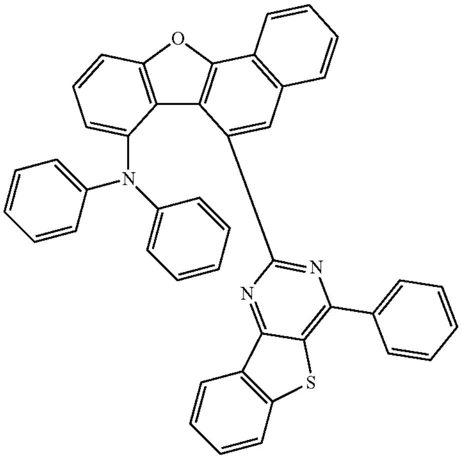
164
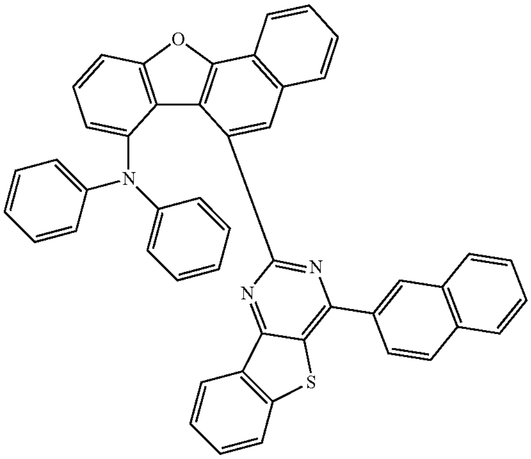
165
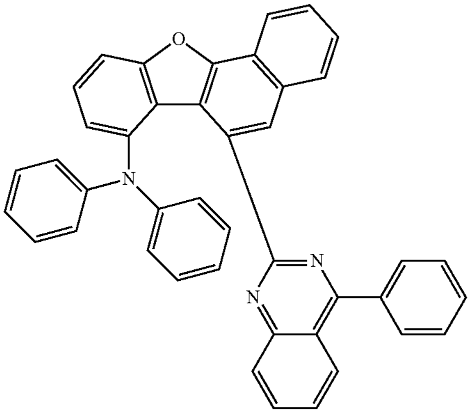
-continued
166
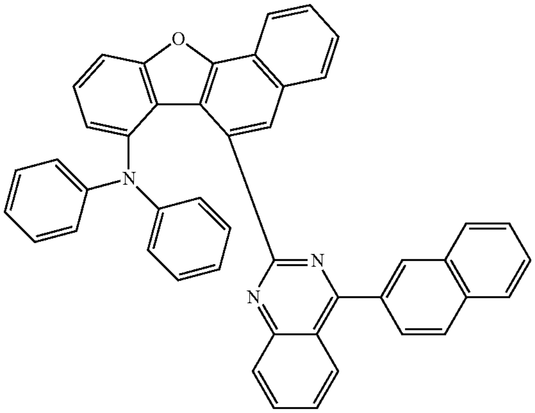
167
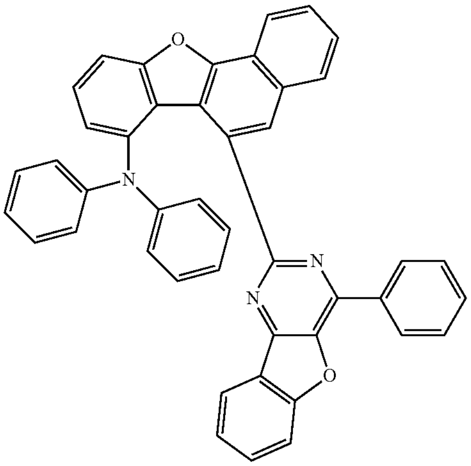
168
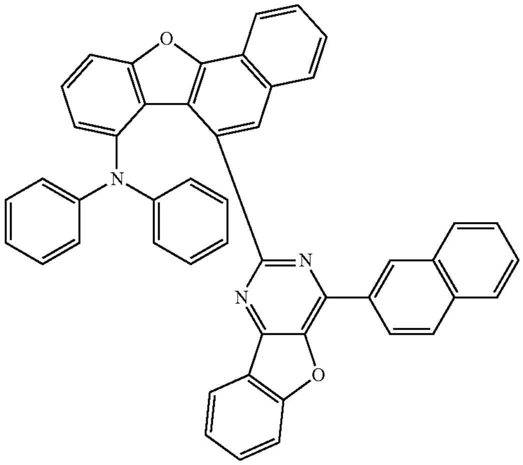

-continued
169
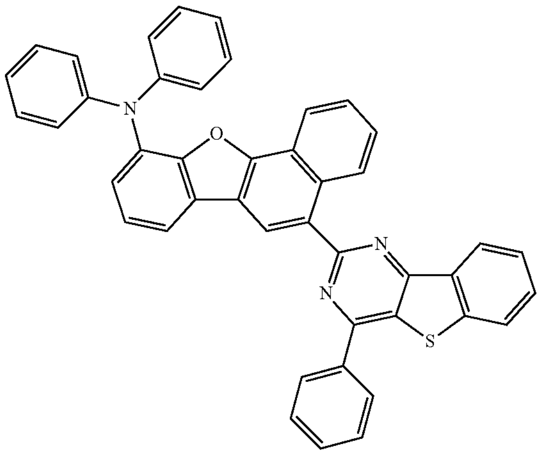
170
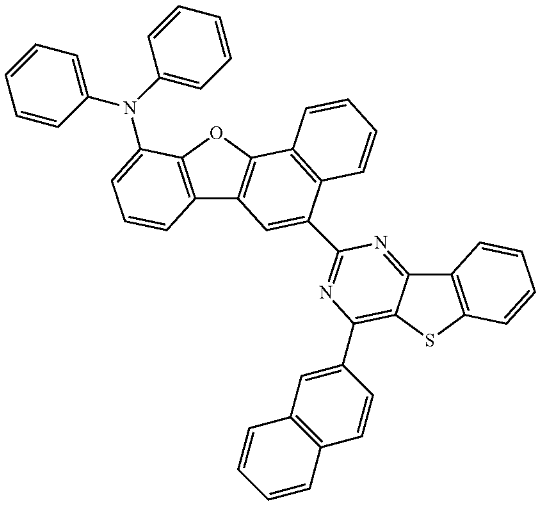
171
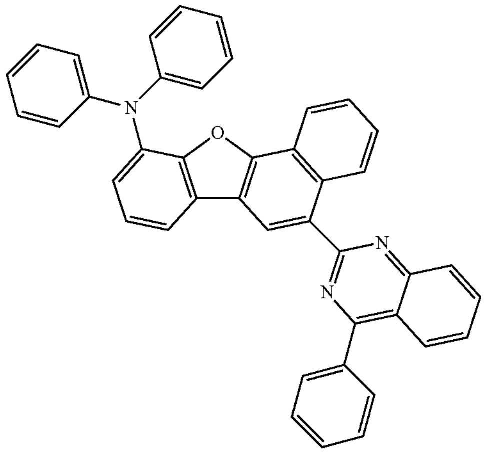
-continued
172
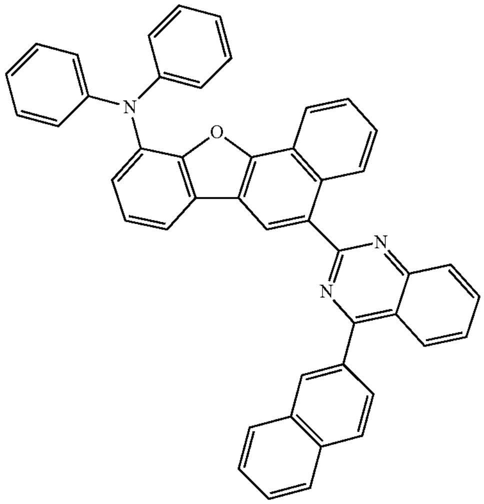
173
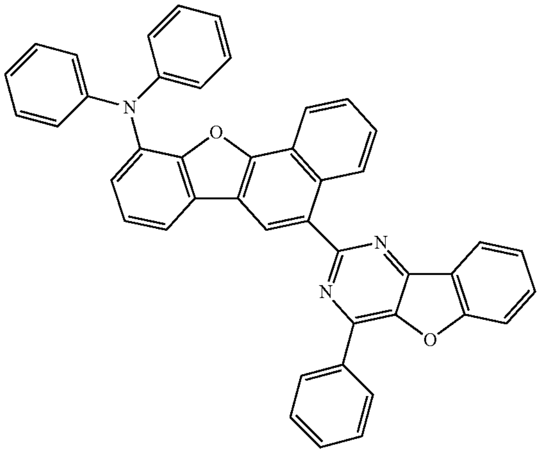
174
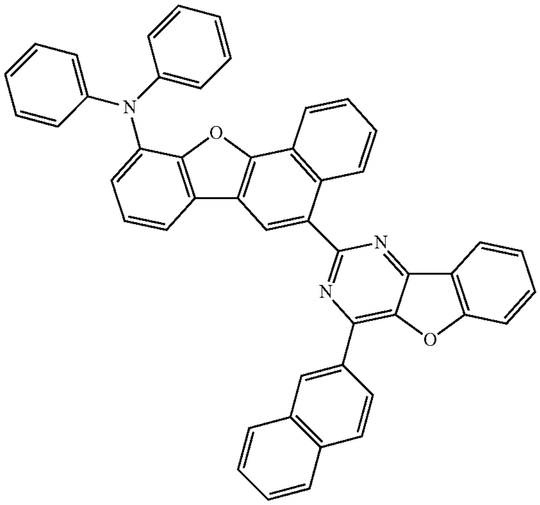

-continued
175
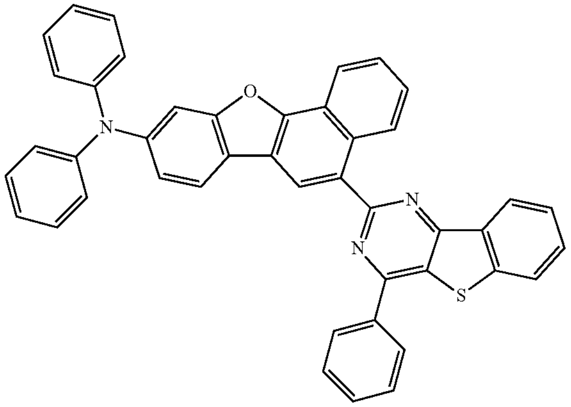
176
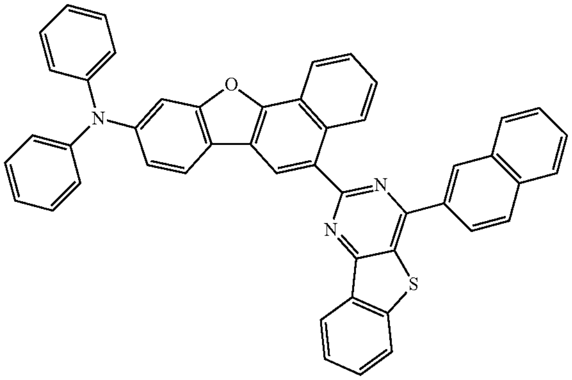
177
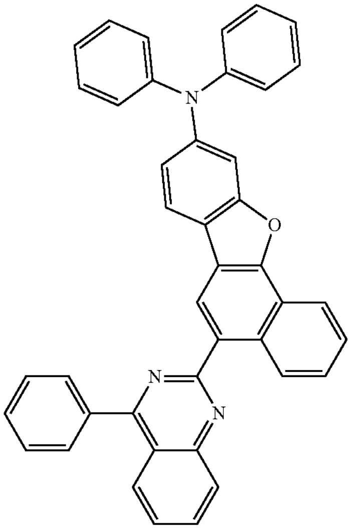
-continued
178
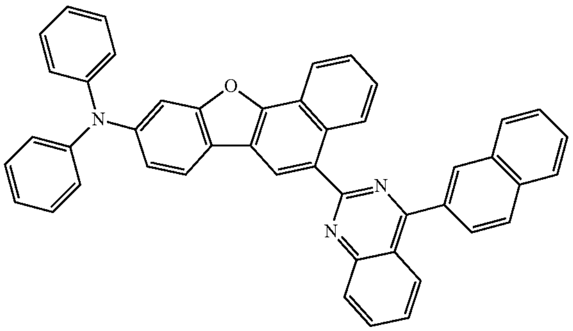
179
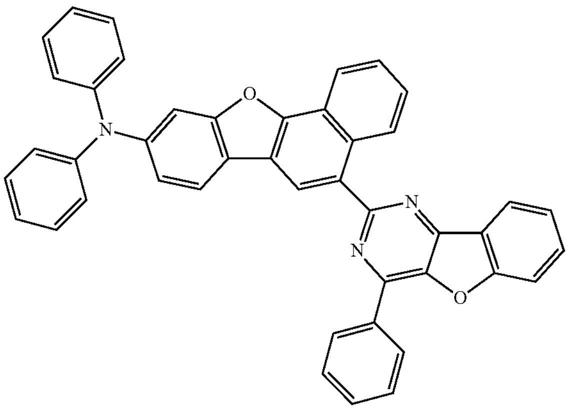
180
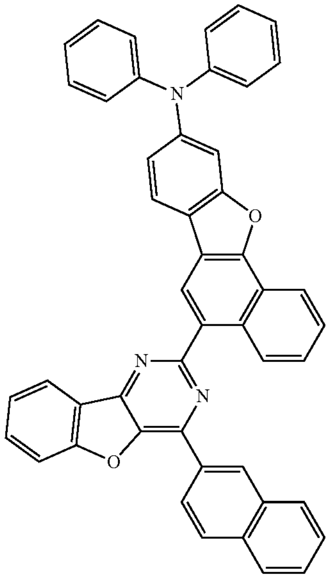

-continued
181
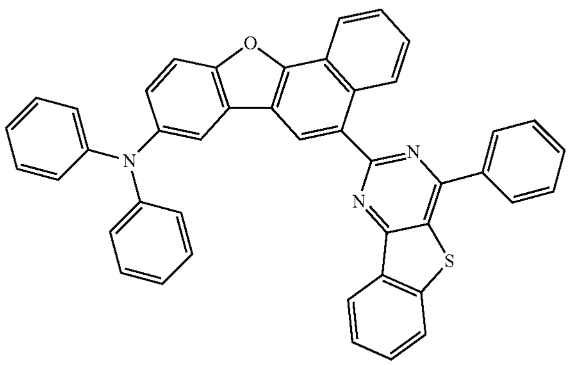
182
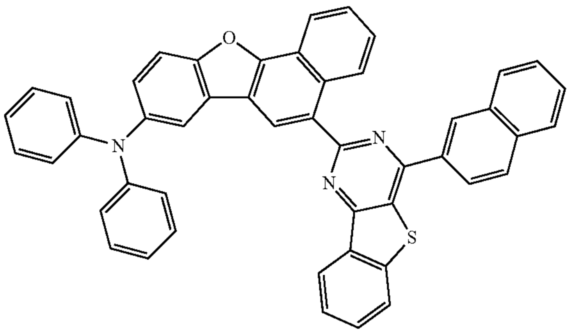
183
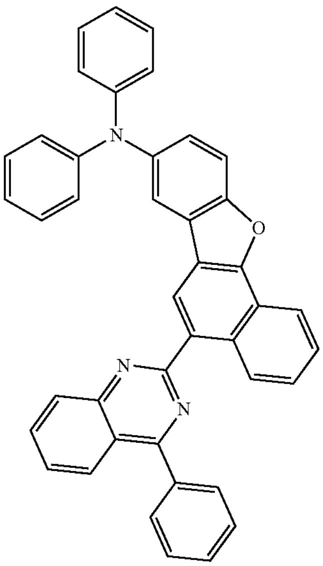
184
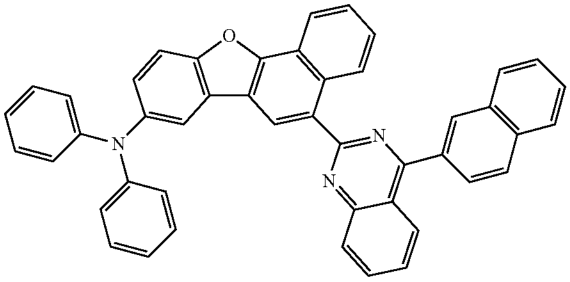
-continued
185
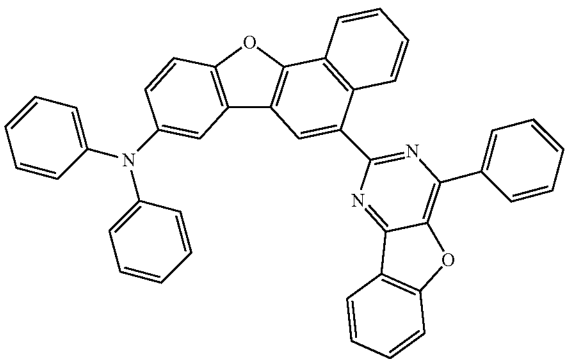
186
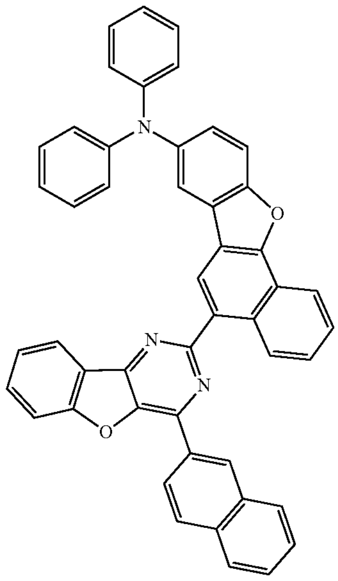
187
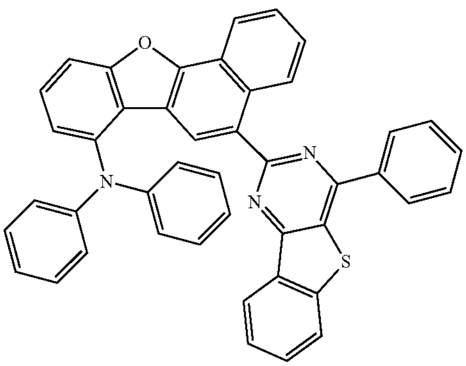

-continued
188
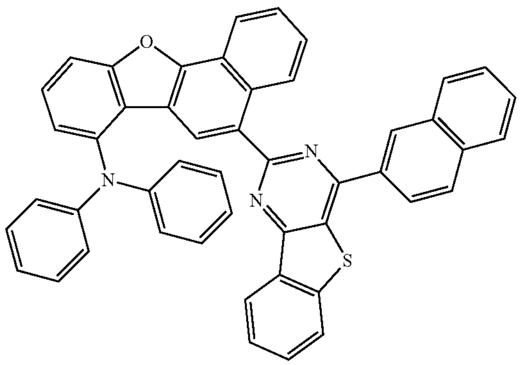
189
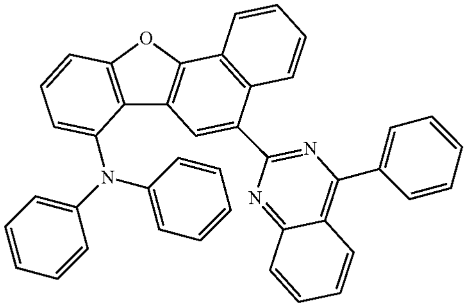
190
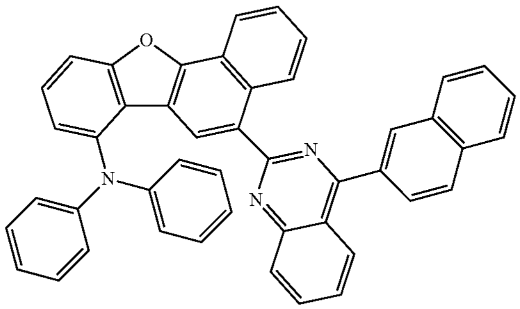
191
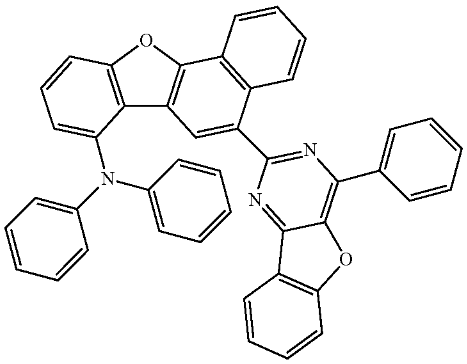
-continued
192
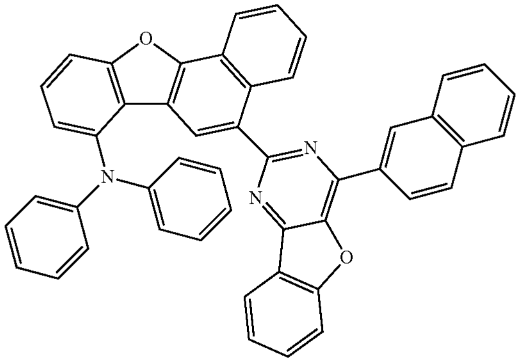
193
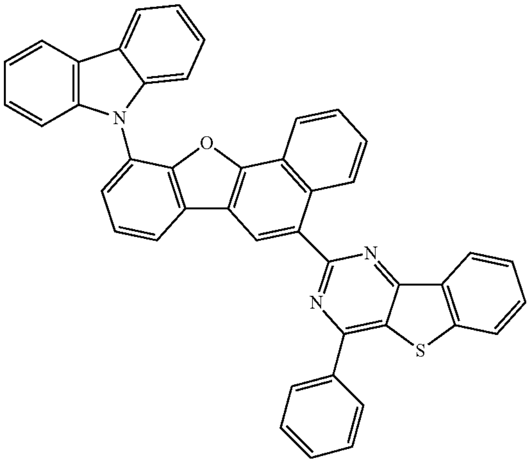
194
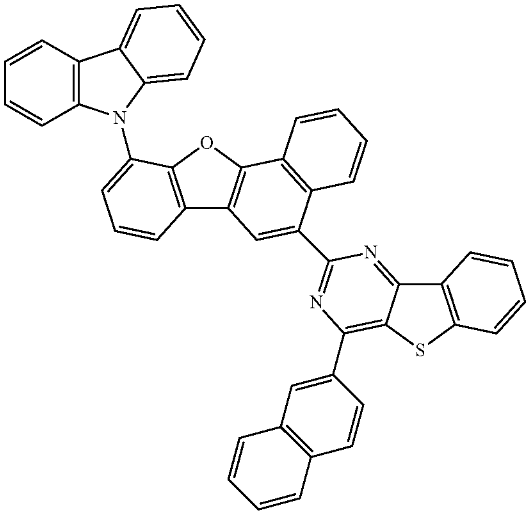

-continued
195
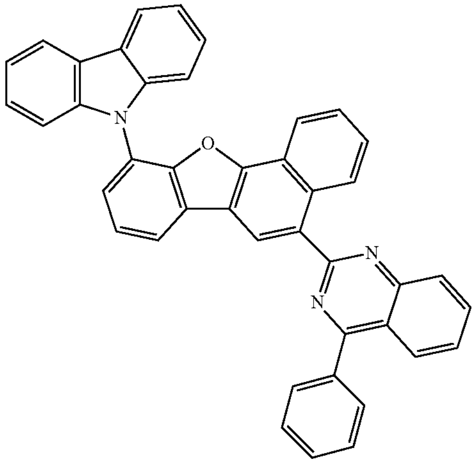
196
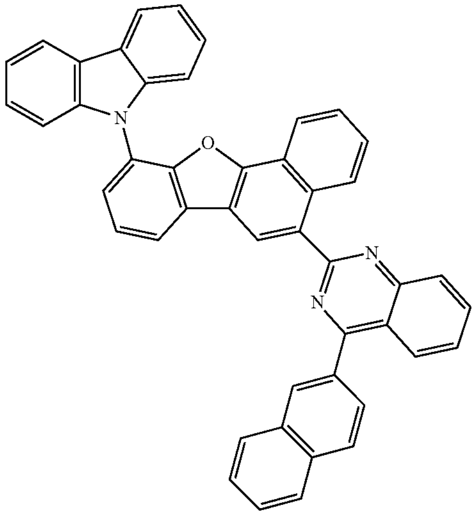
197
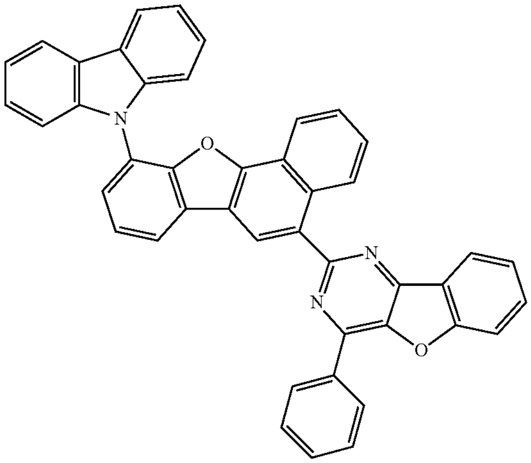
-continued
198
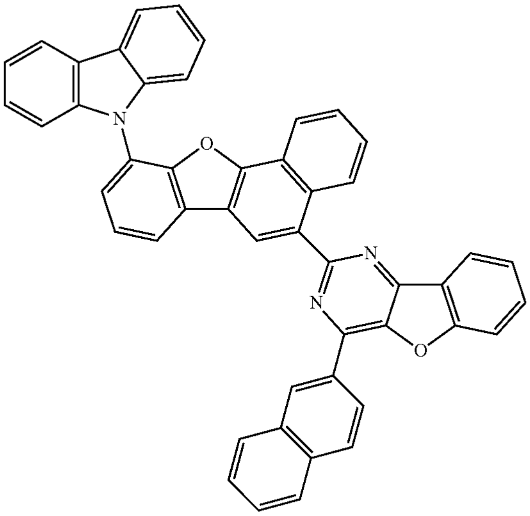
199
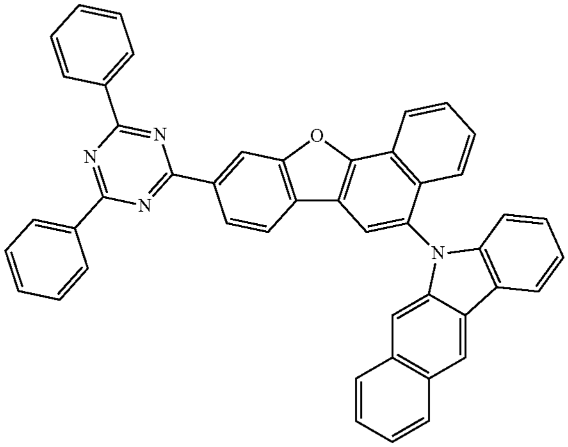
200
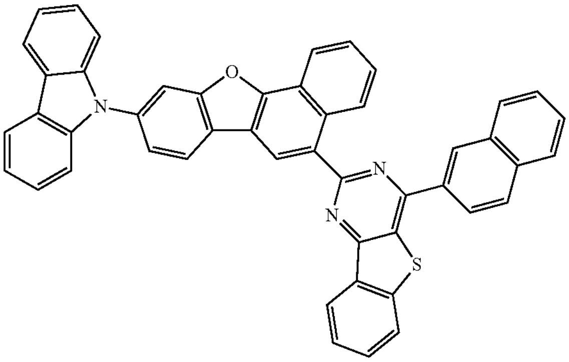

-continued
201
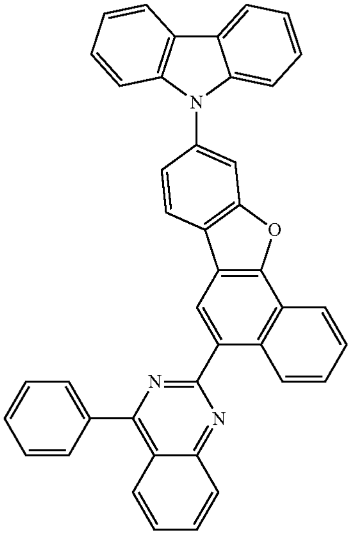
202
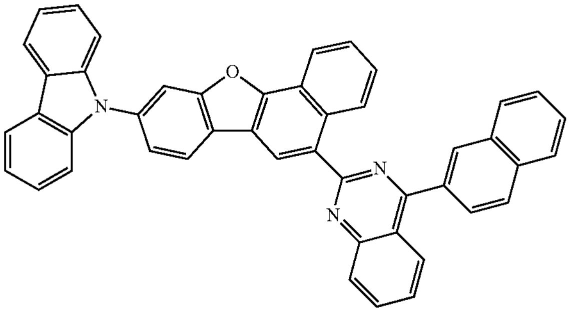
203
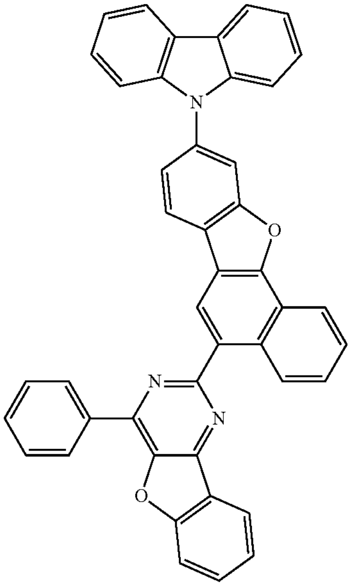
-continued
204
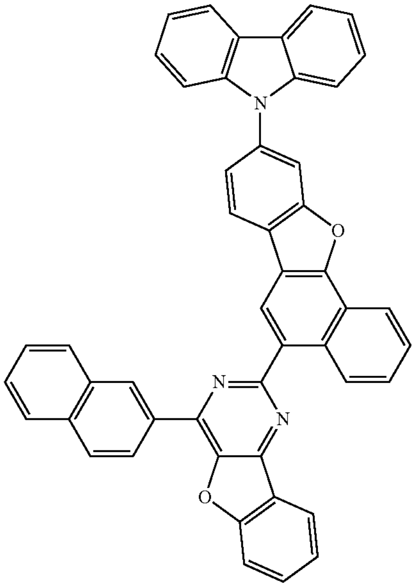
205
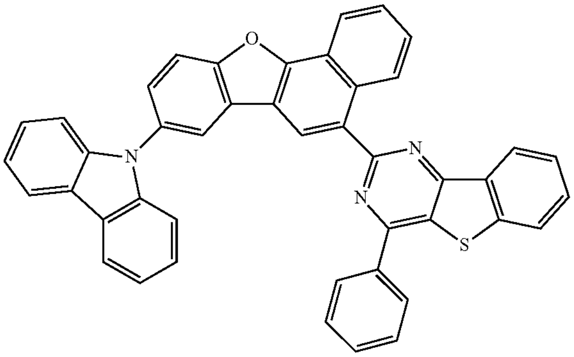
206
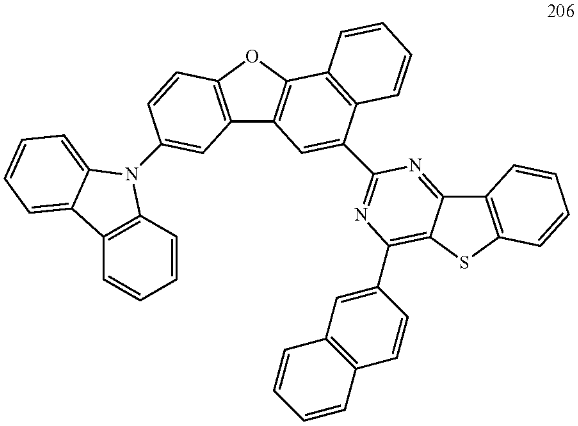

207
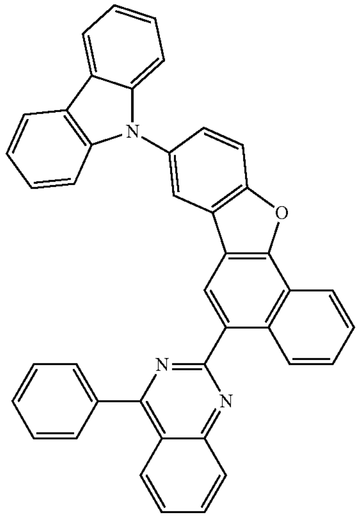
208
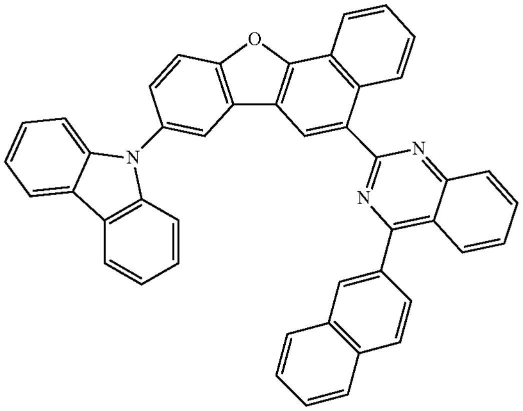
209
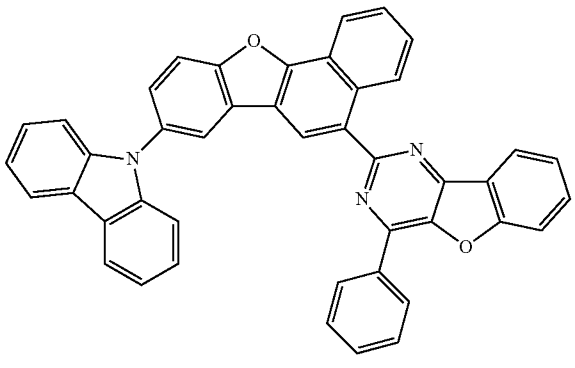
210
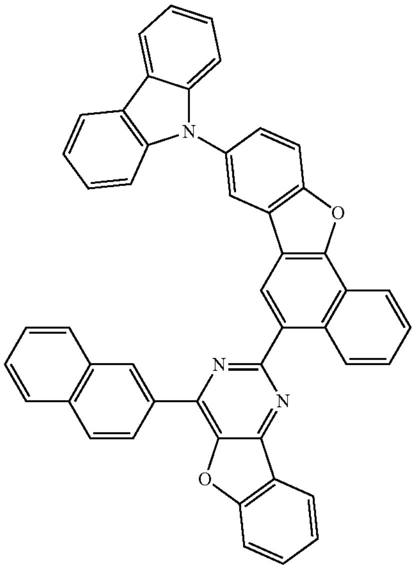
211
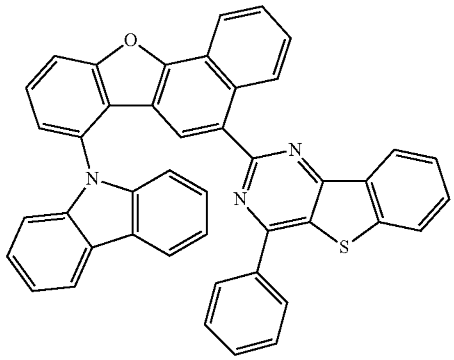
212
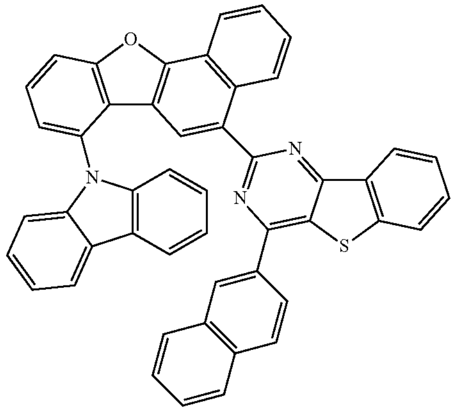

-continued
213
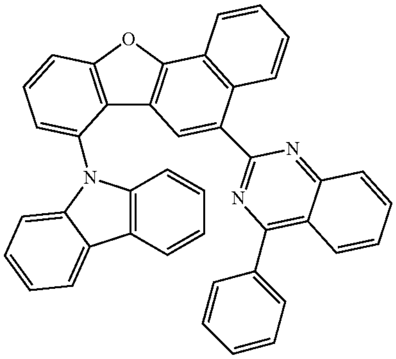
214
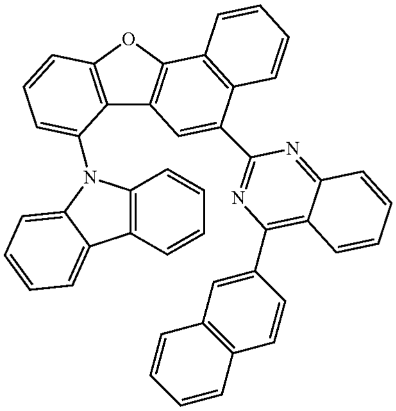
215
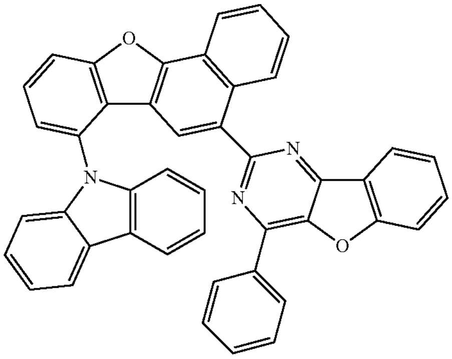
216
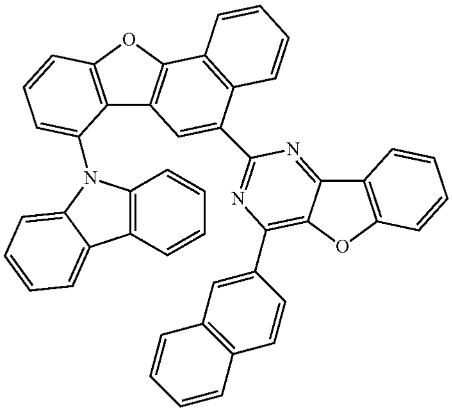
-continued
217
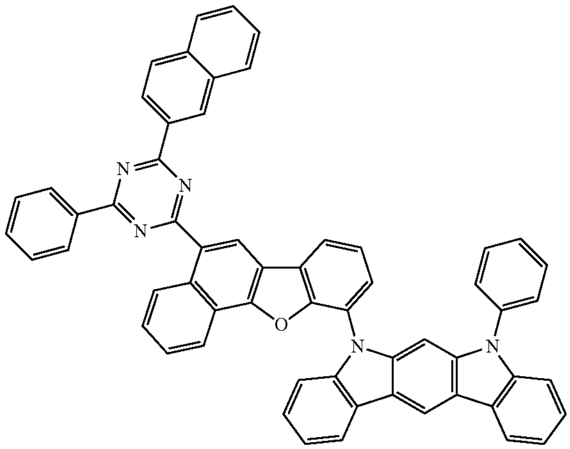
218
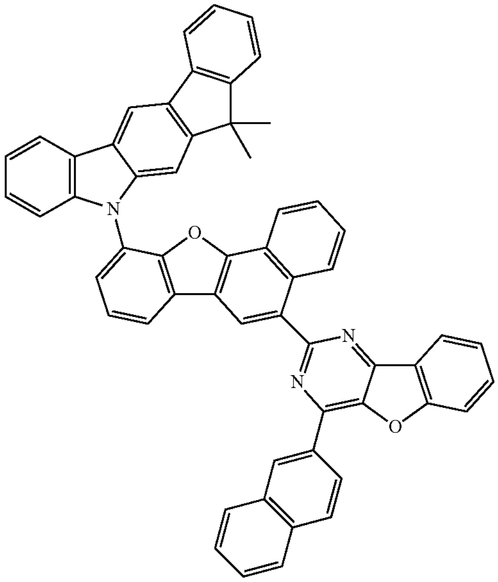
219
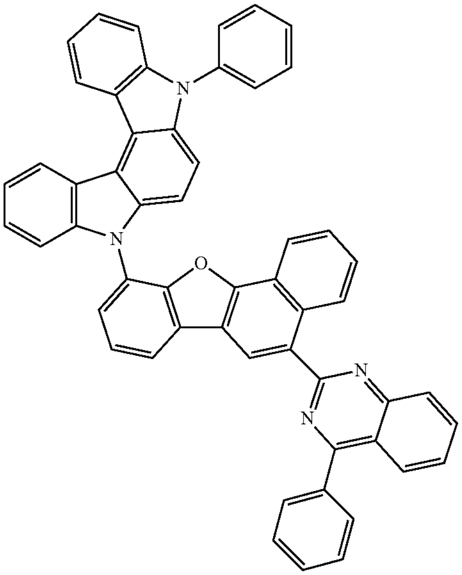

-continued
220
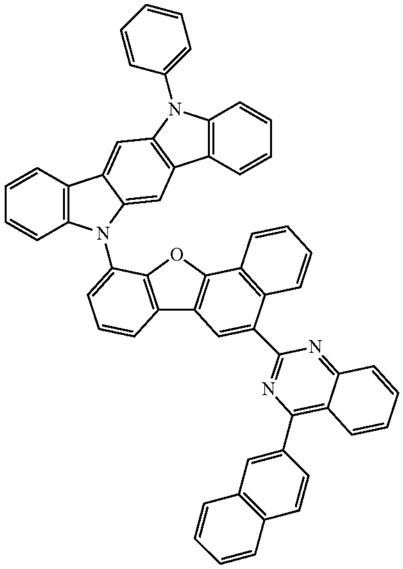
221
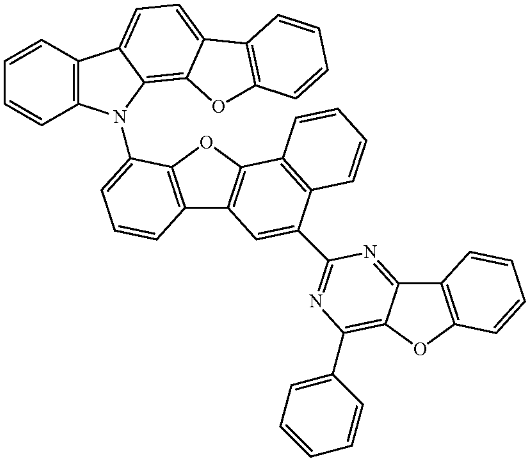
222
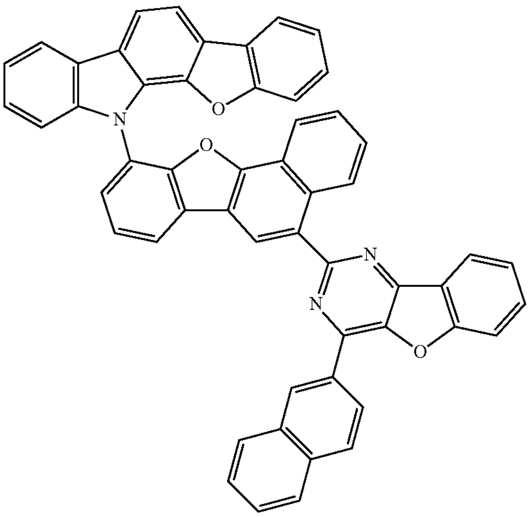
-continued
223
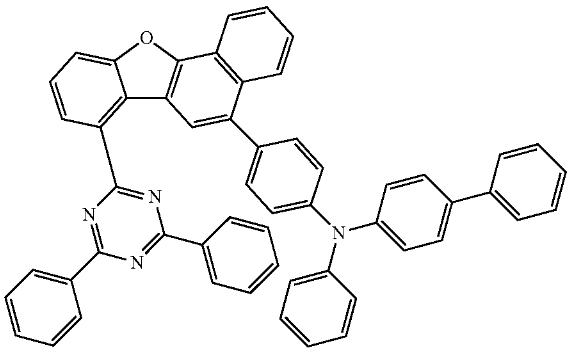
224
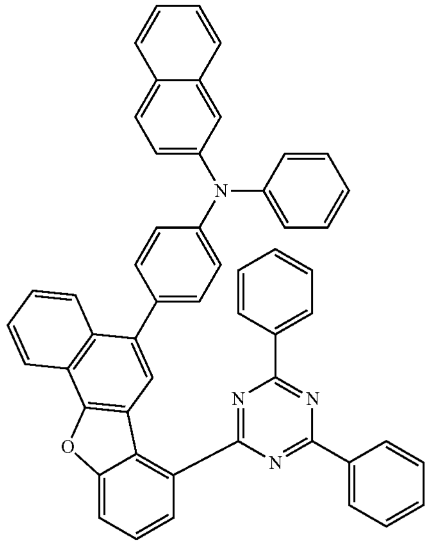
225
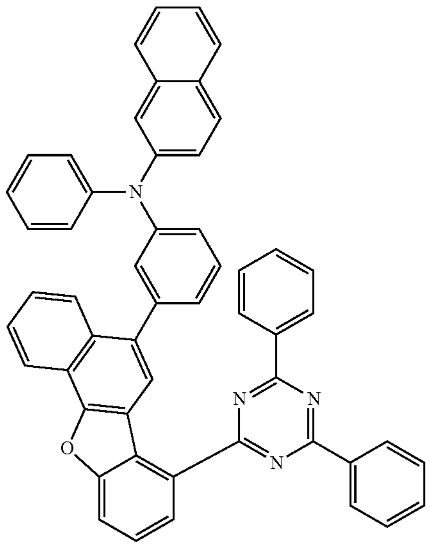

-continued
226
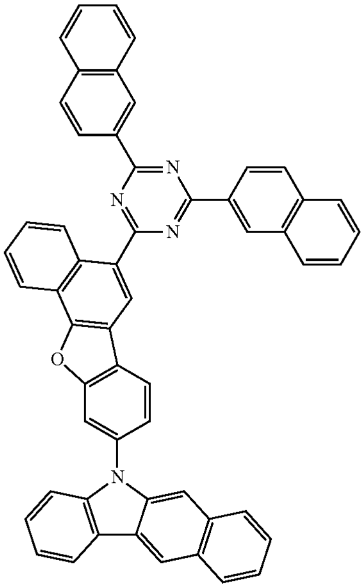
227
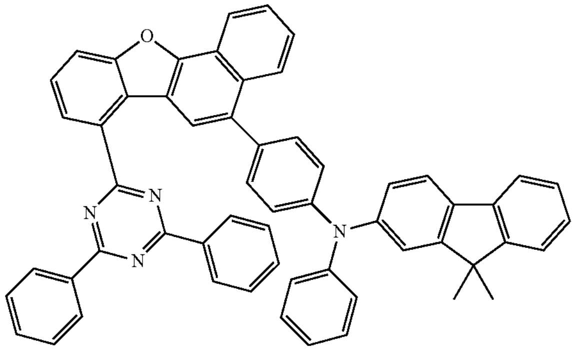
228
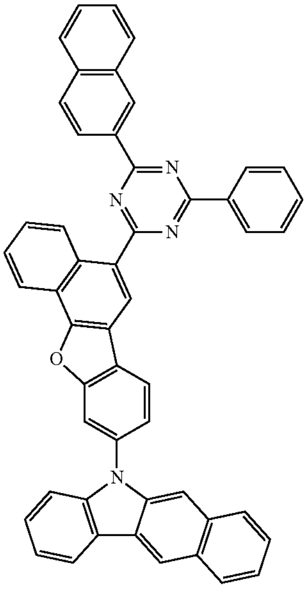
-continued
229
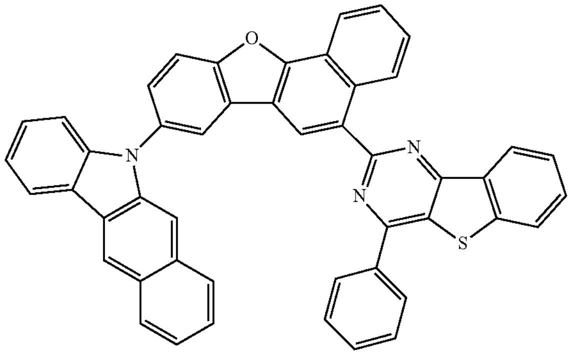
230
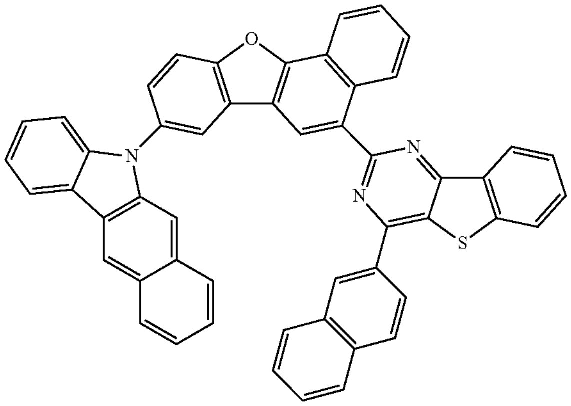
231
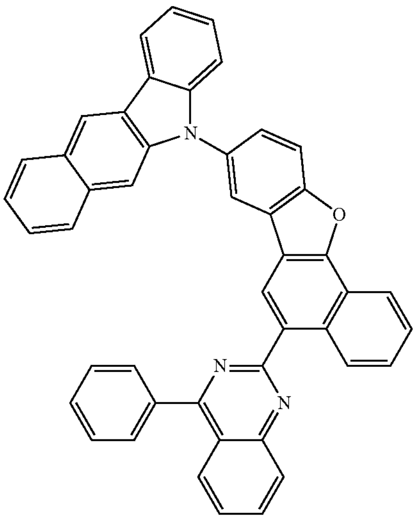

-continued
232
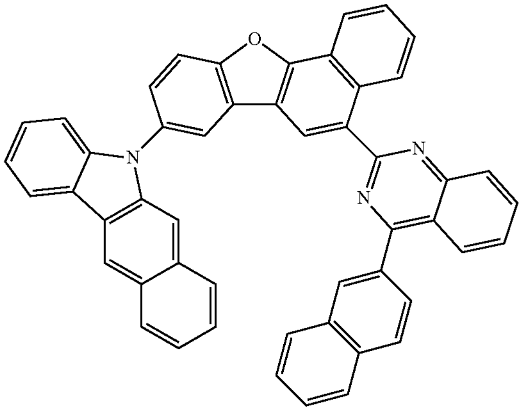
233
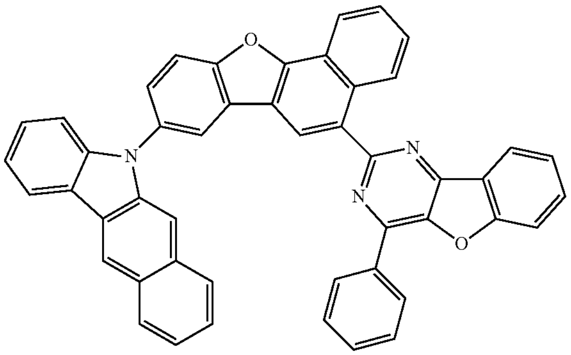
234
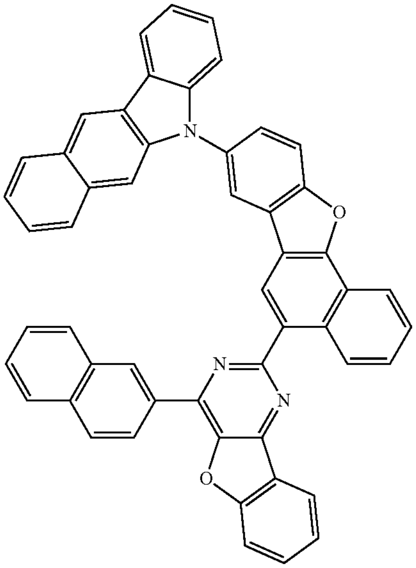
-continued
235
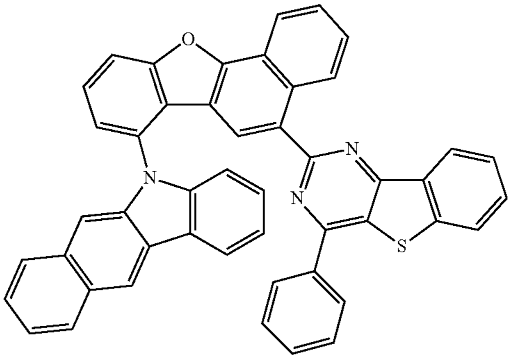
236
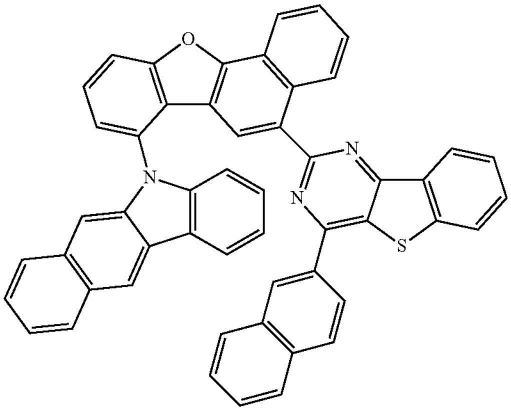
237
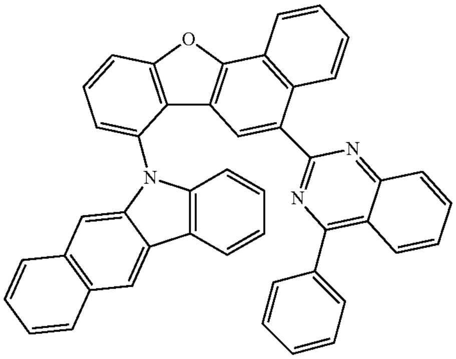
238
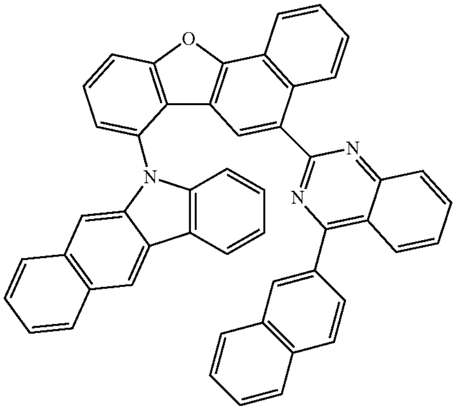

-continued
239
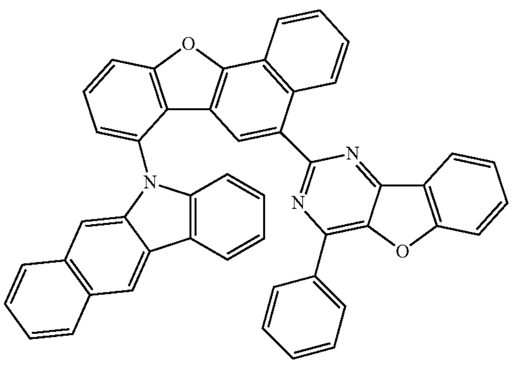
240
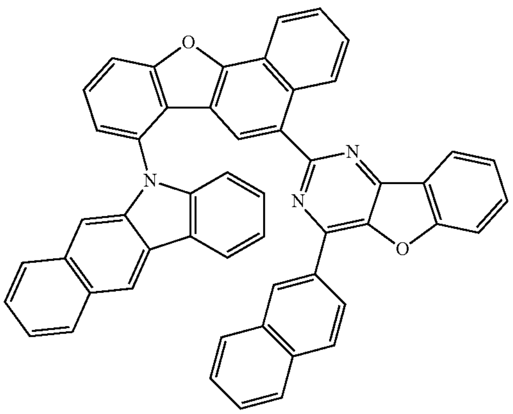
241
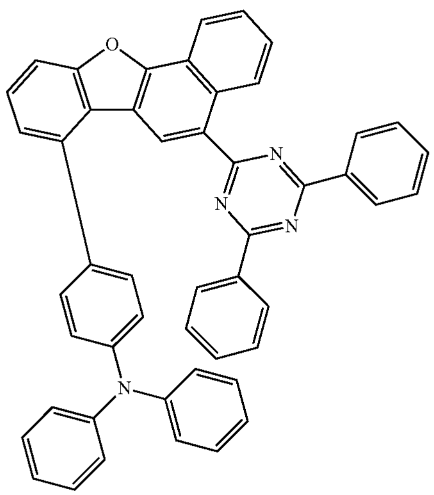
-continued
242
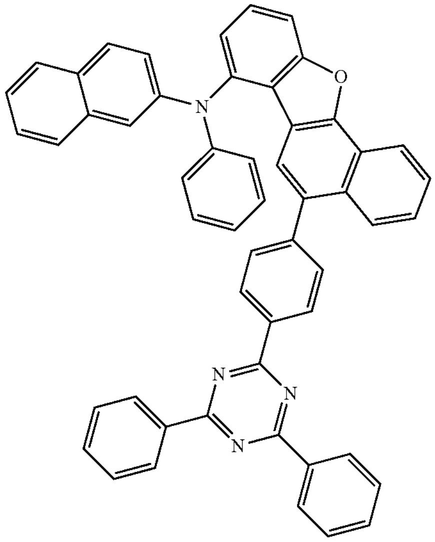
243
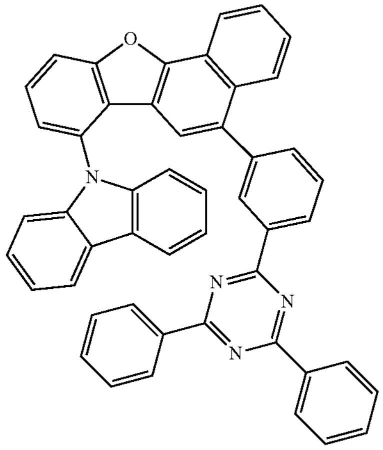
244
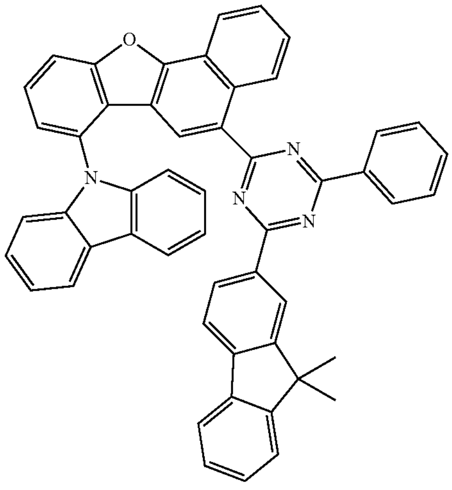

-continued
245
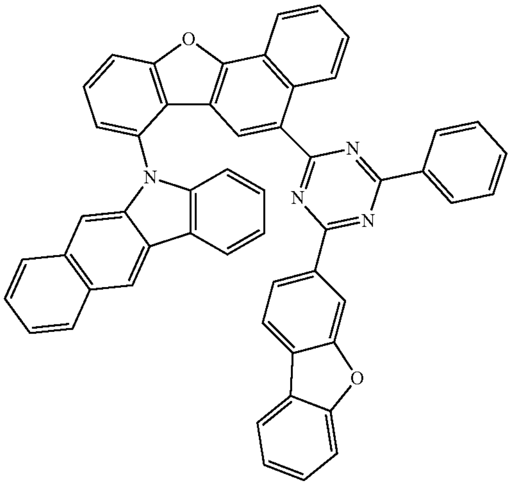
246
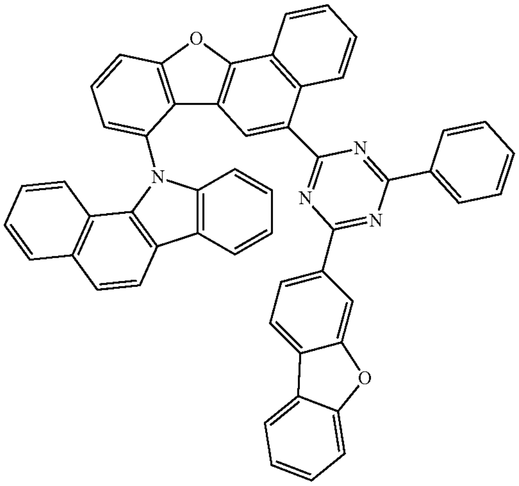
247
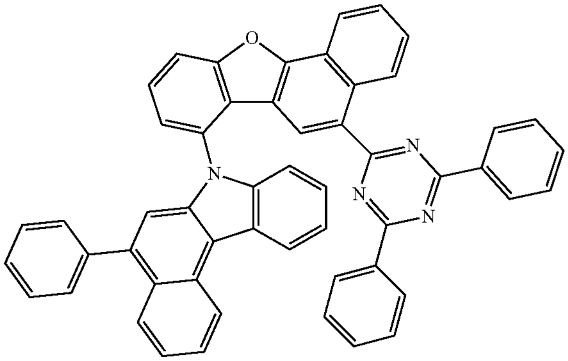
-continued
248
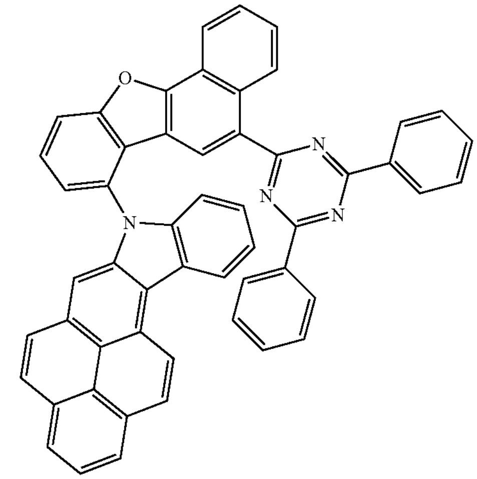
249
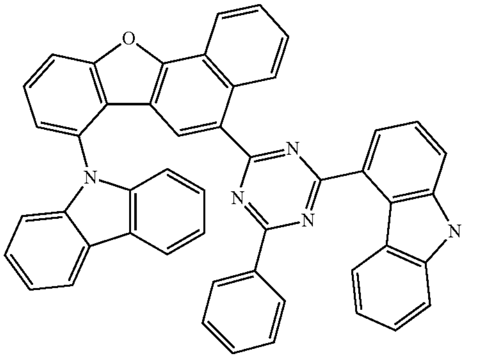
250
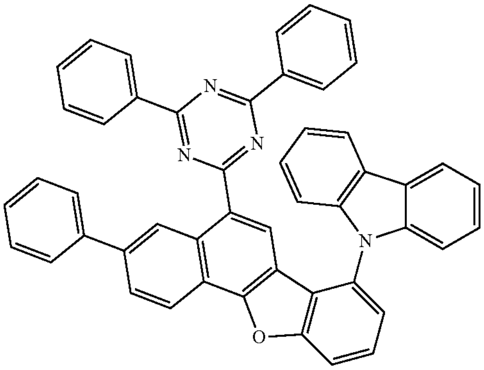

-continued
251
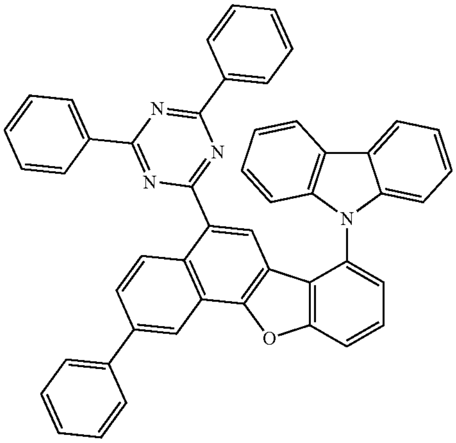
252
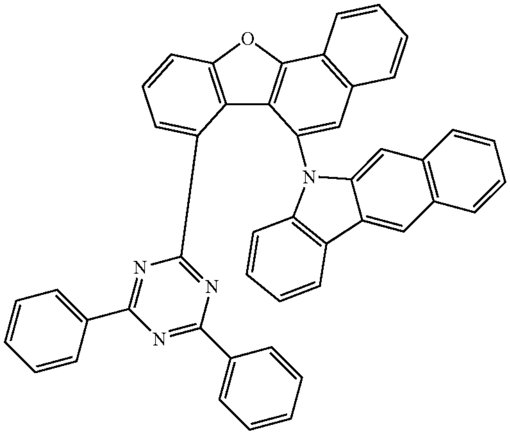
253
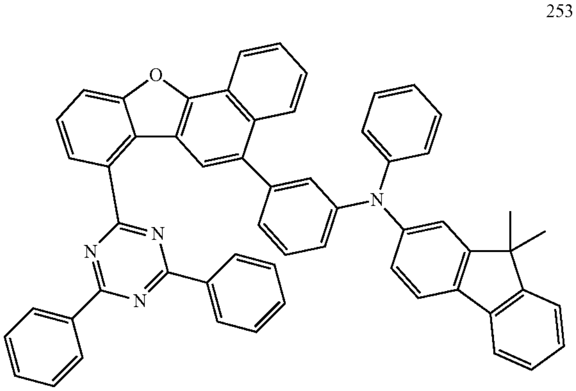
-continued
254
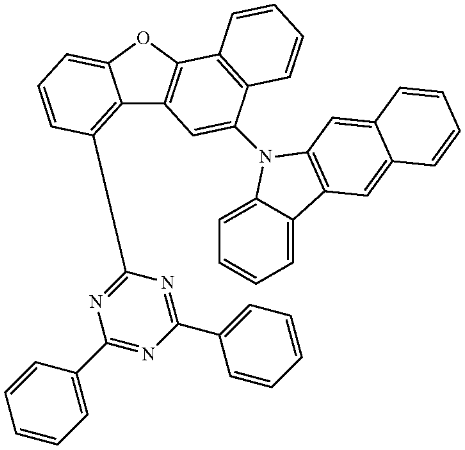
255
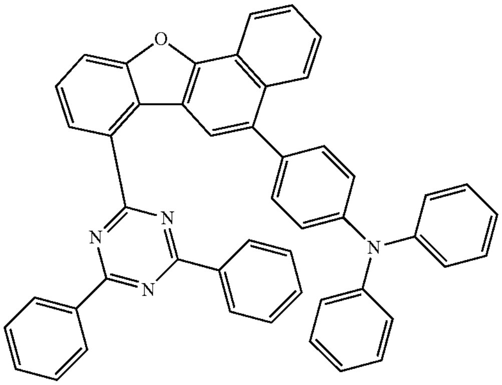
256
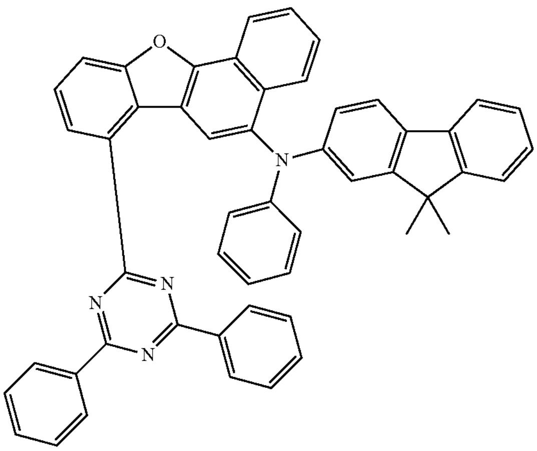

-continued
257
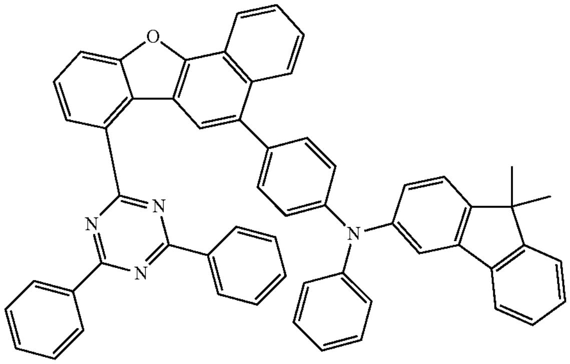
258
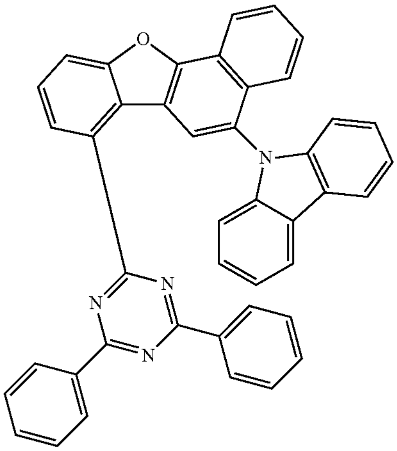
259
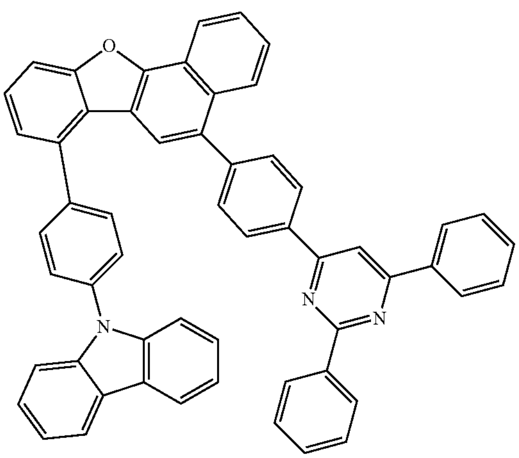
-continued
260
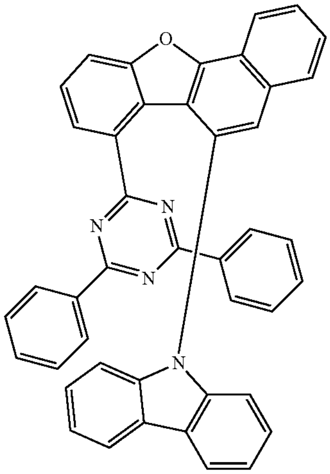
261
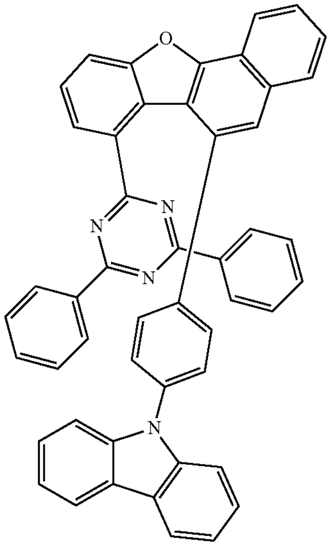
262
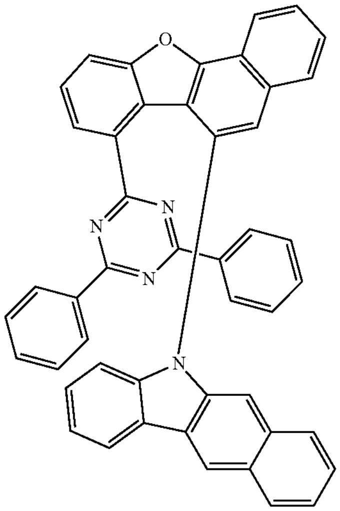

-continued
263
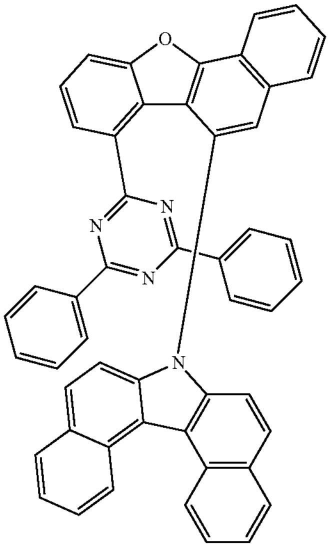
264
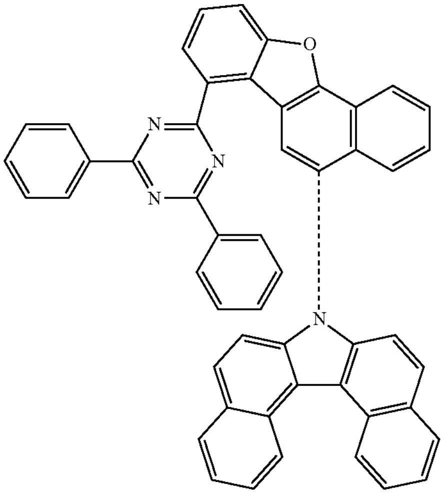
265
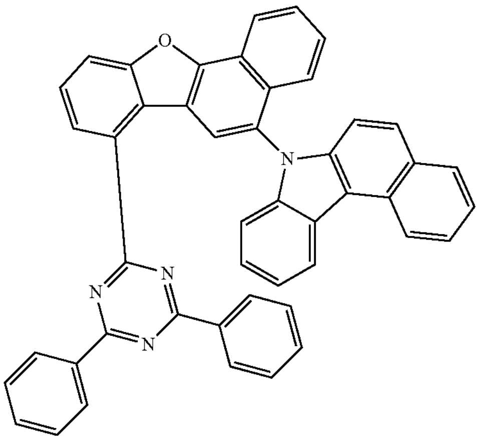
-continued
266
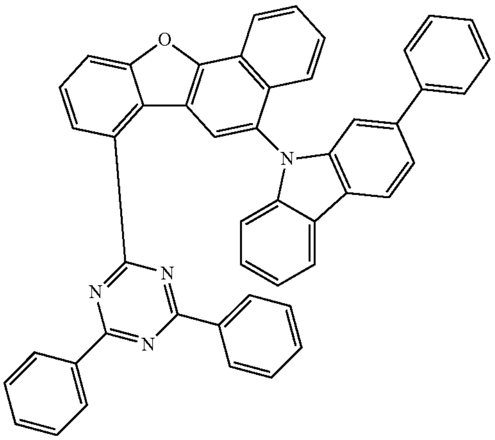
267
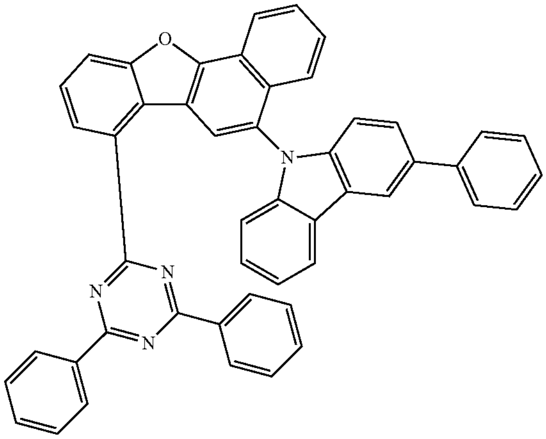
268
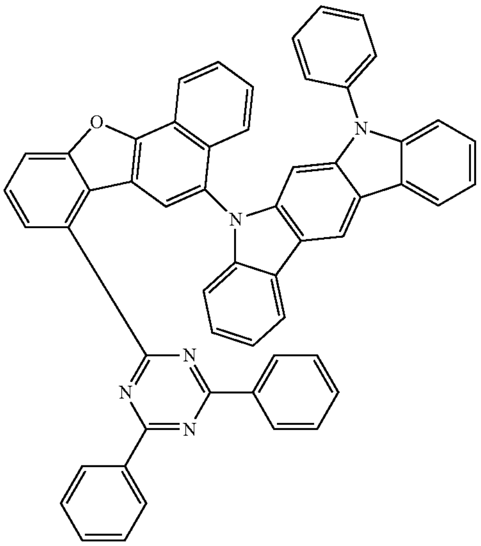

-continued
269
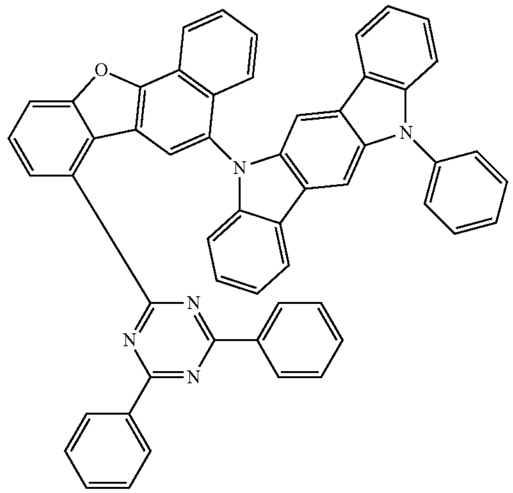
270
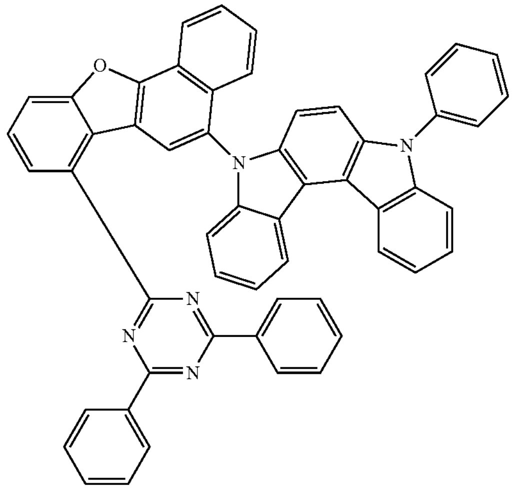
271
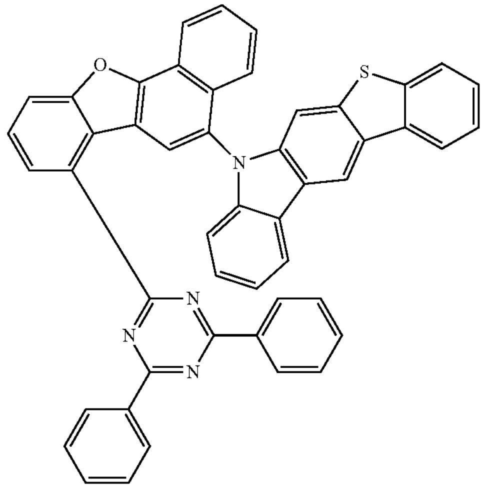
-continued
272
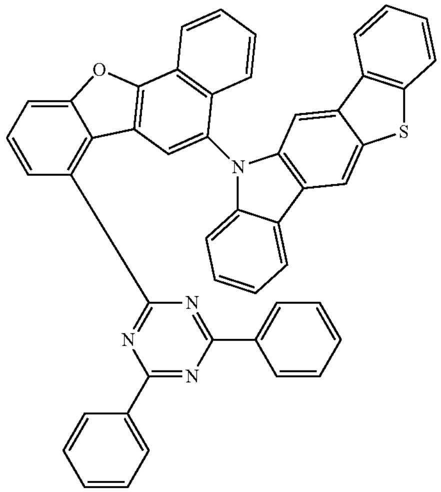
273
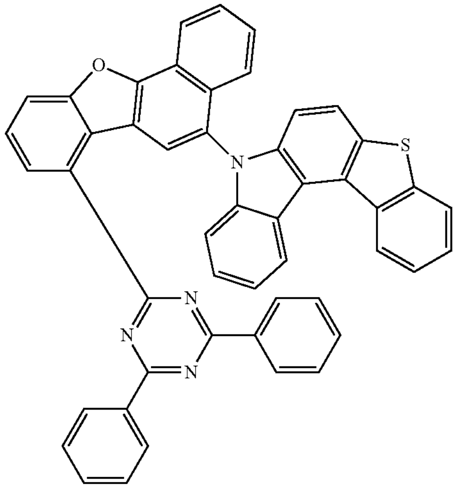
274
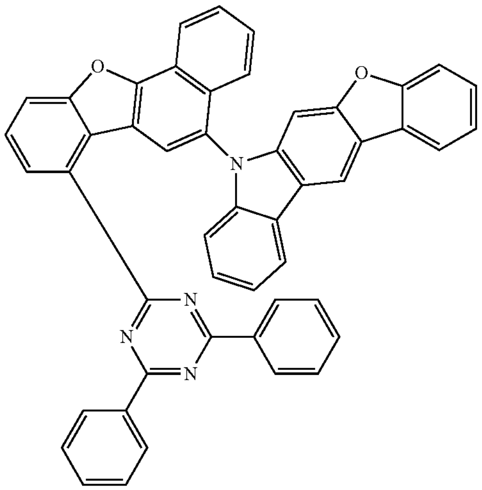

-continued
275
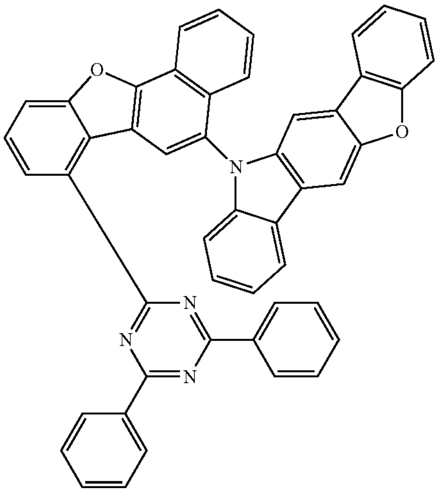
276
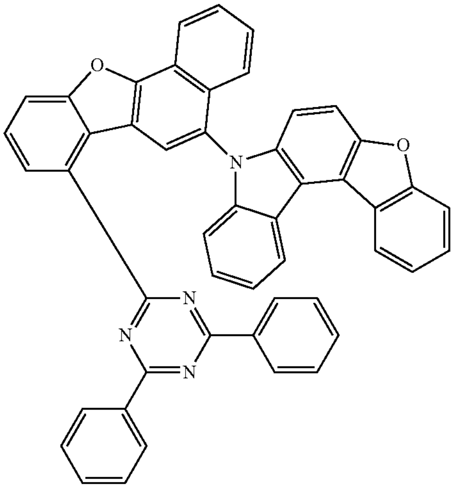
277
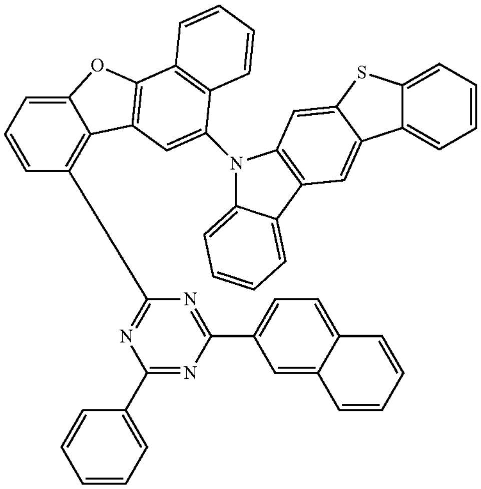
-continued
278
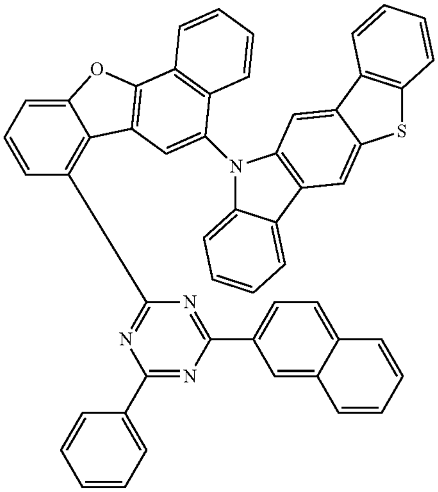
279
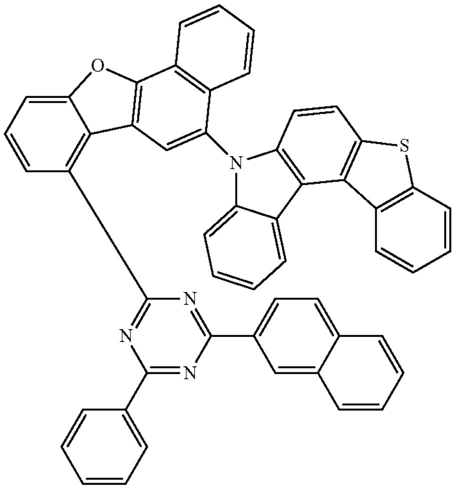
280
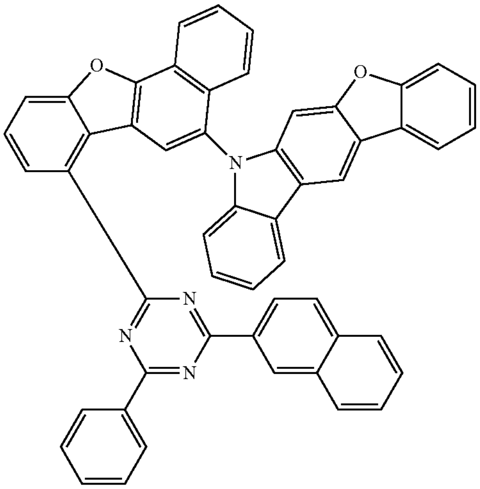

-continued
281
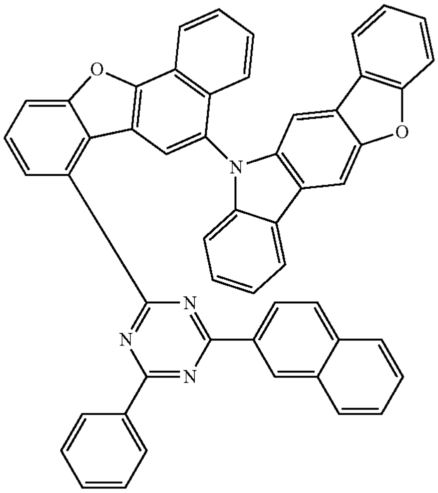
282
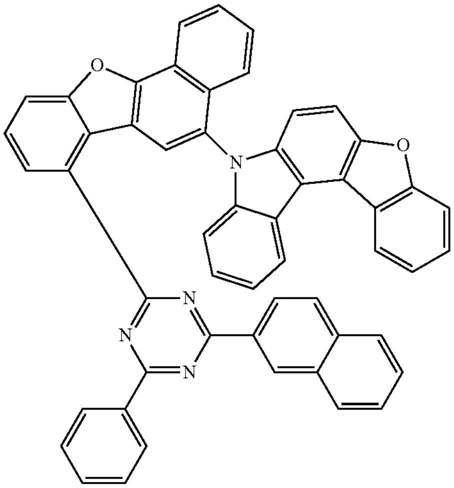
283
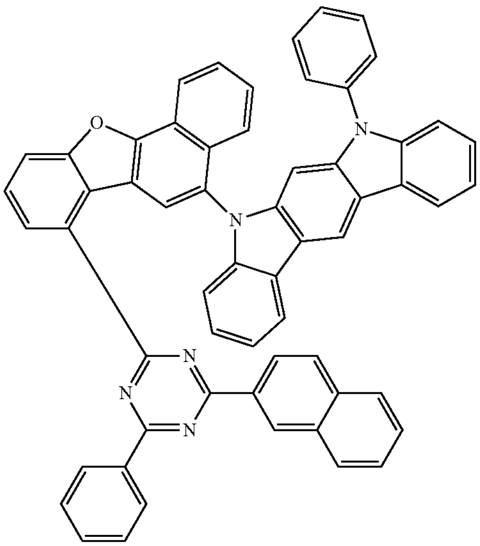
-continued
284
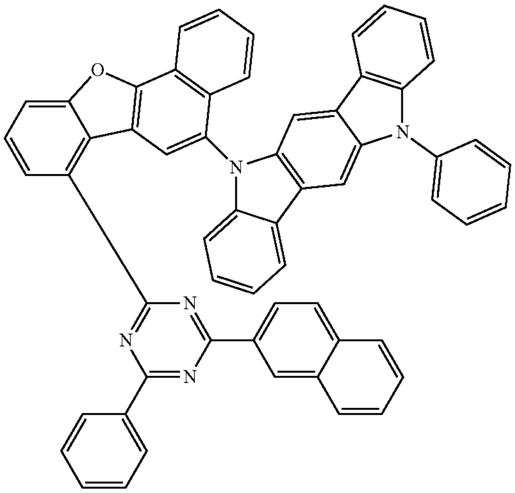
285
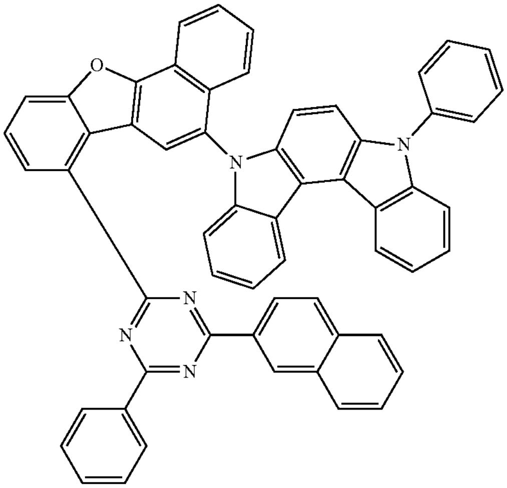
286
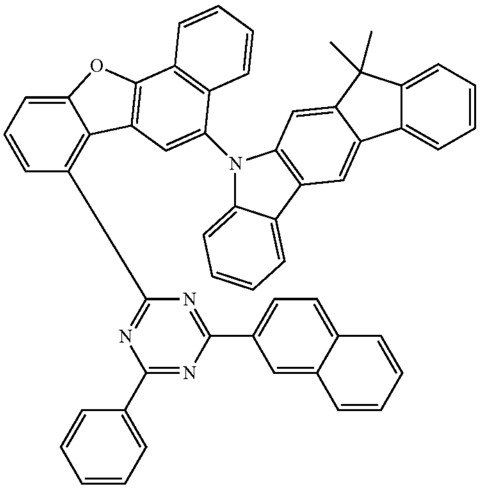

-continued
287
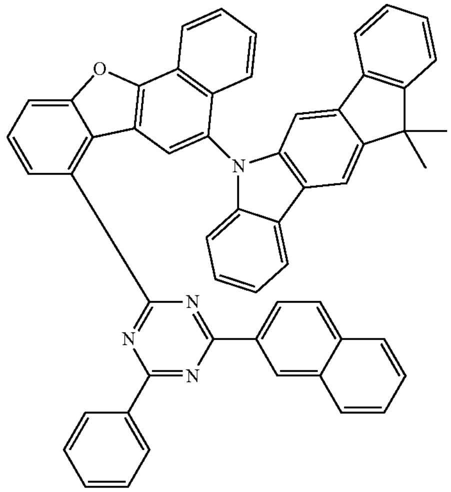
288
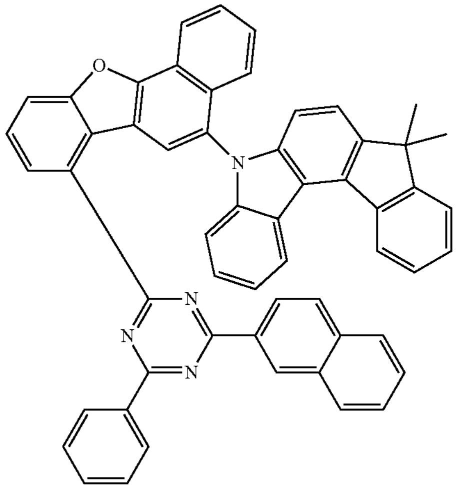
289
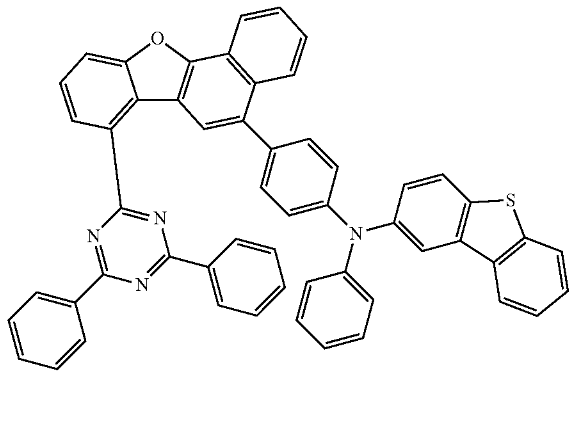
-continued
290
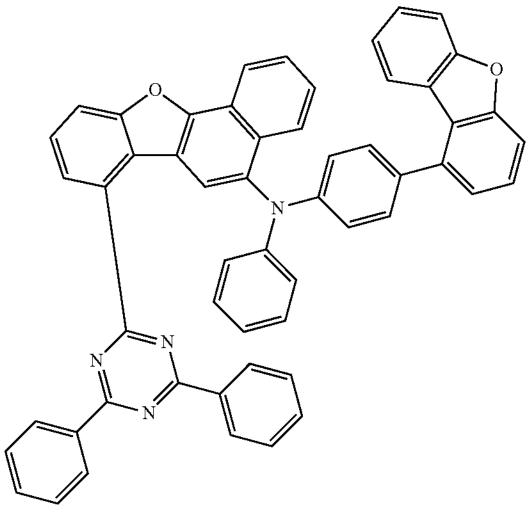
291
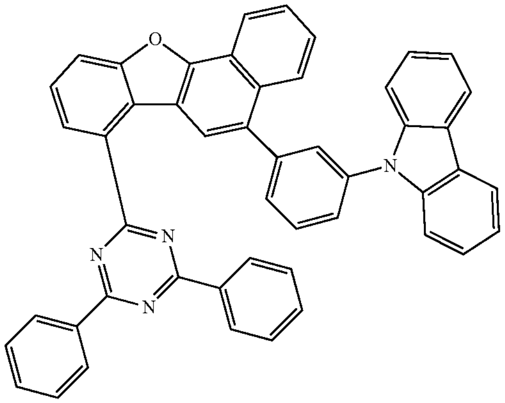
292
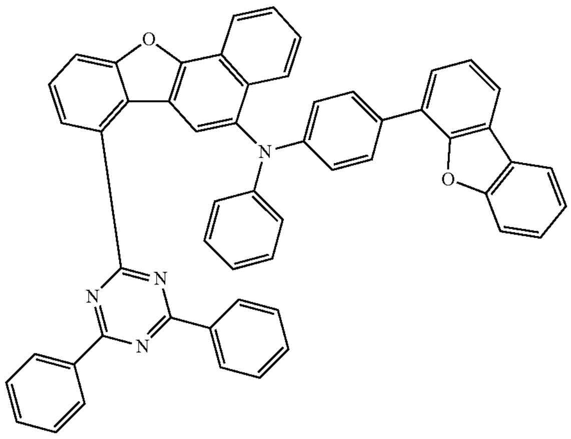

-continued
293
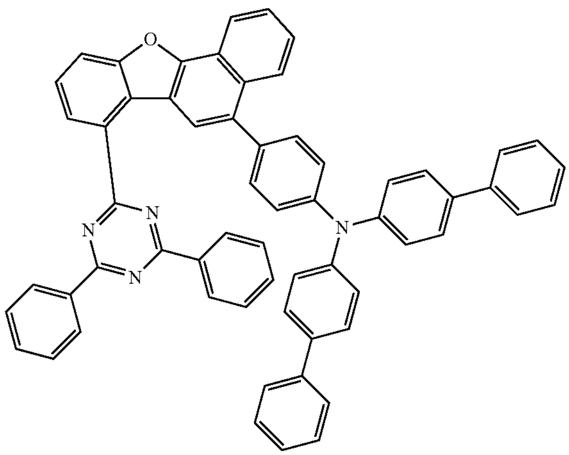
294
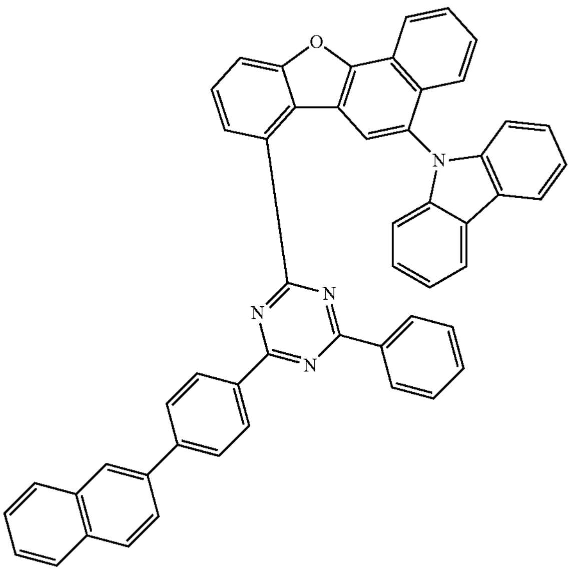
295
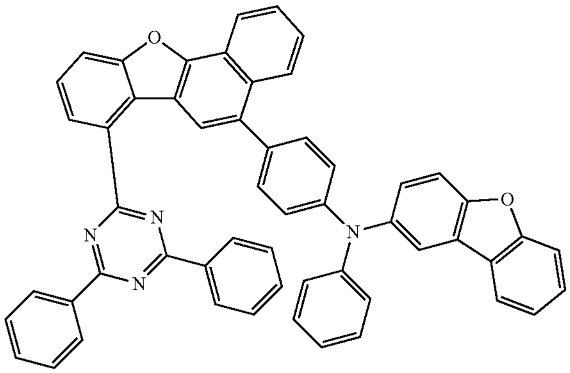
-continued
296
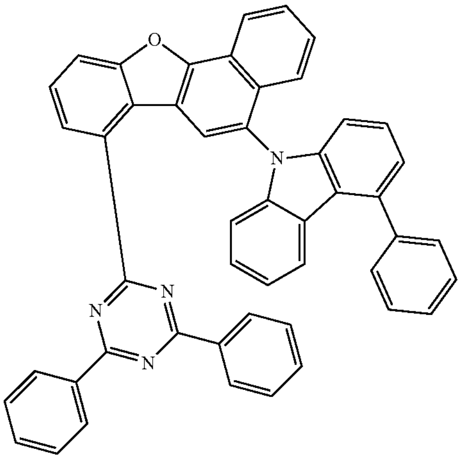
297
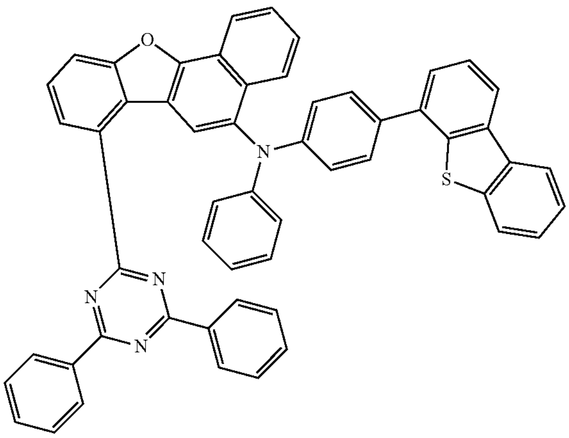
298
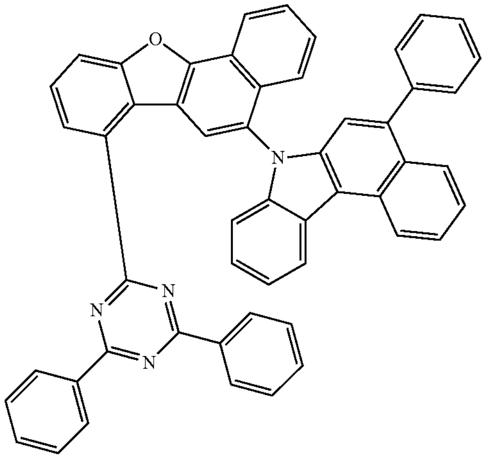

-continued

299

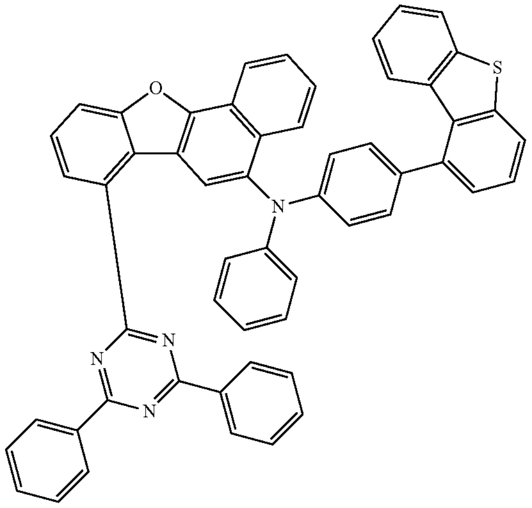

300

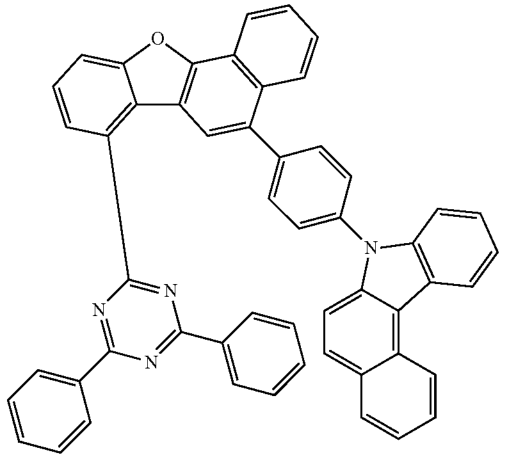

In addition, by introducing various substituents to the structure of Chemical Formula 1, compounds having unique properties of the introduced substituents may be synthesized. For example, by introducing substituents normally used as hole injection layer materials, hole transfer layer materials, light emitting layer materials, electron transfer layer materials and charge generation layer materials used for manufacturing an organic light emitting device to the core structure, materials satisfying conditions required for each organic material layer may be synthesized.

In addition, by introducing various substituents to the structure of Chemical Formula 1, the energy band gap may be finely controlled, and meanwhile, properties at interfaces between organic materials are enhanced, and material applications may become diverse.

One embodiment of the present specification provides an organic light emitting device including a first electrode; a second electrode; and an organic material layer provided between the first electrode and the second electrode, wherein the organic material layer includes one or more types of the heterocyclic compound represented by Chemical Formula 1.

In one embodiment of the present specification, the first electrode may be an anode, and the second electrode may be a cathode.

In another embodiment of the present specification, the first electrode may be a cathode, and the second electrode may be an anode.

In one embodiment of the present specification, the organic light emitting device may be a blue organic light emitting device, and the heterocyclic compound according to Chemical Formula 1 may be used as a material of the blue organic light emitting device. For example, the heterocyclic compound according to Chemical Formula 1 may be included in a host material of a light emitting layer of the blue organic light emitting device.

In another embodiment of the present specification, the organic light emitting device may be a green organic light emitting device, and the heterocyclic compound according to Chemical Formula 1 may be used as a material of the green organic light emitting device. For example, the heterocyclic compound according to Chemical Formula 1 may be included in a host material of a light emitting layer of the green organic light emitting device.

In another embodiment of the present specification, the organic light emitting device may be a red organic light emitting device, and the heterocyclic compound according to Chemical Formula 1 may be used as a material of the red organic light emitting device. For example, the heterocyclic compound according to Chemical Formula 1 may be included in a host material of a light emitting layer of the red organic light emitting device.

Specific descriptions on the heterocyclic compound represented by Chemical Formula 1 are the same as the descriptions provided above.

The organic light emitting device of the present specification may be manufactured using common organic light emitting device manufacturing methods and materials except that one or more of the organic material layers are formed using the heterocyclic compound described above.

The heterocyclic compound may be formed into an organic material layer through a solution coating method as well as a vacuum deposition method when manufacturing the organic light emitting device. Herein, the solution coating method means spin coating, dip coating, inkjet printing, screen printing, a spray method, roll coating and the like, but is not limited thereto.

The organic material layer of the organic light emitting device of the present specification may be formed in a single layer structure, but may be formed in a multilayer structure in which two or more organic material layers are laminated. For example, the organic light emitting device of the present disclosure may have a structure including a hole injection layer, a hole transfer layer, a light emitting layer, an electron transfer layer, an electron injection layer and the like as the organic material layer. However, the structure of the organic light emitting device is not limited thereto, and may include a smaller number of organic material layers.

In the organic light emitting device of the present specification, the organic material layer includes a light emitting layer, and the light emitting layer may include one or more types of the heterocyclic compound of Chemical Formula 1.

In the organic light emitting device of the present specification, the organic material layer includes a light emitting layer, the light emitting layer includes a host, and the host may include one or more types of the heterocyclic compound of Chemical Formula 1.

In one embodiment of the present specification, the organic material layer includes a light emitting layer, the light emitting layer includes a host, and the host may include one type of the heterocyclic compound of Chemical Formula 1.

In another embodiment of the present specification, the organic material layer includes a light emitting layer, the light emitting layer includes a host, and the host may include two types of the heterocyclic compound of Chemical Formula 1.

In another embodiment of the present specification, the host includes two types of the heterocyclic compound of Chemical Formula 1, and the two types of the heterocyclic compound are included in a content ratio of 1:5 to 5:1, preferably 1:3 to 3:1, and more preferably 1:1.

In one embodiment of the present specification, the organic material layer includes a light emitting layer, the light emitting layer includes a host, and the host may include a compound of the following Chemical Formula 5 together with the heterocyclic compound of Chemical Formula 1.

[Chemical Formula 5]

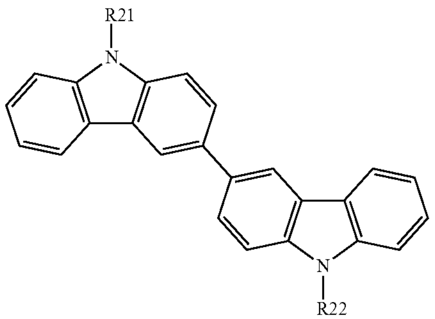

In Chemical Formula 5,

R21 and R22 are each a substituted or unsubstituted aryl group.

In one embodiment of the present specification, R21 and R22 are each a substituted or unsubstituted phenyl group; a substituted or unsubstituted biphenyl group; or a substituted or unsubstituted naphthyl group.

In one embodiment of the present specification, R21 and R22 are each a phenyl group unsubstituted or substituted with an aryl group; a biphenyl group; or a naphthyl group.

In one embodiment of the present specification, the host includes the heterocyclic compound of Chemical Formula 1 and the compound of Chemical Formula 5, and the heterocyclic compound of Chemical Formula 1 and the compound of Chemical Formula 5 have a content ratio (weight ratio) of 1:1 or 1:3 to 3:1, preferably 2:1 to 3:1, and more preferably 3:1.

In another organic light emitting device, the host may be a red host.

In one embodiment of the present specification, the organic material layer includes one or more types of the heterocyclic compound represented by Chemical Formula 1, and a phosphorescent dopant may be used together therewith.

In one embodiment of the present specification, the organic material layer includes one or more types of the heterocyclic compound represented by Chemical Formula 1, and an iridium-based dopant may be used together therewith.

As a material of the phosphorescent dopant, those known in the art may be used.

For example, phosphorescent dopant materials represented by LL'MX', LL'L"M, LMX'X", L2MX' and L3M may be used, however, the scope of the present disclosure is not limited to the examples.

Herein, L, L', L", X' and X" are a bidentate ligand different from each other, and M is a metal forming an octahedral complex.

M may be iridium, platinum, osmium or the like.

L is an anionic bidentate ligand coordinated to M by Sp2 carbon and heteroatom as the iridium-based dopant, and X may function to trap electrons or holes. Nonlimiting examples of L include (1-phenylisoquinoline), 2-(1-naphthyl)benzoxazole, (2-phenylbenzoxazole), (2-phenylbenzothiazole), (7,8-benzoquinoline), (thiophene grouppyrizine), phenylpyridine, benzothiophenepyrizine, 3-methoxy-2-phenylpyridine, thiophenepyrizine, tolylpyridine and the like. Nonlimiting examples of X' and X" include acetylacetonate (acac), hexafluoroacetylacetonate, salicylidene, picolinate, 8-hydroxyquinolinate and the like.

In one embodiment of the present specification, as the iridium-based dopant, $(piq)_2(Ir)(acac)$ may be used as a red phosphorescent dopant.

In one embodiment of the present specification, a content of the dopant may be from 1% to 15%, and preferably from 1% to 10% based on the whole light emitting layer.

The organic light emitting device of the present disclosure may further include one, two or more layers selected from the group consisting of a light emitting layer, a hole injection layer, a hole transfer layer, an electron injection layer, an electron transfer layer, an electron blocking layer and a hole blocking layer.

FIG. 1 to FIG. 3 illustrate a lamination order of electrodes and organic material layers of an organic light emitting device according to one embodiment of the present specification. However, the scope of the present application is not limited to these diagrams, and structures of organic light emitting devices known in the art may also be used in the present application.

FIG. 1 illustrates an organic light emitting device in which an anode (200), an organic material layer (300) and a cathode (400) are consecutively laminated on a substrate (100). However, the structure is not limited to such a structure, and as illustrated in FIG. 2, an organic light emitting device in which a cathode, an organic material layer and an anode are consecutively laminated on a substrate may also be obtained.

FIG. 3 illustrates cases of the organic material layer being a multilayer. The organic light emitting device according to FIG. 3 includes a hole injection layer (301), a hole transfer layer (302), a light emitting layer (303), a hole blocking layer (304), an electron transfer layer (305) and an electron injection layer (306). However, the scope of the present application is not limited to such a lamination structure, and as necessary, layers other than the light emitting layer may not be included, and other necessary functional layers may be further added.

The organic material layer including the heterocyclic compound represented by Chemical Formula 1 may further include other materials as necessary.

In the organic light emitting device according to one embodiment of the present specification, materials other than the heterocyclic compound represented by Chemical Formula 1 are illustrated below, however, these are for illustrative purposes only and not for limiting the scope of the present application, and may be replaced by materials known in the art.

As the anode material, materials having relatively large work function may be used, and transparent conductive oxides, metals, conductive polymers or the like may be used. Specific examples of the anode material include metals such as vanadium, chromium, copper, zinc and gold, or alloys thereof; metal oxides such as zinc oxide, indium oxide, indium tin oxide (ITO) and indium zinc oxide (IZO); combinations of metals and oxides such as ZnO:Al or $SnO_2$:Sb; conductive polymers such as poly(3-methylthiophene), poly[3,4-(ethylene-1,2-dioxy)thiophene](PEDOT), polypyrrole and polyaniline, and the like, but are not limited thereto.

As the cathode material, materials having relatively small work function may be used, and metals, metal oxides, conductive polymers or the like may be used. Specific examples of the cathode material include metals such as magnesium, calcium, sodium, potassium, titanium, indium, yttrium, lithium, gadolinium, aluminum, silver, tin and lead, or alloys thereof; multilayer structure materials such as LiF/Al or $LiO_2$/Al, and the like, but are not limited thereto.

As the hole injection material, known hole injection materials may be used, and for example, phthalocyanine compounds such as copper phthalocyanine disclosed in U.S. Pat. No. 4,356,429, or starburst-type amine derivatives such as tris(4-carbazoyl-9-ylphenyl)amine (TCTA), 4,4',4"-tri[phenyl(m-tolyl)amino]triphenylamine (m-MTDATA) or 1,3,5-tris[4-(3-methylphenylphenylamino)phenyl]benzene (m-MTDAPB) described in the literature [Advanced Material, 6, p. 677 (1994)], polyaniline/dodecylbenzene sulfonic acid, poly(3,4-ethylenedioxythiophene)/poly(4-styrenesulfonate), polyaniline/camphor sulfonic acid or polyaniline/poly(4-styrenesulfonate) that are conductive polymers having solubility, and the like, may be used.

As the hole transfer material, pyrazoline derivatives, arylamine-based derivatives, stilbene derivatives, triphenyldiamine derivatives and the like may be used, and low molecular or high molecular materials may also be used.

As the electron transfer material, metal complexes of oxadiazole derivatives, anthraquinodimethane and derivatives thereof, benzoquinone and derivatives thereof, naphthoquinone and derivatives thereof, anthraquinone and derivatives thereof, tetracyanoanthraquinodimethane and derivatives thereof, fluorenone derivatives, diphenyldicyanoethylene and derivatives thereof, diphenoquinone derivatives, 8-hydroxyquinoline and derivatives thereof, and the like, may be used, and high molecular materials may also be used as well as low molecular materials.

As examples of the electron injection material, LiF is typically used in the art, however, the present application is not limited thereto.

As the light emitting material, red, green or blue light emitting materials may be used, and as necessary, two or more light emitting materials may be mixed and used. Herein, two or more light emitting materials may be used by being deposited as individual sources of supply or by being premixed and deposited as one source of supply. In addition, fluorescent materials may also be used as the light emitting material, however, phosphorescent materials may also be used. As the light emitting material, materials emitting light by bonding electrons and holes injected from an anode and a cathode, respectively, may be used alone, however, materials having a host material and a dopant material involving in light emission together may also be used.

When mixing light emitting material hosts, same series hosts may be mixed, or different series hosts may be mixed. For example, any two or more types of materials among n-type host materials or p-type host materials may be selected and used as a host material of a light emitting layer.

In one embodiment of the present specification, the heterocyclic compound of Chemical Formula 1 may be used as the-n-type host material.

In one embodiment of the present specification, the compound of Chemical Formula 5 may be used as the p-type host material.

The organic light emitting device according to one embodiment of the present specification may be a top-emission type, a bottom-emission type or a dual-emission type depending on the materials used.

The heterocyclic compound according to one embodiment of the present specification may also be used in an organic electronic device including an organic solar cell, an organic photo conductor, an organic transistor and the like under a similar principle used in the organic light emitting device.

Hereinafter, the present specification will be described in more detail with reference to examples, however, these are for illustrative purposes only, and the scope of the present application is not limited thereto.

As reagents and structures A, B and C used in syntheses, commercially-available reagents were used.

[Preparation Example 1] Preparation of Intermediate F (1)

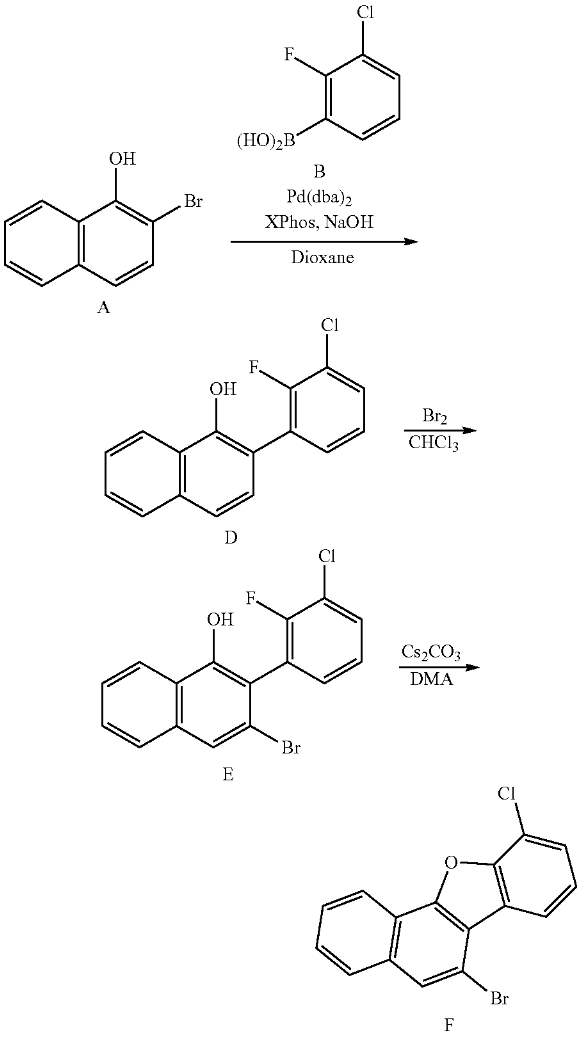

A B D E F

1) Preparation of Intermediate D

After dissolving Intermediate A (10 g, 44.84 mmol), Intermediate B (7.8 g, 44.84 mmol), $Pd(dba)_2$ (bis(dibenzylideneacetone)palladium(0)) (1.3 g, 2.24 mmol), Xphos (2-dicyclohexylphosphino-2',4',6'-triisopropylbiphenyl) (4.2 g, 8.96 mmol) and NaOH (3.6 g, 89.68 mmol) in dioxane (100 mL), the result was stirred for 8 hours at 100° C. The mixture solution completed with the reaction was dissolved in methylene chloride (MC) and extracted with water. The organic layer was dried with anhydrous $MgSO_4$, and then silica gel filtered. The solvent was removed from the filtered filtrate using a rotary evaporator to obtain Intermediate D (5.9 g), yellow oil, in a 48% yield.

2) Preparation of Intermediate E

After dissolving Intermediate D (5.9 g, 21.52 mmol) in $CHCl_3$ (50 mL), $Br_2$ (1.1 mL, 21.52 mmol) was added dropwise thereto at 0° C., and the result was stirred for 2 hours at room temperature. Methanol was introduced to the mixture solution completed with the reaction, and after stirring for 30 minutes, the result was filtered to obtain Intermediate E, white solid, in a 93% yield.

3) Preparation of Intermediate F

After dissolving Intermediate E (7 g, 20.01 mmol) in dimethylacetamide (DMA) (50 mL), $Cs_2CO_3$ (13.03 g, 40.02 mmol) was introduced thereto, and the result was stirred for 1 hour at 160° C. The mixture solution completed with the reaction was filtered, and the solvent was removed from the filtered filtrate using a rotary evaporator to obtain Intermediate F, white solid, in a 93% yield.

Intermediate F of the following Table 1 was synthesized in the same manner as in Preparation Example 1 except that Intermediates A and B of the following Table 1 were used instead of Intermediates A and B of Preparation Example 1.

TABLE 1

| Compound Number | Intermediate A | Intermediate B | Intermediate F |
|---|---|---|---|
| 1 | 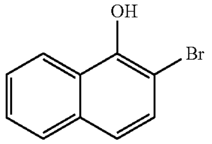 [SMILES: Oc1c(Br)ccc2ccccc12] | 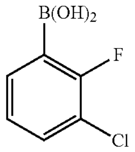 [SMILES: OB(O)c1cccc(Cl)c1F] | 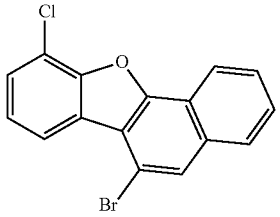 [SMILES: Clc1cccc2c1oc1c3ccccc3cc(Br)c21] |
| 23 | 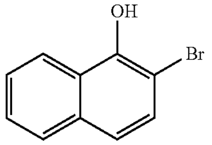 [SMILES: Oc1c(Br)ccc2ccccc12] | 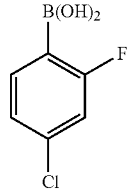 [SMILES: OB(O)c1ccc(Cl)cc1F] | 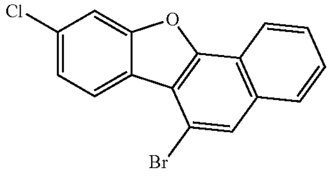 [SMILES: Clc1ccc2c(c1)oc1c3ccccc3cc(Br)c21] |
| 40 | 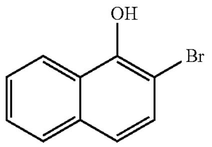 [SMILES: Oc1c(Br)ccc2ccccc12] | 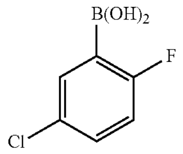 [SMILES: OB(O)c1cc(Cl)ccc1F] | 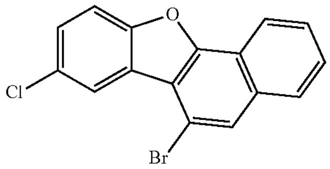 [SMILES: Clc1ccc2oc3c4ccccc4cc(Br)c3c2c1] |
| 160 | 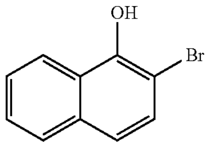 | 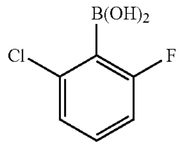 [SMILES: OB(O)c1c(F)cccc1Cl] | 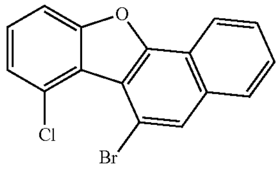 [SMILES: Clc1cccc2oc3c4ccccc4cc(Br)c3c12] |

[Preparation Example 2] Preparation of Intermediate F (2)

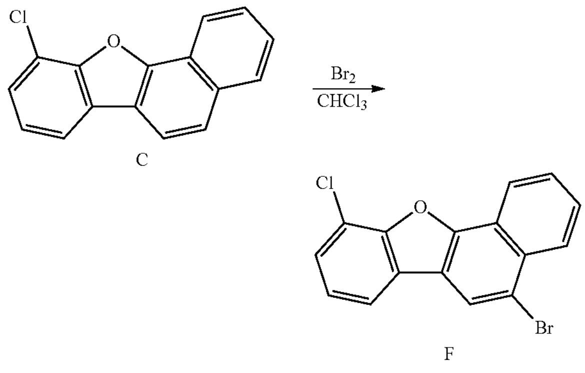

C

F

1) Preparation of Intermediate F

After dissolving Intermediate C (10 g, 39.57 mmol) in $CHCl_3$ (100 mL), $Br_2$ (2.04 mL, 39.57 mmol) was added dropwise thereto at 0° C., and the result was stirred for 2 hours at room temperature. Methanol was introduced to the mixture solution completed with the reaction, and after stirring for 30 minutes, the result was filtered to obtain Intermediate F, white solid, in a 90% yield.

Intermediate F of the following Table 2 was synthesized in the same manner as in Preparation Example 2 except that Intermediate C of the following Table 2 was used instead of Intermediate C of Preparation Example 2.

TABLE 2

| Compound Number | Intermediate C | Intermediate F |
|---|---|---|
| 85 | 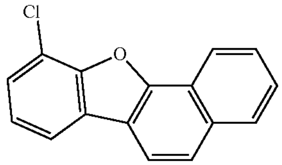 [SMILES: Clc1cccc2c1oc1c3ccccc3ccc21] | 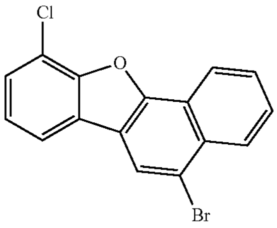 [SMILES: Clc1cccc2c1oc1c3ccccc3c(Br)cc21] |
| 199 | 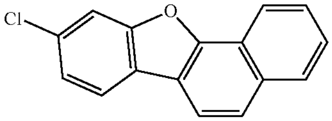 [SMILES: Clc1ccc2c(c1)oc1c3ccccc3ccc21] | 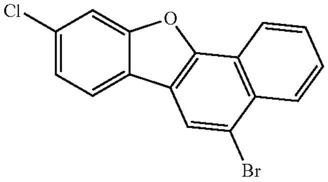 [SMILES: Clc1ccc2c(c1)oc1c3ccccc3c(Br)cc21] |
| 123 | 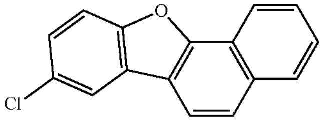 [SMILES: Clc1ccc2oc3c4ccccc4ccc3c2c1] | 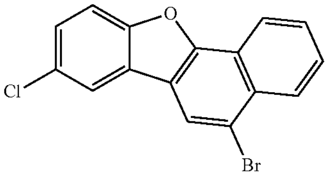 [SMILES: Clc1ccc2oc3c4ccccc4c(Br)cc3c2c1] |
| 254 | 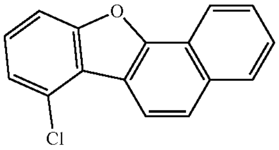 [SMILES: Clc1cccc2oc3c4ccccc4ccc3c12] | 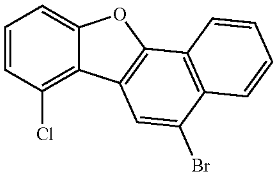 [SMILES: Clc1cccc2oc3c4ccccc4c(Br)cc3c12] |

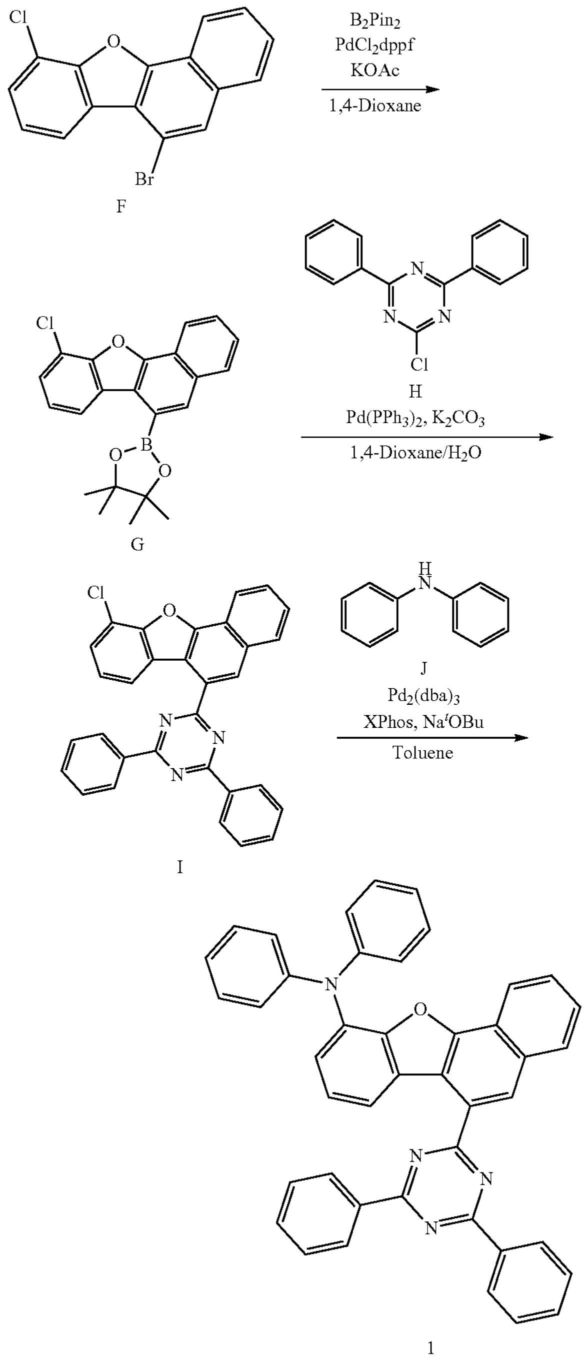

1) Preparation of Intermediate G

After dissolving Intermediate F (10 g, 30.15 mmol), bis(pinacolato)diboron (11.5 g, 45.23 mmol), $PdCl_2dppf$ ([1,1'-bis(diphenylphosphino)ferrocene]palladium(II) dichloride) (1.1 g, 1.5 mmol) and KOAc (potassium acetate) (7.4 g, 75.37 mmol) in 1,4-dioxane (100 mL), the result was stirred for 3 hours at 100° C. The mixture solution completed with the reaction was concentrated, dissolved in MC, and extracted with water. The organic layer was dried with anhydrous $MgSO_4$, and then silica gel filtered. The solvent was removed from the filtered filtrate using a rotary evaporator to obtain Intermediate G, brown solid, in a crude state without separate purification.

2) Preparation of Intermediate I

After dissolving Intermediate G (9.7 g, 25.62 mmol), Intermediate H (2-chloro-4,6-diphenyl-1,3,5-triazine) (6.85 g, 25.62 mmol), $Pd(PPh_3)_4$ (tetrakis(triphenylphosphine)palladium (0)) (1.48 g, 1.28 mmol) and $K_2CO_3$ (7.08 g, 51.24 mmol) in dioxane (80 mL) and $H_2O$ (20 mL), the result was stirred for 6 hours at 100° C. After the reaction was completed, precipitated solid was filtered, and washed with $H_2O$, methanol and acetone to obtain Intermediate I (6.7 g), white solid, in a 54% yield.

3) Preparation of Compound 1

After dissolving Intermediate I (6.7 g, 13.83 mmol), Intermediate J (diphenylamine) (2.34 g, 13.83 mmol), $Pd_2(dba)_3$ (tris(dibenzylideneacetone)dipalladium(0)) (0.63 g, 0.7 mmol), XPhos (1.33 g, 2.8 mmol) and $Na^tObu$ (sodium tert-butoxide) (2.66 g, 27.66 mmol) in toluene (50 mL), the result was stirred for 3 hours at 100° C. After the reaction was completed, precipitated solid was filtered, and washed with $H_2O$ and methanol. The filtered solid was dried, and then silica gel filtered after being dissolved in an excess amount of hot 1,2-dichlorobenzene solvent. After removing the solvent from the filtered filtrate using a rotary evaporator, the result was precipitated using acetone, and then the precipitate was filtered to obtain Compound 1 (5.54 g), yellow solid, in a 65% yield.

Target compounds of the following Table 3 were synthesized in the same manner as in Preparation Example 3 except that Intermediates F, H and J of the following Table 3 were used instead of Intermediates F, H and J of Preparation Example 3.

TABLE 3
| Compound Number | Intermediate F | Intermediate H | Intermediate J | Target Compound | Yield |
|---|---|---|---|---|---|
| 1 | 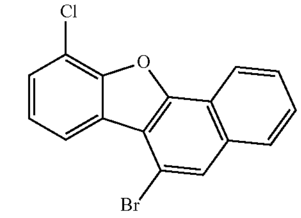 [SMILES: Clc1cccc2c1oc1c3ccccc3cc(Br)c21] | 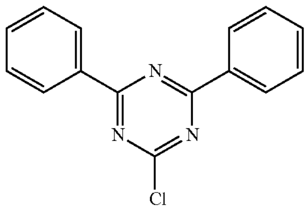 [SMILES: Clc1nc(-c2ccccc2)nc(-c2ccccc2)n1] | 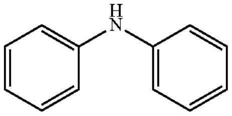 [SMILES: c1ccc(Nc2ccccc2)cc1] | 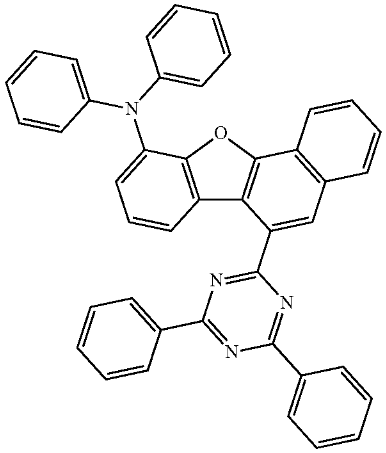 [SMILES: c1ccc(-c2nc(-c3ccccc3)nc(-c3cc4ccccc4c4oc5c(N(c6ccccc6)c6ccccc6)cccc5c34)n2)cc1] | 65% |
| 19 | 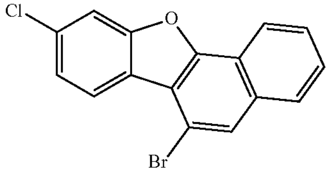 [SMILES: Clc1ccc2c(c1)oc1c3ccccc3cc(Br)c21] | 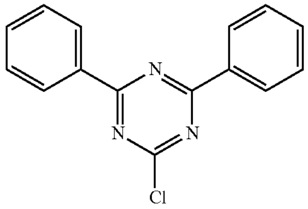 [SMILES: Clc1nc(-c2ccccc2)nc(-c2ccccc2)n1] | 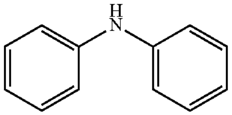 [SMILES: c1ccc(Nc2ccccc2)cc1] | 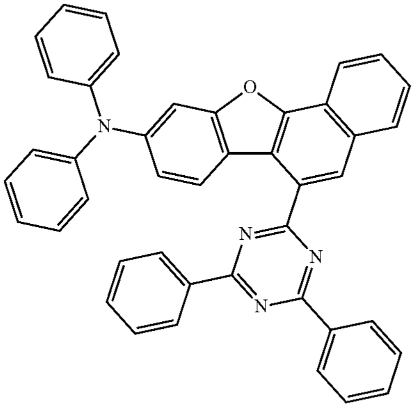 [SMILES: c1ccc(-c2nc(-c3ccccc3)nc(-c3cc4ccccc4c4oc5cc(N(c6ccccc6)c6ccccc6)ccc5c34)n2)cc1] | 74% |

TABLE 3-continued
| Compound Number | Intermediate F | Intermediate H | Intermediate J | Target Compound | Yield |
|---|---|---|---|---|---|
| 31 | 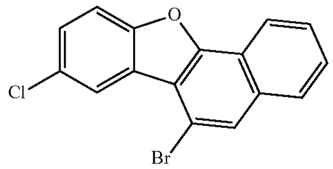 [SMILES: Clc1ccc2oc3c4ccccc4cc(Br)c3c2c1] | 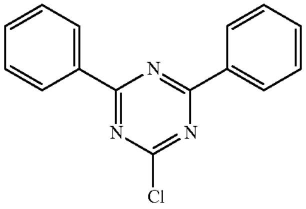 [SMILES: Clc1nc(-c2ccccc2)nc(-c2ccccc2)n1] | 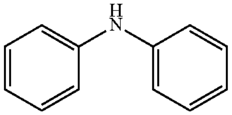 [SMILES: c1ccc(Nc2ccccc2)cc1] | 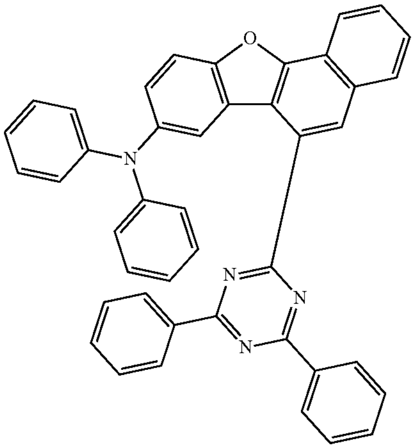 [SMILES: c1ccc(-c2nc(-c3ccccc3)nc(-c3cc4ccccc4c4oc5ccc(N(c6ccccc6)c6ccccc6)cc5c34)n2)cc1] | 69% |
| 160 | 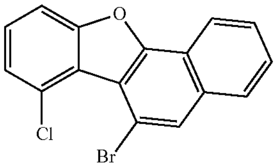 [SMILES: Clc1cccc2oc3c4ccccc4cc(Br)c3c12] | 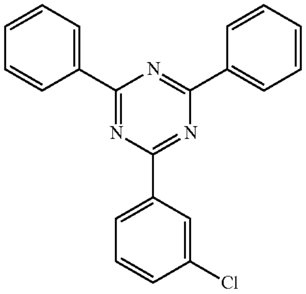 [SMILES: Clc1cccc(-c2nc(-c3ccccc3)nc(-c3ccccc3)n2)c1] | 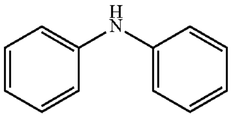 [SMILES: c1ccc(Nc2ccccc2)cc1] | 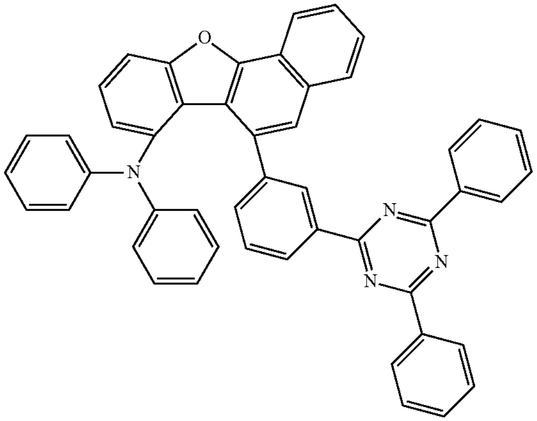 [SMILES: c1ccc(-c2nc(-c3ccccc3)nc(-c3cccc(-c4cc5ccccc5c5oc6cccc(N(c7ccccc7)c7ccccc7)c6c45)c3)n2)cc1] | 51% |

[Preparation Example 4] Preparation of Target Compound (2)

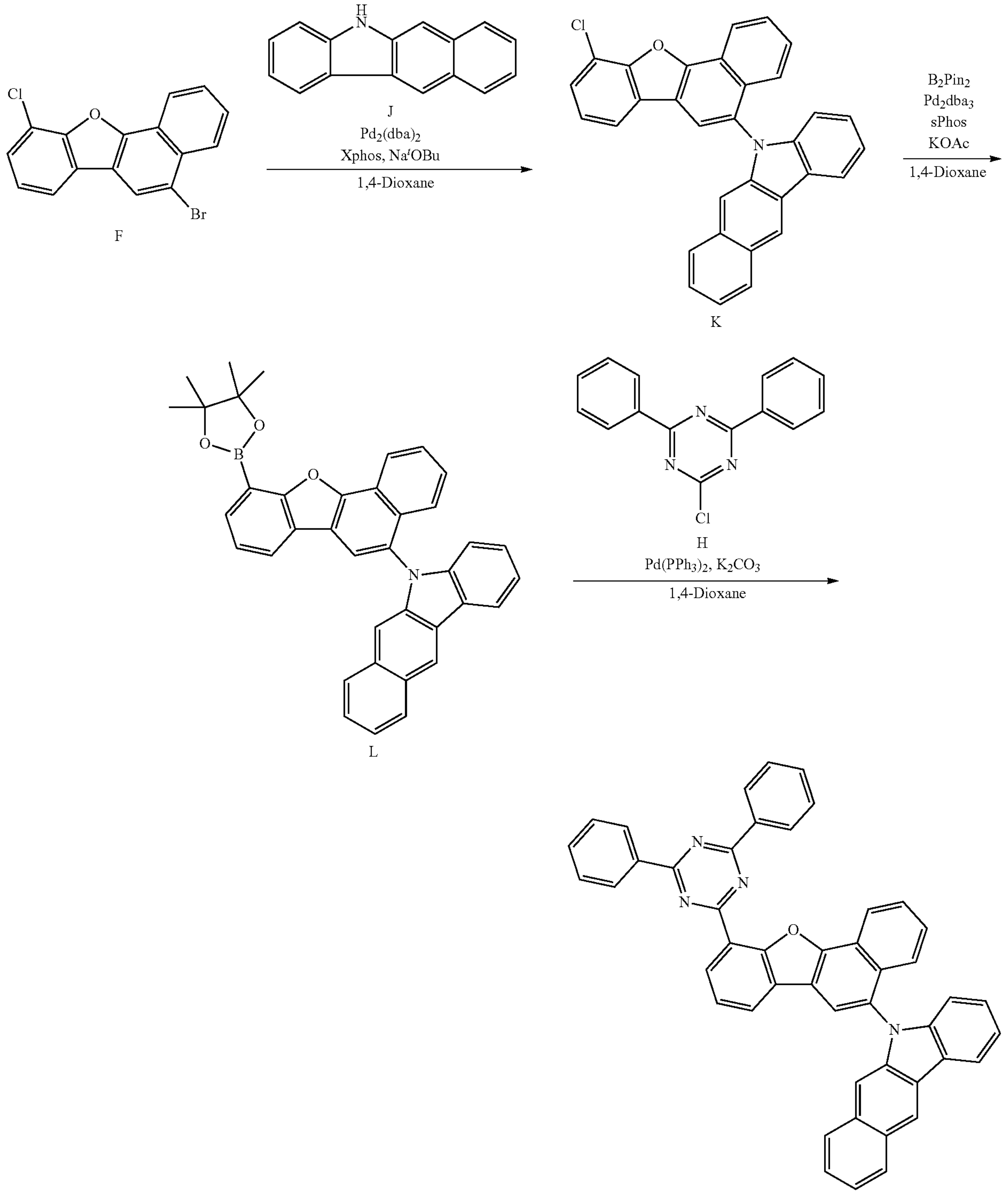

1) Preparation of Intermediate K

After dissolving Intermediate F (10 g, 30.15 mmol), Intermediate J (5H-benzo[b]carbazole) (6.5 g, 30.15 mmol), $Pd_2(dba)_3$ (1.38 g, 1.5 mmol), XPhos (2-dicyclohexylphosphino-2',4',6'-triisopropylbiphenyl) (2.86 g, 6 mmol) and Na$^t$OBu (5.8 g, 60.3 mmol) in toluene (100 mL), the result was stirred for 3 hours at 100° C. After the reaction was completed, precipitated solid was filtered, and washed with $H_2O$ and methanol. The filtered solid was dried, and then silica gel filtered after being dissolved in an excess amount of hot 1,2-dichlorobenzene solvent. After removing the solvent from the filtered filtrate using a rotary evaporator, the result was precipitated using acetone, and then the precipitate was filtered to obtain Intermediate K (11.14 g), white solid, in a 79% yield.

2) Preparation of Intermediate L

After dissolving Intermediate K (11.14 g, 23.81 mmol), bis(pinacolato)diboron (9.08 g, 35.71 mmol), $Pd_2(dba)_3$ (1.1 g, 1.2 mmol), sPhos (2-dicyclohexylphosphino-2',6'-dimethoxybiphenyl) (2 g, 4.8 mmol) and KOAc (7 g, 71.43 mmol) in 1,4-dioxane (100 mL), the result was stirred for 3 hours at 100° C. The mixture solution completed with the reaction was concentrated, dissolved in MC, and extracted with water. The organic layer was dried with anhydrous $MgSO_4$, and then silica gel filtered. The solvent was removed from the filtered filtrate using a rotary evaporator to obtain Intermediate L, brown solid, in a crude state without separate purification.

3) Preparation of Compound 85

After dissolving Intermediate L (10.65 g, 19.04 mmol), Intermediate H (2-chloro-4,6-diphenyl-1,3,5-triazine) (5.1 g, 19.04 mmol), $Pd(PPh_3)_4$ (1.1 g, 0.95 mmol) and $K_2CO_3$ (5.3 g, 38.08 mmol) in dioxane (80 mL) and $H_2O$ (20 mL), the result was stirred for 6 hours at 100° C. After the reaction was completed, precipitated solid was filtered, and washed with $H_2O$, methanol and acetone to obtain Compound 85 (8.1 g), white solid, in a 64% yield.

Target compounds of the following Table 4 were synthesized in the same manner as in Preparation Example 4 except that Intermediates F, H and J of the following Table 4 were used instead of Intermediates F, H and J of Preparation Example 4.

TABLE 4
| Compound Number | Intermediate F | Intermediate H | Intermediate J | Target Compound | Yield |
|---|---|---|---|---|---|
| 85 | 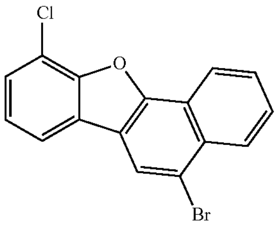 [SMILES: Clc1cccc2c1oc1c3ccccc3c(Br)cc21] | 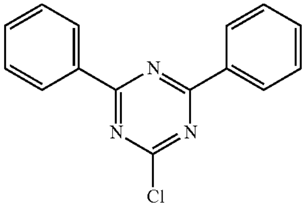 [SMILES: Clc1nc(-c2ccccc2)nc(-c2ccccc2)n1] | 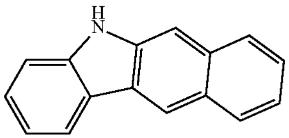 [SMILES: c1ccc2cc3c(cc2c1)[nH]c1ccccc13] | 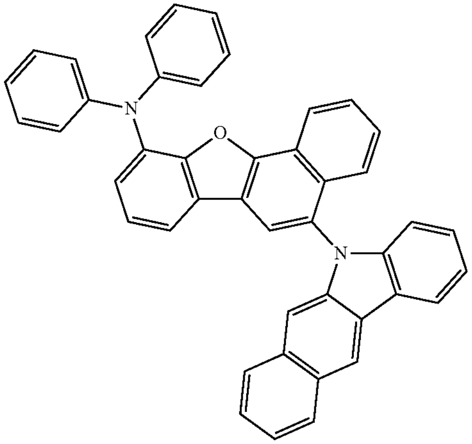 [SMILES: c1ccc(N(c2ccccc2)c2cccc3c2oc2c4ccccc4c(-n4c5ccccc5c5cc6ccccc6cc54)cc32)cc1] | 64% |
| 199 | 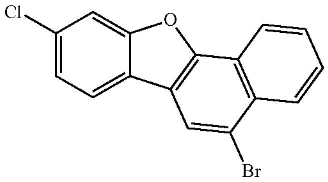 [SMILES: Clc1ccc2c(c1)oc1c3ccccc3c(Br)cc21] | 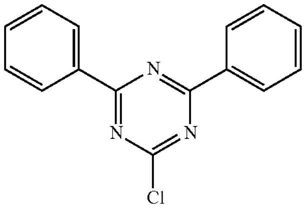 [SMILES: Clc1nc(-c2ccccc2)nc(-c2ccccc2)n1] | 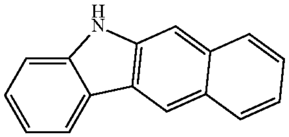 [SMILES: c1ccc2cc3c(cc2c1)[nH]c1ccccc13] | 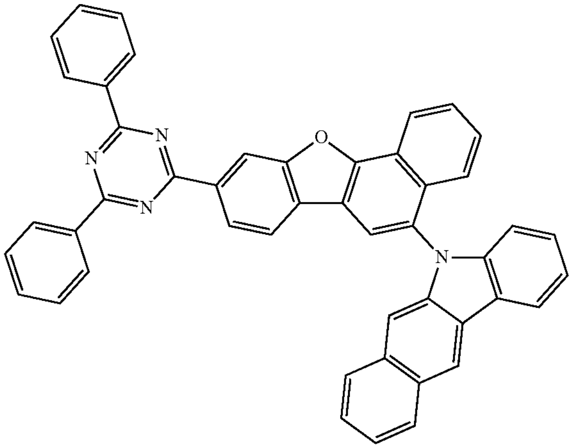 [SMILES: c1ccc(-c2nc(-c3ccccc3)nc(-c3ccc4c(c3)oc3c5ccccc5c(-n5c6ccccc6c6cc7ccccc7cc65)cc43)n2)cc1] | 78% |

TABLE 4-continued
| Compound Number | Intermediate F | Intermediate H | Intermediate J | Target Compound | Yield |
|---|---|---|---|---|---|
| 123 | 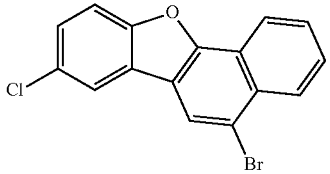 [SMILES: Clc1ccc2oc3c4ccccc4c(Br)cc3c2c1] | 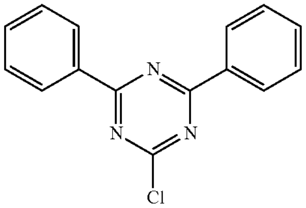 [SMILES: Clc1nc(-c2ccccc2)nc(-c2ccccc2)n1] | 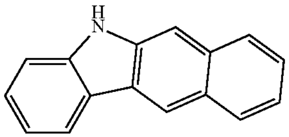 [SMILES: c1ccc2cc3c(cc2c1)[nH]c1ccccc13] | 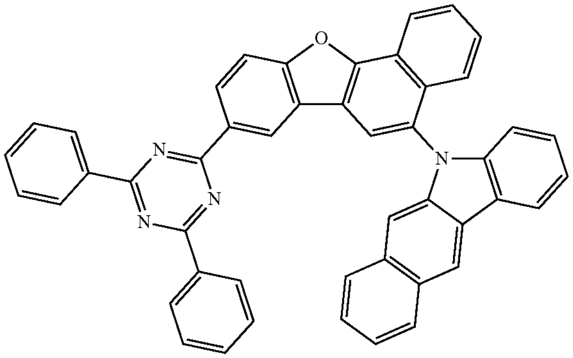 [SMILES: c1ccc(-c2nc(-c3ccccc3)nc(-c3ccc4oc5c6ccccc6c(-n6c7ccccc7c7cc8ccccc8cc76)cc5c4c3)n2)cc1] | 76% |
| 254 | 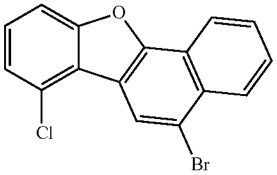 [SMILES: Clc1cccc2oc3c4ccccc4c(Br)cc3c12] | 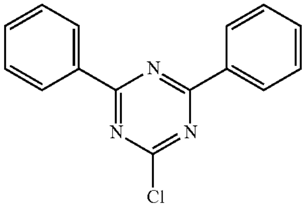 [SMILES: Clc1nc(-c2ccccc2)nc(-c2ccccc2)n1] | 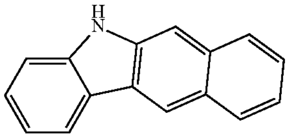 [SMILES: c1ccc2cc3c(cc2c1)[nH]c1ccccc13] | 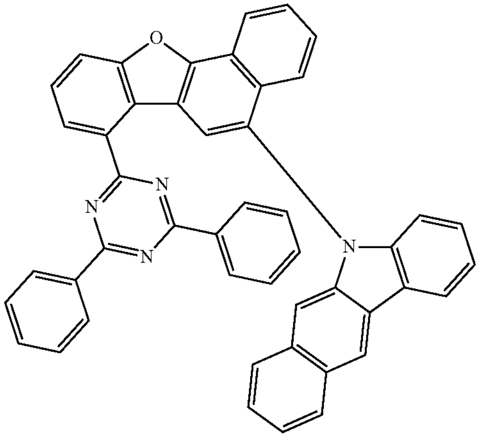 [SMILES: c1ccc(-c2nc(-c3ccccc3)nc(-c3cccc4oc5c6ccccc6c(-n6c7ccccc7c7cc8ccccc8cc76)cc5c34)n2)cc1] | 61% |

Compounds usable as Intermediates H and J in addition to the compounds described in the tables are as follows.
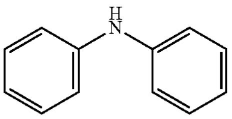
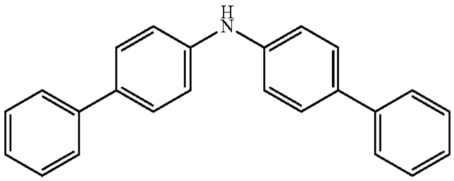
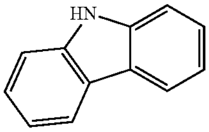
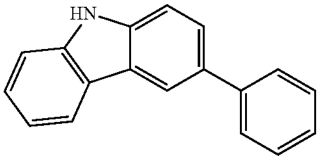
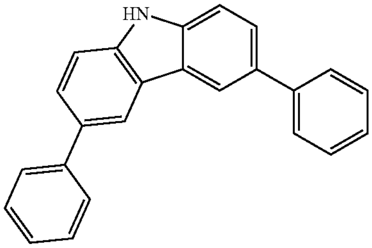
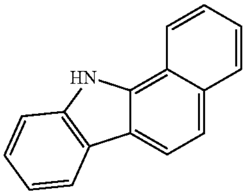
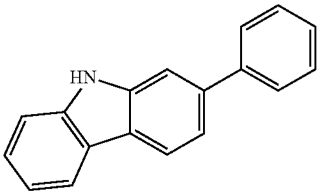
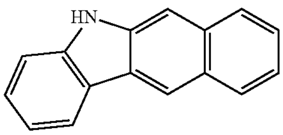
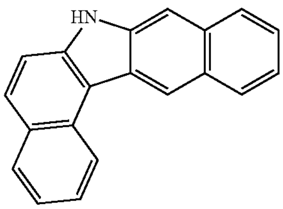
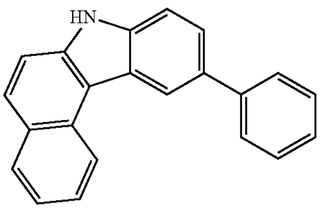
-continued
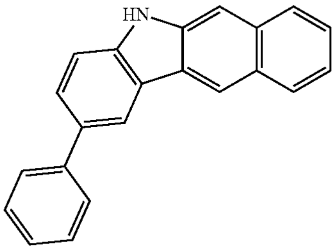
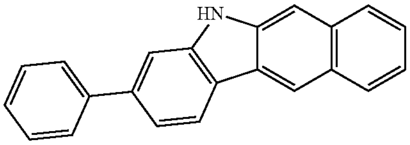
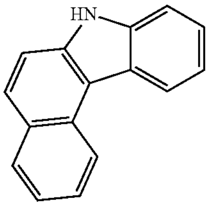
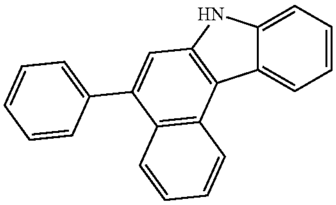
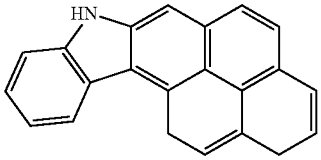
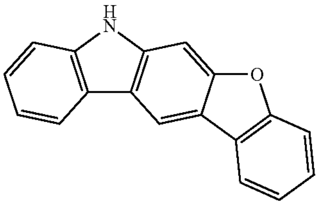
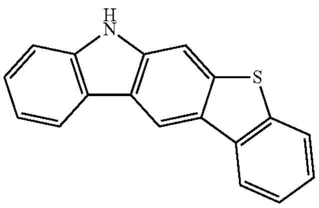
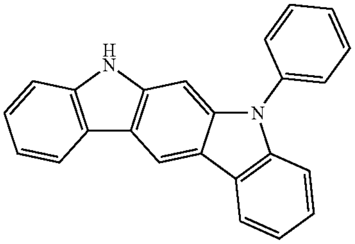

-continued
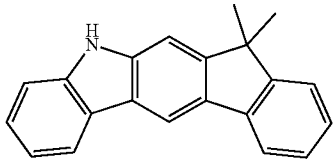
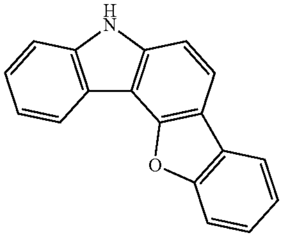
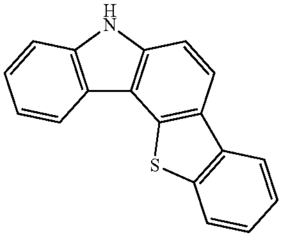
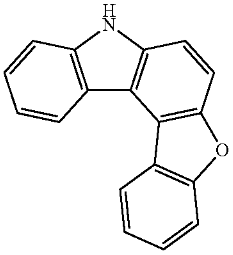
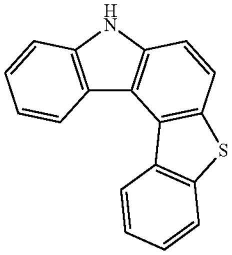
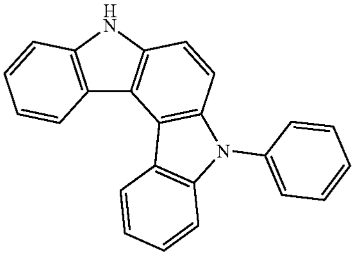
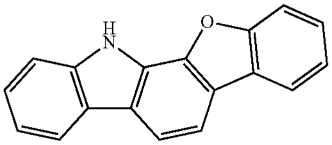
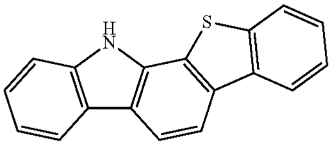
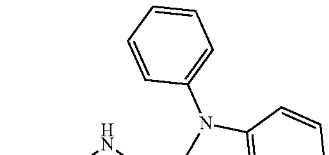
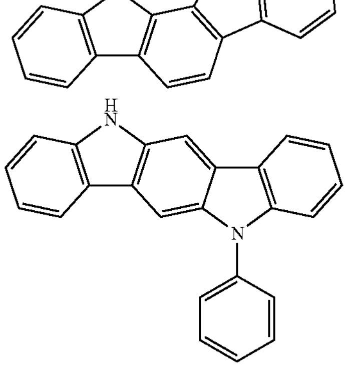
-continued
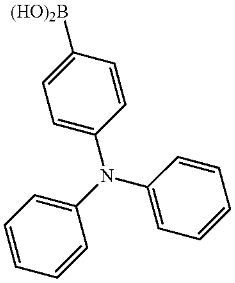
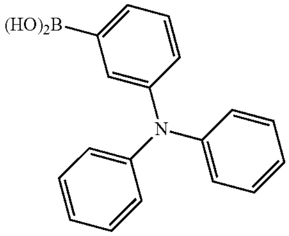
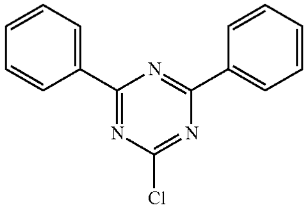
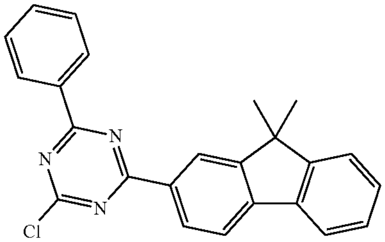
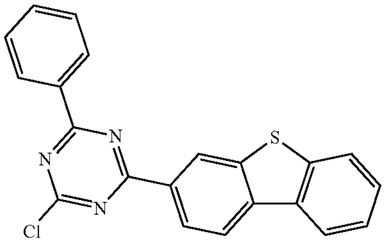
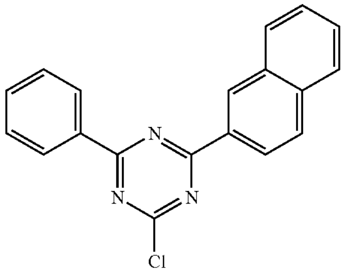
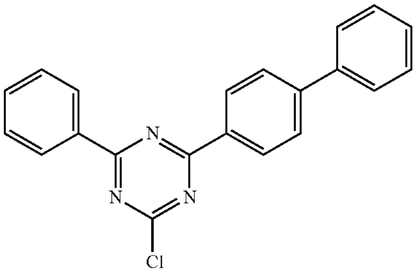
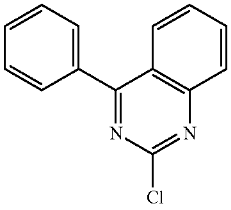

-continued

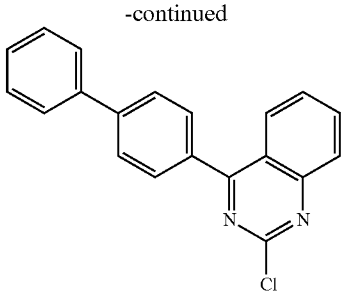

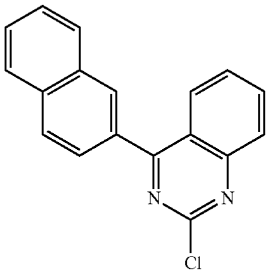

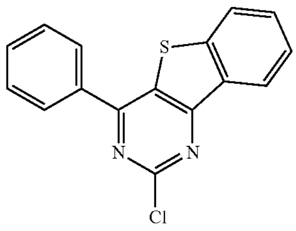

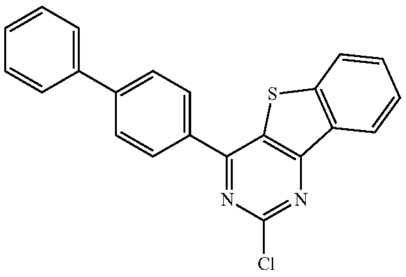

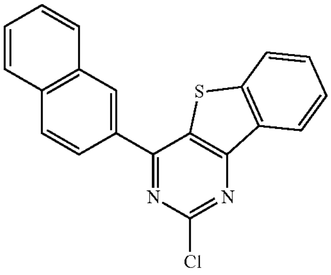

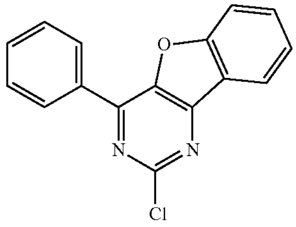

The reagents and the structures used in the syntheses are as follows.

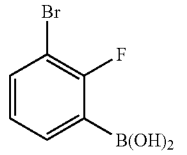
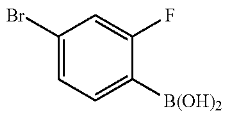

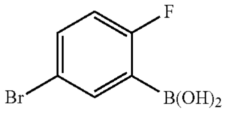
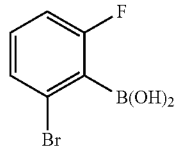

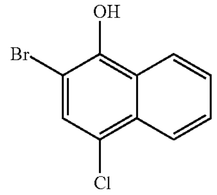
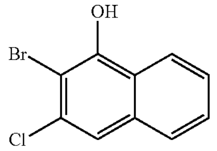

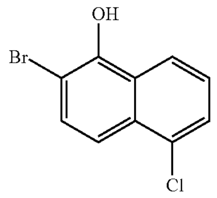
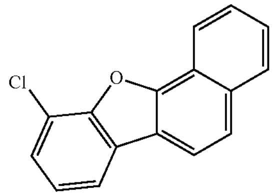

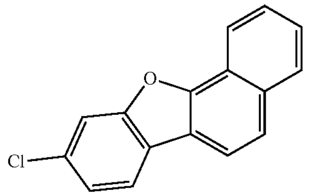
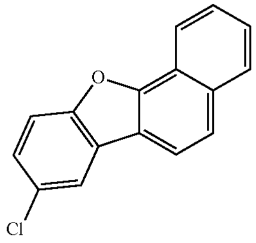

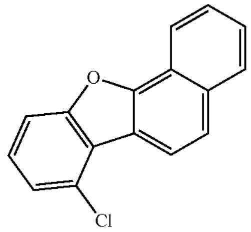
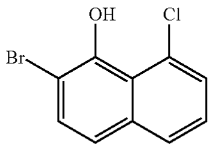

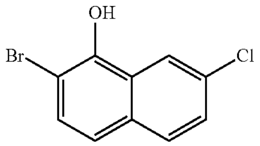
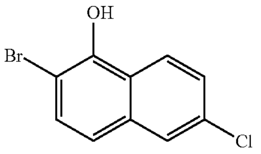

Compounds other than the compounds described in Preparation Examples 1 to 4 were also prepared in the same manner as the compounds described in Preparation Examples 1 to 4, and the synthesis identification results are shown in the following Table 5 and Table 6.

TABLE 5

| Compound | 1H NMR ($CDCl_3$, 200 Mz) |
|---|---|
| 1 | δ = 8.65(d, 4H), 8.36(d, 1H), 8.20(d, 1H), 8.03(d, 1H), 7.95 (s, 1H), 7.80~7.69(m, 6H), 7.62~7.50(m, 6H), 7.49~7.33 (m, 8H). |

TABLE 5-continued

| Compound | 1H NMR ($CDCl_3$, 200 Mz) |
|---|---|
| 2 | δ = 8.26(d, 4H), 8.06(d, 1H), 8.03~7.98(m, 5H), 7.95~7.88 (s, 7H), 7.80~7.69(m, 6H), 7.62~7.50(m, 6H), 7.25(m, 1H), 7.07 d, 1H), 6.99~6.90(d, 4H), 6.39(d, 1H) |
| 4 | δ = 9.25(d, 1H), 9.05(d, 4H), 8.68(d, 1H), 8.46(d, 1H), 8.26 (d, 1H), 8.03(d, 1H), 7.95(s, 1H), 7.81~7.69(m, 6H), 7.62~7.53(m, 6H), 7.49~7.33(m, 8H). |
| 8 | δ = 9.08(d, 1H), 8.98(d, 4H), 8.55(d, 1H), 8.28(d, 1H), 8.17~8.13(m, 5H), 7.70~7.63(m, 7H), 7.58~7.49(m, 8H), 7.35~7.42 (m, 4H), 7.16(m, 1H) |
| 11 | δ = 9.00(d, 1H), 8.71(s, 1H), 8.43(d, 1H), 8.20(d, 1H), 7.99 (d, 1H), 7.81(s, 1H), 7.70~7.59(m, 8H), 7.51~7.41(m, 8H), 7.31~7.28(m, 6H). |
| 15 | δ = 9.11(d, 1H), 8.75(s, 1H), 8.53(d, 1H), 8.21(d, 1H), 7.99 (d, 1H), 7.81(s, 1H), 7.70~7.59(m, 8H), 7.51~7.41(m, 8H), 7.31~7.28(m, 6H). |
| 19 | δ = 8.65(d, 4H), 8.36(d, 1H), 8.20(d, 1H), 8.11(s, 1H), 7.90 (s, 1H), 7.80~7.69(m, 6H), 7.62~7.50(m, 6H), 7.49~7.33(m, 8H). |
| 23 | δ = 9.29(s, 1H), 9.02(d, 1H), 8.99(d, 4H), 8.59(s, 1H), 8.43 (d, 1H), 8.26(d, 1H), 8.11(d, 1H), 8.01(d, 1H), 7.93(s, 1H), 7.85~7.71(m, 8H), 7.54~7.50(m, 4H), 7.42~7.37(m, 4H). |
| 25 | δ = 9.04(d, 1H), 8.95(d, 4H), 8.80(d, 1H), 8.65(d, 1H), 8.23 (d, 1H), 7.99(d, 1H), 7.82(s, 1H), 7.75~7.62(m, 6H), 7.59~7.49(m, 6H), 7.40~7.29(m, 8H). |
| 28 | δ = 8.97(d, 1H), 8.56(s, 1H), 8.35(d, 1H), 8.09(d, 1H), 7.94 (d, 1H), 7.80(s, 1H), 7.65~7.55(m, 8H), 7.45~7.36(m, 10H), 7.30~7.25(m, 4H). |
| 31 | δ = 8.65(d, 4H), 8.36(d, 1H), 8.20(d, 1H), 8.03(s, 1H), 7.98 (s, 1H), 7.79~7.65(m, 6H), 7.60~7.51(m, 6H), 7.49~7.38(m, 8H). |
| 47 | δ = 9.12(d, 1H), 9.05(d, 4H), 8.84(d, 1H), 8.41(d, 1H), 8.35 (d, 1H), 8.12(d, 1H), 7.94(s, 1H), 7.74~7.65(m, 6H), 7.59~7.52 (m, 6H), 7.43~7.33(m, 8H), 1.64(m, 6H). |
| 49 | δ = 9.33(d, 1H), 9.08(d, 4H), 8.99(s, 1H), 8.82(d, 1H), 8.56 (d, 1H), 8.47(d, 1H), 8.18(d, 1H), 8.08(s, 1H), 7.87~7.79(m, 6H), 7.64~7.56(m, 6H), 7.40~7.29(m, 5H). |
| 57 | δ = 9.25(d, 1H), 9.01(d, 4H), 8.85(s, 1H), 8.64(d, 1H), 8.33 (d, 1H), 8.17(d, 1H), 8.00(d, 1H), 7.87~7.80(m, 6H), 7.67~7.54(m, 6H), 7.41~7.27(m, 8H). |
| 59 | δ = 9.00(d, 1H), 8.71(s, 1H), 8.43(d, 1H), 8.28~8.20(m, 4H), 7.99(d, 1H), 7.81(s, 1H), 7.70~7.59(m, 8H), 7.51~7.41(m, 7H), 7.31~7.28(m, 6H). |
| 74 | δ = 8.92(d, 1H), 8.76(d, 4H), 8.65(s, 1H), 8.53(d, 1H), 8.32(d, 1H), 8.18(d, 1H), 8.04(d, 1H), 7.84~7.70(m, 8H), 7.63~7.58(m, 8H), 7.44~7.31(m, 10H). |
| 80 | δ = 9.12(d, 1H), 8.92(d, 4H), 8.64(d, 1H), 8.32(d, 1H), 8.21(d, 1H), 8.03(d, 1H), 7.88(s, 1H), 7.75~7.69(m, 6H), 7.58~7.44(m, 6H), 7.35~7.27(m, 6H). |
| 82 | δ = 9.12(d, 1H), 8.70(s, 1H), 8.51~8.40(m, 2H), 7.99(d, 1H), 7.81(s, 1H), 7.70~7.59(m, 8H), 7.51~7.41(m, 8H), 7.31~7.28 (m, 6H). |
| 85 | δ = 9.05(d, 1H), 8.71(s, 1H), 8.43(d, 1H), 8.20~8.12(m, 2H), 7.81(s, 1H), 7.70~7.59(m, 8H), 7.51~7.41(m, 8H), 7.31~7.28 (m, 6H). |
| 87 | δ = 9.31(d, 1H) 9.02(d, 4H), 8.91(s, 1H), 8.82(d, 1H), 8.43(d, 1H), 8.34(d, 1H), 8.12(d, 1H), 8.05(s, 1H), 7.88~7.75(m, 7H), 7.69~7.57(m, 6H), 7.45~7.31(m, 8H). |
| 98 | δ = 9.33(d, 1H), 9.12(d, 4H), 8.89(d, 1H), 8.57(d, 1H), 8.31(d, 1H), 8.09(d, 1H), 7.99(s, 1H), 7.80~7.69(m, 6H), 7.60~7.53(m, 6H), 7.45~7.33(m, 8H). |
| 100 | δ = 8.55(d, 1H), 8.25(m, 4H), 8.21~8.18(m, 2H), 7.99~7.98(m, 2H), 7.81(s, 1H), 7.70~7.59(m, 8H), 7.51~7.41(m, 8H), 7.31~7.28(m, 4H). |
| 102 | δ = 9.38(d, 1H), 9.20(s, 1H), 8.87(d, 4H), 8.66(s, 1H), 8.64(d, 1H), 8.41(d, 1H), 8.33(d, 1H), 8.11(d, 1H), 8.09(s, 1H), 7.91~7.76(m, 5H), 7.67~7.62(m, 6H), 7.53~7.35(m, 5H). |
| 103 | δ = 8.55(d, 1H), 8.25(m, 4H), 8.21~8.18(m, 2H), 7.99~7.98(m, 2H), 7.81(s, 1H), 7.70~7.59(m, 8H), 7.51~7.41(m, 8H), 7.31~7.28(m, 4H). |
| 112 | δ = 9.25(d, 1H), 8.99(d, 4H), 8.78(s, 1H), 8.71(d, 1H), 8.35(d, 1H), 8.22(d, 1H), 8.07(d, 1H), 8.01(s, 1H), 7.85~7.71(m, 7H), 7.64~7.59(m, 7H), 7.49~7.36(m, 7H). |
| 114 | δ = 9.12(d, 1H), 8.72(s, 1H), 8.51(d, 1H), 8.29(d, 1H), 8.03(d, 1H), 7.86(s, 1H), 7.72~7.60(m, 8H), 7.52~7.42(m, 8H), 7.33~7.29(m, 4H). |

TABLE 5-continued

| Compound | 1H NMR ($CDCl_3$, 200 Mz) |
|---|---|
| 115 | δ = 8.55(d, 1H), 8.29(d, 1H), 8.18~8.05(m, 3H), 8.03(d, 1H), 7.79~7.55(m, 8H) 7.21~7.19(m, 5H), 6.81(m, 2H), 6.63(d, 5H), 6.33(d, 1H). |
| 117 | δ = 9.19(d, 1H), 9.09(d, 1H), 8.81(s, 1H), 8.65(d, 1H), 8.36(d, 1H), 8.12(d, 1H), 7.91(s, 1H), 7.76~7.63(m, 6H), 7.58~7.40(m, 8H), 7.29~7.20(m, 4H). |
| 123 | δ = 9.10(d, 1H), 8.99(d, 4H), 8.63~8.59(m, 2H), 8.32~8.29(m, 3H), 8.05(d, 1H), 7.98(s, 1H), 7.89~7.71(m, 8H), 7.61~7.54(m, 4H), 7.49~7.36(m, 4H). |
| 125 | δ = 9.29(s, 1H), 9.18(d, 1H), 8.99(d, 4H), 8.63(s, 1H), 8.52(d, 1H), 8.37(d, 1H), 8.27(d, 1H), 8.05(d, 1H), 7.98(s, 1H), 7.89~7.71(m, 8H), 7.61~7.54(m, 4H), 7.49~7.36(m, 4H). |
| 126 | δ = 9.29(s, 1H), 9.18(d, 1H), 8.99(d, 4H), 8.63(s, 1H), 8.52(d, 1H), 8.37(d, 1H), 8.27(d, 1H), 8.05(d, 1H), 7.98(s, 1H), 7.89~7.71(m, 8H), 7.61~7.54(m, 4H), 7.49~7.36(m, 4H). |
| 130 | δ = 9.12(s, 1H), 8.98(s, 1H), 8.76(d, 4H), 8.65~8.45(m, 2H), 8.21~8.02(m, 4H), 7.85~7.73(m, 8H), 7.65~7.52(m, 4H), 7.44~7.31(m, 4H). |
| 132 | δ = 9.11(s, 1H), 9.03(d, 1H), 8.76(d, 4H), 8.67(s, 1H), 8.45(d, 1H), 8.23(d, 1H), 8.11~8.02(m, 3H), 7.85~7.73(m, 8H), 7.65~7.52(m, 4H), 7.44~7.31(m, 4H). |
| 133 | δ = 9.27(d, 1H) 9.09(d, 4H), 8.89(s, 1H), 8.78(d, 1H), 8.46(d, 1H), 8.37(d, 1H), 8.23(s, 1H), 8.01(d, 1H), 7.93~7.80(m, 8H), 7.69~7.54(m, 6H), 7.40~7.27(m, 8H). |
| 148 | δ = 9.34(d, 1H), 9.21(d, 4H), 9.02(d, 1H), 8.74(d, 1H), 8.45(d, 1H), 8.12(d, 1H), 8.01(s, 1H), 7.86~7.71(m, 6H), 7.63~7.50(m, 6H), 7.42~7.30(m, 8H). |
| 149 | δ = 9.27(s, 1H), 9.08(d, 1H), 8.84(d, 4H), 8.61(s, 1H), 8.52(d, 1H), 8.31(d, 1H), 8.15(d, 1H), 8.08(d, 1H), 7.99(s, 1H), 7.85~7.69(m, 8H), 7.59~7.50(m, 4H), 7.40~7.31(m, 4H). |
| 150 | δ = 9.29(d, 1H) 9.01(d, 4H), 8.96(s, 1H), 8.84(d, 1H), 8.48(d, 1H), 8.32(d, 1H), 8.11(d, 1H), 8.02(s, 1H), 7.85~7.75(m, 6H), 7.65~7.57(m, 5H), 7.40~7.31(m, 6H). |
| 151 | δ = 9.24(d, 1H), 9.01(d, 4H), 8.82(d, 1H), 8.49(d, 1H), 8.27(d, 1H), 8.05(d, 1H), 7.93(s, 1H), 7.84~7.62(m, 6H), 7.64~7.53(m, 6H), 7.43~7.30(m, 8H). |
| 154 | δ = 8.96(d, 1H), 8.82(d, 4H), 8.71(d, 1H), 8.50(d, 1H), 8.29(d, 1H), 8.07(d, 1H), 7.92(s, 1H), 7.75~7.64(m, 6H), 7.59~7.50(m, 6H), 7.42~7.30(m, 6H). |
| 159 | δ = 9.18(d, 1H) 8.98(d, 4H), 8.85(s, 1H), 8.62(d, 1H), 8.38(d, 1H), 8.24(d, 1H), 8.02(d, 1H), 7.98(s, 1H), 7.91~7.79(m, 7H), 7.64~7.50(m, 6H), 7.40~7.29(m, 8H). |
| 160 | δ = 8.67(d, 1H), 8.45~8.23(m, 5H), 8.20~8.09(m, 6H), 7.70(s, 1H), 7.41~7.65(m, 7H) 7.20.~7.15(m, 7H), 6.63~6.60(m, 4H), 6.32(d, 1H). |
| 176 | δ = 9.13(d, 1H), 9.05(d, 1H), 8.79(s, 1H), 8.56(d, 1H), 8.28(d, 1H), 8.04(d, 1H), 7.75~7.60(m, 7H), 7.55~7.40(m, 8H), 7.29~7.11(m, 8H). |
| 179 | δ = 9.24(d, 1H), 9.15(d, 1H), 8.93(s, 1H), 8.77(d, 1H), 8.56(d, 1H), 8.29(d, 1H), 7.99(s, 1H), 7.82~7.69(m, 6H), 7.58~7.39(m, 8H), 7.20~7.12(m, 6H). |
| 196 | δ = 9.12(d, 1H), 9.02(d, 1H), 8.75(s, 1H), 8.62(d, 1H), 8.30(d, 1H), 8.09(d, 1H), 7.90(s, 1H), 7.77~7.65(m, 6H), 7.57~7.40(m, 8H), 7.28~7.20(m, 6H). |
| 199 | δ = 9.02(d, 1H), 8.90(d, 4H), 8.63~8.59(m, 5H), 8.05(d, 1H), 7.98(s, 1H), 7.89~7.71(m, 8H), 7.61~7.54(m, 4H), 7.49~7.36 (m, 4H). |
| 205 | δ = 8.91(s, 1H), 8.84(d, 1H), 8.66(d, 4H), 8.43(s, 1H), 8.26(d, 1H), 8.11(d, 1H), 8.01(d, 1H), 7.89(d, 1H), 7.84~7.69(m, 6H), 7.54~7.50(m, 4H), 7.37~7.30(m, 4H). |
| 210 | δ = 9.05(s, 1H), 8.89(d, 1H), 8.71(d, 4H), 8.63(s, 1H), 8.40(d, 1H), 8.20(d, 1H), 8.09~8.02(m, 4H), 7.84~7.73(m, 6H), 7.59~7.52(m, 4H), 7.42~7.31(m, 4H). |
| 217 | δ = 9.28(d, 1H), 9.15(s, 1H), 8.92(d, 4H), 8.78(s, 1H), 8.69(d, 1H), 8.40(d, 1H), 8.30(d, 1H), 8.14(d, 1H), 8.04(s, 1H), 7.90~7.76(m, 7H), 7.69~7.61(m, 8H), 7.53~7.35(m, 8H). |
| 223 | δ = 8.56(d, 1H), 8.28~8.26(m, 4H), 8.18(d, 1H), 7.75~7.71(m, 2H), 7.65~7.60(m, 8H), 7.51~7.40(m, 9H), 7.35~7.30(m, 4H), 7.20 (d, 2H), 6.69~6.80(m, 5H) |
| 227 | δ = 8.56(d, 1H), 8.28~8.20(m, 3H), 8.18(d, 1H), 7.72~7.70(m, 3H), 7.65~7.60(m, 7H), 7.51~7.40(m, 8H), 7.35~7.30(m, 4H), 7.20 (d, 2H), 6.69~6.80(m, 5H), 1.78(s, 6H) |
| 228 | δ = 9.19(d, 1H) 9.02(d, 4H), 8.85(s, 1H), 8.67(d, 1H), 8.43(d, 1H), 8.32(d, 1H), 8.10(d, 1H), 7.87~7.73(m, 6H), 7.68~7.55(m, 6H), 7.43~7.29(m, 8H). |

TABLE 5-continued

| Compound | 1H NMR ($CDCl_3$, 200 Mz) |
|---|---|
| 232 | δ = 9.19(d, 1H), 9.09(d, 1H), 8.81(s, 1H), 8.65(d, 1H), 8.36(d, 1H), 8.12(d, 1H), 7.91(s, 1H), 7.76~7.63(m, 6H), 7.58~7.40(m, 8H), 7.29~7.20(m, 6H). |
| 233 | δ = 8.51(s, 1H), 8.45~8.40(m, 3H), 8.36~8.30(m, 5H), 8.12(d, 1H), 7.76~7.68(m, 6H), 7.58~7.40(m, 7H), 7.29~7.20(m, 4H). |
| 254 | δ = 8.55(d, 1H), 8.50(m, 4H), 8.45~8.40(m, 3H), 8.36~8.30 (m, 2H), 8.02(d, 1H), 7.76~7.68(m, 6H), 7.58~7.40(m, 7H), 7.29~7.20(m, 4H). |
| 255 | δ = 8.56(d, 1H), 8.28~8.26(m, 4H), 8.08(d, 1H), 7.75~7.71(m, 2H), 7.65~7.60(m, 6H), 7.51~7.40(m, 8H), 7.35~7.30(m, 2H), 7.20 (d, 2H), 6.69~6.80(m, 2H) |
| 256 | δ = 8.55(d, 1H), 8.30~8.26(m, 4H), 8.15(d, 1H), 7.75~7.71(m, 2H), 7.65~7.60 (m, 8H), 7.51~7.40 (m, 6H), 7.35~7.30 (m, 4H), 6.69~6.80 (m, 4H), 1.80(s, 6H) |
| 268 | δ = 8.56(d, 1H), 8.28~8.26(m, 4H), 8.15~8.00 (m, 3H), 7.75~7.71(m, 2H), 7.65~7.59(m, 7H), 7.51~7.40 (m, 8H), 7.35~7.30 (m, 2H), 7.20 (d, 2H), 6.69~6.80 (m, 2H) |
| 291 | δ = 8.54(d, 1H), 8.30(m, 2H), 8.15~8.08 (m, 3H), 7.94(d, 1H), 7.75~7.71(m, 2H), 7.65~7.59(m, 7H), 7.51~7.40 (m, 8H), 7.35~7.30 (m, 2H), 7.20 (d, 4H), |

TABLE 6

| Compound | FD-Mass |
|---|---|
| 1 | m/z = 616.7240 (C43H28N4O, 616.2263) |
| 2 | m/z = 768.9200 (C55H36N4O, 768.2889) |
| 3 | m/z = 614.7080 (C43H26N4O, 614.2107) |
| 4 | m/z = 690.8060 (C49H30N4O, 690.2420) |
| 5 | m/z = 766.9040 (C55H34N4O, 766.2733) |
| 6 | m/z = 664.7680 (C47H28N4O, 664.2263) |
| 7 | m/z = 690.8060 (C49H30N4O, 690.2420) |
| 8 | m/z = 740.8660 (C53H32N4O, 740.2576) |
| 9 | m/z = 714.8280 (C51H30N4O, 714.2420) |
| 10 | m/z = 740.8660 (C53H32N4O, 740.2576) |
| 11 | m/z = 664.7680 (C47H28N4O, 664.2263) |
| 12 | m/z = 740.8660 (C53H32N4O, 740.2576) |
| 13 | m/z = 740.8660 (C53H32N4O, 740.2576) |
| 14 | m/z = 738.8500 (C53H30N4O, 738.2420) |
| 15 | m/z = 704.7890 (C49H28N4O2, 704.2212) |
| 16 | m/z = 720.8500 (C49H28N4OS, 720.1984) |
| 17 | m/z = 704.7890 (C49H28N4O2, 704.2212) |
| 18 | m/z = 720.8500 (C49H28N4OS, 720.1984) |
| 19 | m/z = 616.7240 (C43H28N4O, 616.2263) |
| 20 | m/z = 768.9200 (C55H36N4O, 768.2889) |
| 21 | m/z = 614.7080 (C43H26N4O, 614.2107) |
| 22 | m/z = 690.8060 (C49H30N4O, 690.2420) |
| 23 | m/z = 664.7680 (C47H28N4O, 664.2263) |
| 24 | m/z = 664.7680 (C47H28N4O, 664.2263) |
| 25 | m/z = 690.8060 (C49H30N4O, 690.2420) |
| 26 | m/z = 664.7680 (C47H28N4O, 664.2263) |
| 27 | m/z = 704.7890 (C49H28N4O2, 704.2212) |
| 28 | m/z = 720.8500 (C49H28N4OS, 720.1984) |
| 29 | m/z = 704.7890 (C49H28N4O2, 704.2212) |
| 30 | m/z = 720.8500 (C49H28N4OS, 720.1984) |
| 31 | m/z = 616.7240 (C43H28N4O, 616.2263) |
| 32 | m/z = 768.9200 (C55H36N4O, 768.2889) |
| 33 | m/z = 614.7080 (C43H26N4O, 614.2107) |
| 34 | m/z = 690.8060 (C49H30N4O, 690.2420) |
| 35 | m/z = 664.7680 (C47H28N4O, 664.2263) |
| 36 | m/z = 664.7680 (C47H28N4O, 664.2263) |
| 37 | m/z = 690.8060 (C49H30N4O, 690.2420) |
| 38 | m/z = 664.7680 (C47H28N4O, 664.2263) |
| 39 | m/z = 704.7890 (C49H28N4O2, 704.2212) |
| 40 | m/z = 720.8500 (C49H28N4OS, 720.1984) |
| 41 | m/z = 704.7890 (C49H28N4O2, 704.2212) |
| 42 | m/z = 720.8500 (C49H28N4OS, 720.1984) |
| 43 | m/z = 730.8710 (C52H34N4O, 730.2733) |
| 44 | m/z = 704.7890 (C49H28N4O2, 704.2212) |
| 45 | m/z = 720.8500 (C49H28N4OS, 720.1984) |
| 46 | m/z = 720.8500 (C49H28N4OS, 720.1984) |
| 47 | m/z = 730.8710 (C52H34N4O, 730.2733) |
| 48 | m/z = 704.7890 (C49H28N4O2, 704.2212) |
| 49 | m/z = 720.8500 (C49H28N4OS, 720.1984) |

TABLE 6-continued

| Compound | FD-Mass |
|---|---|
| 50 | m/z = 720.8500 (C49H28N4OS, 720.1984) |
| 51 | m/z = 730.8710 (C52H34N4O, 730.2733) |
| 52 | m/z = 704.7890 (C49H28N4O2, 704.2212) |
| 53 | m/z = 720.8500 (C49H28N4OS, 720.1984) |
| 54 | m/z = 720.8500 (C49H28N4OS, 720.1984) |
| 55 | m/z = 690.8060 (C49H30N4O, 690.2420) |
| 56 | m/z = 690.8060 (C49H30N4O, 690.2420) |
| 57 | m/z = 690.8060 (C49H30N4O, 690.2420) |
| 58 | m/z = 690.8060 (C49H30N4O, 690.2420) |
| 59 | m/z = 740.8660 (C53H32N4O, 740.2576) |
| 60 | m/z = 714.8280 (C51H30N4O, 714.2420) |
| 61 | m/z = 719.8620 (C50H29N3OS, 719.2031) |
| 62 | m/z = 719.8620 (C50H29N3OS, 719.2031) |
| 63 | m/z = 663.7800 (C48H29N3O, 663.2311) |
| 64 | m/z = 663.7800 (C48H29N3O, 663.2311) |
| 65 | m/z = 703.8010 (C50H29N3O2, 703.2260) |
| 66 | m/z = 703.8010 (C50H29N3O2, 703.2260) |
| 67 | m/z = 693.8240 (C48H27N3OS, 693.1875) |
| 68 | m/z = 693.8240 (C48H27N3OS, 693.1875) |
| 69 | m/z = 719.8620 (C50H29N3OS, 719.2031) |
| 70 | m/z = 663.7800 (C48H29N3O, 663.2311) |
| 71 | m/z = 589.6980 (C42H27N3O, 589.2154) |
| 72 | m/z = 663.7800 (C48H29N3O, 663.2311) |
| 73 | m/z = 616.7240 (C43H28N4O, 616.2263) |
| 74 | m/z = 768.9200 (C55H36N4O, 768.2889) |
| 75 | m/z = 614.7080 (C43H26N4O, 614.2107) |
| 76 | m/z = 690.8060 (C49H30N4O, 690.2420) |
| 77 | m/z = 664.7680 (C47H28N4O, 664.2263) |
| 78 | m/z = 664.7680 (C47H28N4O, 664.2263) |
| 79 | m/z = 690.8060 (C49H30N4O, 690.2420) |
| 80 | m/z = 664.7680 (C47H28N4O, 664.2263) |
| 81 | m/z = 704.7890 (C49H28N4O2, 704.2212) |
| 82 | m/z = 720.8500 (C49H28N4OS, 720.1984) |
| 83 | m/z = 704.7890 (C49H28N4O2, 704.2212) |
| 84 | m/z = 720.8500 (C49H28N4OS, 720.1984) |
| 85 | m/z = 664.7680 (C47H28N4O, 664.2263) |
| 86 | m/z = 692.8220 (C49H32N4O, 692.2576) |
| 87 | m/z = 692.8220 (C49H32N4O, 692.2576) |
| 88 | m/z = 692.8220 (C49H32N4O, 692.2576) |
| 89 | m/z = 628.7350 (C44H28N4O, 628.2263) |
| 90 | m/z = 626.7190 (C44H26N4O, 626.2107) |
| 91 | m/z = 645.7800 (C44H27N3OS, 645.1875) |
| 92 | m/z = 695.8400 (C48H29N3OS, 695.2031) |
| 93 | m/z = 589.6980 (C42H27N3O, 589.2154) |
| 94 | m/z = 639.7580 (C46H29N3O, 639.2311) |
| 95 | m/z = 629.7190 (C44H27N3O2, 629.2103) |
| 96 | m/z = 679.7790 (C48H29N3O2, 679.2260) |
| 97 | m/z = 616.7240 (C43H28N4O, 616.2263) |
| 98 | m/z = 666.7840 (C47H30N4O, 666.2420) |
| 99 | m/z = 614.7080 (C43H26N4O, 614.2107) |
| 100 | m/z = 690.8060 (C49H30N4O, 690.2420) |
| 101 | m/z = 740.8660 (C53H32N4O, 740.2576) |
| 102 | m/z = 664.7680 (C47H28N4O, 664.2263) |
| 103 | m/z = 690.8060 (C49H30N4O, 690.2420) |
| 104 | m/z = 664.7680 (C47H28N4O, 664.2263) |
| 105 | m/z = 704.7890 (C49H28N4O2, 704.2212) |
| 106 | m/z = 720.8500 (C49H28N4OS, 720.1984) |
| 107 | m/z = 704.7890 (C49H28N4O2, 704.2212) |
| 108 | m/z = 720.8500 (C49H28N4OS, 720.1984) |
| 109 | m/z = 692.8220 (C49H32N4O, 692.2576) |
| 110 | m/z = 692.8220 (C49H32N4O, 692.2576) |
| 111 | m/z = 692.8220 (C49H32N4O, 692.2576) |
| 112 | m/z = 692.8220 (C49H32N4O, 692.2576) |
| 113 | m/z = 628.7350 (C44H28N4O, 628.2263) |
| 114 | m/z = 626.7190 (C44H26N4O, 626.2107) |
| 115 | m/z = 645.7800 (C44H27N3OS, 645.1875) |
| 116 | m/z = 695.8400 (C48H29N3OS, 695.2031) |
| 117 | m/z = 589.6980 (C42H27N3O, 589.2154) |
| 118 | m/z = 639.7580 (C46H29N3O, 639.2311) |
| 119 | m/z = 629.7190 (C44H27N3O2, 629.2103) |
| 120 | m/z = 679.7790 (C48H29N3O2, 679.2260) |
| 121 | m/z = 616.7240 (C43H28N4O, 616.2263) |
| 122 | m/z = 666.7840 (C47H30N4O, 666.2420) |
| 123 | m/z = 664.7680 (C47H28N4O, 664.2263) |
| 124 | m/z = 690.8060 (C49H30N4O, 690.2420) |
| 125 | m/z = 664.7680 (C47H28N4O, 664.2263) |
| 126 | m/z = 664.7680 (C47H28N4O, 664.2263) |
| 127 | m/z = 690.8060 (C49H30N4O, 690.2420) |

TABLE 6-continued

| Compound | FD-Mass |
|---|---|
| 128 | m/z = 664.7680 (C47H28N4O, 664.2263) |
| 129 | m/z = 704.7890 (C49H28N4O2, 704.2212) |
| 130 | m/z = 720.8500 (C49H28N4OS, 720.1984) |
| 131 | m/z = 704.7890 (C49H28N4O2, 704.2212) |
| 132 | m/z = 720.8500 (C49H28N4OS, 720.1984) |
| 133 | m/z = 692.8220 (C49H32N4O, 692.2576) |
| 134 | m/z = 692.8220 (C49H32N4O, 692.2576) |
| 135 | m/z = 692.8220 (C49H32N4O, 692.2576) |
| 136 | m/z = 692.8220 (C49H32N4O, 692.2576) |
| 137 | m/z = 628.7350 (C44H28N4O, 628.2263) |
| 138 | m/z = 626.7190 (C44H26N4O, 626.2107) |
| 139 | m/z = 645.7800 (C44H27N3OS, 645.1875) |
| 140 | m/z = 695.8400 (C48H29N3OS, 695.2031) |
| 141 | m/z = 589.6980 (C42H27N3O, 589.2154) |
| 142 | m/z = 639.7580 (C46H29N3O, 639.2311) |
| 143 | m/z = 629.7190 (C44H27N3O2, 629.2103) |
| 144 | m/z = 679.7790 (C48H29N3O2, 679.2260) |
| 145 | m/z = 616.7240 (C43H28N4O, 616.2263) |
| 146 | m/z = 666.7840 (C47H30N4O, 666.2420) |
| 147 | m/z = 614.7080 (C43H26N4O, 614.2107) |
| 148 | m/z = 690.8060 (C49H30N4O, 690.2420) |
| 149 | m/z = 664.7680 (C47H28N4O, 664.2263) |
| 150 | m/z = 664.7680 (C47H28N4O, 664.2263) |
| 151 | m/z = 690.8060 (C49H30N4O, 690.2420) |
| 152 | m/z = 664.7680 (C47H28N4O, 664.2263) |
| 153 | m/z = 704.7890 (C49H28N4O2, 704.2212) |
| 154 | m/z = 720.8500 (C49H28N4OS, 720.1984) |
| 155 | m/z = 704.7890 (C49H28N4O2, 704.2212) |
| 156 | m/z = 720.8500 (C49H28N4OS, 720.1984) |
| 157 | m/z = 692.8220 (C49H32N4O, 692.2576) |
| 158 | m/z = 692.8220 (C49H32N4O, 692.2576) |
| 159 | m/z = 692.8220 (C49H32N4O, 692.2576) |
| 160 | m/z = 692.8220 (C49H32N4O, 692.2576) |
| 161 | m/z = 628.7350 (C44H28N4O, 628.2263) |
| 162 | m/z = 626.7190 (C44H26N4O, 626.2107) |
| 163 | m/z = 645.7800 (C44H27N3OS, 645.1875) |
| 164 | m/z = 695.8400 (C48H29N3OS, 695.2031) |
| 165 | m/z = 589.6980 (C42H27N3O, 589.2154) |
| 166 | m/z = 639.7580 (C46H29N3O, 639.2311) |
| 167 | m/z = 629.7190 (C44H27N3O2, 629.2103) |
| 168 | m/z = 679.7790 (C48H29N3O2, 679.2260) |
| 169 | m/z = 645.7800 (C44H27N3OS, 645.1875) |
| 170 | m/z = 695.8400 (C48H29N3OS, 695.2031) |
| 171 | m/z = 589.6980 (C42H27N3O, 589.2154) |
| 172 | m/z = 639.7580 (C46H29N3O, 639.2311) |
| 173 | m/z = 629.7190 (C44H27N3O2, 629.2103) |
| 174 | m/z = 679.7790 (C48H29N3O2, 679.2260) |
| 175 | m/z = 645.7800 (C44H27N3OS, 645.1875) |
| 176 | m/z = 695.8400 (C48H29N3OS, 695.2031) |
| 177 | m/z = 589.6980 (C42H27N3O, 589.2154) |
| 178 | m/z = 639.7580 (C46H29N3O, 639.2311) |
| 179 | m/z = 629.7190 (C44H27N3O2, 629.2103) |
| 180 | m/z = 679.7790 (C48H29N3O2, 679.2260) |
| 181 | m/z = 645.7800 (C44H27N3OS, 645.1875) |
| 182 | m/z = 695.8400 (C48H29N3OS, 695.2031) |
| 183 | m/z = 589.6980 (C42H27N3O, 589.2154) |
| 184 | m/z = 639.7580 (C46H29N3O, 639.2311) |
| 185 | m/z = 629.7190 (C44H27N3O2, 629.2103) |
| 186 | m/z = 679.7790 (C48H29N3O2, 679.2260) |
| 187 | m/z = 645.7800 (C44H27N3OS, 645.1875) |
| 188 | m/z = 695.8400 (C48H29N3OS, 695.2031) |
| 189 | m/z = 589.6980 (C42H27N3O, 589.2154) |
| 190 | m/z = 639.7580 (C46H29N3O, 639.2311) |
| 191 | m/z = 629.7190 (C44H27N3O2, 629.2103) |
| 192 | m/z = 679.7790 (C48H29N3O2, 679.2260) |
| 193 | m/z = 643.7640 (C44H25N3OS, 643.1718) |
| 194 | m/z = 693.8240 (C48H27N3OS, 693.1875) |
| 195 | m/z = 587.6820 (C42H25N3O, 587.1998) |
| 196 | m/z = 637.7420 (C46H27N3O, 637.2154) |
| 197 | m/z = 627.7030 (C44H25N3O2, 627.1947) |
| 198 | m/z = 677.7630 (C48H27N3O2, 677.2103) |
| 199 | m/z = 664.7680 (C47H28N4O, 664.2263) |
| 200 | m/z = 693.8240 (C48H27N3OS, 693.1875) |
| 201 | m/z = 587.6820 (C42H25N3O, 587.1998) |
| 202 | m/z = 637.7420 (C46H27N3O, 637.2154) |
| 203 | m/z = 627.7030 (C44H25N3O2, 627.1947) |
| 204 | m/z = 677.7630 (C48H27N3O2, 677.2103) |
| 205 | m/z = 643.7640 (C44H25N3OS, 643.1718) |

TABLE 6-continued

| Compound | FD-Mass |
|---|---|
| 206 | m/z = 693.8240 (C48H27N3OS, 693.1875) |
| 207 | m/z = 587.6820 (C42H25N3O, 587.1998) |
| 208 | m/z = 637.7420 (C46H27N3O, 637.2154) |
| 209 | m/z = 627.7030 (C44H25N3O2, 627.1947) |
| 210 | m/z = 677.7630 (C48H27N3O2, 677.2103) |
| 211 | m/z = 643.7640 (C44H25N3OS, 643.1718) |
| 212 | m/z = 693.8240 (C48H27N3OS, 693.1875) |
| 213 | m/z = 587.6820 (C42H25N3O, 587.1998) |
| 214 | m/z = 637.7420 (C46H27N3O, 637.2154) |
| 215 | m/z = 627.7030 (C44H25N3O2, 627.1947) |
| 216 | m/z = 677.7630 (C48H27N3O2, 677.2103) |
| 217 | m/z = 829.9630 (C59H35N5O, 829.2842) |
| 218 | m/z = 809.9870 (C57H35N3OS, 809.2501) |
| 219 | m/z = 752.8770 (C54H32N4O, 752.2576) |
| 220 | m/z = 802.9370 (C58H34N4O, 802.2733) |
| 221 | m/z = 733.8450 (C50H27N3O2S, 733.1824) |
| 222 | m/z = 767.8440 (C54H29N3O3, 767.2209) |
| 223 | m/z = 768.9200 (C55H36N4O, 768.2889) |
| 224 | m/z = 742.8820 (C53H34N4O, 742.2733) |
| 225 | m/z = 742.8820 (C53H34N4O, 742.2733) |
| 226 | m/z = 764.8880 (C55H32N4O, 764.2576) |
| 227 | m/z = 808.9850 (C58H40N4O, 808.3202) |
| 228 | m/z = 714.8280 (C51H30N4O, 714.2420) |
| 229 | m/z = 693.8240 (C48H27N3OS, 693.1875) |
| 230 | m/z = 743.8840 (C52H29N3OS, 743.2031) |
| 231 | m/z = 637.7420 (C46H27N3O, 637.2154) |
| 232 | m/z = 687.8020 (C50H29N3O, 687.2311) |
| 233 | m/z = 677.7630 (C48H27N3O2, 677.2103) |
| 234 | m/z = 727.8230 (C52H29N3O2, 727.2260) |
| 235 | m/z = 693.8240 (C48H27N3OS, 693.1875) |
| 236 | m/z = 743.8840 (C52H29N3OS, 743.2031) |
| 237 | m/z = 637.7420 (C46H27N3O, 637.2154) |
| 238 | m/z = 687.8020 (C50H29N3O, 687.2311) |
| 239 | m/z = 677.7630 (C48H27N3O2, 677.2103) |
| 240 | m/z = 727.8230 (C52H29N3O2, 727.2260) |
| 241 | m/z = 692.8220 (C49H32N4O, 692.2576) |
| 242 | m/z = 742.8820 (C53H34N4O, 742.2733) |
| 243 | m/z = 690.8060 (C49H30N4O, 690.2420) |
| 244 | m/z = 730.8710 (C52H34N4O, 730.2733) |
| 245 | m/z = 754.8490 (C53H30N4O2, 754.2369) |
| 246 | m/z = 770.9100 (C53H30N4OS, 770.2140) |
| 247 | m/z = 740.8660 (C53H32N4O, 740.2576) |
| 248 | m/z = 738.8500 (C53H30N4O, 738.2420) |
| 249 | m/z = 720.8500 (C49H28N4OS, 720.1984) |
| 250 | m/z = 690.8060 (C49H30N4O, 690.2420) |
| 251 | m/z = 690.8060 (C49H30N4O, 690.2420) |
| 252 | m/z = 664.7680 (C47H28N4O, 664.2263) |
| 253 | m/z = 808.9850 (C58H40N4O, 808.3202) |
| 254 | m/z = 664.7680 (C47H28N4O, 664.2263) |
| 255 | m/z = 692.8220 (C49H32N4O, 692.2576) |
| 256 | m/z = 732.8870 (C52H36N4O, 732.2889) |
| 257 | m/z = 808.9850 (C58H40N4O, 808.3202) |
| 258 | m/z = 614.7080 (C43H26N4O, 614.2107) |
| 259 | m/z = 765.9160 (C56H35N3O, 765.2780) |
| 260 | m/z = 614.7080 (C43H26N4O, 614.2107) |
| 261 | m/z = 690.8060 (C49H30N4O, 690.2420) |
| 262 | m/z = 664.7680 (C47H28N4O, 664.2263) |
| 263 | m/z = 714.8280 (C51H30N4O, 714.2420) |
| 264 | m/z = 714.8280 (C51H30N4O, 714.2420) |
| 265 | m/z = 664.7680 (C47H28N4O, 664.2263) |
| 266 | m/z = 690.8060 (C49H30N4O, 690.2420) |
| 267 | m/z = 690.8060 (C49H30N4O, 690.2420) |
| 268 | m/z = 779.9030 (C55H35N5O, 779.2685) |
| 269 | m/z = 779.9030 (C55H35N5O, 779.2685) |
| 270 | m/z = 779.9030 (C55H35N5O, 779.2685) |
| 271 | m/z = 720.8500 (C49H28N4OS, 720.1984) |
| 272 | m/z = 720.8500 (C49H28N4OS, 720.1984) |
| 273 | m/z = 720.8500 (C49H28N4OS, 720.1984) |
| 274 | m/z = 704.7890 (C49H28N4O2, 704.2212) |
| 275 | m/z = 704.7890 (C49H28N4O2, 704.2212) |
| 276 | m/z = 704.7890 (C49H28N4O2, 704.2212) |
| 277 | m/z = 770.9100 (C53H30N4OS, 770.2140) |
| 278 | m/z = 770.9100 (C53H30N4OS, 770.2140) |
| 279 | m/z = 770.9100 (C53H30N4OS, 770.2140) |
| 280 | m/z = 754.8490 (C53H30N4O2, 754.2369) |
| 281 | m/z = 754.8490 (C53H30N4O2, 754.2369) |
| 282 | m/z = 754.8490 (C53H30N4O2, 754.2369) |
| 283 | m/z = 829.9630 (C59H35N5O, 829.2842) |

TABLE 6-continued

| Compound | FD-Mass |
|---|---|
| 284 | m/z = 829.9630 (C59H35N5O, 829.2842) |
| 285 | m/z = 829.9630 (C59H35N5O, 829.2842) |
| 286 | m/z = 780.9310 (C56H36N4O, 730.2889) |
| 287 | m/z = 780.9310 (C56H36N4O, 730.2889) |
| 288 | m/z = 780.9310 (C56H36N4O, 730.2889) |
| 289 | m/z = 798.9640 (C55H34N4OS, 798.2458) |
| 290 | m/z = 782.9030 (C55H34N4O2, 782.2682) |
| 291 | m/z = 690.8060 (C49H30N4O, 690.2420) |
| 292 | m/z = 782.9030 (C55H34N4O2, 782.2682) |
| 293 | m/z = 845.0180 (C61H40N4O, 844.3202) |
| 294 | m/z = 740.8660 (C53H32N4O, 740.2576) |
| 295 | m/z = 782.9030 (C55H34N4O2, 782.2682) |
| 296 | m/z = 690.8060 (C49H30N4O, 690.2420) |
| 297 | m/z = 798.9640 (C55H34N4OS, 798.2458) |
| 298 | m/z = 740.8660 (C53H32N4O, 740.2576) |
| 299 | m/z = 798.9640 (C55H34N4OS, 798.2458) |
| 300 | m/z = 740.8660 (C53H32N4O, 740.2576) |

<Experimental Example 1> Manufacture of Organic Light Emitting Device

1) Manufacture of Organic Light Emitting Device

A glass substrate on which indium tin oxide (ITO) was coated as a thin film to a thickness of 1,500 Å was cleaned with distilled water ultrasonic waves. After the cleaning with distilled water was finished, the substrate was ultrasonic cleaned with solvents such as acetone, methanol and isopropyl alcohol, then dried, and ultraviolet ozone (UNVO) treatment was conducted for 5 minutes using LIV in a ultraviolet (UV) cleaner. After that, the substrate was transferred to a plasma cleaner (PT), and after conducting plasma treatment under vacuum for ITO work function and residual film removal, the substrate was transferred to a thermal deposition apparatus for organic deposition.

On the transparent ITO electrode (anode), a hole injection layer 2-TNATA (4,4',4"-tris[2-naphthyl(phenyl)amino]triphenylamine) and a hole transfer layer NPB (N,N'-di(1-naphthyl)-N,N'-diphenyl-(1,1'-biphenyl)-4,4'-diamine), which are common layers, were formed.

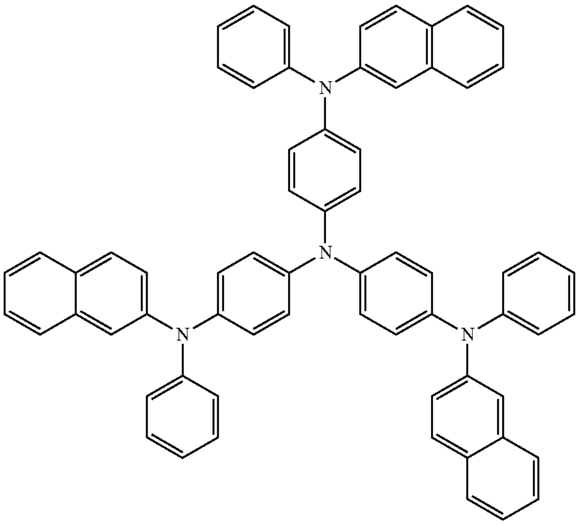

2-TNATA

-continued

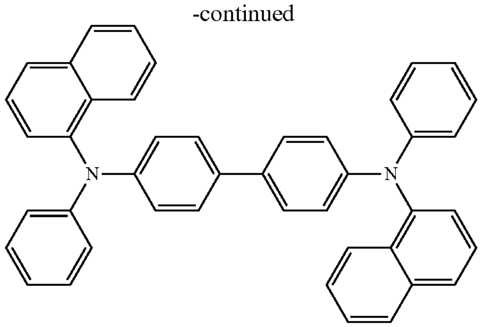

NPB

A light emitting layer was thermal vacuum deposited thereon as follows. The light emitting layer was deposited to 500 Å using a compound described in the following Table 7 as a red host, and doping $(piq)_2(Ir)(acac)$ (bis(1-phenylisoquinoline)(acetylacetonate)iridium(III)) to the host by 3% as a red phosphorescent dopant. After that, BCP (2,9-dimethyl-4,7-diphenyl-1,10-phenanthroline) was deposited to 60 Å as a hole blocking layer, and $Alq_3$ was deposited to 200 Å thereon as an electron transfer layer. Lastly, an electron injection layer was formed on the electron transfer layer by depositing lithium fluoride (LiF) to a thickness of 10 Å, and then a cathode was formed on the electron injection layer by depositing an aluminum (Al) cathode to a thickness of 1,200 Å, and as a result, an organic electroluminescent device was manufactured.

Meanwhile, all the organic compounds required to manufacture the OLED were vacuum sublimation purified under $10^{-8}$ torr to $10^{-6}$ torr for each material to be used in the OLED manufacture.

For each of the organic electroluminescent devices manufactured as above, electroluminescent (EL) properties were measured using M7000 manufactured by McScience Inc., and with the measurement results, $T_{90}$ was measured when standard luminance was 6,000 cd/m$^2$ through a lifetime measurement system (M6000) manufactured by McScience Inc. Properties of the organic electroluminescent device of the present disclosure are as shown in the following Table 7.

TABLE 7

| | Compound | Driving Voltage (V) | Efficiency (cd/A) | Color Coordinate (x, y) | Lifetime ($T_{90}$) |
|---|---|---|---|---|---|
| Comparative Example 1-1 | Comparative Compound A | 5.35 | 14.5 | 0.673, 0.328 | 60 |
| Comparative Example 1-2 | Comparative Compound B | 5.74 | 13.19 | 0.677, 0.324 | 45 |
| Comparative Example 1-3 | Comparative Compound C | 5.50 | 13.7 | 0.680, 0.319 | 57 |
| Comparative Example 1-4 | Comparative Compound D | 5.70 | 14.5 | 0.677, 0.322 | 55 |
| Example 1-1 | Compound 2 | 3.99 | 22.0 | 0.679, 0.321 | 88 |
| Example 1-2 | Compound 4 | 4.19 | 18.9 | 0.685, 0.316 | 113 |
| Example 1-3 | Compound 8 | 4.10 | 22.8 | 0.688, 0.311 | 108 |
| Example 1-4 | Compound 11 | 4.21 | 21.2 | 0.685, 0.314 | 103 |
| Example 1-5 | Compound 23 | 4.10 | 24.9 | 0.678, 0.320 | 122 |
| Example 1-6 | Compound 49 | 4.10 | 22.7 | 0.679, 0.321 | 105 |
| Example 1-7 | Compound 57 | 4.26 | 18.9 | 0.685, 0.315 | 107 |

TABLE 7-continued

| | Compound | Driving Voltage (V) | Efficiency (cd/A) | Color Coordinate (x, y) | Lifetime ($T_{90}$) |
|---|---|---|---|---|---|
| Example 1-8 | Compound 59 | 4.19 | 21.0 | 0.681, 0.318 | 109 |
| Example 1-9 | Compound 82 | 4.20 | 18.5 | 0.692, 0.307 | 102 |
| Example 1-10 | Compound 100 | 4.21 | 20.1 | 0.689, 0.311 | 111 |
| Example 1-11 | Compound 115 | 3.99 | 25.0 | 0.681, 0.317 | 87 |
| Example 1-12 | Compound 123 | 4.11 | 25.0 | 0.679, 0.322 | 120 |
| Example 1-13 | Compound 125 | 4.09 | 24.8 | 0.679, 0.321 | 119 |
| Example 1-14 | Compound 126 | 4.11 | 19.9 | 0.679, 0.320 | 99 |
| Example 1-15 | Compound 130 | 4.16 | 20.5 | 0.684, 0.316 | 100 |
| Example 1-16 | Compound 199 | 4.13 | 23.9 | 0.679, 0.322 | 122 |
| Example 1-17 | Compound 217 | 4.18 | 19.5 | 0.685, 0.314 | 98 |
| Example 1-18 | Compound 223 | 4.13 | 20.2 | 0.680, 0.319 | 96 |
| Example 1-19 | Compound 227 | 4.02 | 24.9 | 0.679, 0.321 | 89 |
| Example 1-20 | Compound 254 | 4.08 | 24.5 | 0.678, 0.326 | 121 |
| Example 1-21 | Compound 256 | 4.01 | 19.2 | 0.681, 0.320 | 92 |
| Example 1-22 | Compound 268 | 4.13 | 19.8 | 0.687, 0.313 | 99 |

(Comparative Compound A)

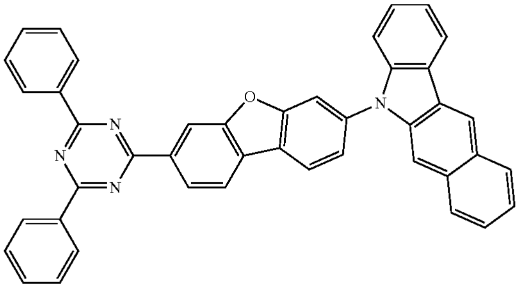 [SMILES: c1ccc(-c2nc(-c3ccccc3)nc(-c3ccc4c(c3)oc3cc(-n5c6ccccc6c6cc7ccccc7cc65)ccc34)n2)cc1]

(Comparative Compound B)

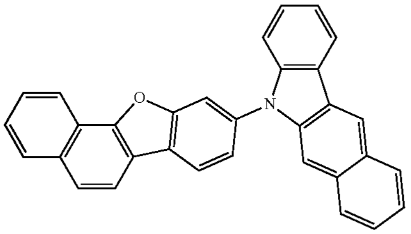 [SMILES: c1ccc2cc3c(cc2c1)c1ccccc1n3-c1ccc2c(c1)oc1c3ccccc3ccc21]

(Comparative Compound C)

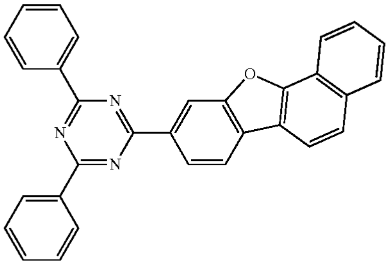 [SMILES: c1ccc(-c2nc(-c3ccccc3)nc(-c3ccc4c(c3)oc3c5ccccc5ccc43)n2)cc1]

TABLE 7-continued

| Compound | Driving Voltage (V) | Efficiency (cd/A) | Color Coordinate (x, y) | Lifetime ($T_{90}$) |
|---|---|---|---|---|

(Comparative Compound D)

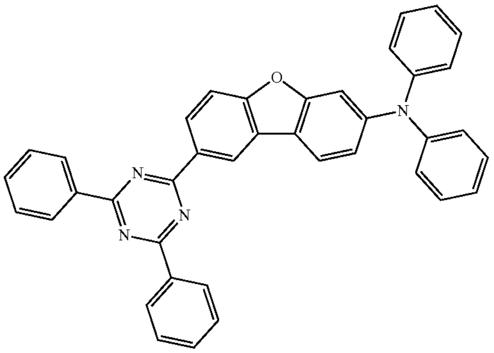 [SMILES: c1ccc(-c2nc(-c3ccccc3)nc(-c3ccc4oc5cc(N(c6ccccc6)c6ccccc6)ccc5c4c3)n2)cc1]

As seen from Table 7, it was identified that, when using the compound corresponding to Chemical Formula 1 in the light emitting layer of the organic light emitting device, excellent effects were obtained in the properties of lifetime, efficiency and driving voltage compared to the cases without the compound. Introducing naphthobenzofuran with increased n-conjugation to the dibenzofuran linker enables suitable use as a red host, and helps with better lifetime, efficiency and enhancement in driving voltage.

<Experimental Example 2> Manufacture of Organic Light Emitting Device (Red N+N Mixed Host)

A glass substrate on which ITO was coated as a thin film to a thickness of 1,500 Å was cleaned with distilled water ultrasonic waves. After the cleaning with distilled water was finished, the substrate was ultrasonic cleaned with solvents such as acetone, methanol and isopropyl alcohol, then dried, and UVO treatment was conducted for 5 minutes using UV in a UV cleaner. After that, the substrate was transferred to a plasma cleaner (PT), and after conducting plasma treatment under vacuum for ITO work function and residual film removal, the substrate was transferred to a thermal deposition apparatus for organic deposition.

On the transparent ITO electrode (anode), a hole injection layer 2-TNATA (4,4',4"-tris[2-naphthyl(phenyl)amino]triphenylamine) and a hole transfer layer NPB (N,N'-di(1-naphthyl)-N,N'-diphenyl-(1,1'-biphenyl)-4,4'-diamine), which are common layers, were formed.

A light emitting layer was thermal vacuum deposited thereon as follows. As the light emitting layer, two types of compounds described in the following Table 8 were premixed and deposited to 400 Å in one source of supply as a red host, and as a red phosphorescent dopant, $(piq)_2(Ir)(acac)$ was doped by 3% and deposited. After that, BCP was deposited to 60 Å as a hole blocking layer, and $Alq_3$ was deposited to 200 Å thereon as an electron transfer layer. Lastly, an electron injection layer was formed on the electron transfer layer by depositing lithium fluoride (LiF) to a thickness of 10 Å, and then a cathode was formed on the electron injection layer by depositing an aluminum (Al) cathode to a thickness of 1,200 Å, and as a result, an organic electroluminescent device was manufactured.

Meanwhile, all the organic compounds required to manufacture the OLED were vacuum sublimation purified under $10^{-8}$ torr to $10^{-6}$ torr for each material to be used in the OLED manufacture.

For each of the organic electroluminescent devices manufactured as above, electroluminescent (EL) properties were measured using M7000 manufactured by McScience Inc., and with the measurement results, $T_{90}$ was measured when standard luminance was 6,000 cd/$m^2$ through a lifetime measurement system (M6000) manufactured by McScience Inc. Properties of the organic electroluminescent device of the present disclosure are as shown in the following Table 8.

TABLE 8

| | Light Emitting Layer Compound | Ratio (N:N) | Driving Voltage (V) | Efficiency (cd/A) | Color Coordinate (x, y) | Lifetime ($T_{90}$) |
|---|---|---|---|---|---|---|
| Example 2-1 | Compound 23:2 | 1:1 | 4.17 | 24.9 | 0.679, 0.321 | 381 |
| Example 2-2 | Compound 123:115 | 1:1 | 4.18 | 25.6 | 0.681, 0.319 | 373 |
| Example 2-3 | Compound 125:133 | 1:1 | 4.25 | 24.9 | 0.681, 0.319 | 369 |
| Example 2-4 | Compound 199:223 | 1:1 | 4.26 | 24.0 | 0.680, 0.320 | 371 |
| Example 2-5 | Compound 254:227 | 1:1 | 4.20 | 26.5 | 0.681, 0.319 | 408 |
| Example 2-6 | Compound 268:255 | 1:1 | 4.26 | 26.1 | 0.680, 0.320 | 405 |
| Example 2-7 | Compound 291:256 | 1:1 | 4.28 | 24.2 | 0.679, 0.321 | 377 |

<Experimental Example 3> Manufacture of Organic Light Emitting Device (Red N+P Mixed Host)

A glass substrate on which ITO was coated as a thin film to a thickness of 1,500 Å was cleaned with distilled water ultrasonic waves. After the cleaning with distilled water was finished, the substrate was ultrasonic cleaned with solvents such as acetone, methanol and isopropyl alcohol, then dried, and UVO treatment was conducted for 5 minutes using UV in a UV cleaner. After that, the substrate was transferred to a plasma cleaner (PT), and after conducting plasma treatment under vacuum for ITO work function and residual film removal, the substrate was transferred to a thermal deposition apparatus for organic deposition.

On the transparent ITO electrode (anode), a hole injection layer 2-TNATA (4,4',4"-tris[2-naphthyl(phenyl)amino]triphenylamine) and a hole transfer layer NPB (N,N'-di(1-naphthyl)-N,N'-diphenyl-(1,1'-biphenyl)-4,4'-diamine), which are common layers, were formed.

A light emitting layer was thermal vacuum deposited thereon as follows. As the light emitting layer, two types of compounds described in the following Table 9 were pre-mixed and deposited to 400 Å in one source of supply as a red host, and as a red phosphorescent dopant, $(piq)_2(Ir)(acac)$ was doped by 3% and deposited. After that, BCP was deposited to 60 Å as a hole blocking layer, and $Alq_3$ was deposited to 200 Å thereon as an electron transfer layer. Lastly, an electron injection layer was formed on the electron transfer layer by depositing lithium fluoride (LiF) to a thickness of 10 Å, and then a cathode was formed on the electron injection layer by depositing an aluminum (Al) cathode to a thickness of 1,200 Å, and as a result, an organic electroluminescent device was manufactured.

Meanwhile, all the organic compounds required to manufacture the OLED were vacuum sublimation purified under $10^{-8}$ torr to $10^{-6}$ torr for each material to be used in the OLED manufacture.

For each of the organic electroluminescent devices manufactured as above, electroluminescent (EL) properties were measured using M7000 manufactured by McScience Inc., and with the measurement results, $T_{90}$ was measured when standard luminance was 6,000 cd/$m^2$ through a lifetime measurement system (M6000) manufactured by McScience Inc. Properties of the organic electroluminescent device of the present disclosure are as shown in the following Table 9.

TABLE 9

| | Light Emitting Layer Compound | Ratio (N:P) | Driving Voltage (V) | Efficiency (cd/A) | Color (x, y) | Lifetime ($T_{90}$) |
|---|---|---|---|---|---|---|
| Example 3-1 | Compound 2:P-Host A | 3:1 | 4.05 | 28.5 | 0.673, 0.327 | 411 |
| Example 3-2 | Compound 2:P-Host A | 2:1 | 4.11 | 26.0 | 0.677, 0.323 | 399 |
| Example 3-3 | Compound 2:P-Host A | 1:1 | 4.23 | 24.6 | 0.674, 0.325 | 375 |
| Example 3-4 | Compound 2:P-Host A | 1:2 | 4.35 | 22.7 | 0.679, 0.321 | 354 |
| Example 3-5 | Compound 2:P-Host A | 1:3 | 4.70 | 20.4 | 0.677, 0.323 | 341 |
| Example 3-6 | Compound 223:P-Host B | 3:1 | 4.12 | 28.9 | 0.674, 0.326 | 422 |
| Example 3-7 | Compound 223:P-Host B | 2:1 | 4.20 | 25.8 | 0.685, 0.315 | 415 |
| Example 3-8 | Compound 223:P-Host B | 1:1 | 4.31 | 23.2 | 0.681, 0.319 | 379 |
| Example 3-9 | Compound 223:P-Host B | 1:2 | 4.43 | 22.6 | 0.680, 0.319 | 350 |
| Example 3-10 | Compound 223:P-Host B | 1:3 | 4.68 | 20.2 | 0.682, 0.317 | 339 |
| Example 3-11 | Compound 115:P-Host C | 3:1 | 4.09 | 26.1 | 0.682, 0.318 | 407 |
| Example 3-12 | Compound 227:P-Host D | 3:1 | 4.13 | 27.8 | 0.682, 0.318 | 412 |
| Example 3-13 | Compound 256:P-Host E | 3:1 | 4.15 | 26.1 | 0.684, 0.316 | 388 |

TABLE 9-continued
| | Light Emitting Layer Compound | Ratio (N:P) | Driving Voltage (V) | Efficiency (cd/A) | Color (x, y) | Lifetime ($T_{90}$) |
|---|---|---|---|---|---|---|
| Example 3-14 | Compound 103:P-Host C | 3:1 | 4.28 | 29.3 | 0.681, 0.319 | 380 |
| Example 3-15 | Compound 133:P-Host D | 3:1 | 4.29 | 25.2 | 0.680, 0.320 | 401 |
| Example 3-16 | Compound 255:P-Host E | 3:1 | 4.24 | 27.6 | 0.679, 0.321 | 411 |
P-Host A
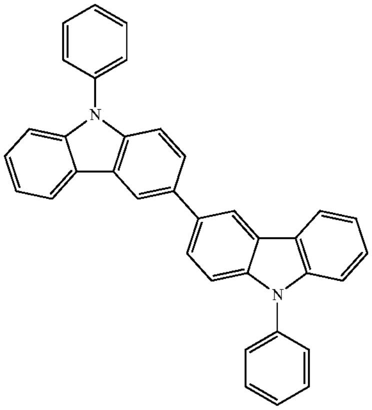 [SMILES: c1ccc(-n2c3ccccc3c3cc(-c4ccc5c(c4)c4ccccc4n5-c4ccccc4)ccc32)cc1]
P-Host B
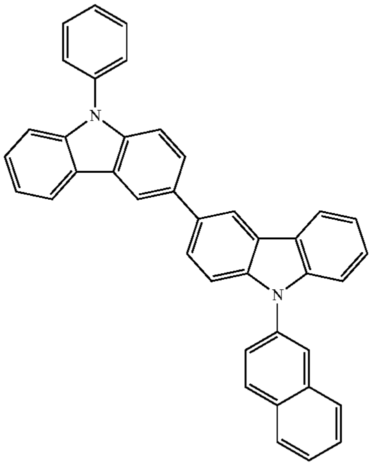 [SMILES: c1ccc(-n2c3ccccc3c3cc(-c4ccc5c(c4)c4ccccc4n5-c4ccc5ccccc5c4)ccc32)cc1]
P-Host C
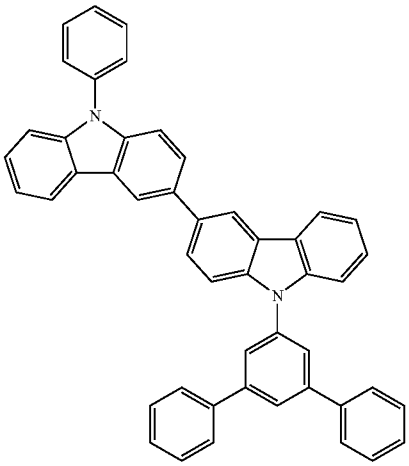 [SMILES: c1ccc(-c2cc(-c3ccccc3)cc(-n3c4ccccc4c4cc(-c5ccc6c(c5)c5ccccc5n6-c5ccccc5)ccc43)c2)cc1]

TABLE 9-continued

| Light Emitting Layer Compound | Ratio (N:P) | Driving Voltage (V) | Efficiency (cd/A) | Color (x, y) | Lifetime ($T_{90}$) |
|---|---|---|---|---|---|

P-Host D

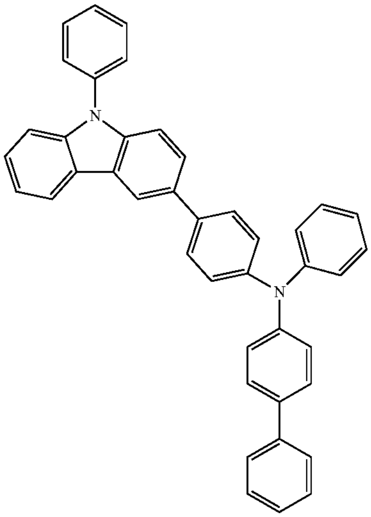 [SMILES: c1ccc(-c2ccc(N(c3ccccc3)c3ccc(-c4ccc5c(c4)c4ccccc4n5-c4ccccc4)cc3)cc2)cc1]

P-Host E

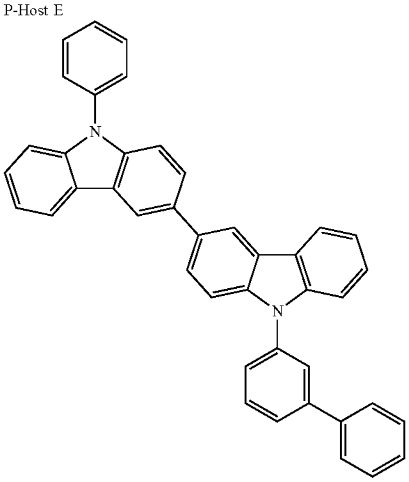

As seen from Tables 8 and 9, effects of more superior efficiency and lifetime were obtained when including both the N+N or N+P compounds in the organic material layer of the organic light emitting device. Such results may lead to a forecast that an exciplex phenomenon occurs when including the two compounds at the same time. Particularly, the exciplex phenomenon of the N+P compounds is a phenomenon of releasing energy having sizes of a donor (p-host) HOMO level and an acceptor (n-host) LUMO level due to electron exchanges between two molecules. When a donor (p-host) having a favorable hole transfer ability and an acceptor (n-host) having a favorable electron transfer ability are used as a host of a light emitting layer, holes are injected to the p-host and electrons are injected to the n-host, and therefore, a driving voltage may decrease, which resultantly helps with enhancement in the lifetime.

The invention claimed is:

1. A heterocyclic compound represented by the following Chemical Formula 1-1 or 1-2:

[Chemical Formula 1-1]

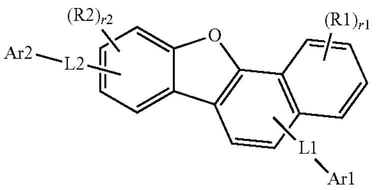

[Chemical Formula 1-2]

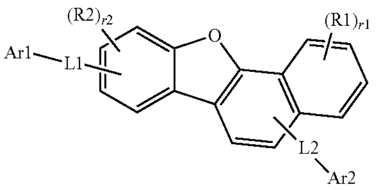

wherein, in Chemical Formulae 1-1 and 1-2,

L1 and L2 are each independently a direct bond; a substituted or unsubstituted C6 to C60 arylene group; or a substituted or unsubstituted divalent C2 to C60 heterocyclic group, Ar1 is represented by the following Chemical Formula 2,

[Chemical Formula 2]

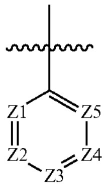

in Chemical Formula 2,

Z1 to Z5 are each CR or N, and at least one thereof is N,

R is hydrogen; deuterium; a halogen group; a substituted or unsubstituted C1 to C60 alkyl group; a substituted or unsubstituted C3 to C60 cycloalkyl group; a substituted or unsubstituted C6 to C60 aryl group; or a substituted or unsubstituted C2 to C60 heterocyclic group, or two or more groups adjacent to each other bond to each other to form a substituted or unsubstituted C3 to C60 aliphatic hydrocarbon ring; a substituted or unsubstituted C6 to C60 aromatic hydrocarbon ring; or a substituted or unsubstituted C2 to C60 heteroring, Ar2 is —N(R106)(R107); or represented by the following Chemical Formula 4,

[Chemical Formula 4]

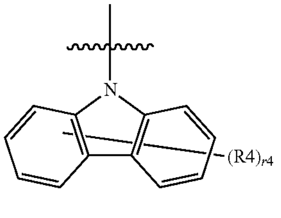

in Chemical Formula 4,

R4 is hydrogen; deuterium; a halogen group; a substituted or unsubstituted C1 to C60 alkyl group; a substituted or unsubstituted C3 to C60 cycloalkyl group; a substituted or unsubstituted C6 to C60 aryl group; or a substituted or unsubstituted C2 to C60 heterocyclic group, or two or more groups adjacent to each other bond to each other to form a substituted or unsubstituted C3 to C60 aliphatic hydrocarbon ring; a substituted or unsubstituted C6 to C60 aromatic hydrocarbon ring; or a C2 to C60 heteroring, r4 is an integer of 1 to 8, when r4 is 2 or greater, substituents in the parentheses are the same as or different from each other, R1 and R2 are each independently hydrogen; or deuterium, R106 and R107 are each independently hydrogen; deuterium; a halogen group; an alkyl group; an alkenyl group; an alkoxy group; a cycloalkyl group; an aryl group; or a heterocyclic group, r1 is an integer of 1 to 4, r2 is an integer of 1 to 3, and when r1 and r2 are each 2 or greater, substituents in the parentheses are the same as or different from each other.

2. The heterocyclic compound of claim 1, wherein Ar1 is selected from among the following structural formulae:

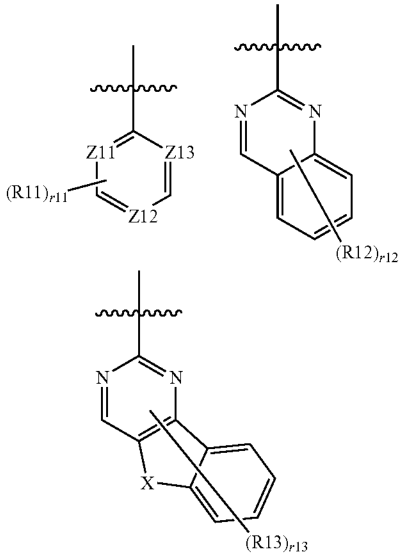

in the structural formulae,

X is O; S; or NR,

Z11 to Z13 are each independently CR' or N, and at least two thereof are N,

R, R' and R11 to R13 are each independently hydrogen; deuterium; a halogen group; a substituted or unsubstituted C1 to C60 alkyl group; a substituted or unsubstituted C3 to C60 cycloalkyl group; a substituted or unsubstituted C6 to C60 aryl group; or a substituted or unsubstituted C2 to C60 heterocyclic group, r11 is 1 or 2, r12 and r13 are each independently an integer of 1 to 5, and when r11 is 2 and r12 and r13 are each an integer of 2 or greater, substituents in the parentheses are the same as or different from each other.

3. The heterocyclic compound of claim 1, wherein Chemical Formula 4 is represented by any one of the following Chemical Formulae 4-1 to 4-5:

[Chemical Formula 4-1]

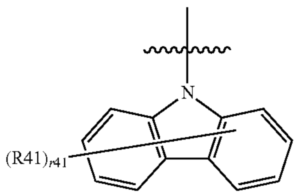

[Chemical Formula 4-2]

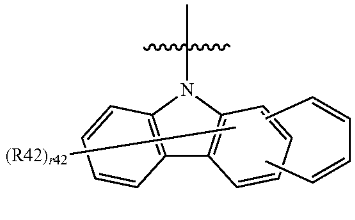

-continued

[Chemical Formula 4-3]

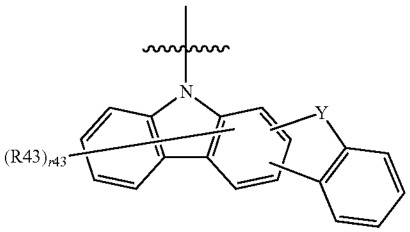

[Chemical Formula 4-4]

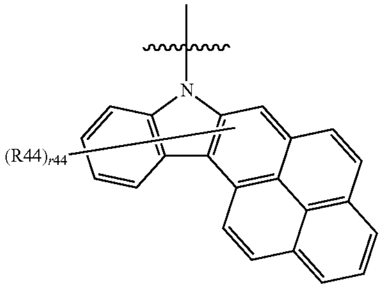

[Chemical Formula 4-5]

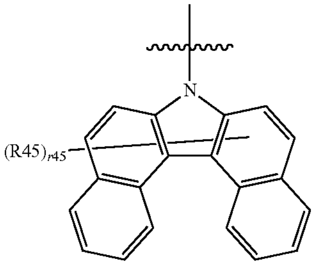

in Chemical Formulae 4-1 to 4-5,

Y is O; S; NR' or CR'R",

R', R" and R41 to R45 are each independently hydrogen; deuterium; a substituted or unsubstituted C1 to C60 alkyl group; a substituted or unsubstituted C6 to C60 aryl group; or a substituted or unsubstituted C2 to C60 heterocyclic group, r41 is an integer of 1 to 8, r42 and r43 are each an integer of 1 to 6, r44 is an integer of 1 to 5, r45 is an integer of 1 to 4, and when r41 to r45 are each 2 or greater, substituents in the parentheses are the same as or different from each other.

4. The heterocyclic compound of claim 1, wherein L1 and L2 are each independently a direct bond; or a phenylene group.

5. The heterocyclic compound of claim 1, wherein Chemical Formula 1 is represented by any one of the following compounds:

1

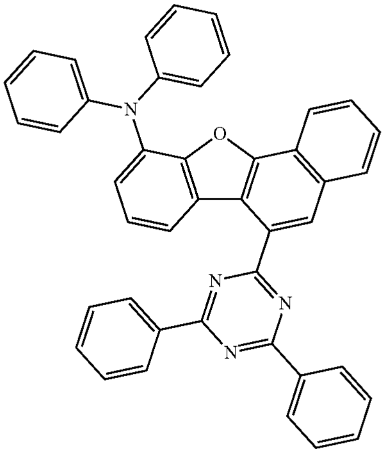

2

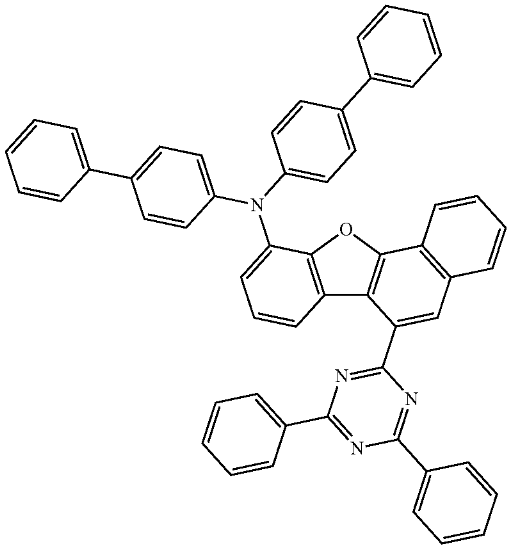

3

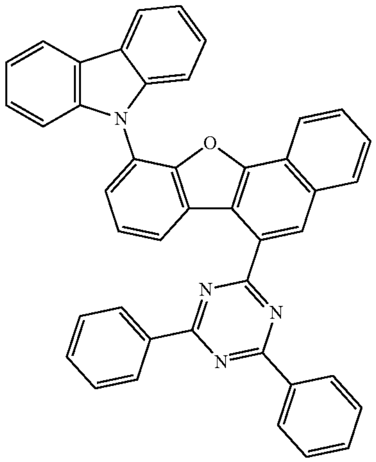

-continued
4
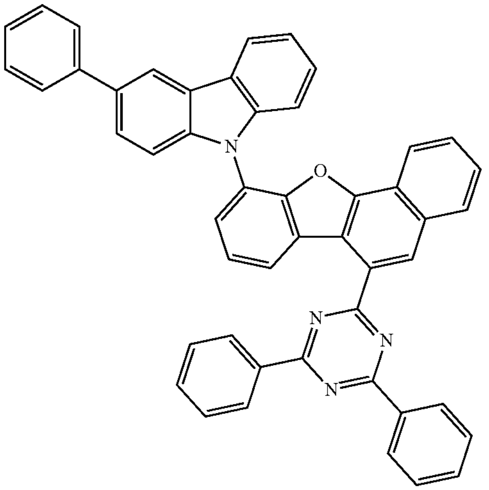
5
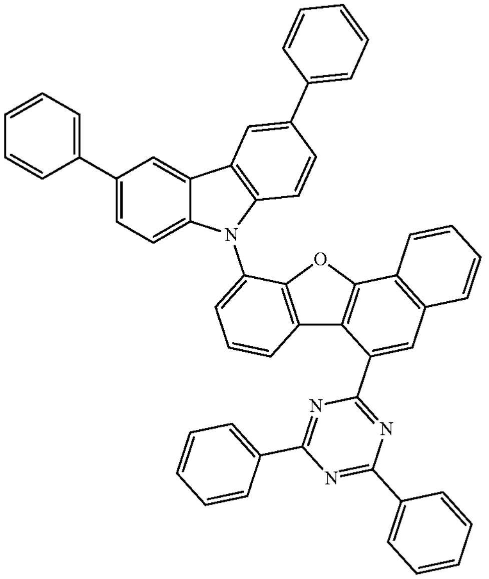
6
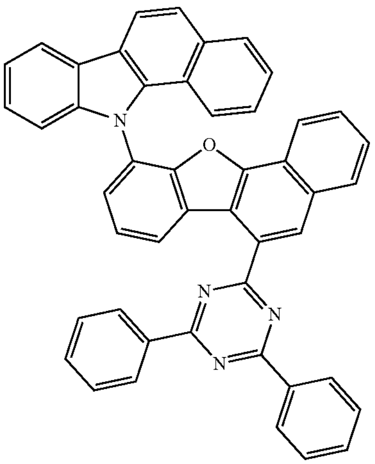
-continued
7
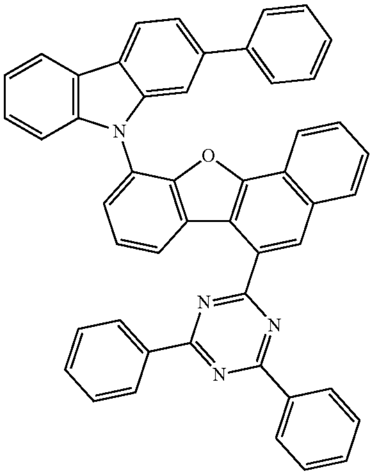
8
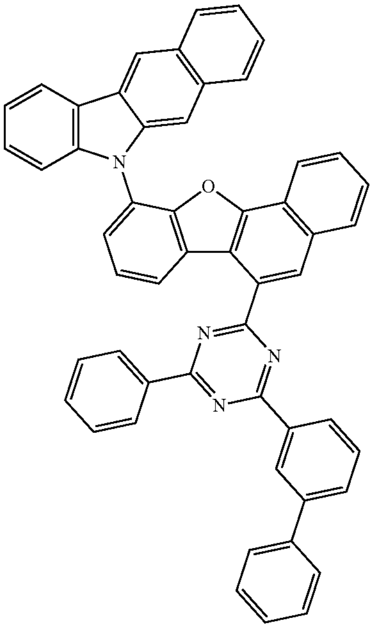
9
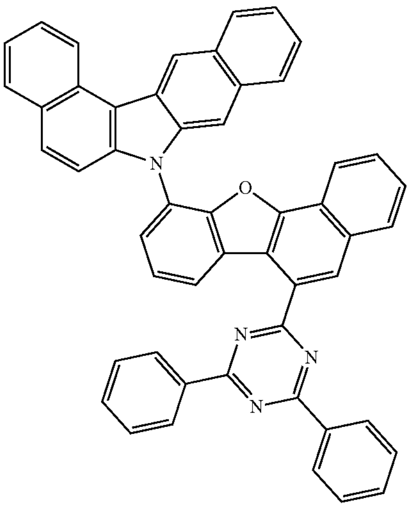

-continued
10
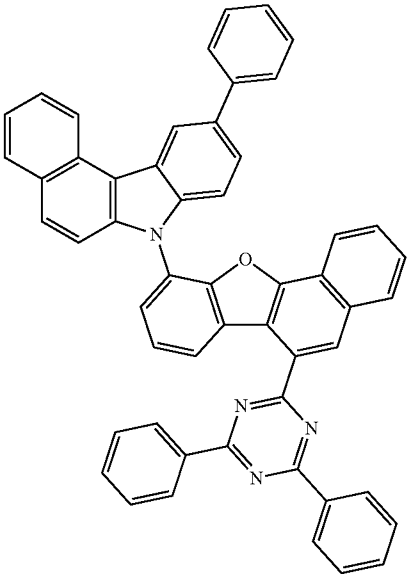
11
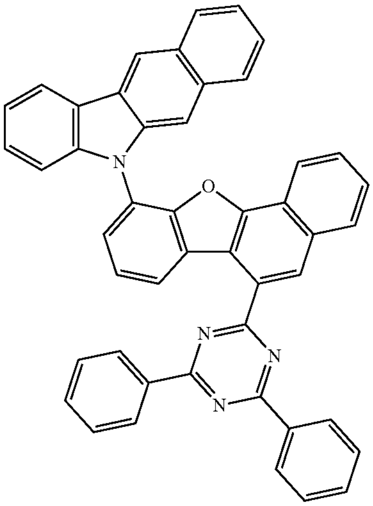
12
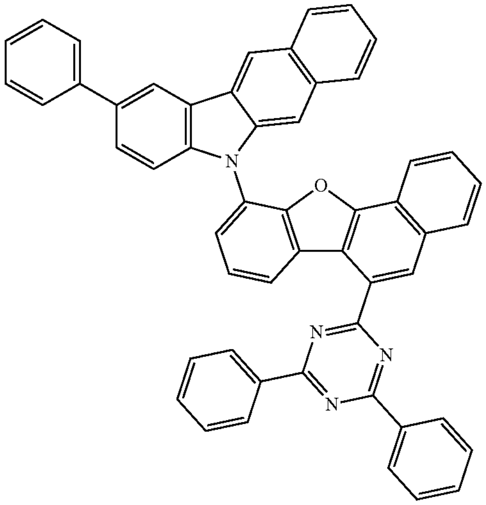
-continued
13
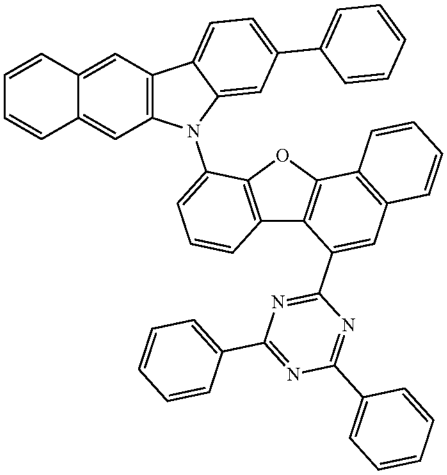
14
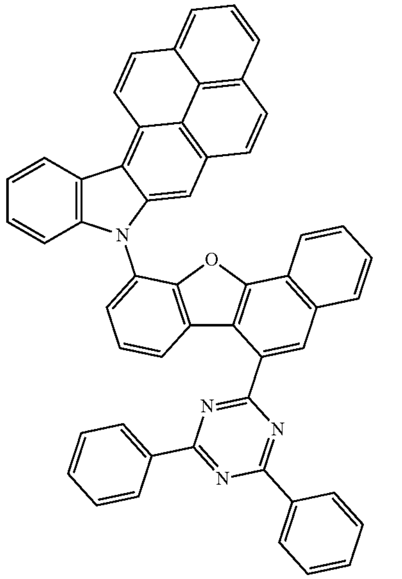
15
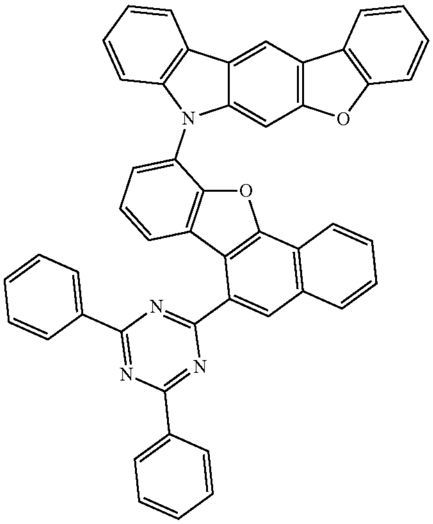

16
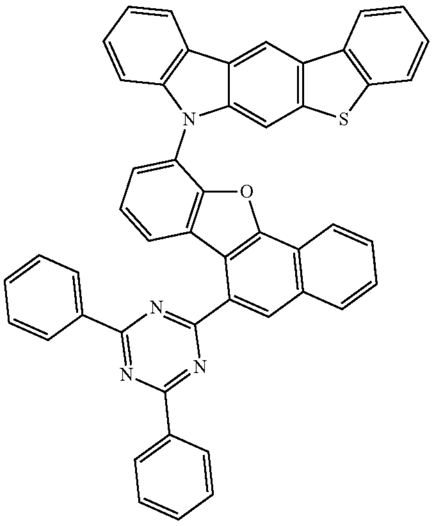
17
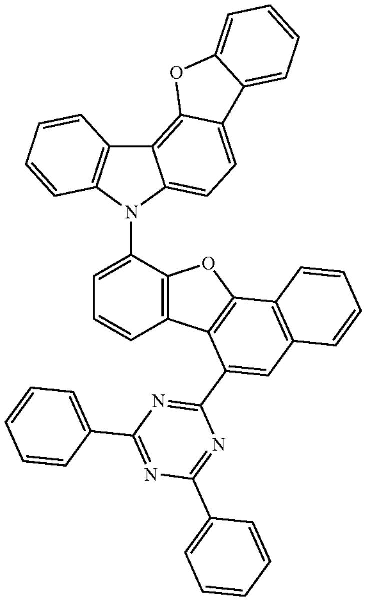
18
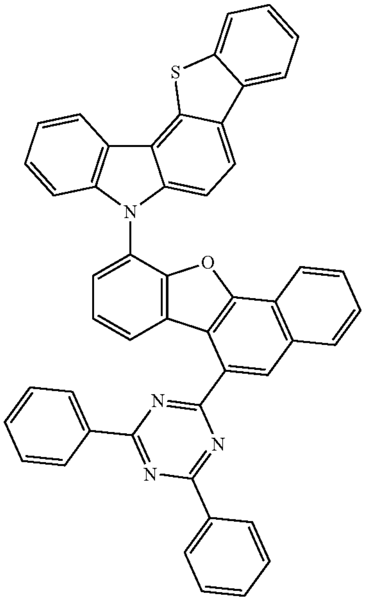
19
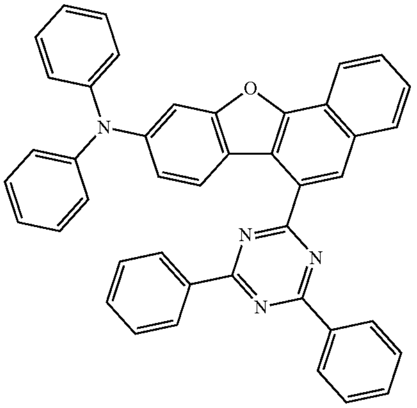
20
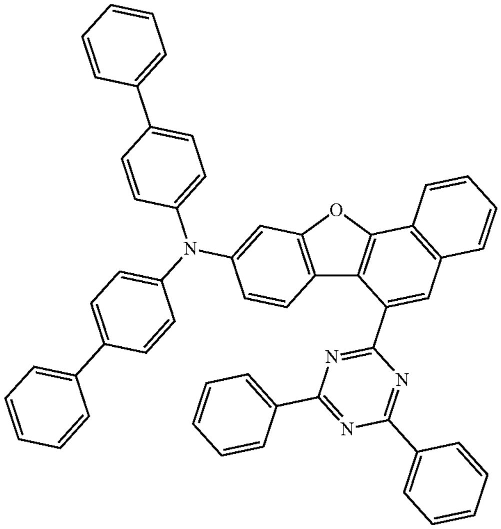

-continued
21
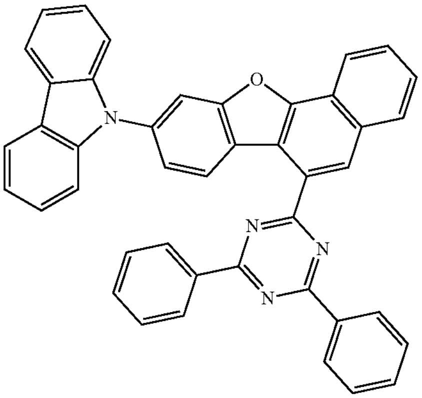
22
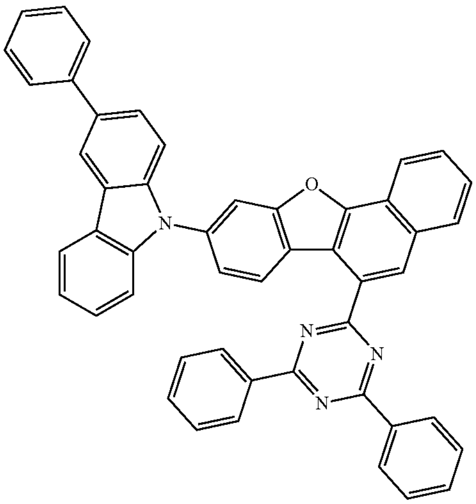
23
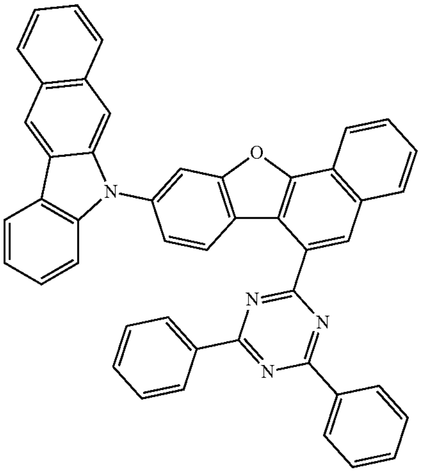
-continued
24
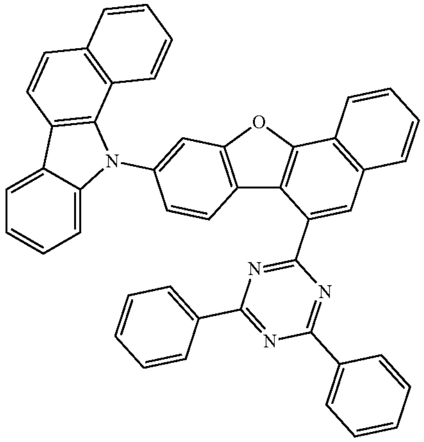
25
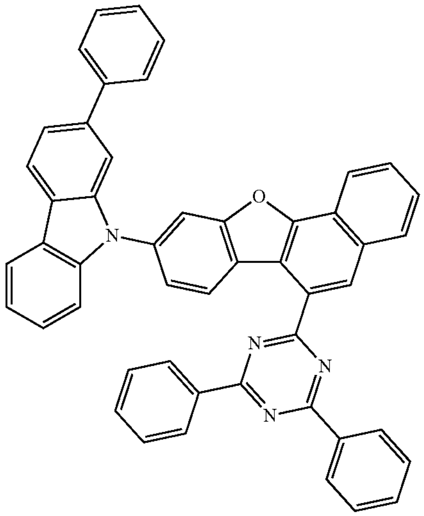
26
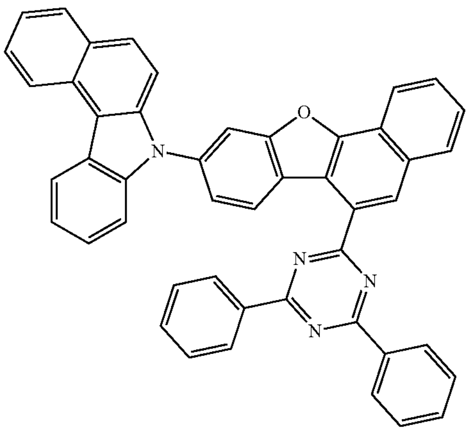

-continued
27
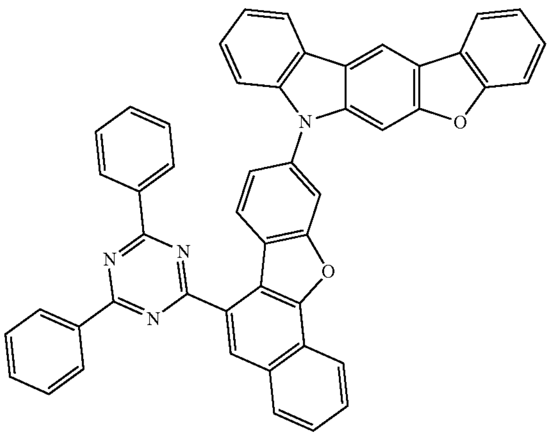
28
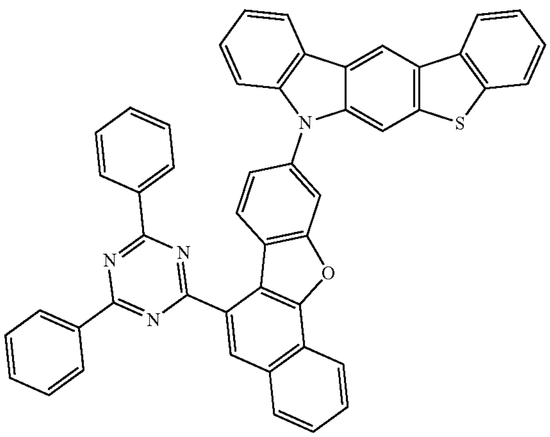
29
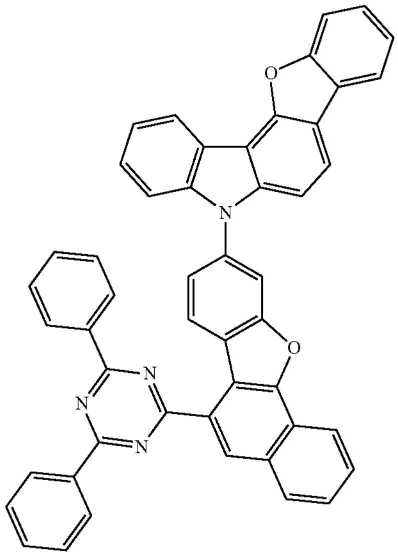
-continued
30
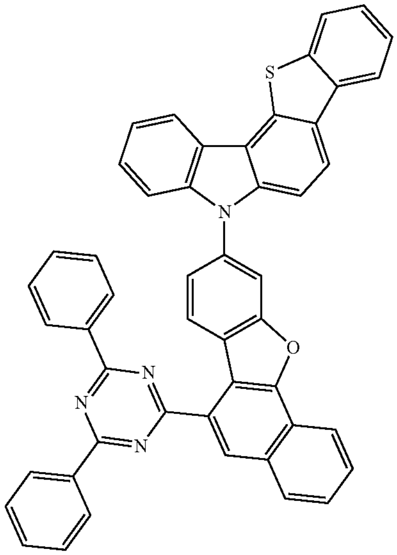
31
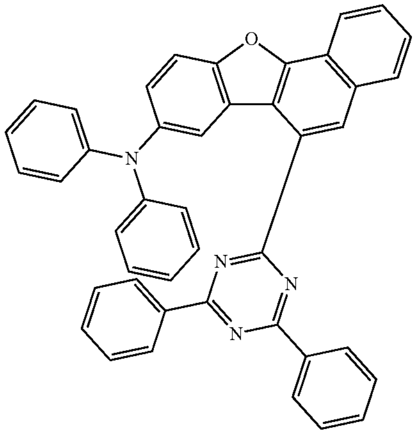
32
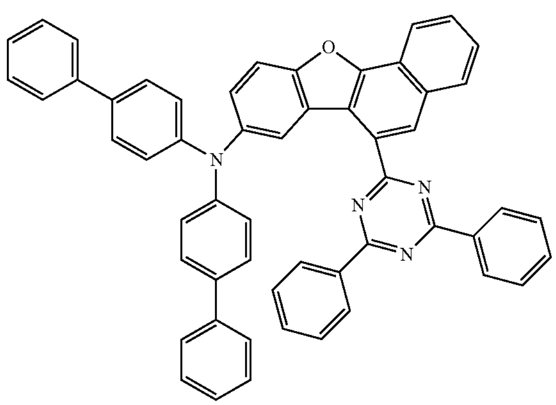

-continued
33
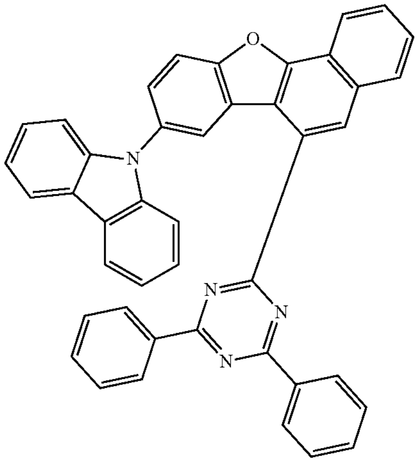
34
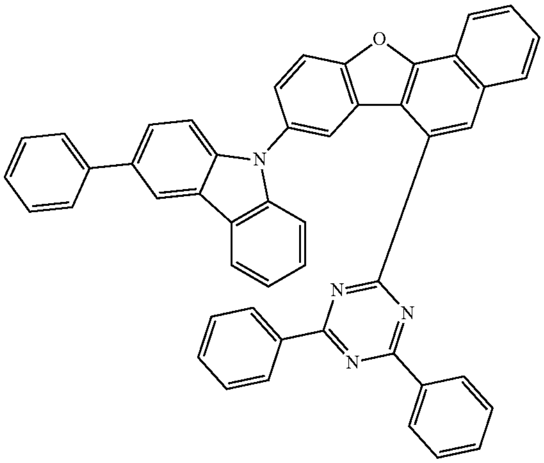
35
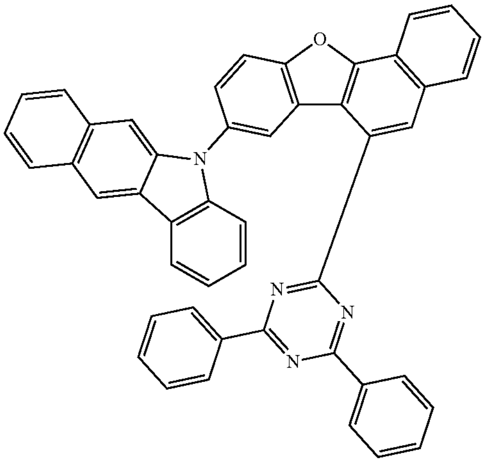
-continued
36
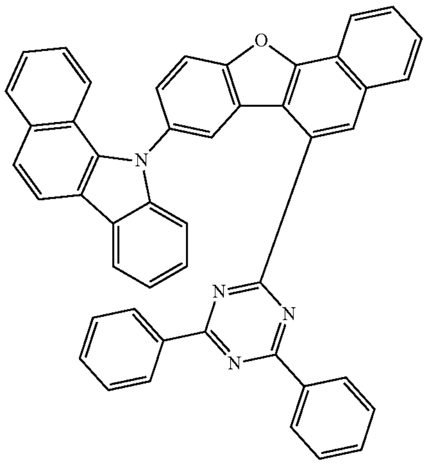
37
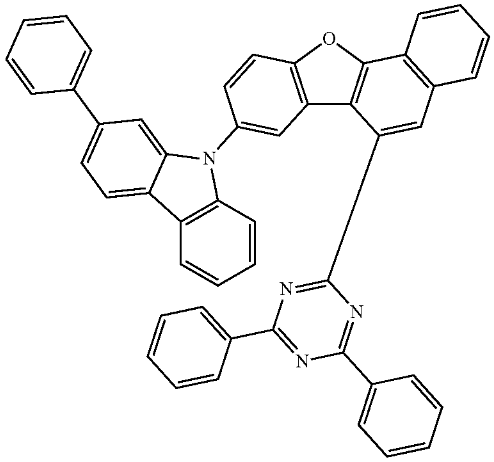
38
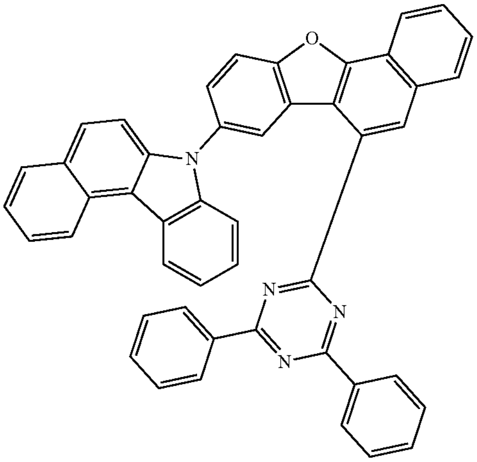

-continued
39
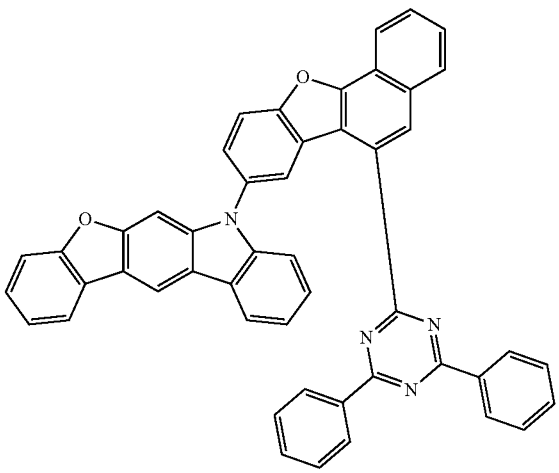
40
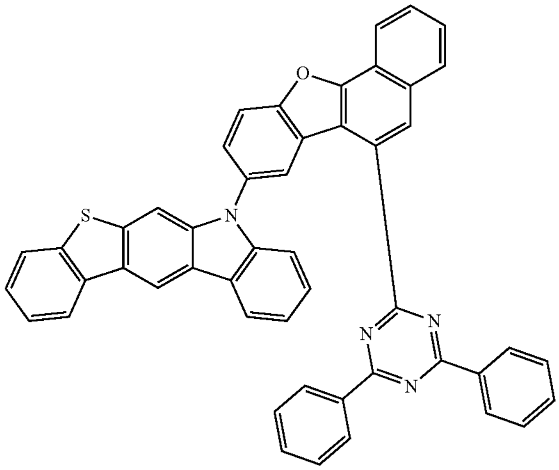
41
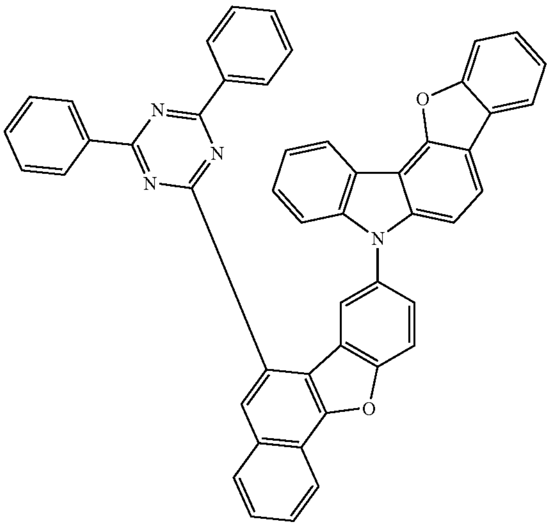
-continued
42
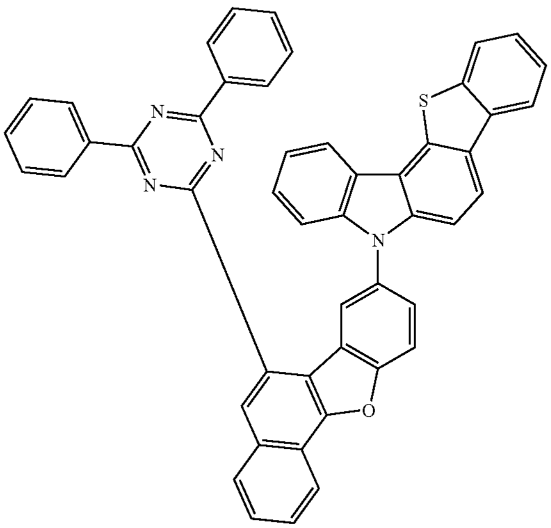
43
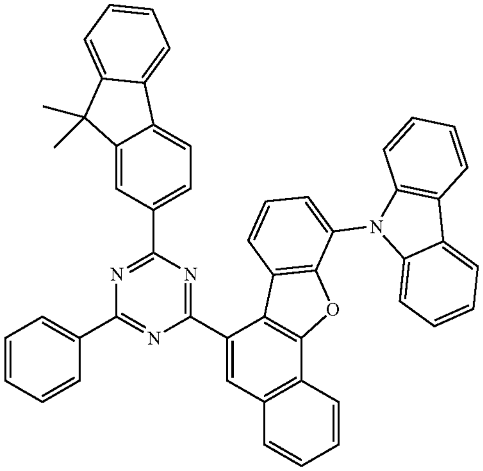
44
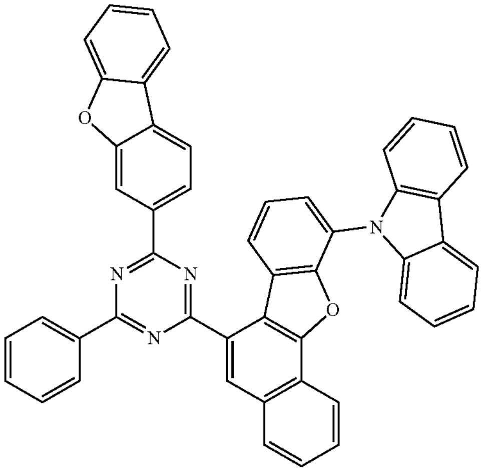

-continued
45
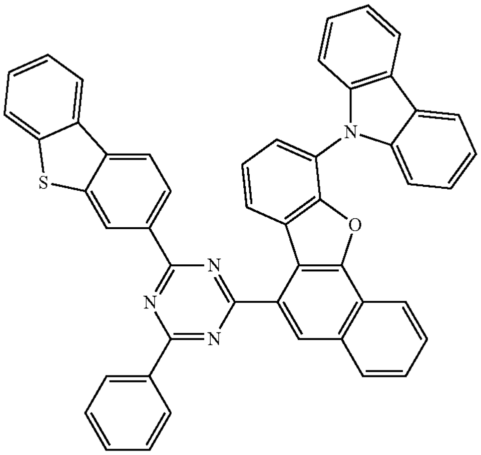
46
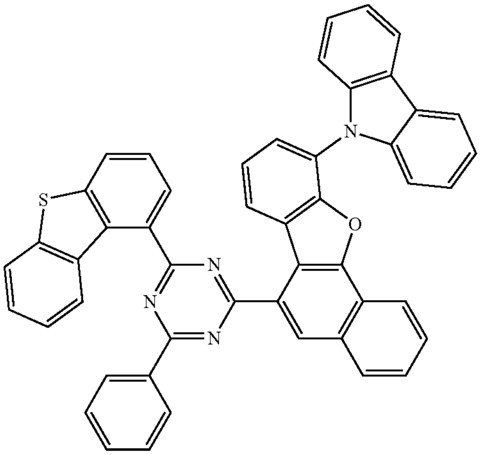
47
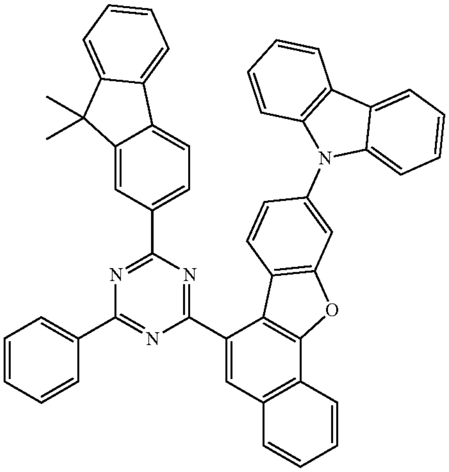
-continued
48
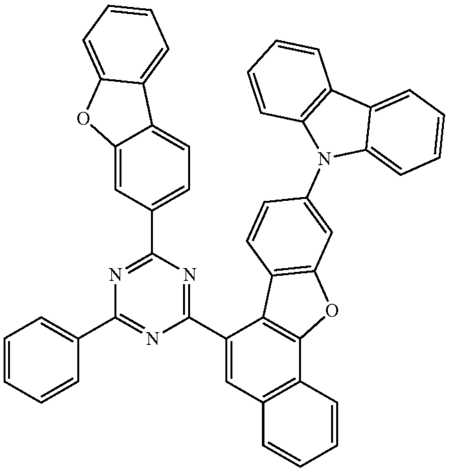
49
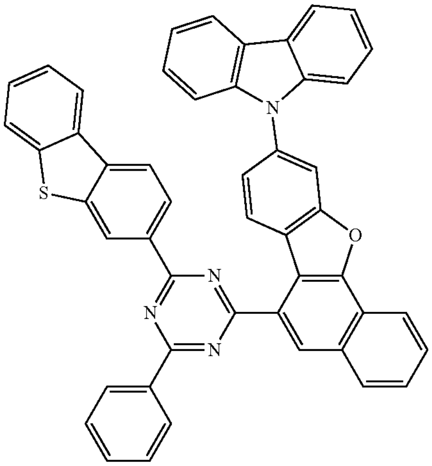
50
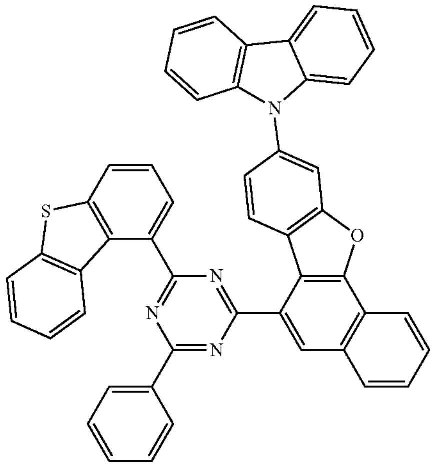

-continued
51
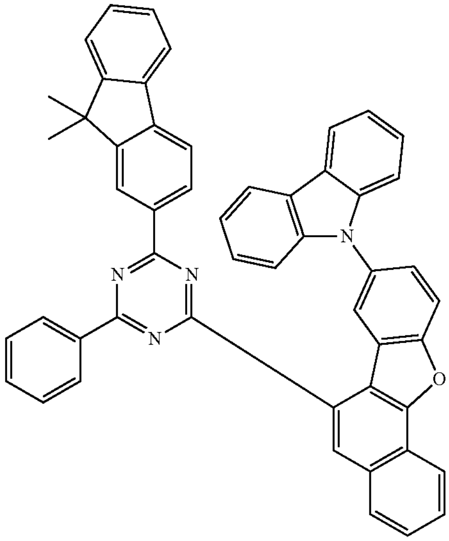
52
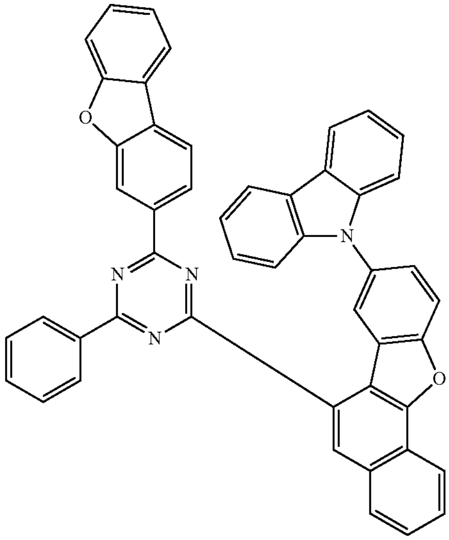
53
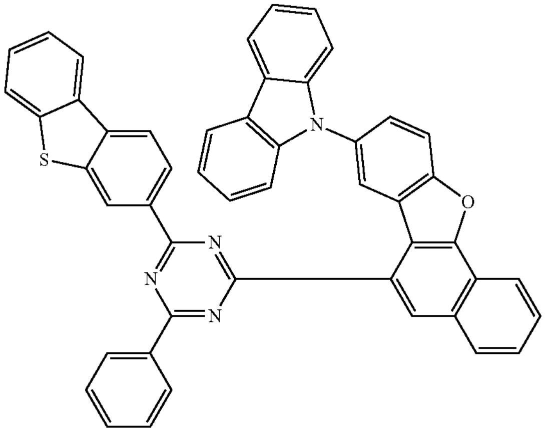
-continued
54
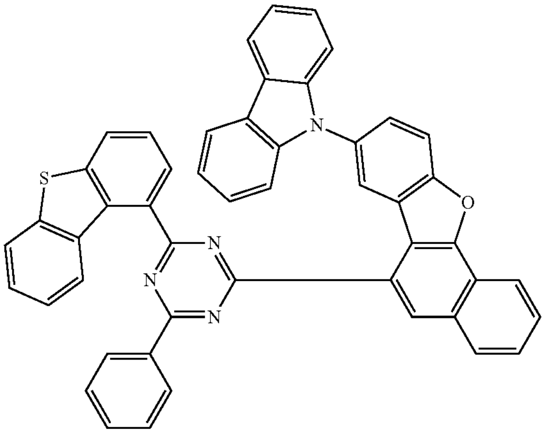
59
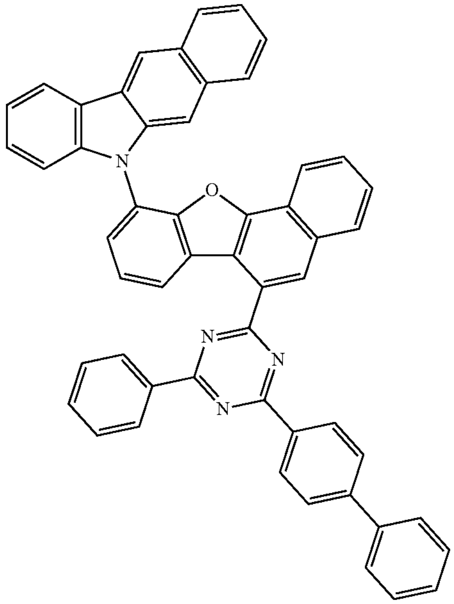
60
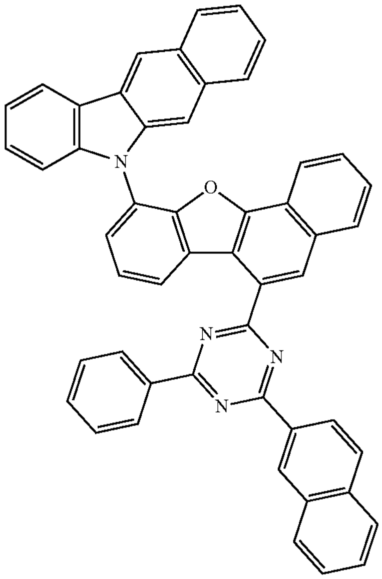

-continued
61
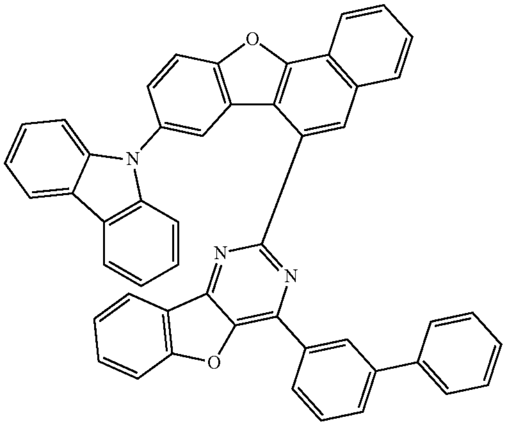
62
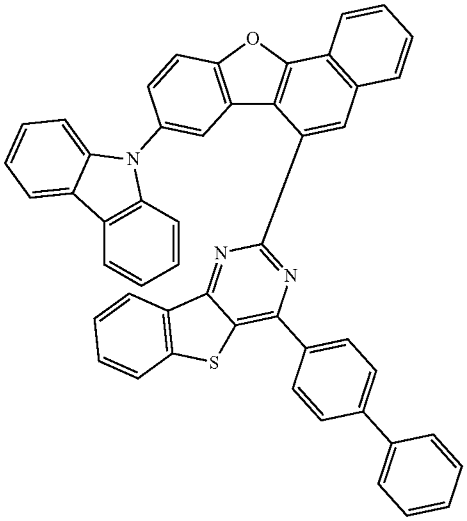
63
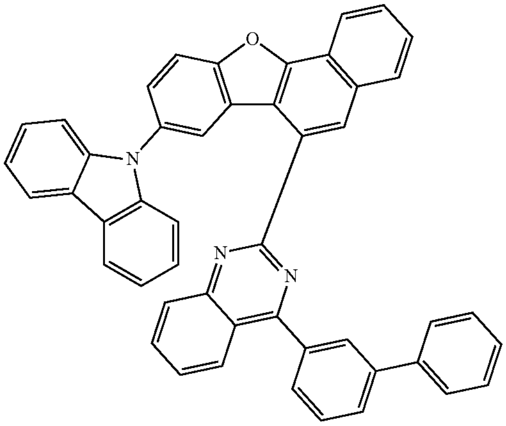
-continued
64
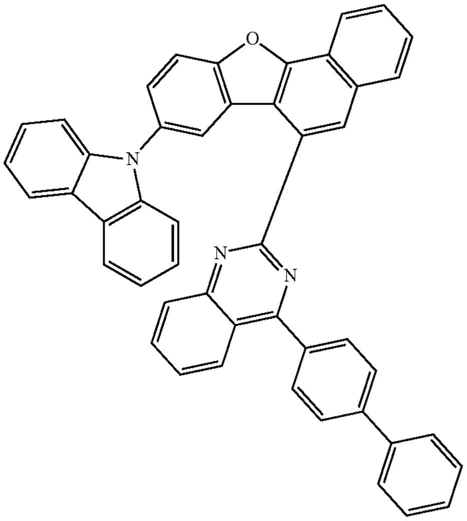
65
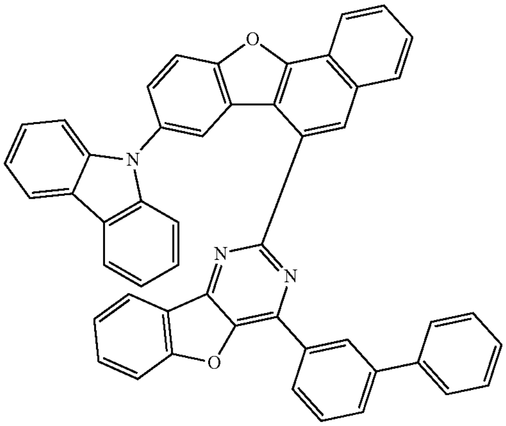
66
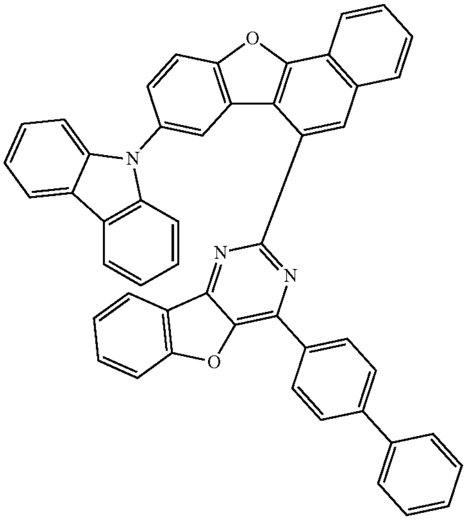

-continued
67
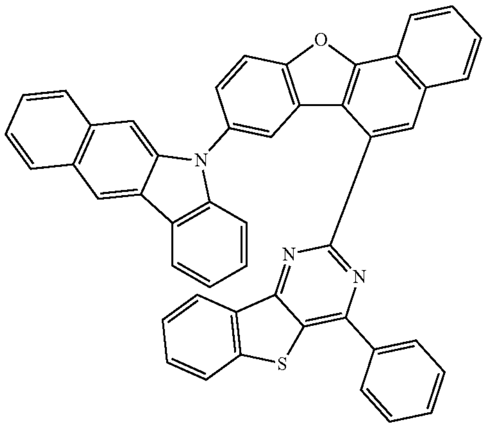
68
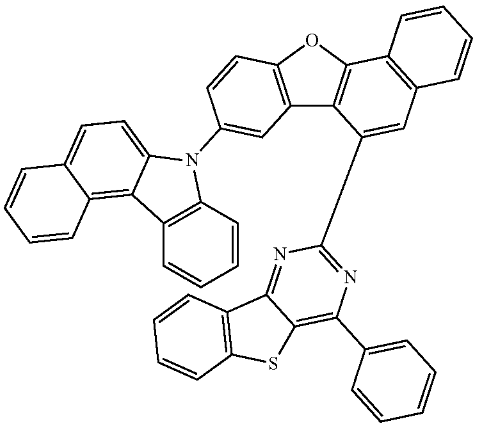
69
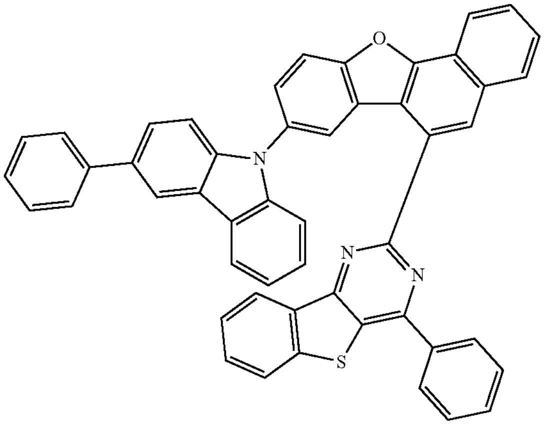
-continued
70
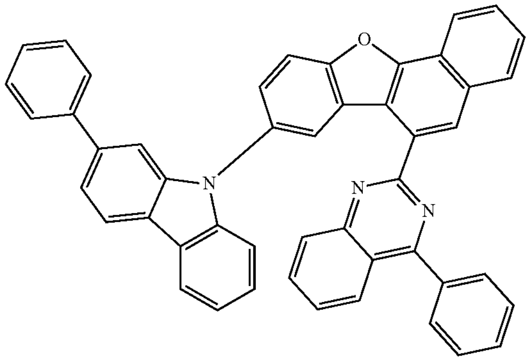
71
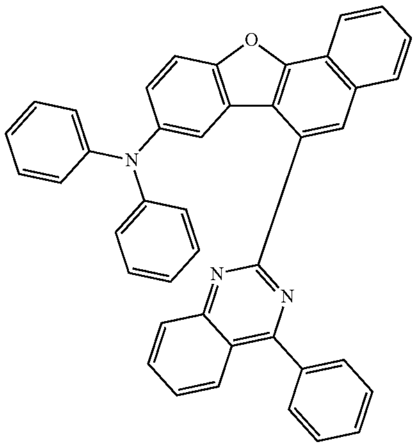
72
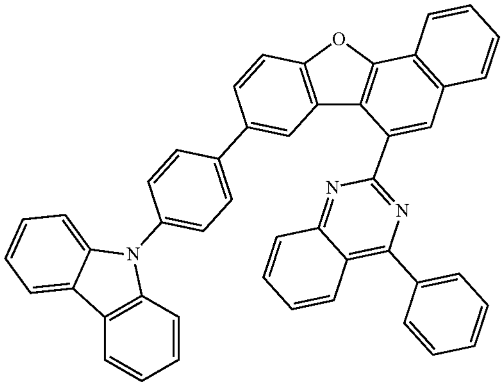

-continued
73
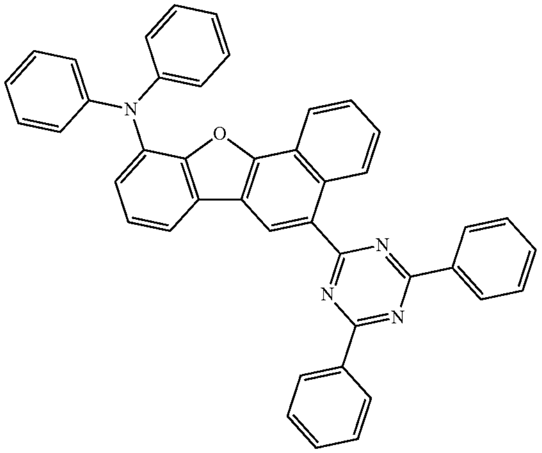
74
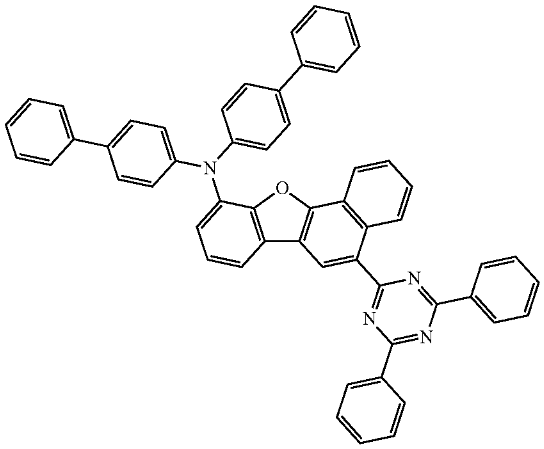
75
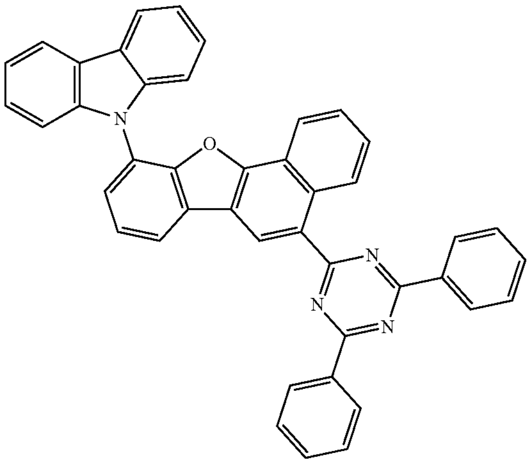
-continued
76
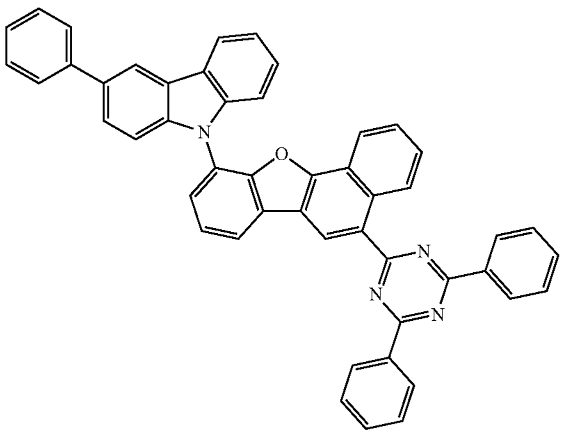
77
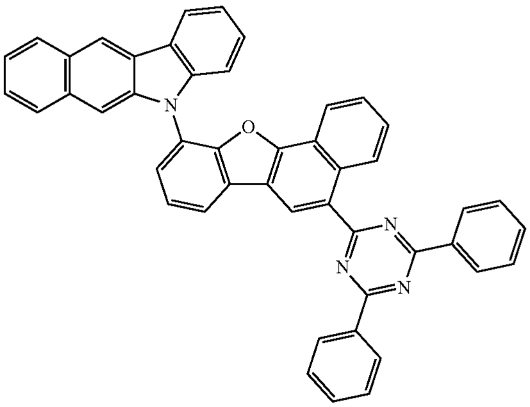
78
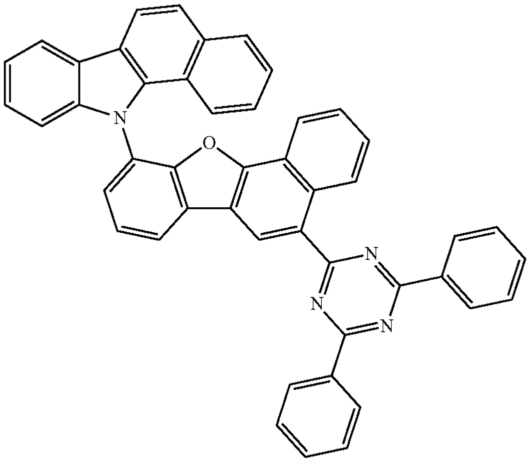

-continued
79
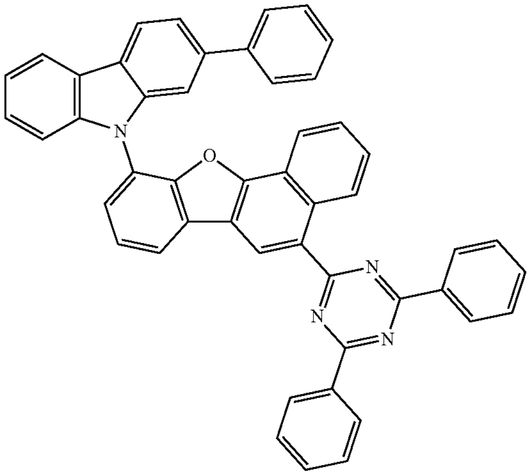
80
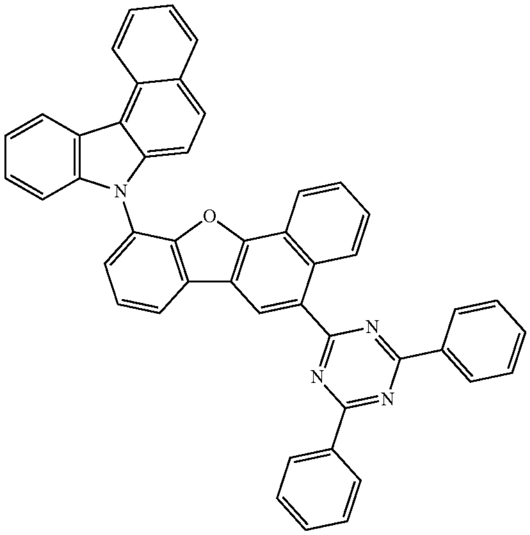
81
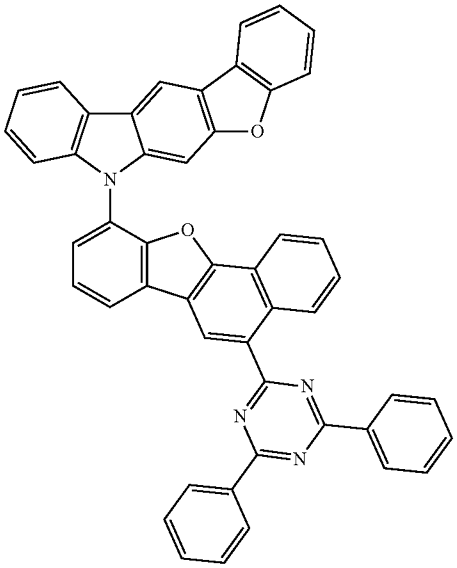
82
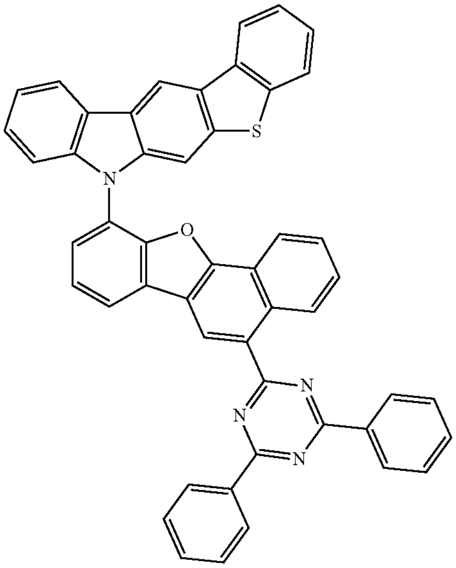
83
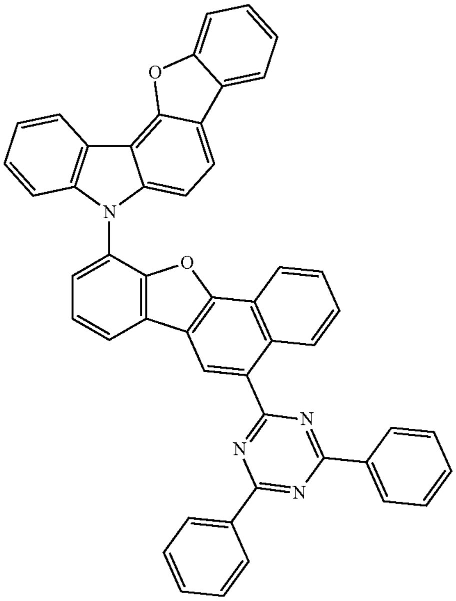

-continued
84
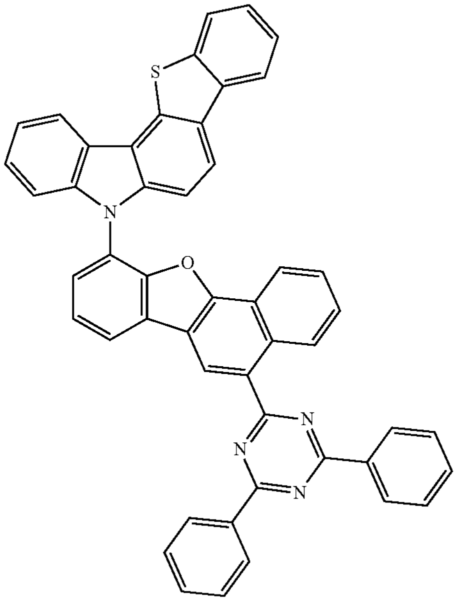
85
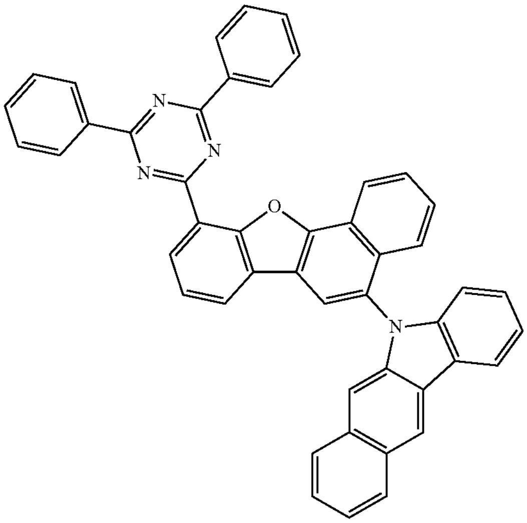
86
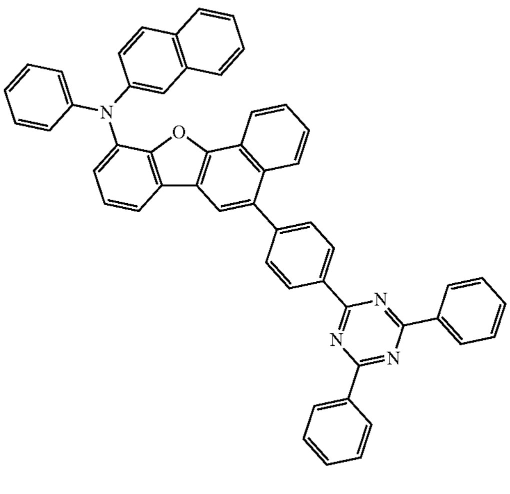
-continued
87
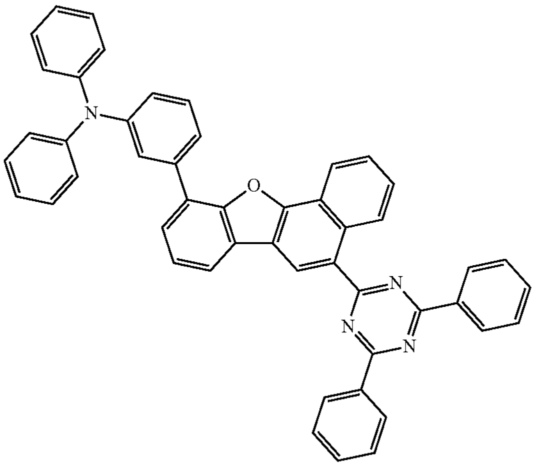
88
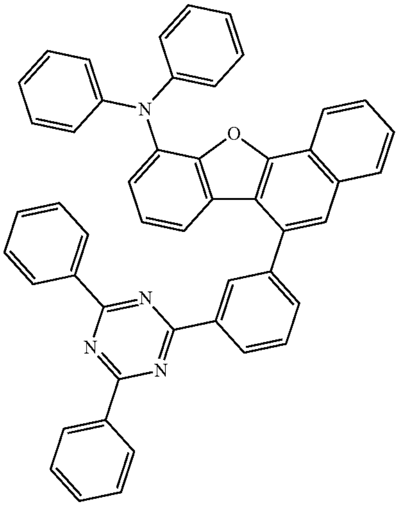
89
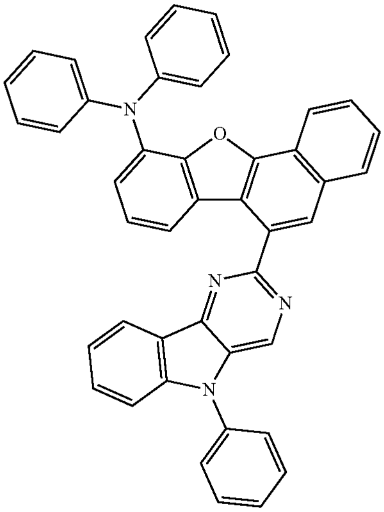

-continued
90
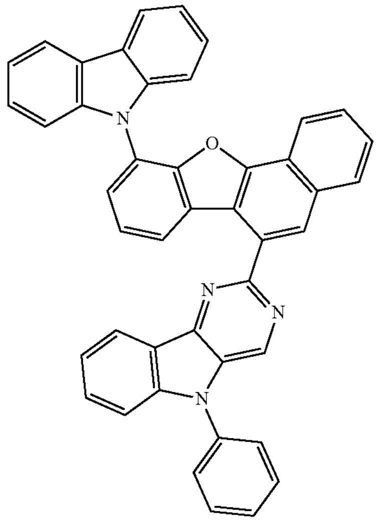
91
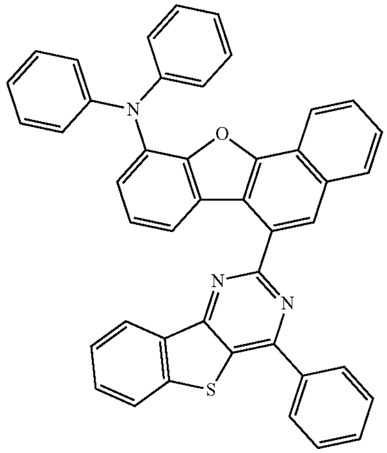
92
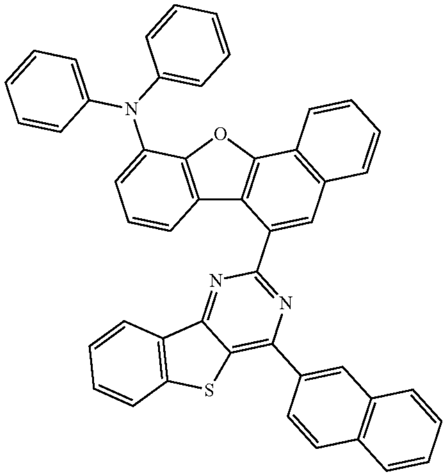
93
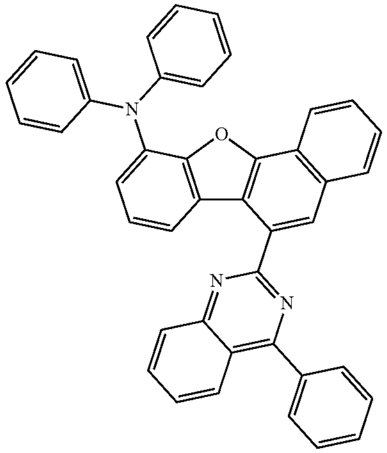
94
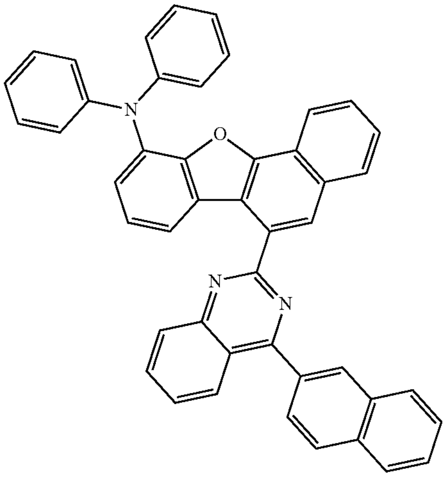
95
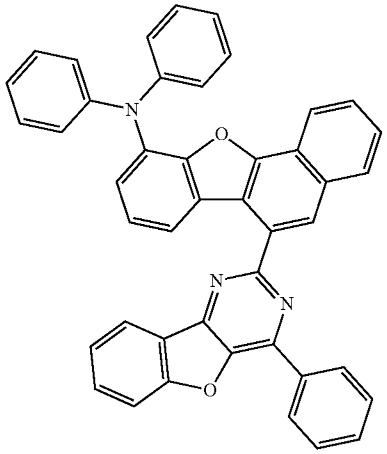

-continued
96
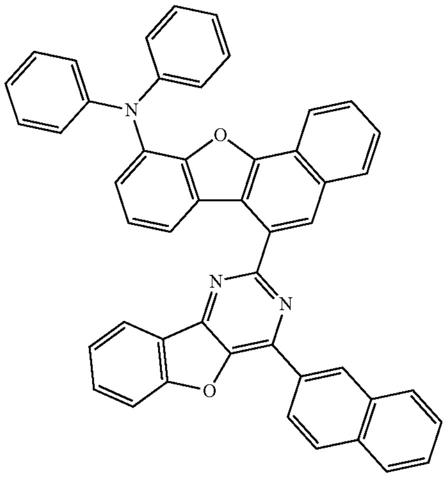
97
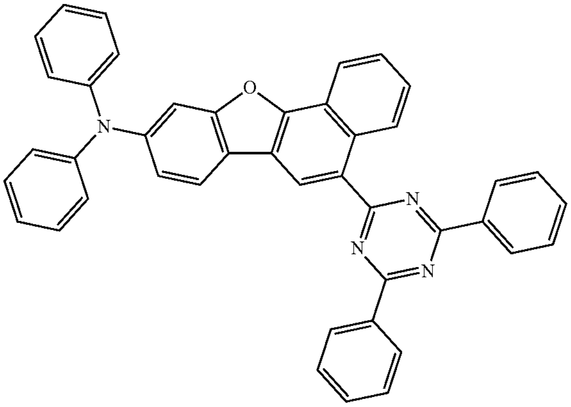
98
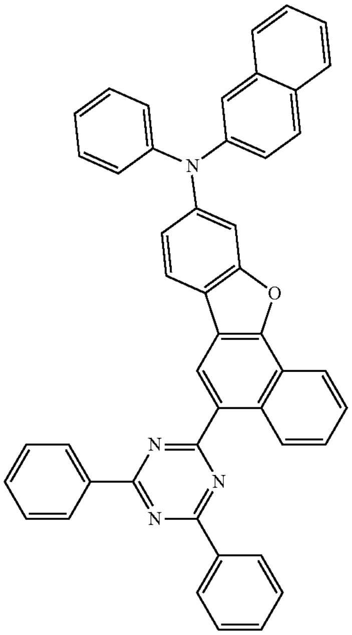
-continued
99
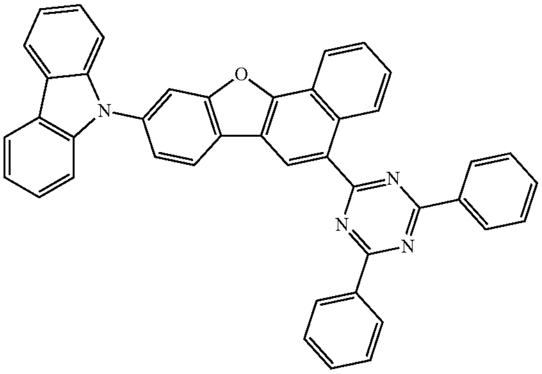
100
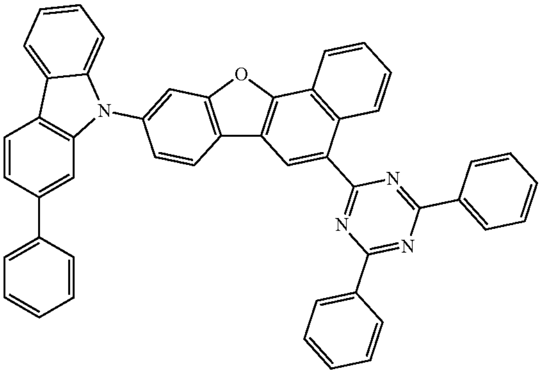
102
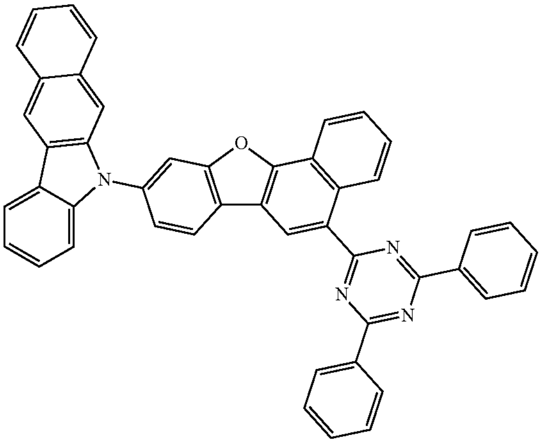

-continued
103
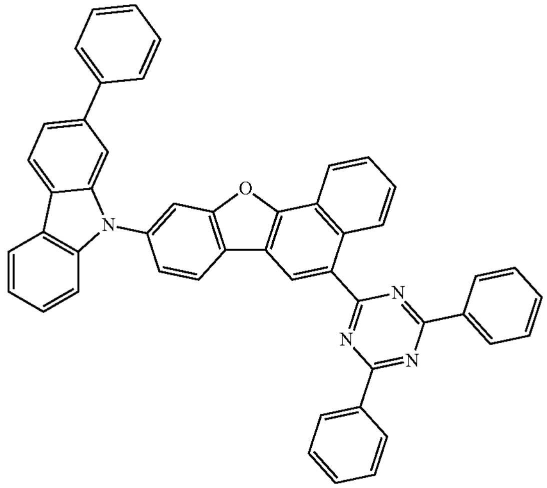
104
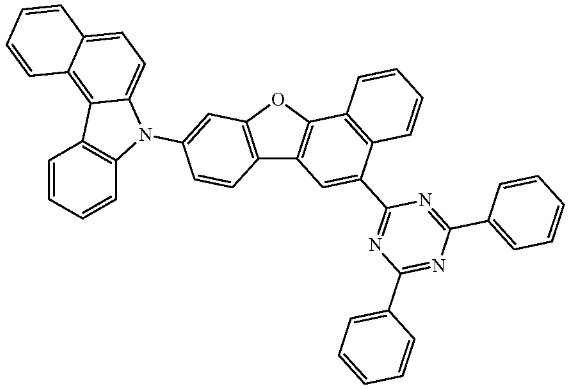
105
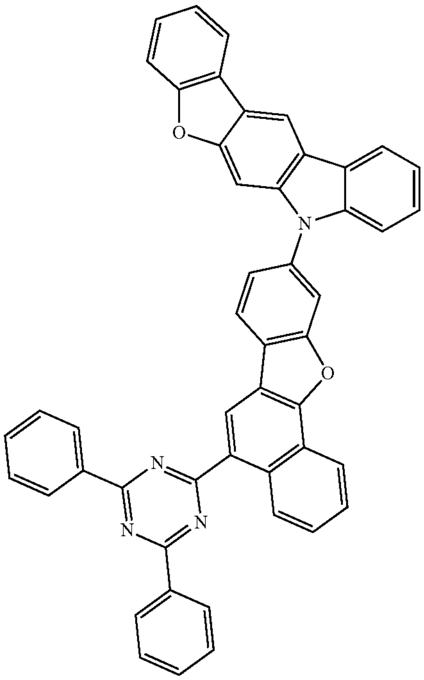
-continued
106
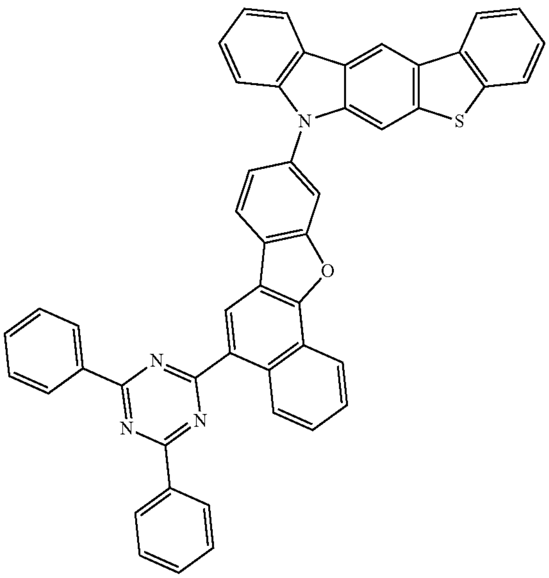
107
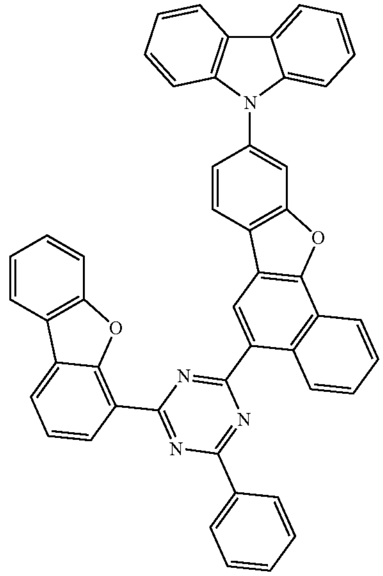

-continued
108
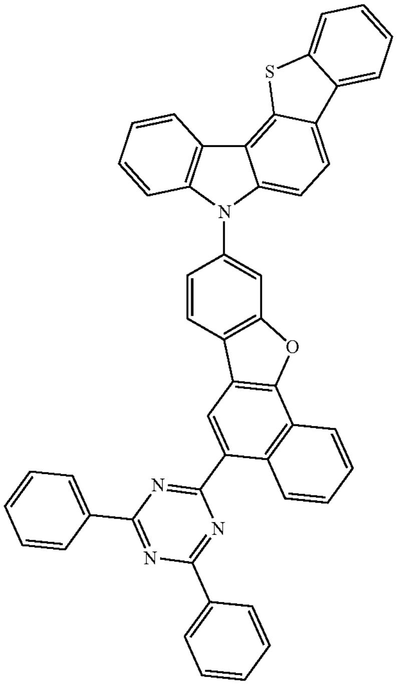
109
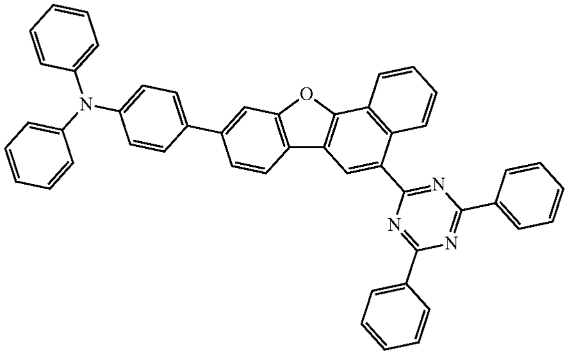
-continued
110
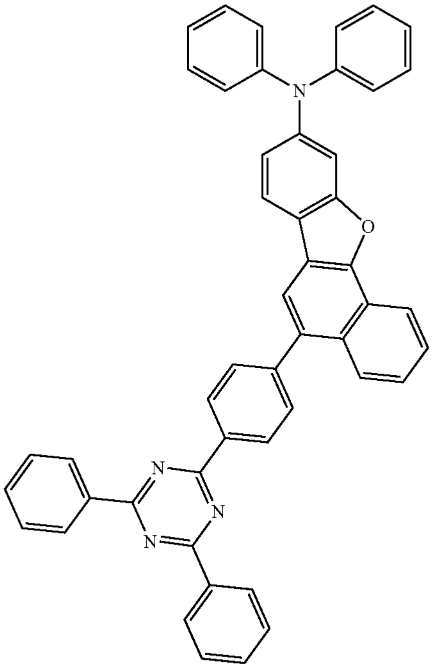
111
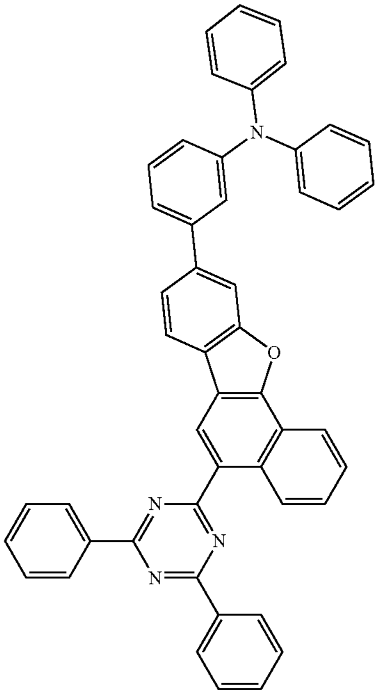

-continued
112
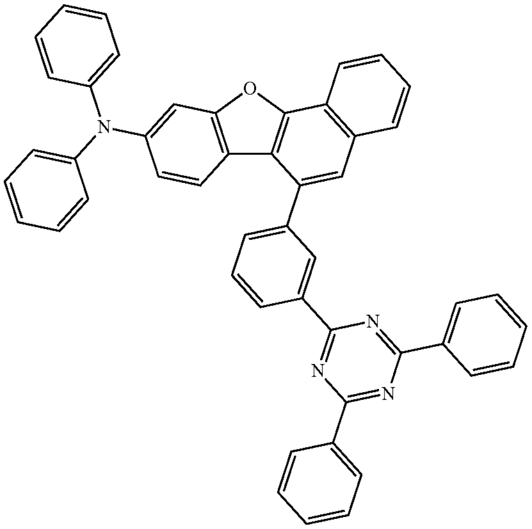
113
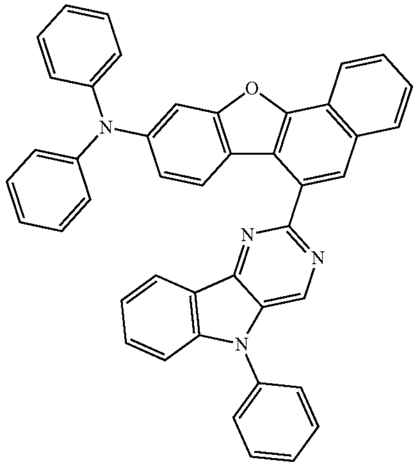
114
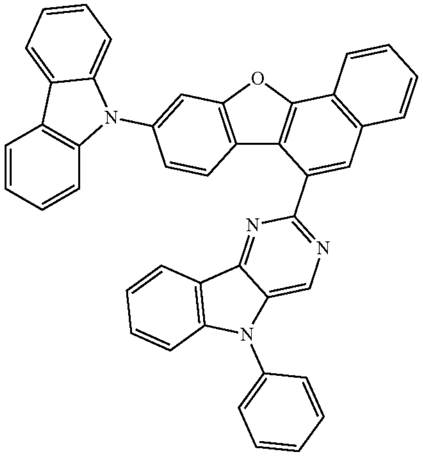
-continued
115
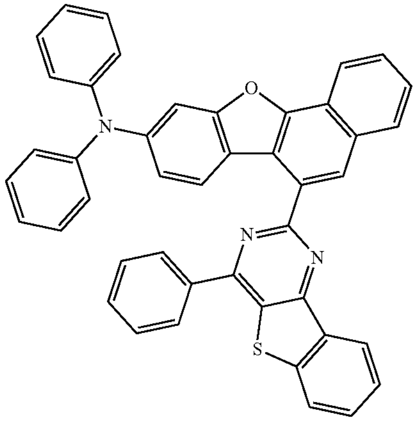
116
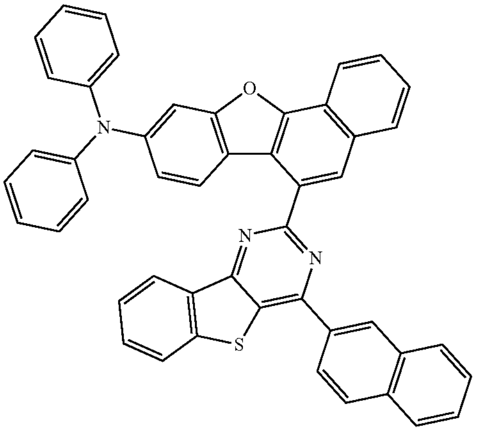
117
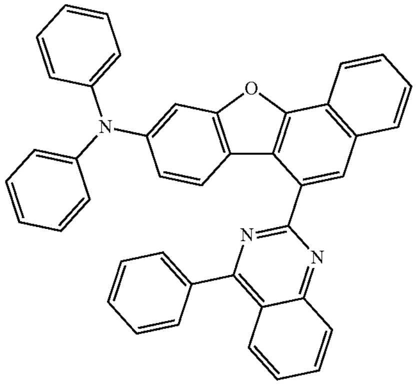

-continued
118
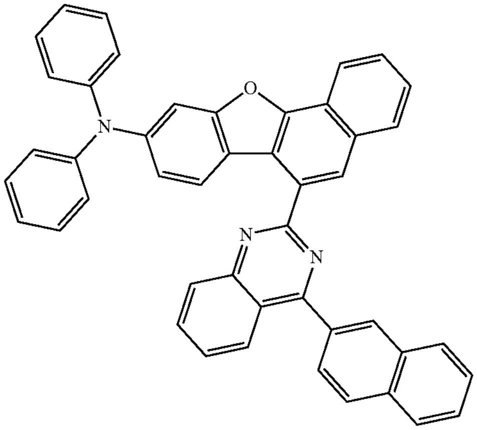
119
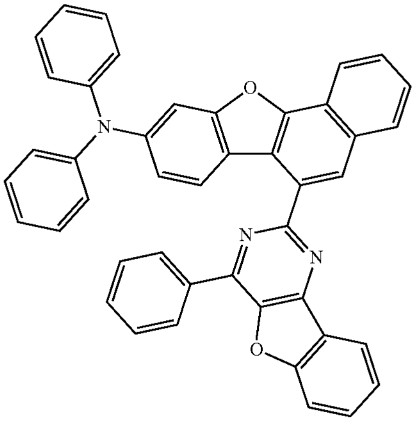
120
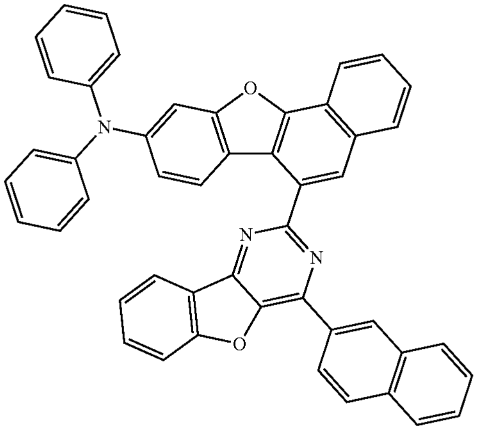
-continued
121
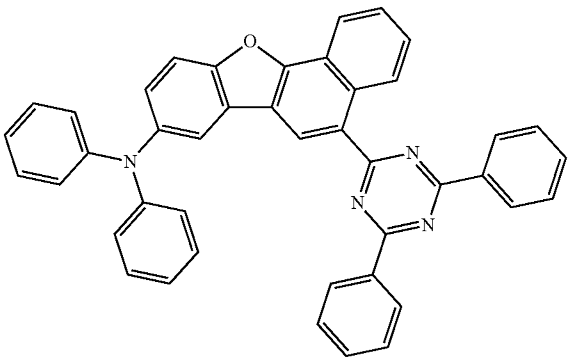
122
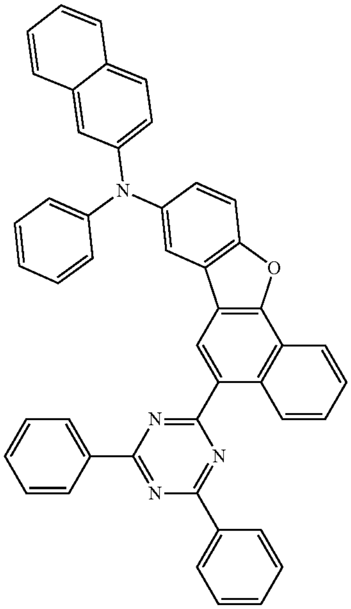
123
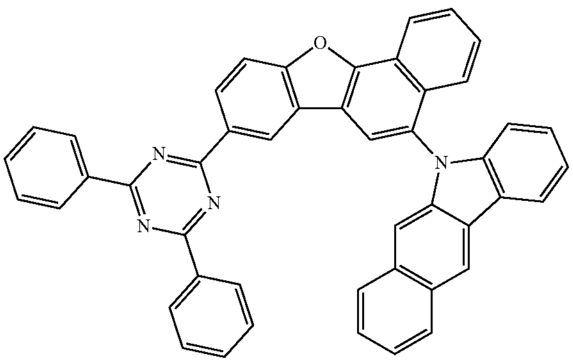

-continued
124
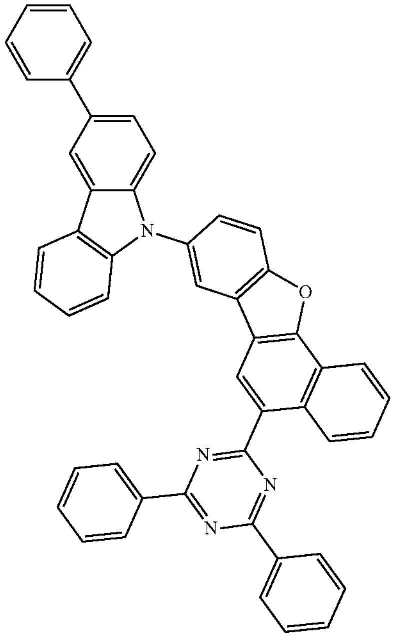
125
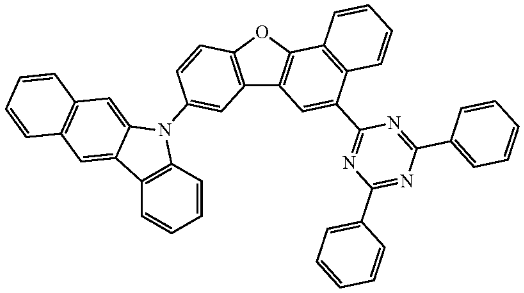
126
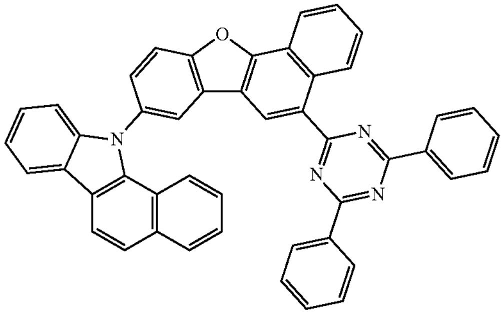
127
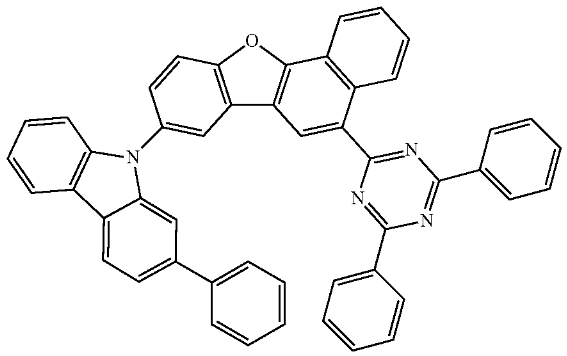
128
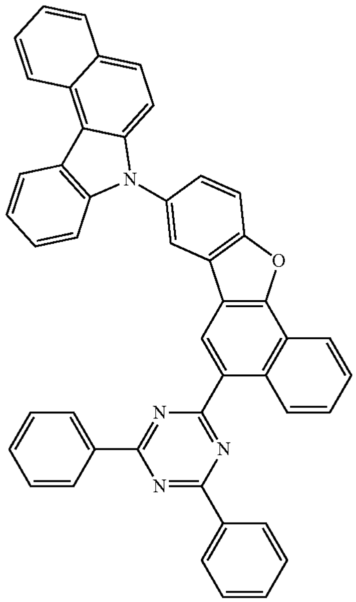
129
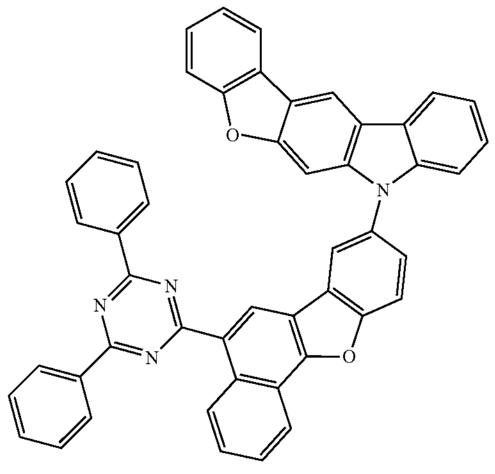

-continued
130
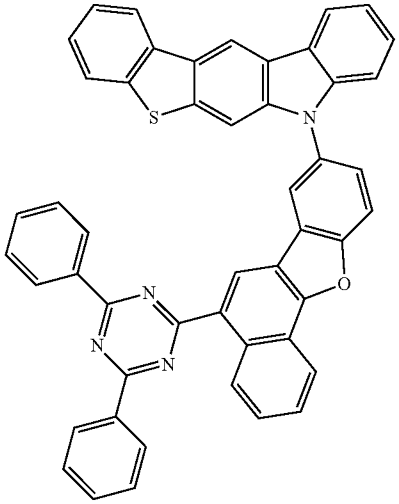
131
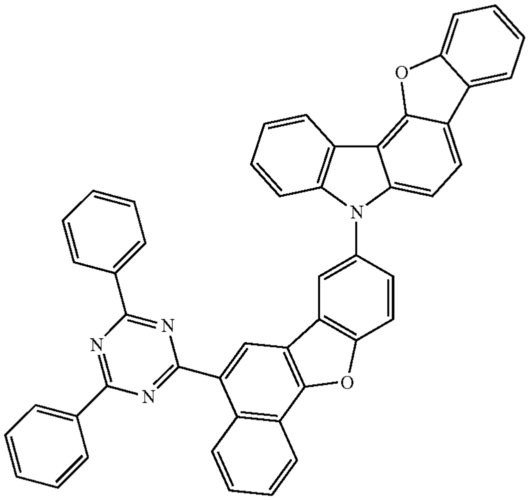
132
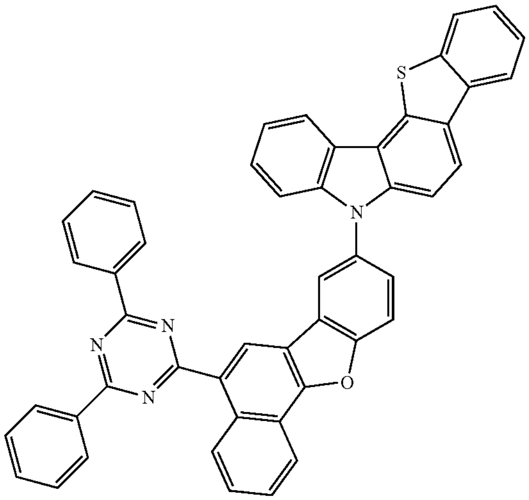
-continued
133
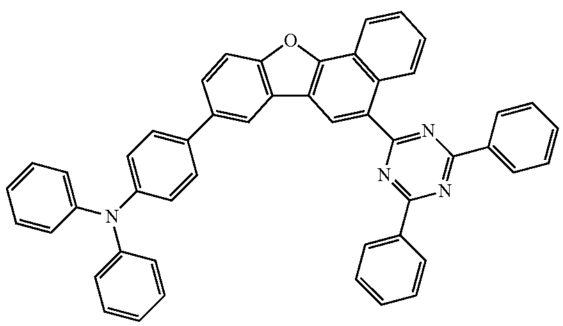
134
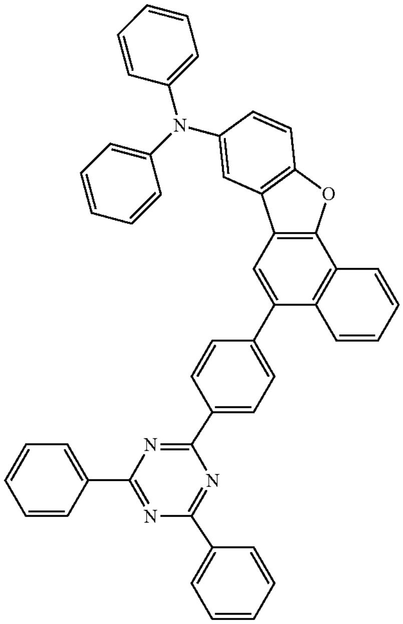
135
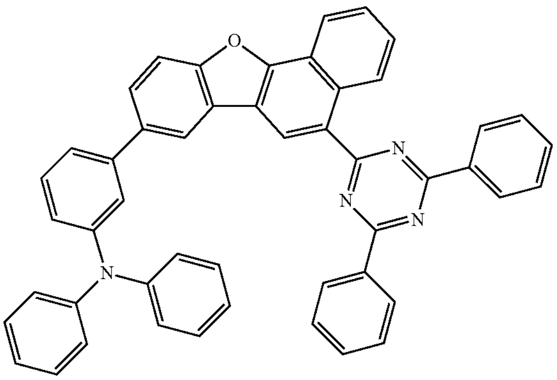

-continued
136
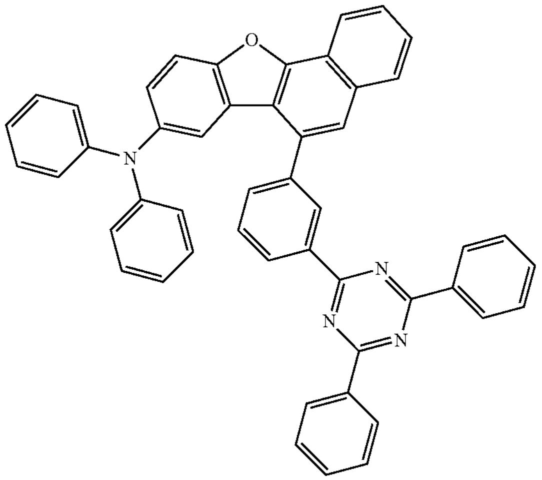
137
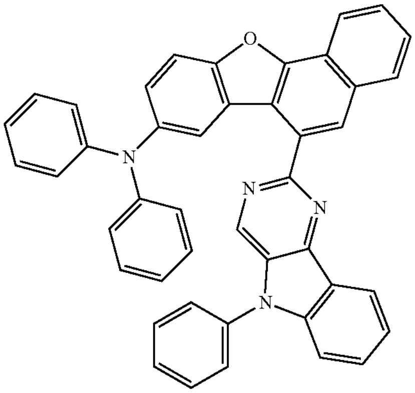
138
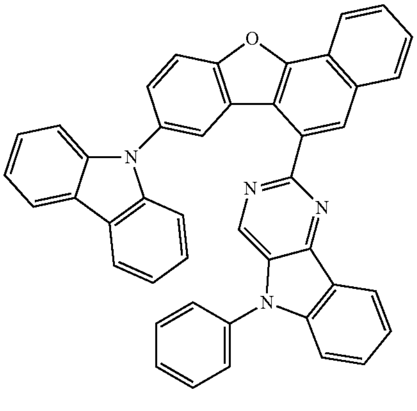
-continued
139
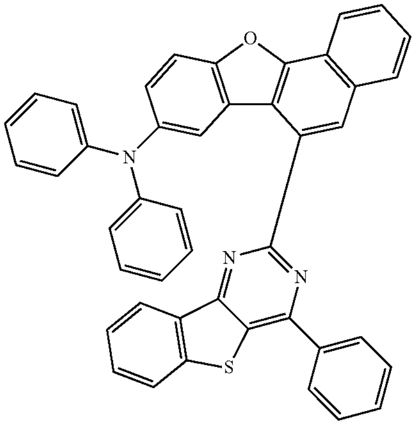
140
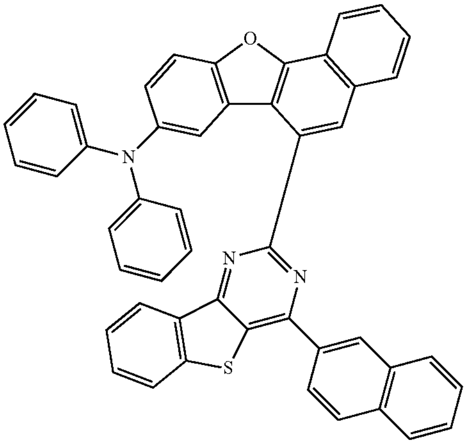
141
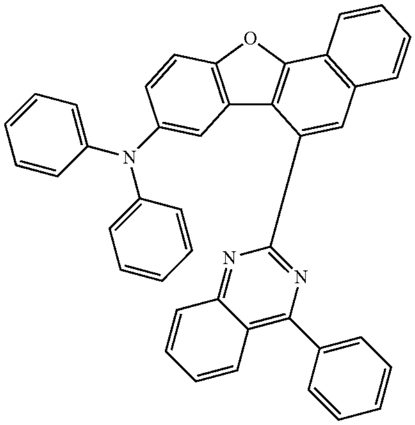

-continued
142
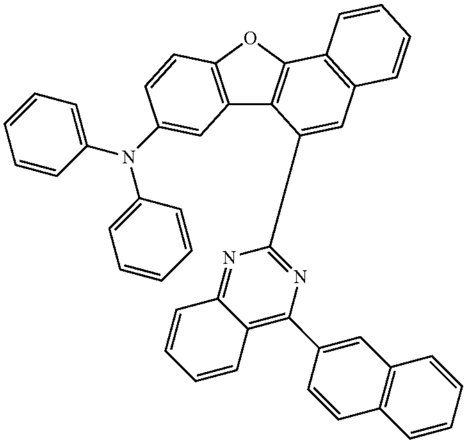
143
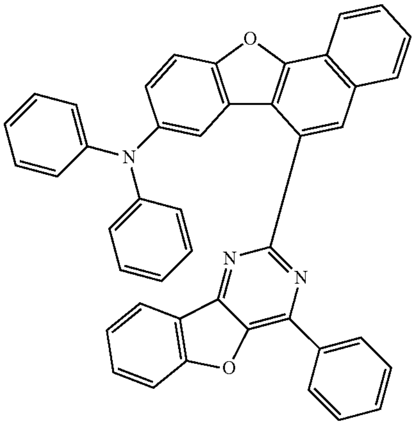
144
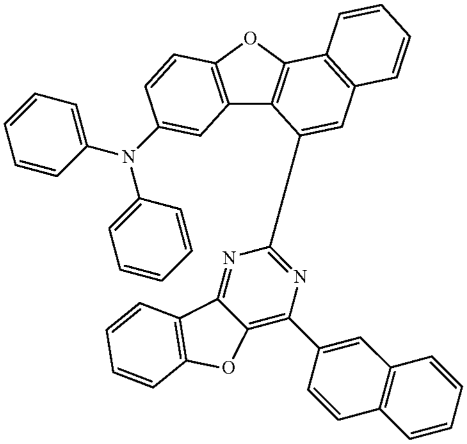
-continued
145
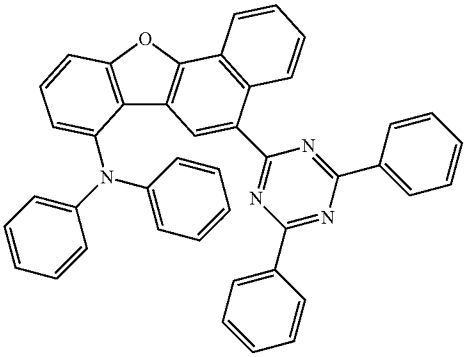
146
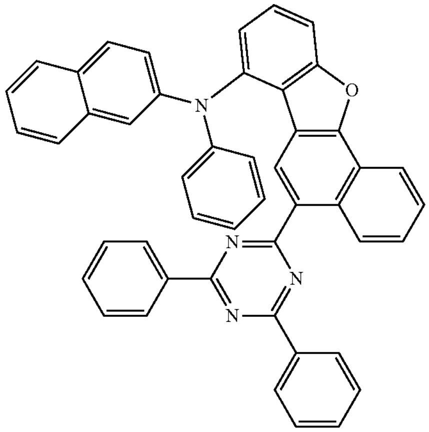
147
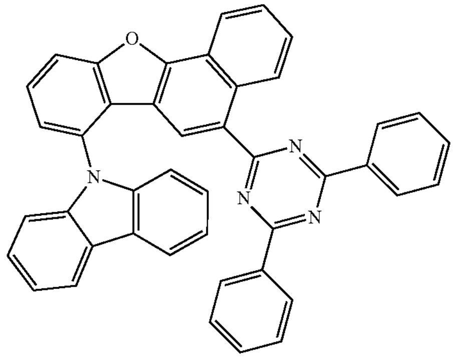
148
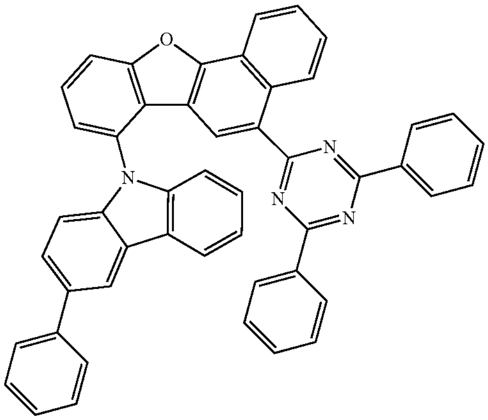

-continued
149
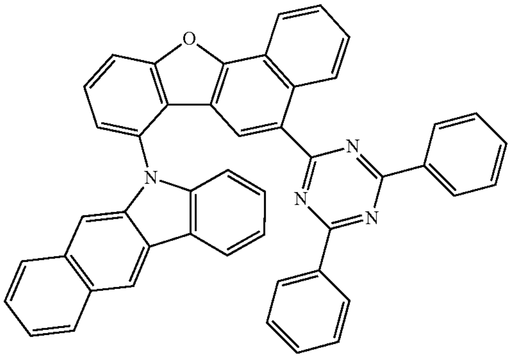
150
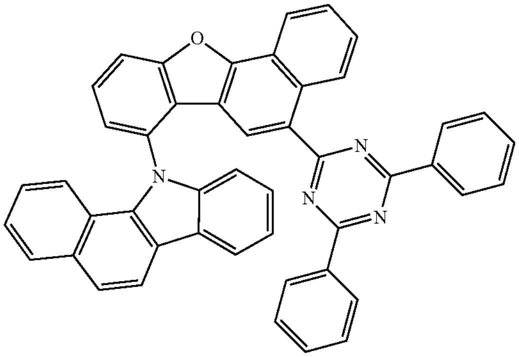
151
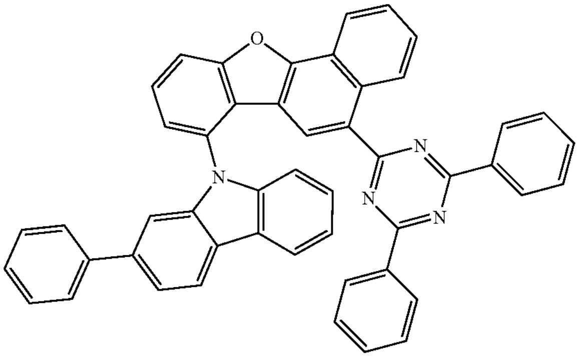
152
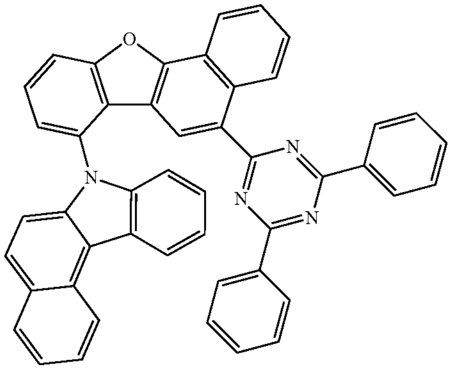
-continued
153
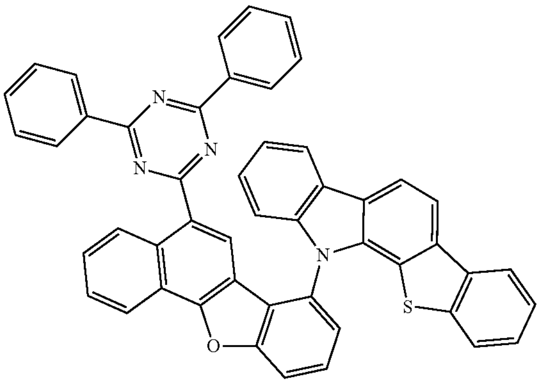
154
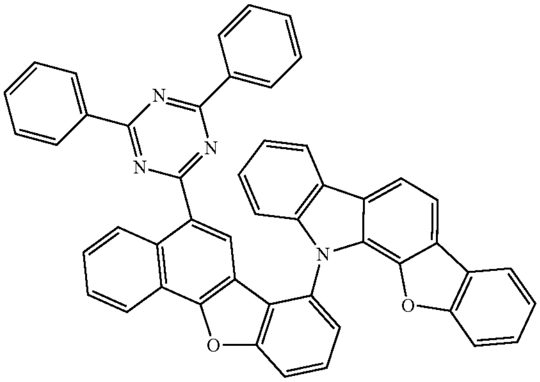
155
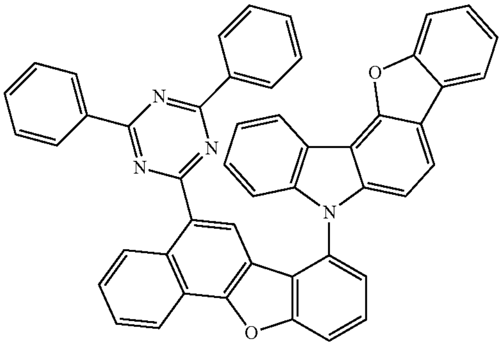
156
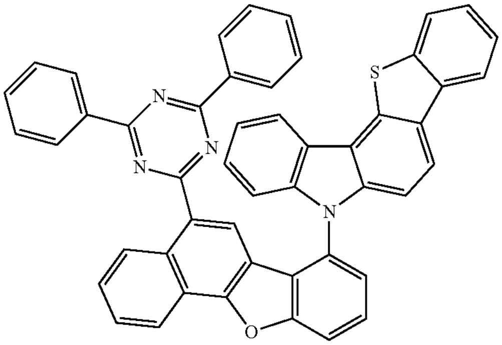

-continued
157
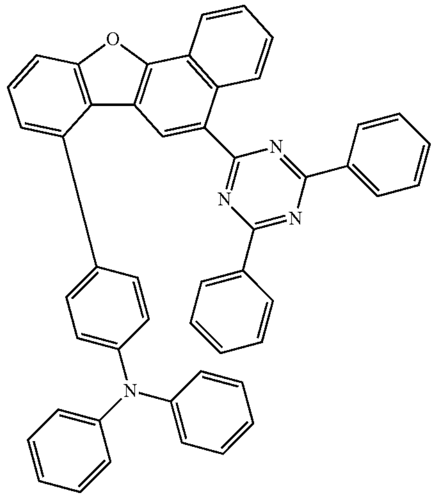
158
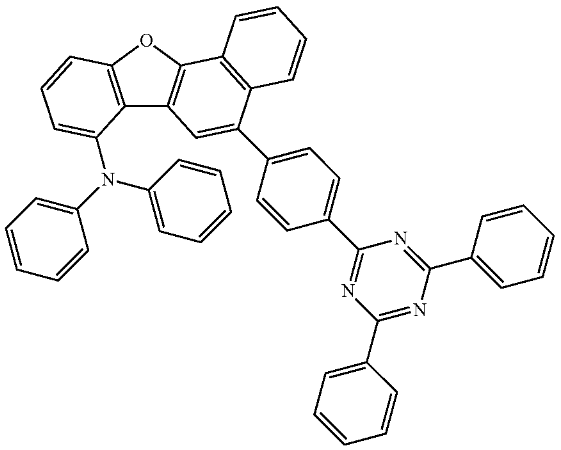
159
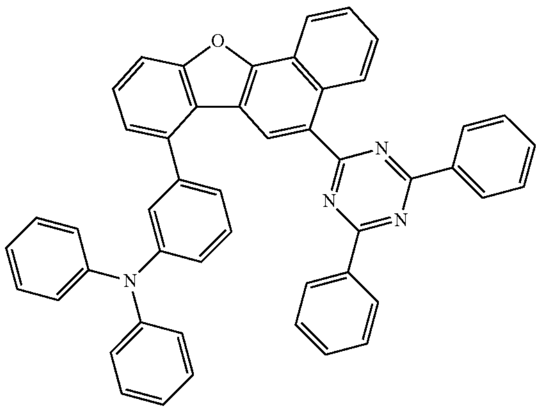
-continued
160
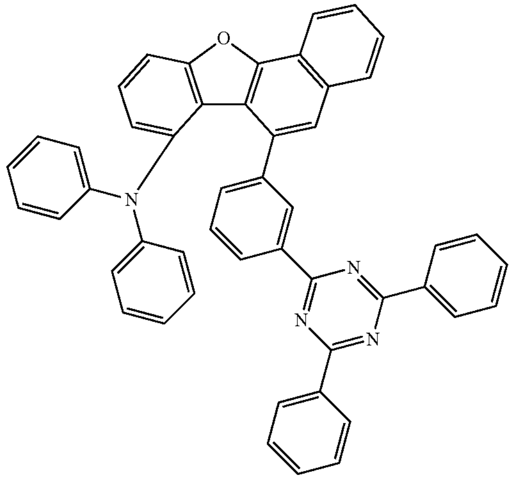
161
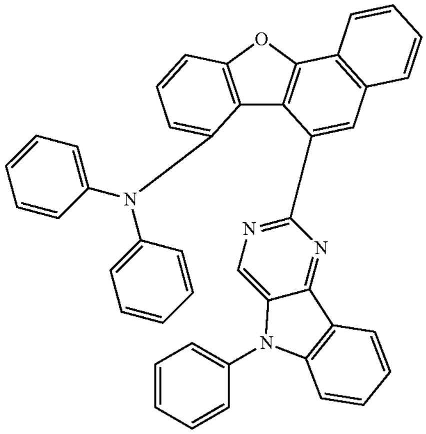
162
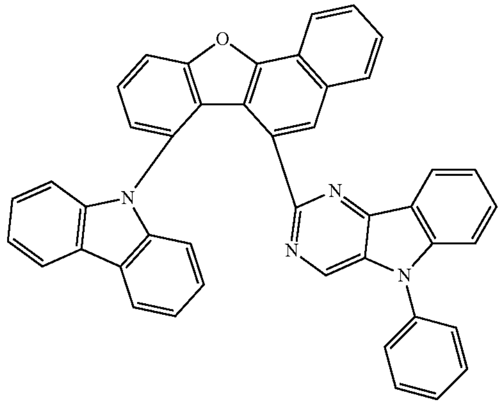

-continued
163
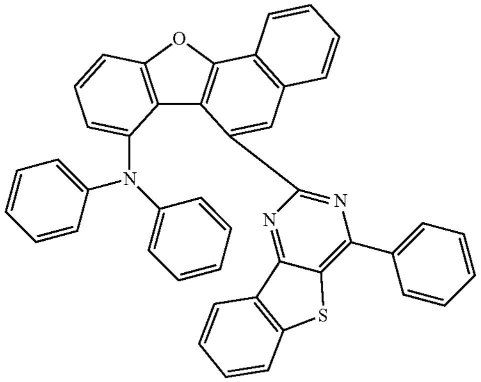
164
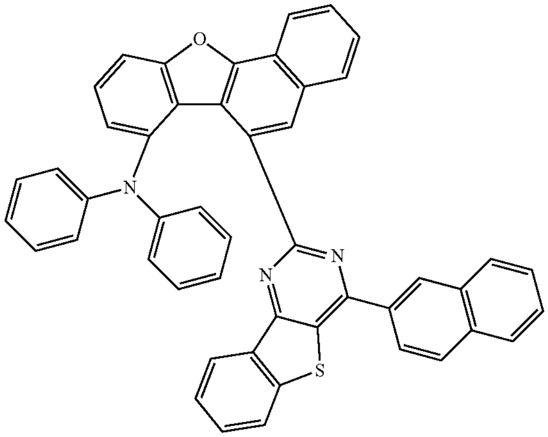
165
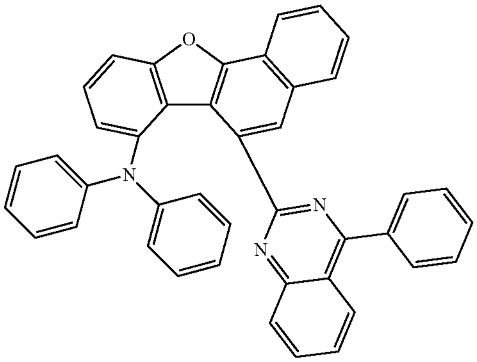
166
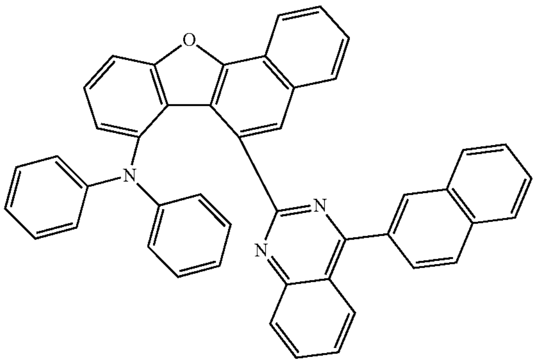
-continued
167
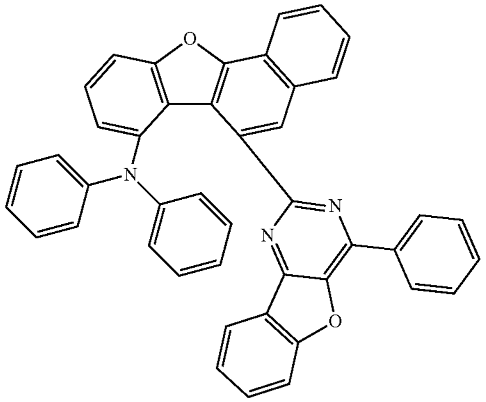
168
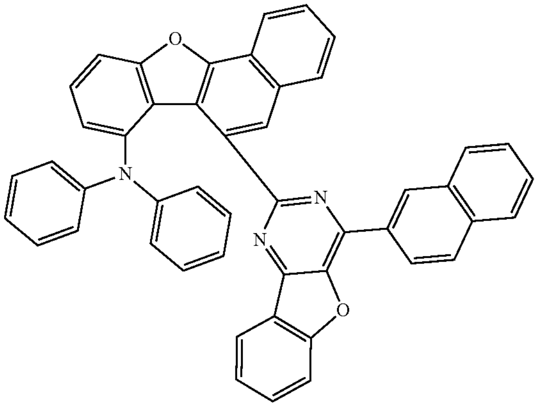
169
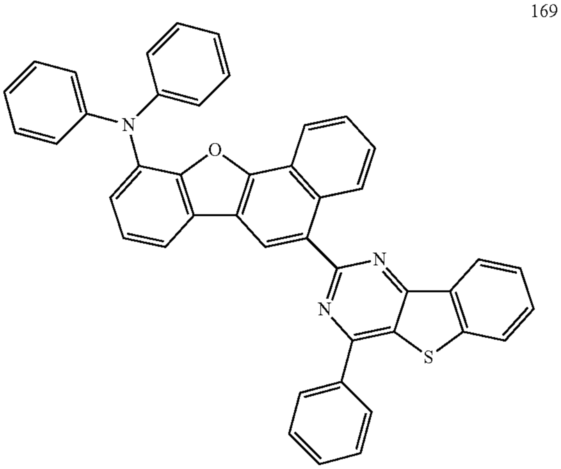

-continued
170
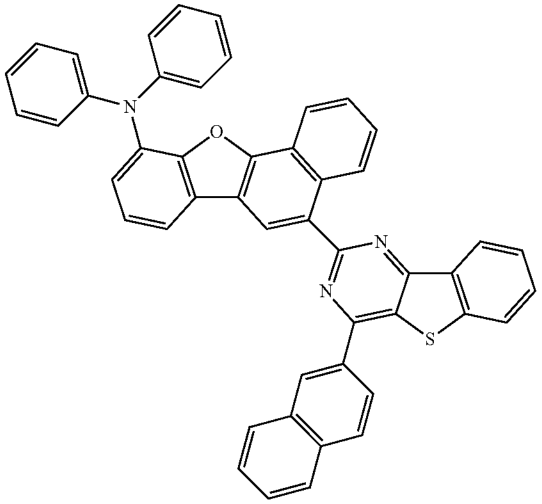
171
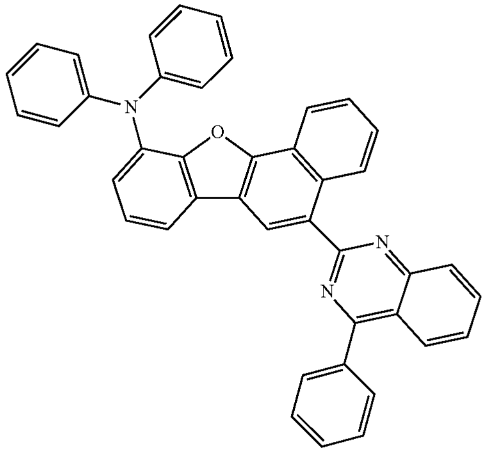
172
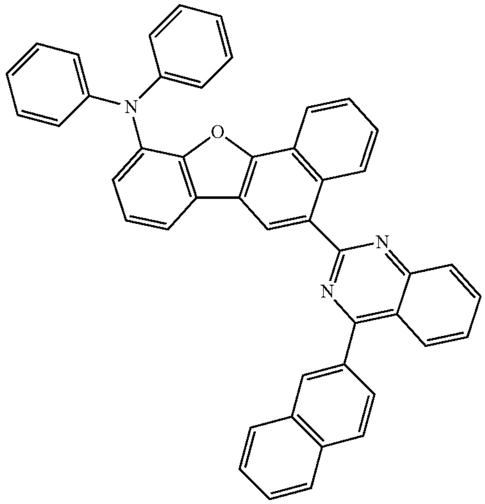
-continued
173
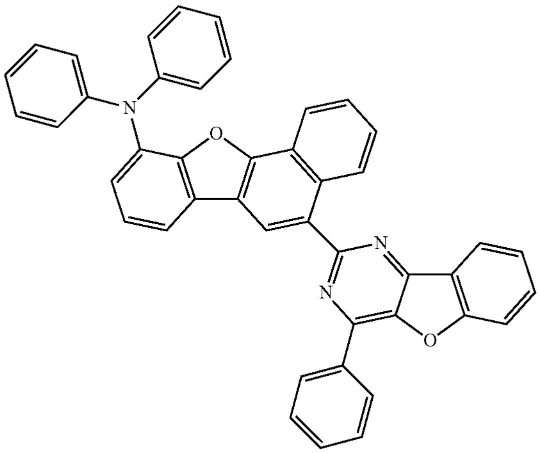
174
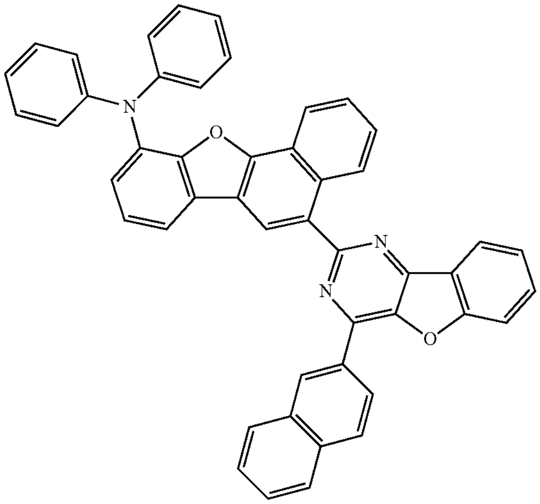
175
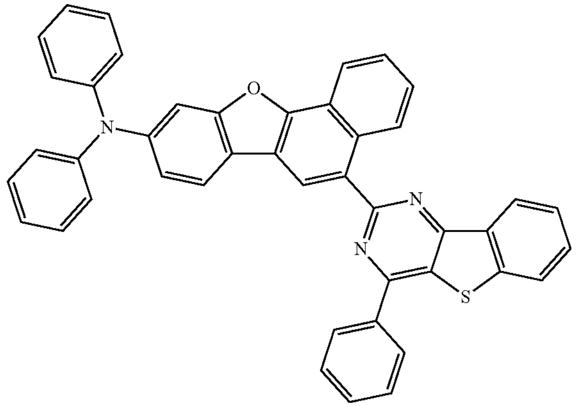

-continued
176
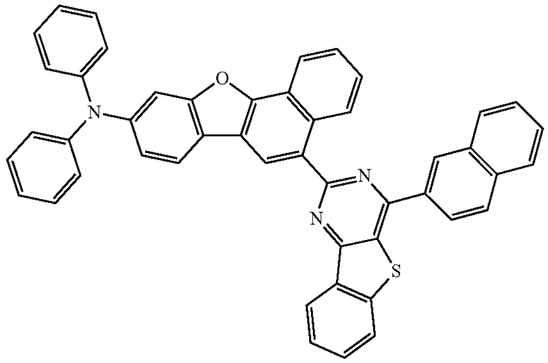
177
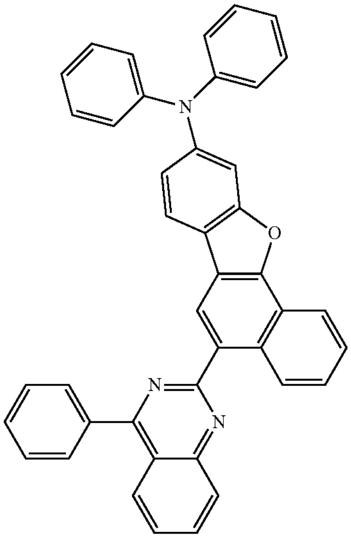
178
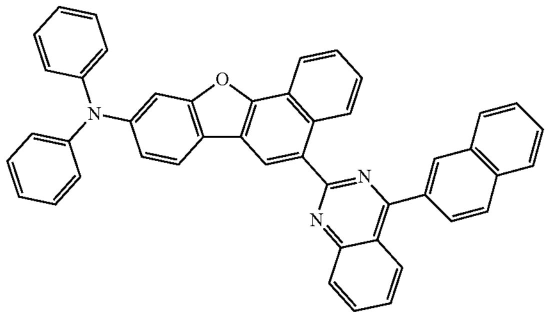
-continued
179
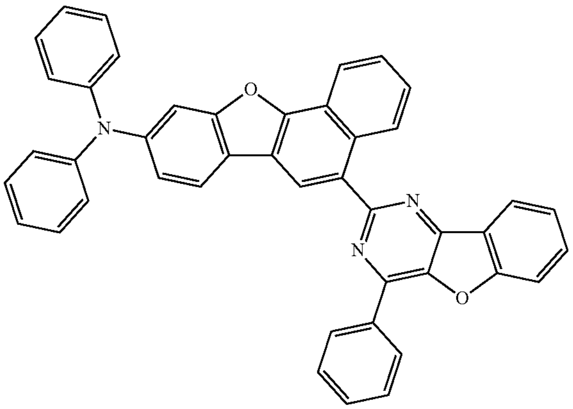
180
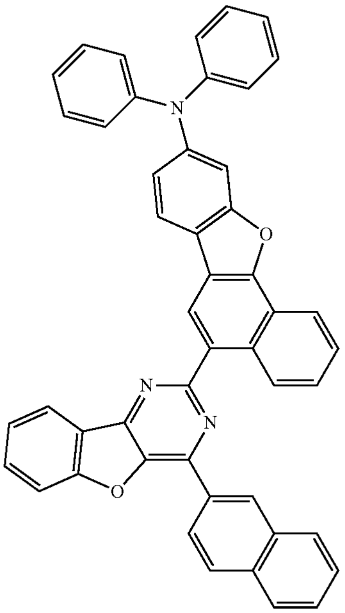
181
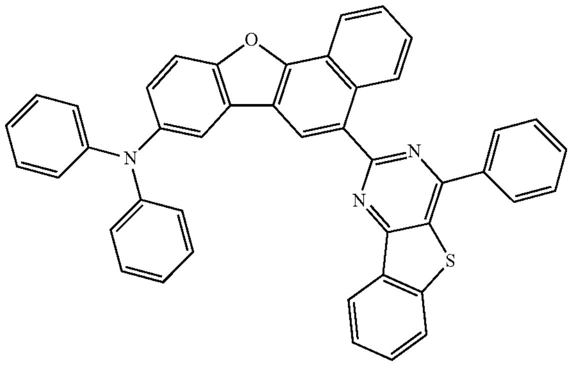

-continued
182
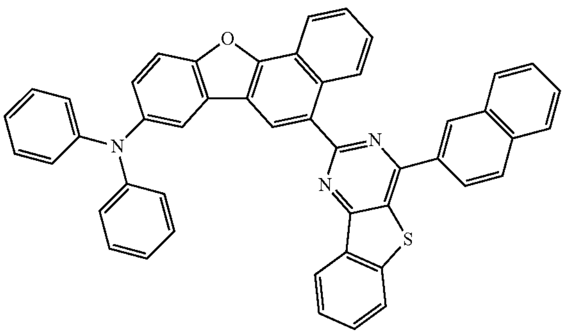
183
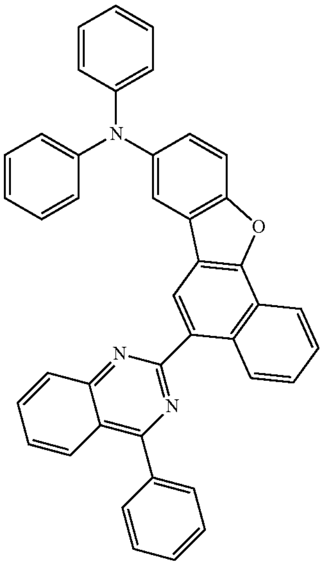
184
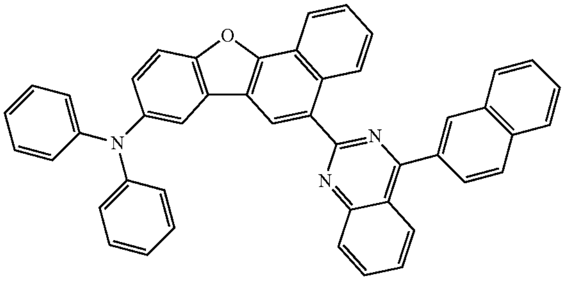
185
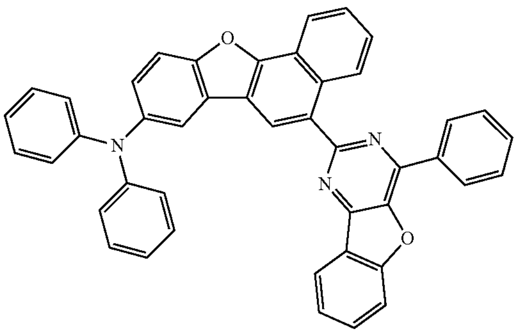
-continued
186
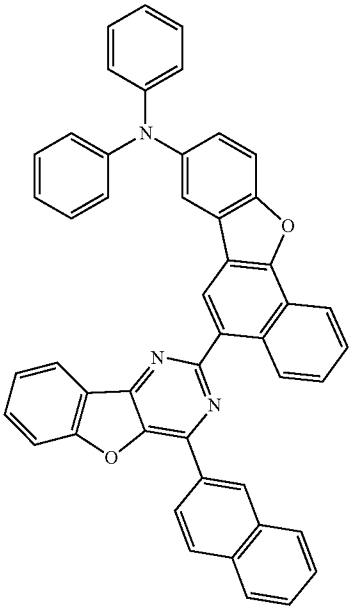
187
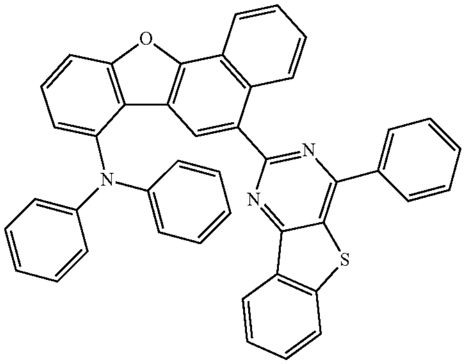
188
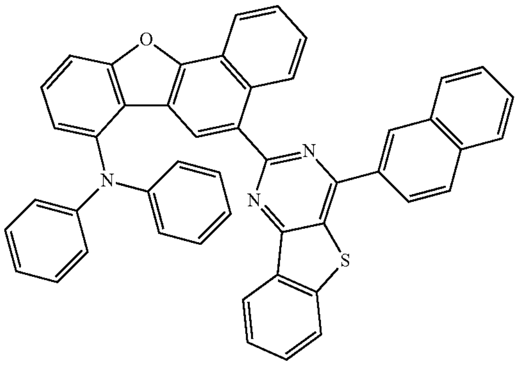

-continued
189
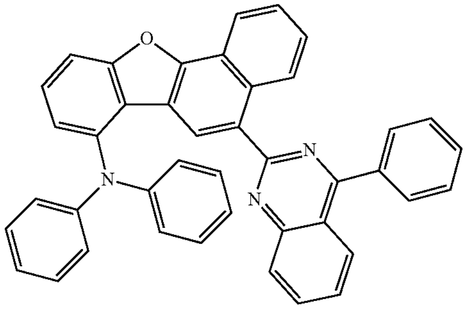
190
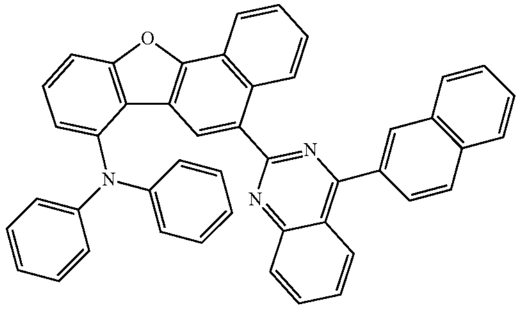
191
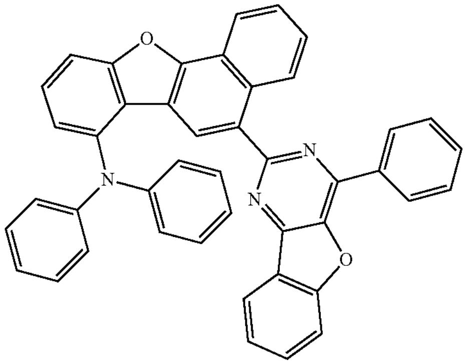
192
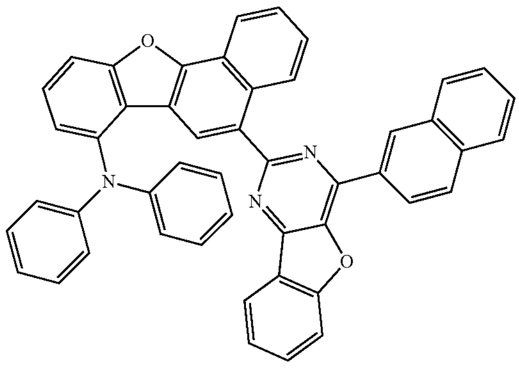
-continued
193
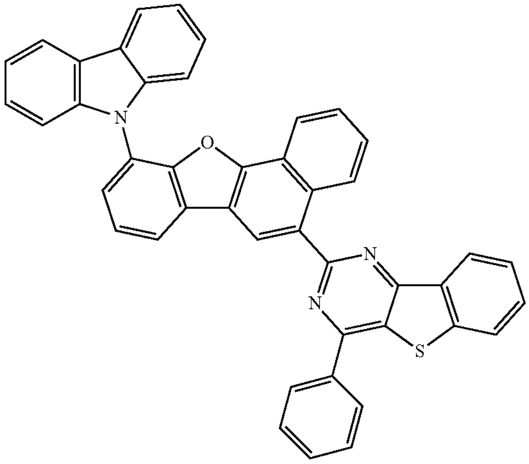
194
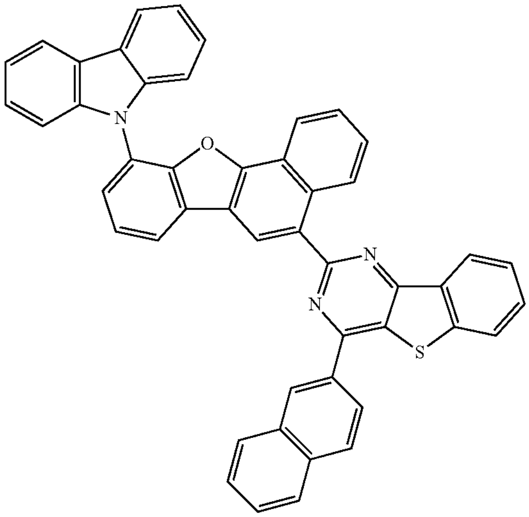
195
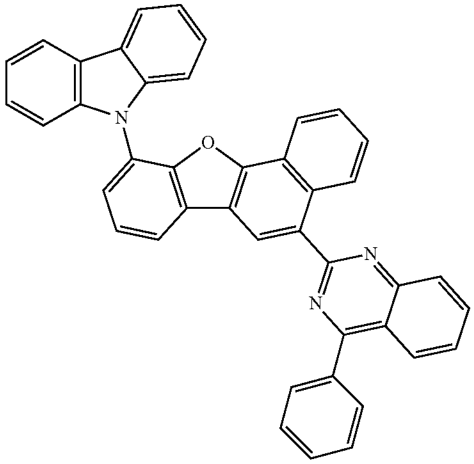

-continued
196
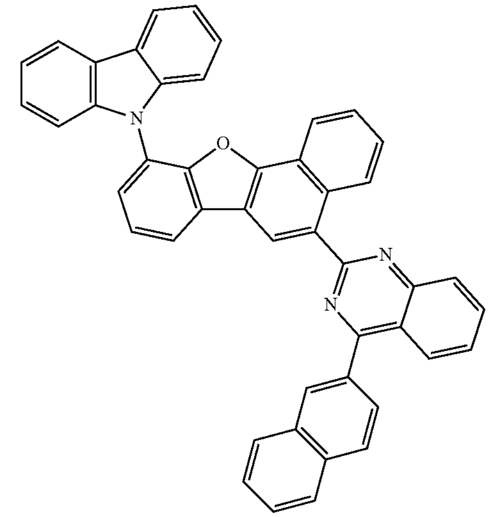
197
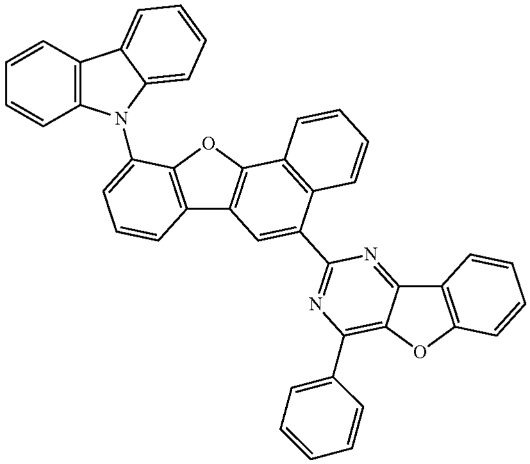
198
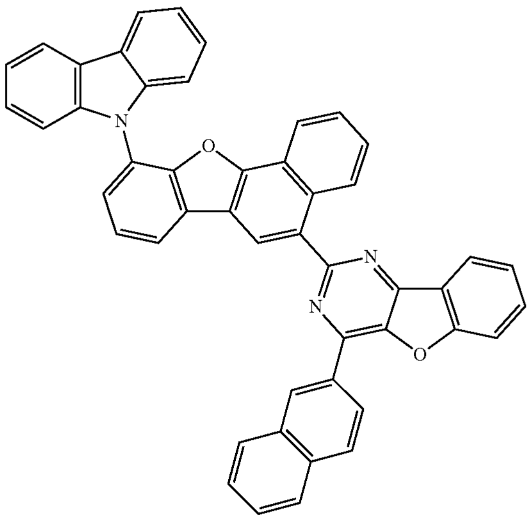
-continued
199
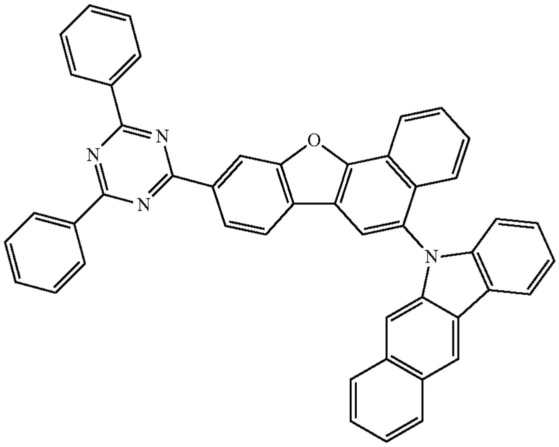
200
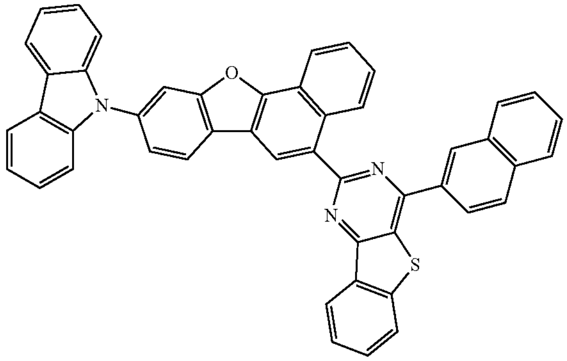
201
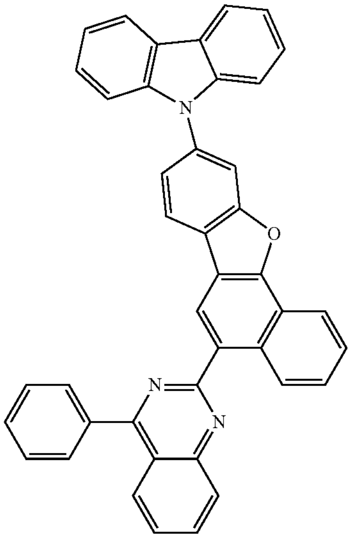

-continued
202
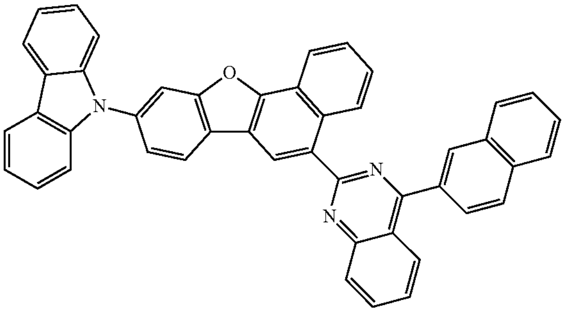
203
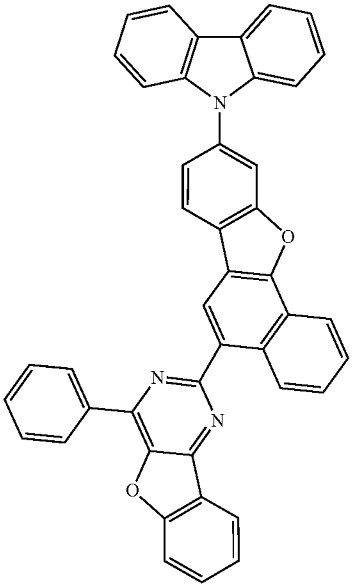
204
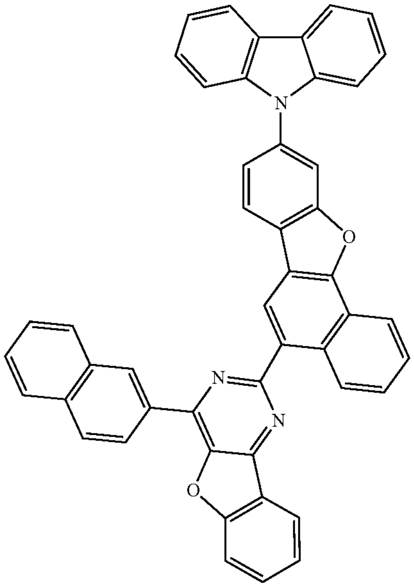
-continued
205
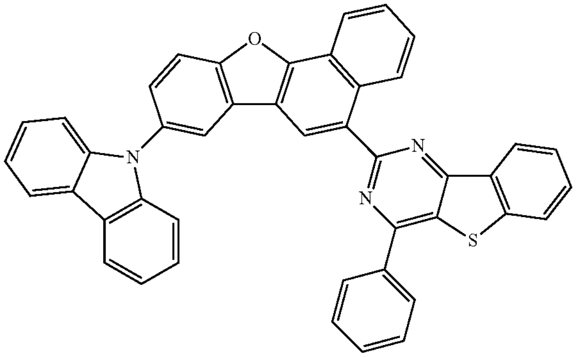
206
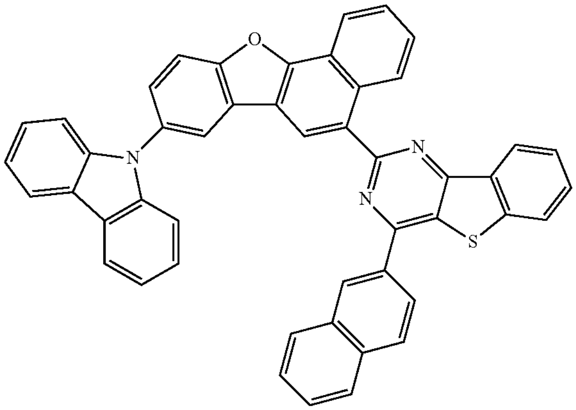
207
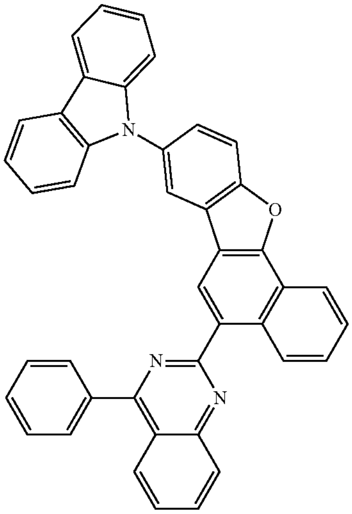

208
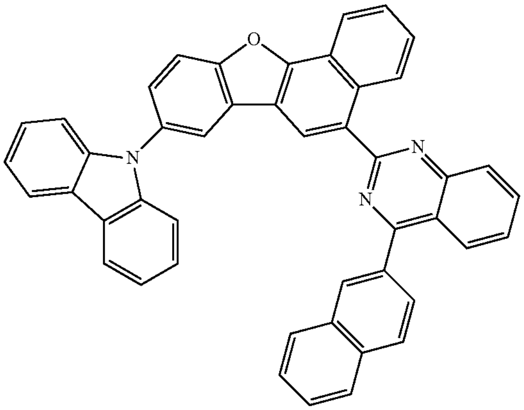
209
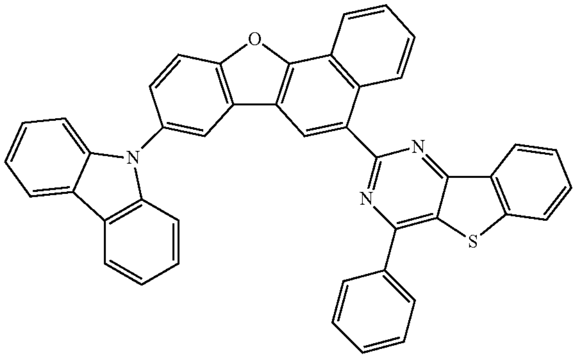
210
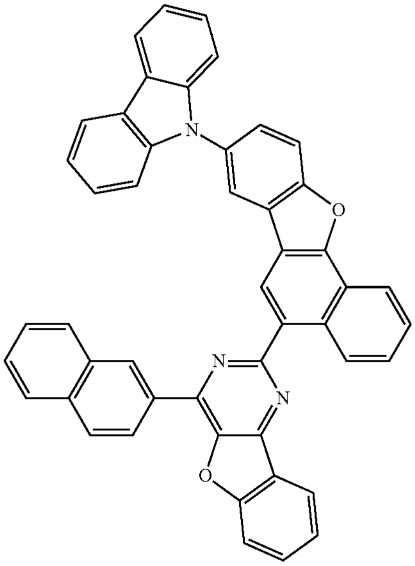
211
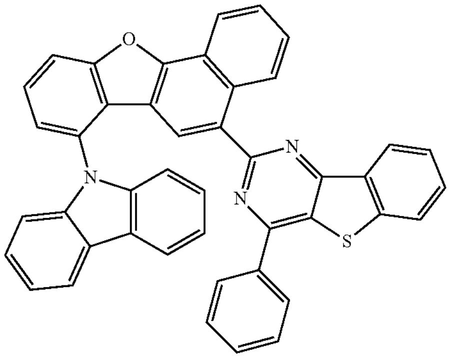
212
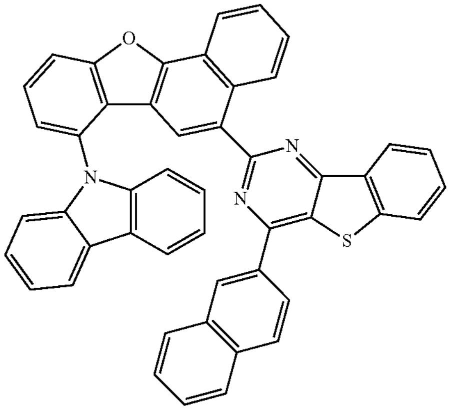
213
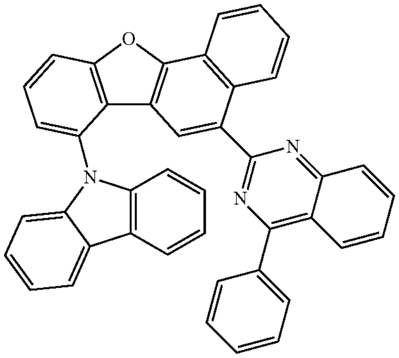
214
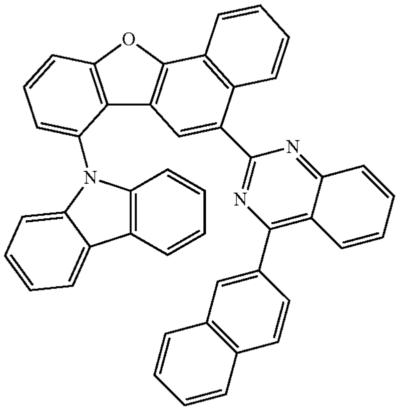

-continued
215
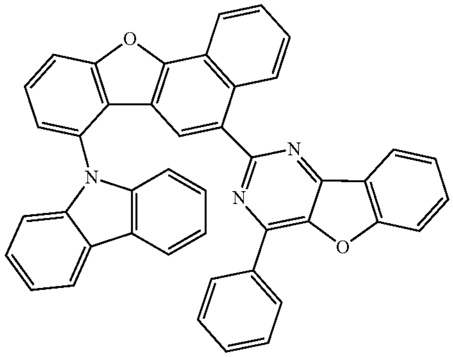
216
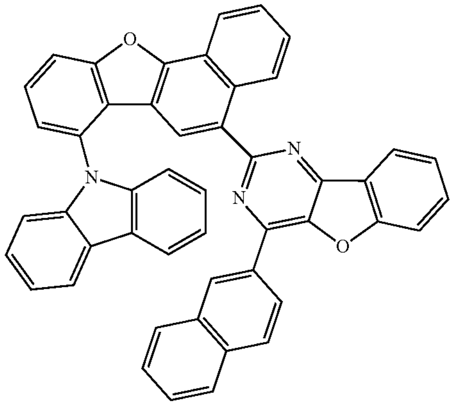
217
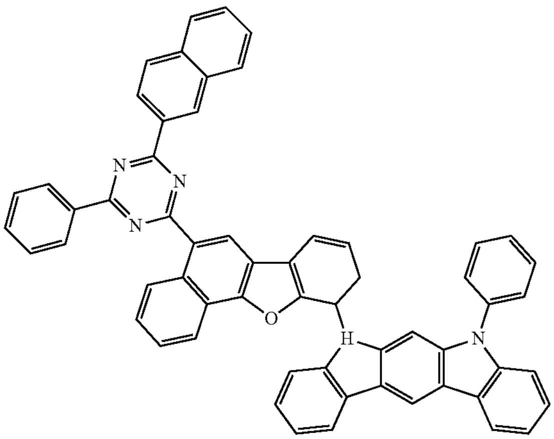
-continued
218
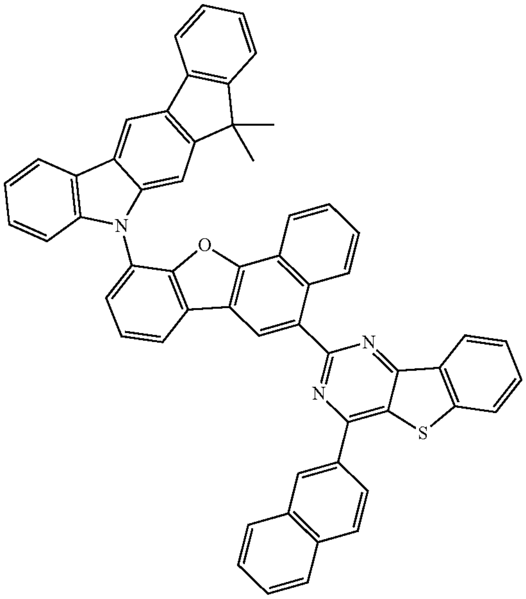
219
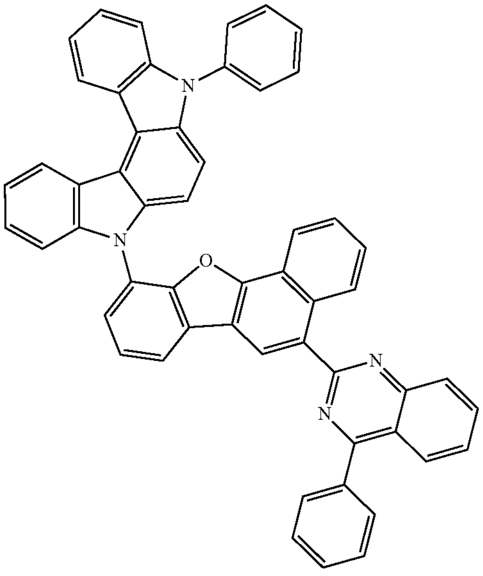

-continued
220
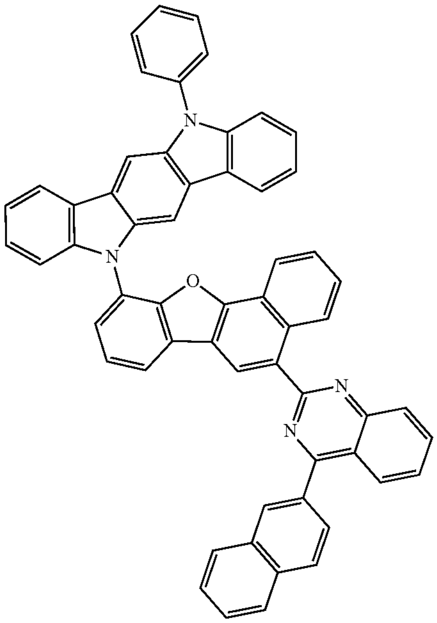
221
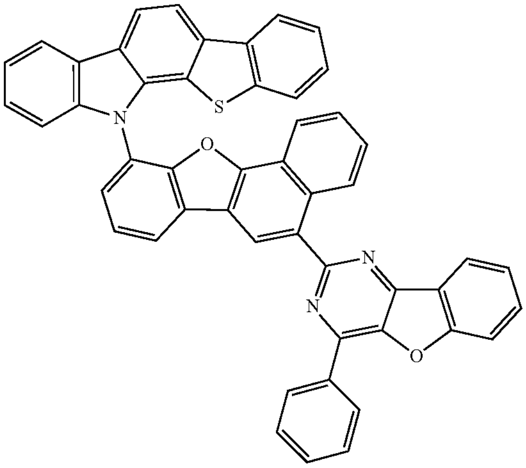
222
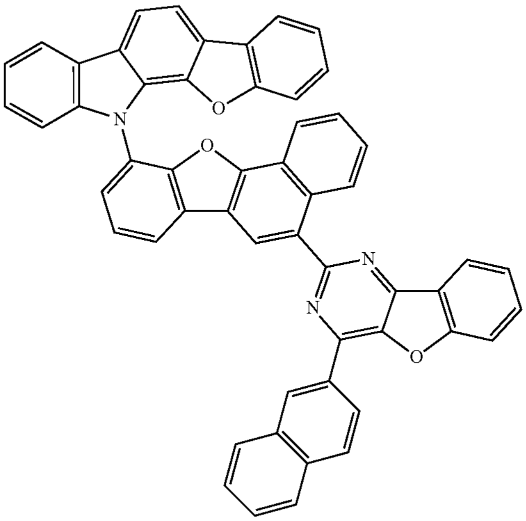
-continued
223
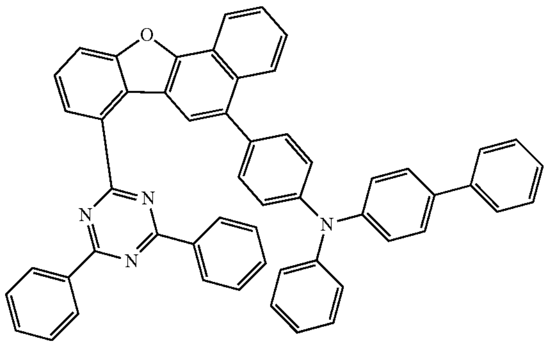
224
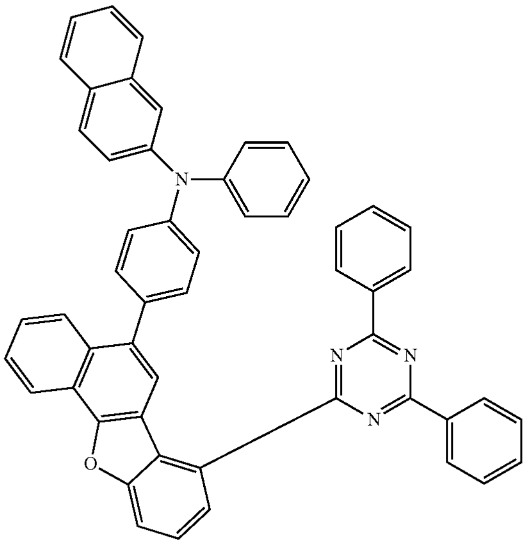
225
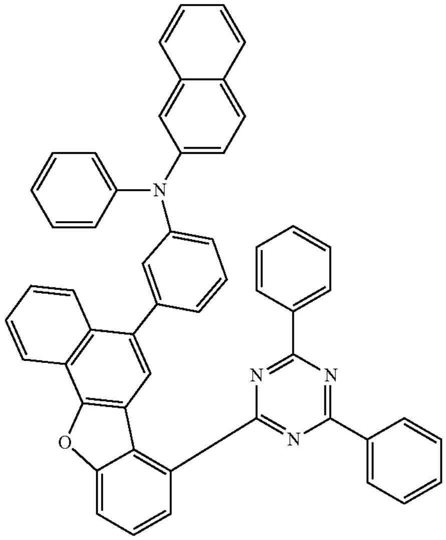

-continued
226
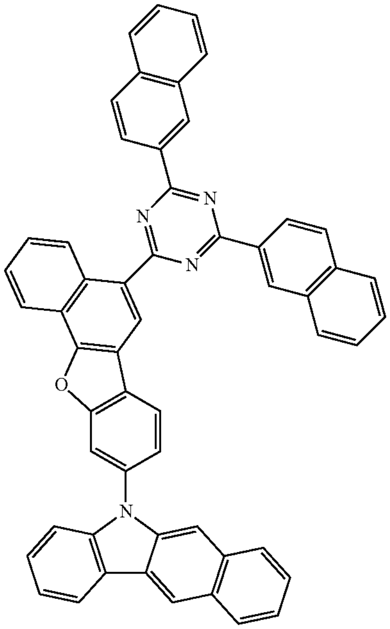
227
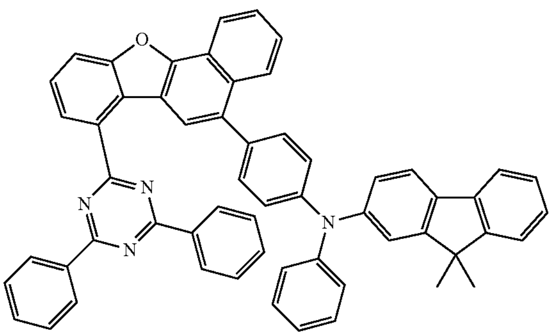
228
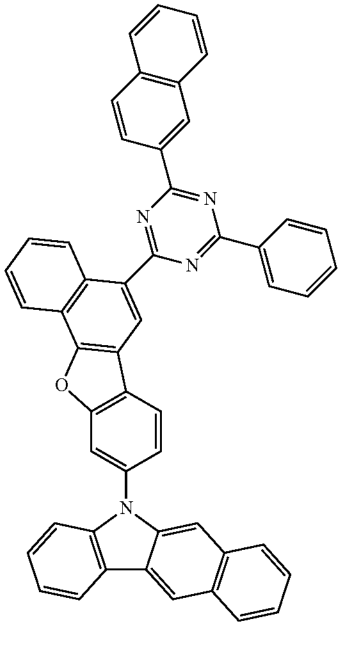
-continued
229
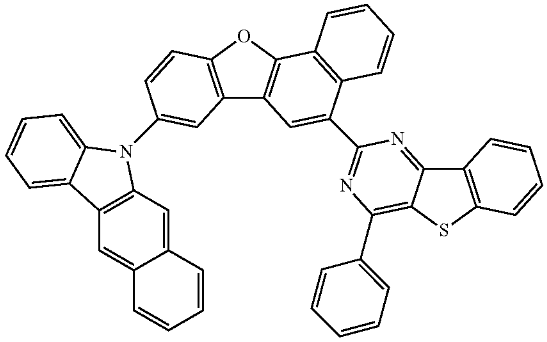
230
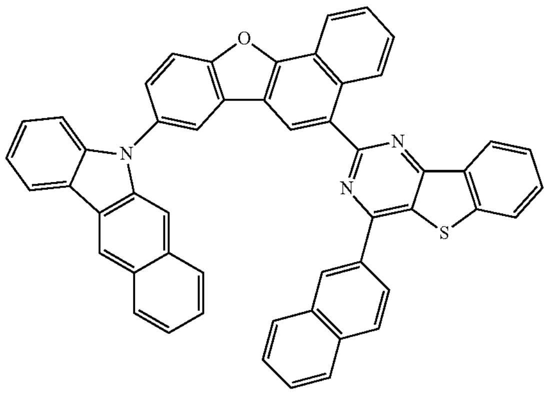
231
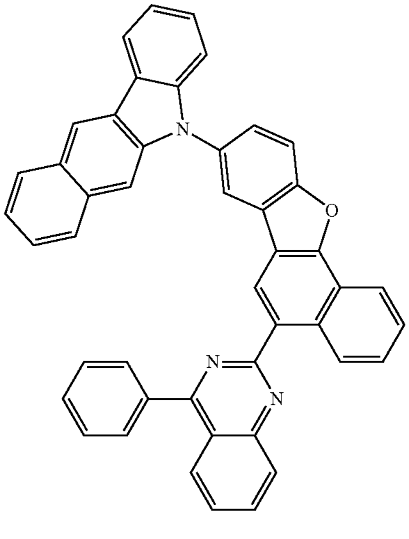

-continued
232
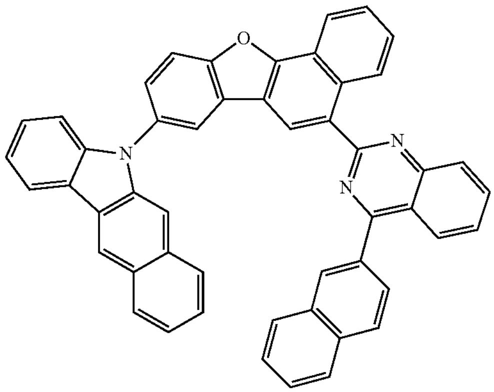
233
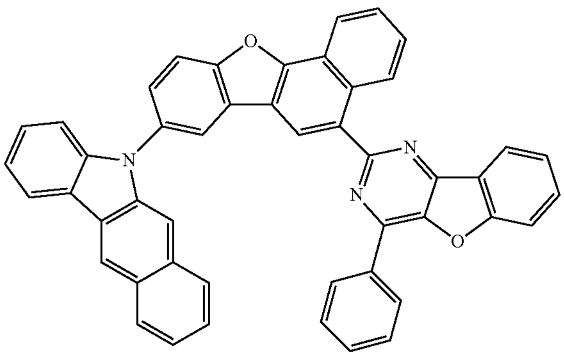
234
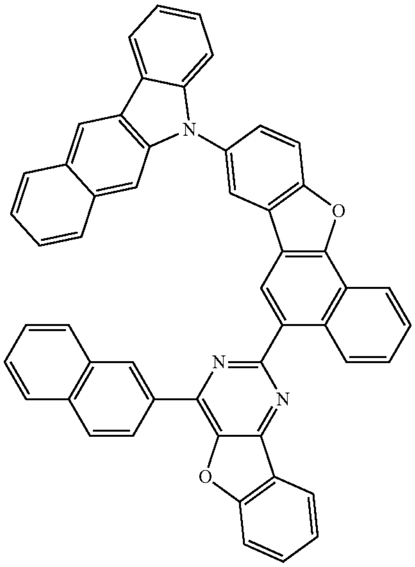
-continued
235
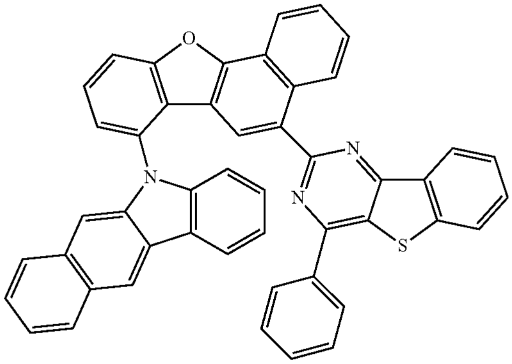
236
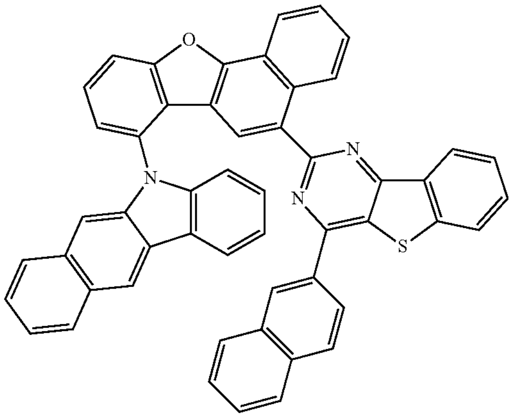
237
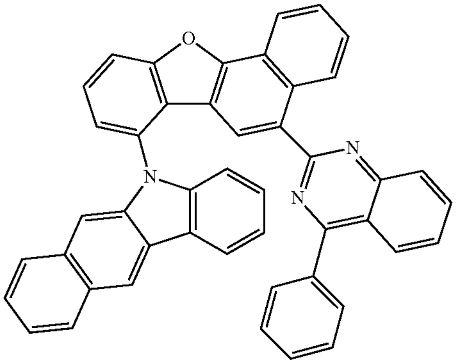
238
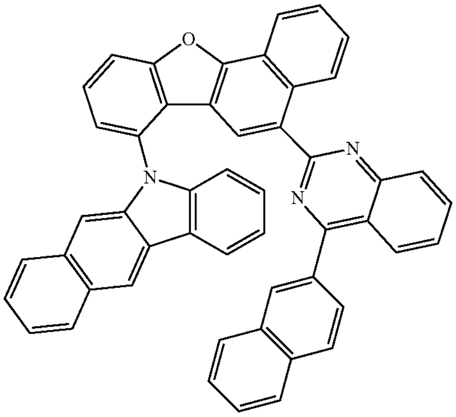

-continued
239
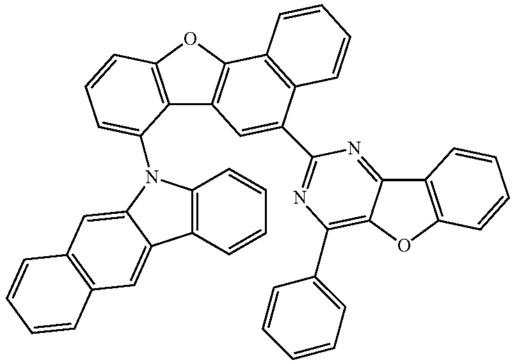
240
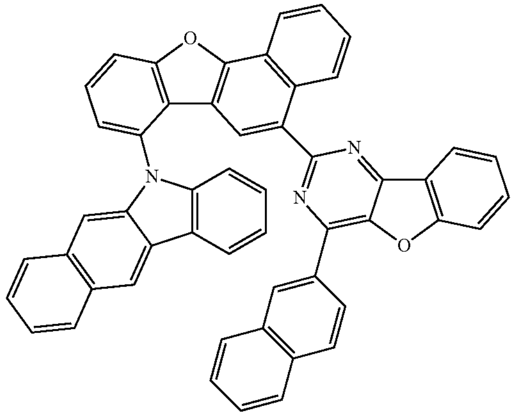
241
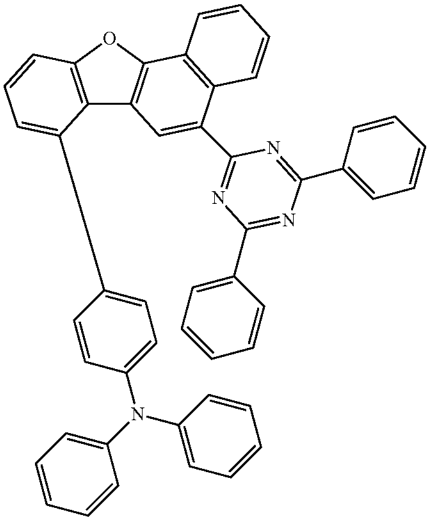
-continued
242
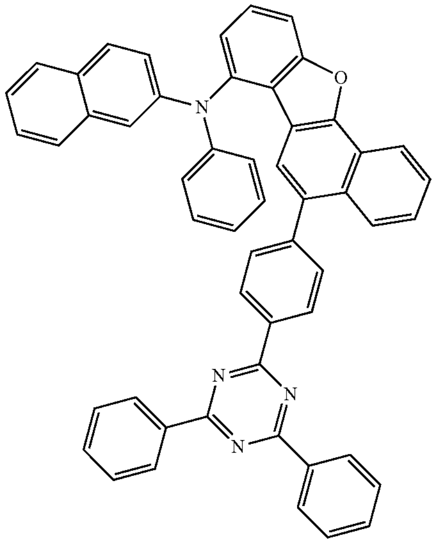
243
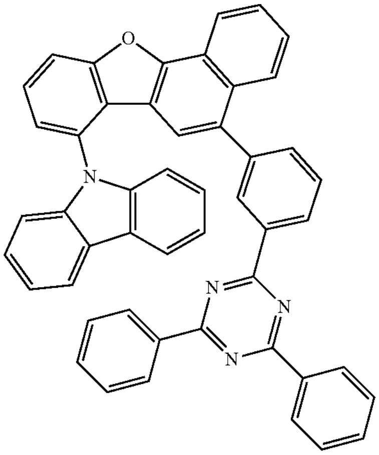
244
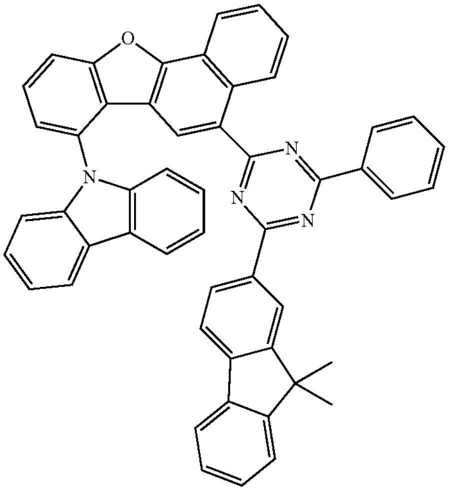

-continued
245
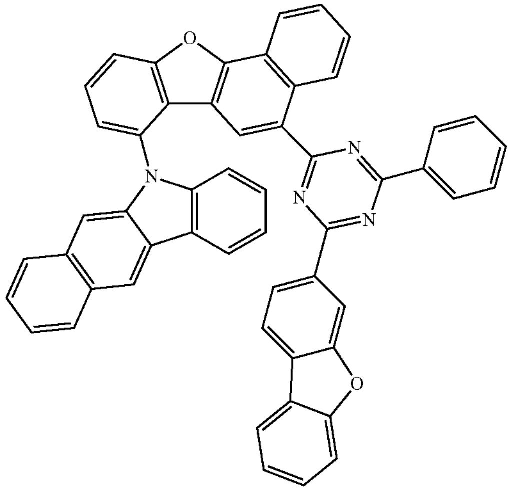
246
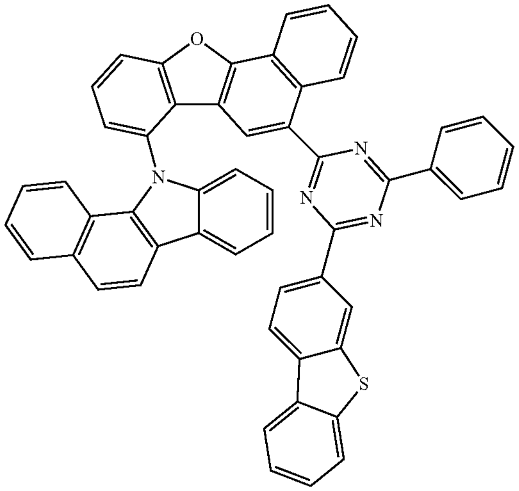
247
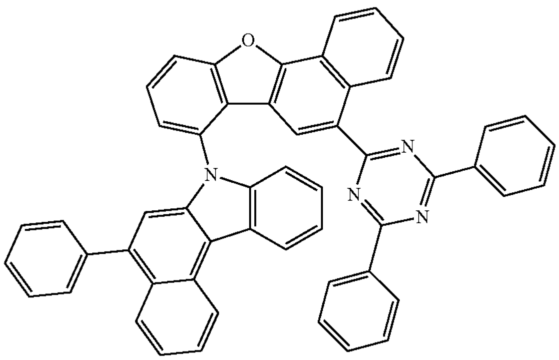
-continued
248
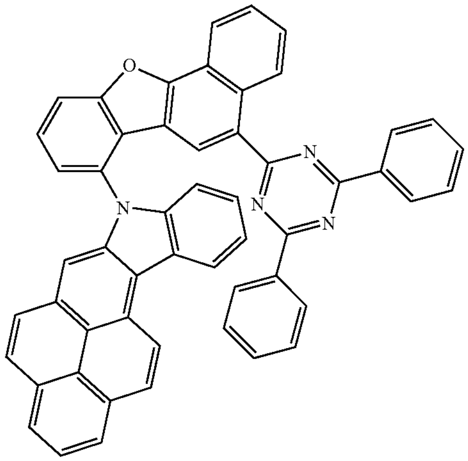
249
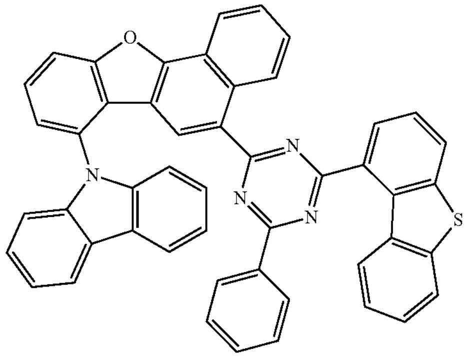
252
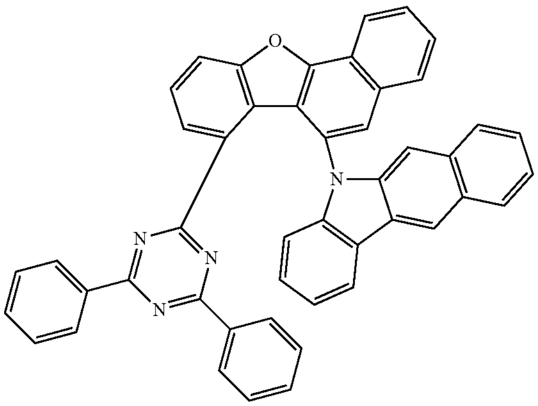
253
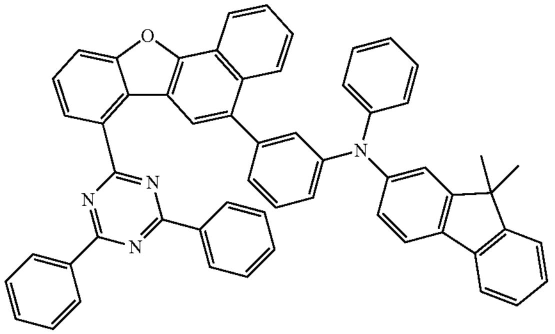

-continued
254
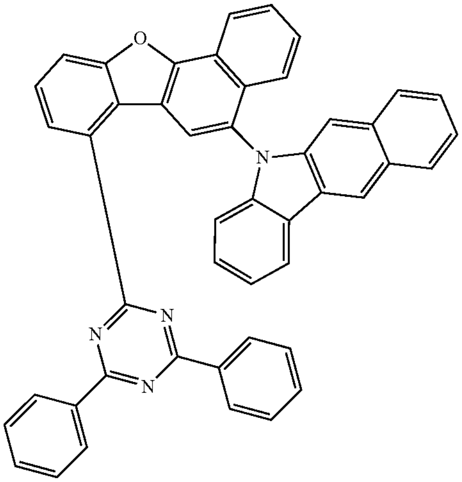
255
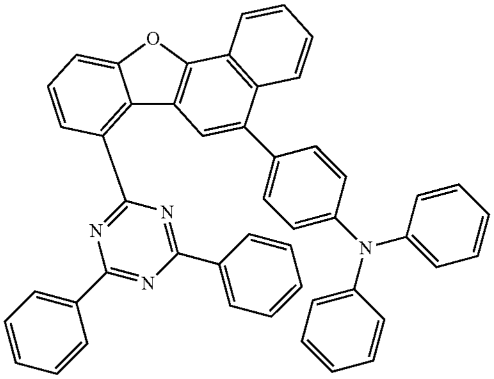
256
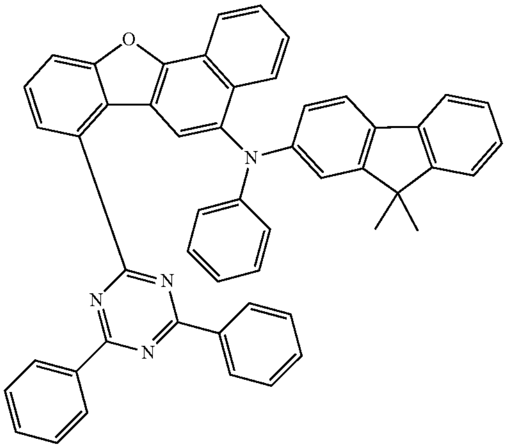
-continued
257
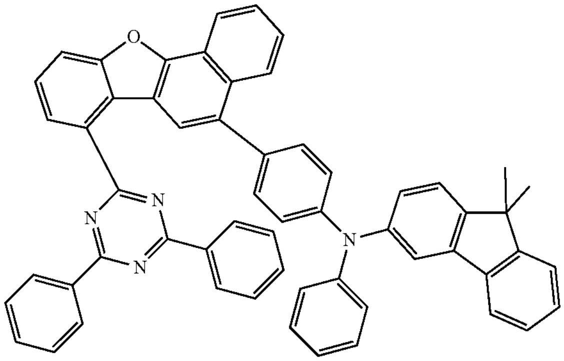
258
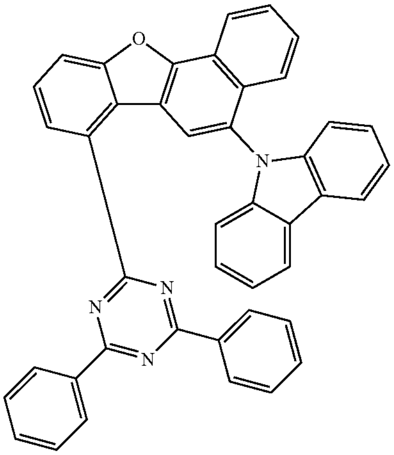
259
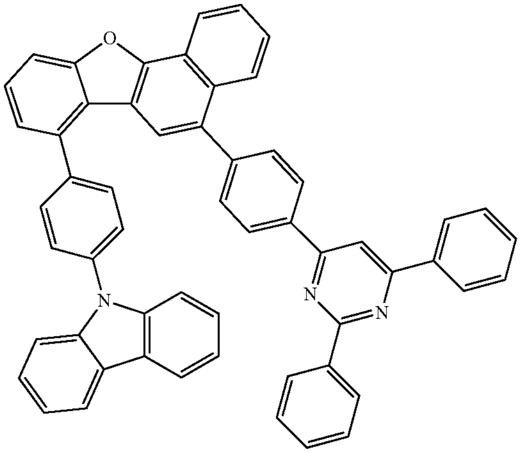

-continued
260
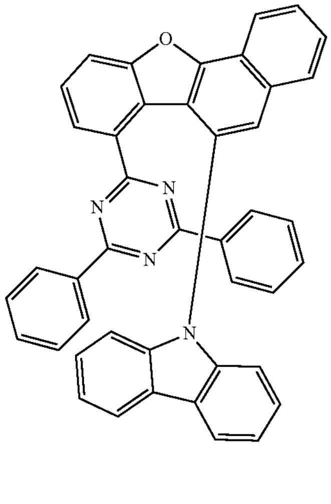
261
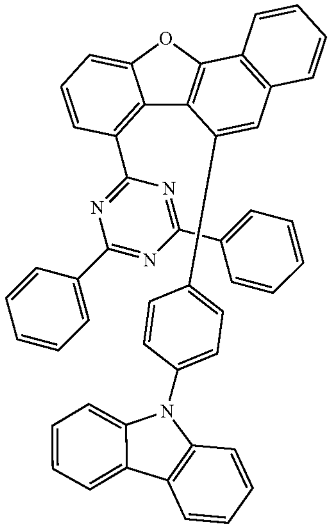
262
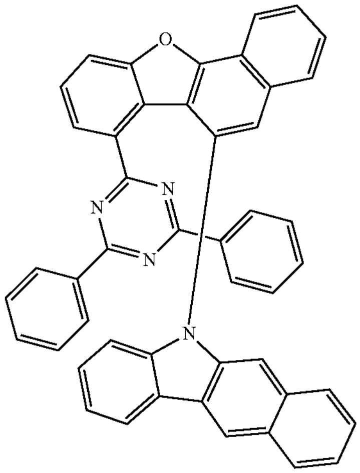
-continued
263
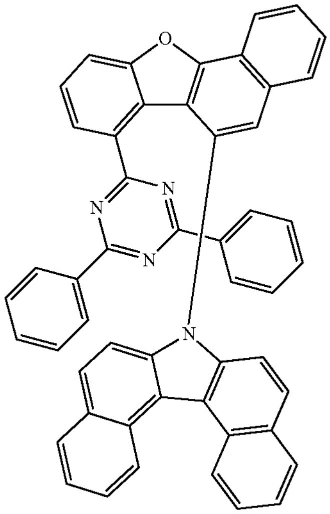
264
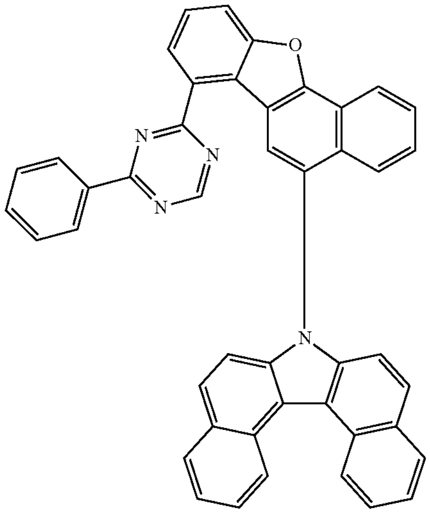
265
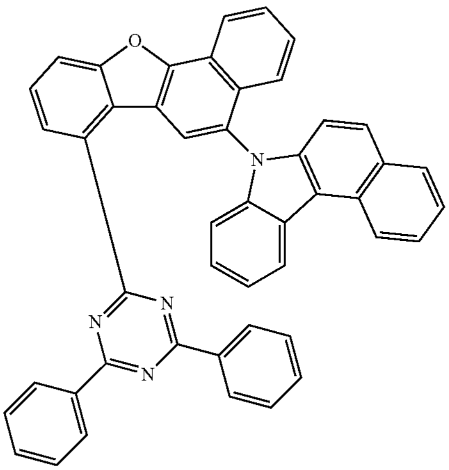

-continued
266
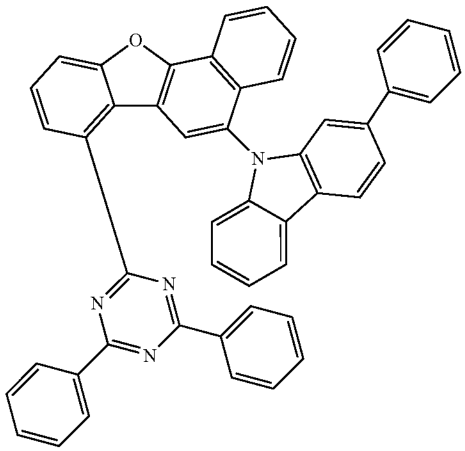
267
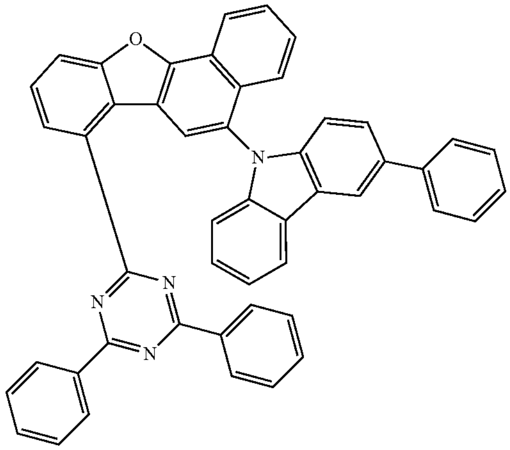
268
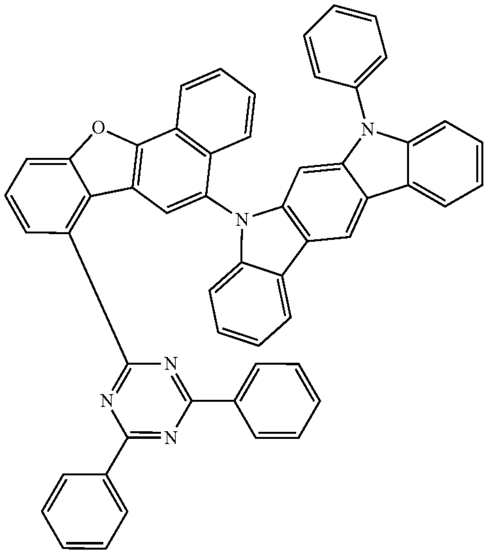
-continued
269
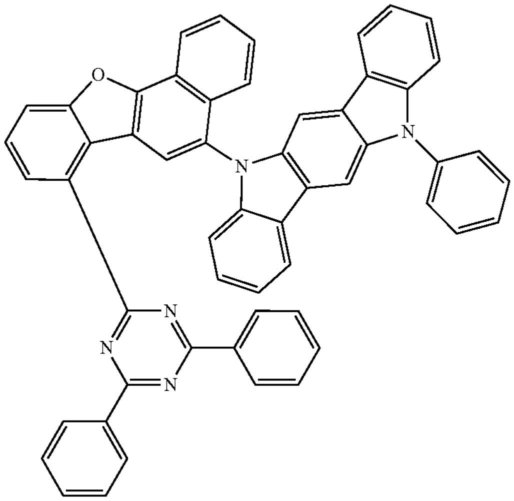
270
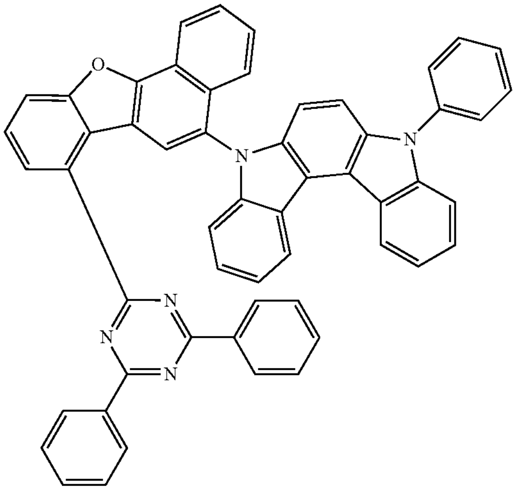
271
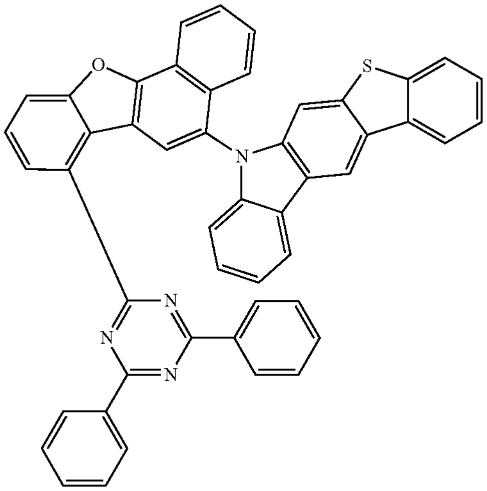

-continued
272
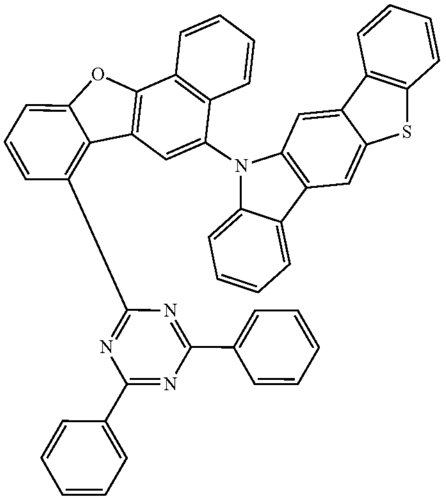
273
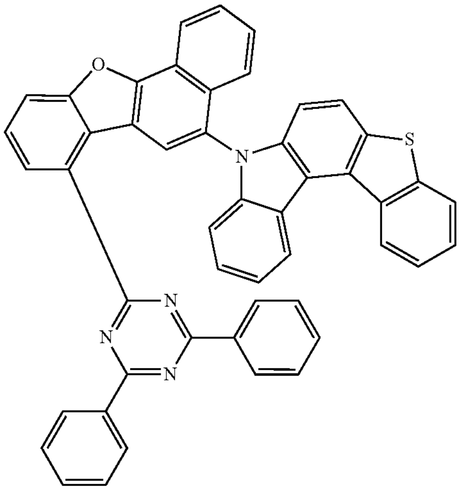
274
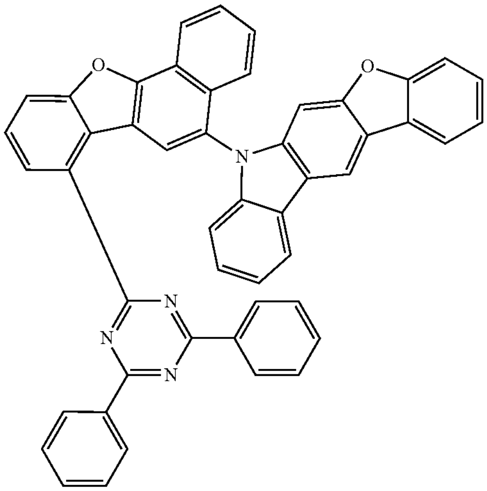
-continued
275
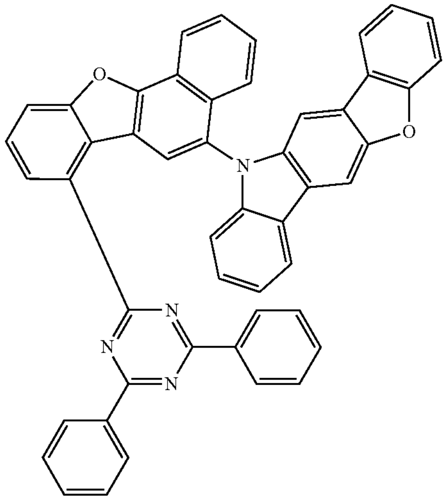
276
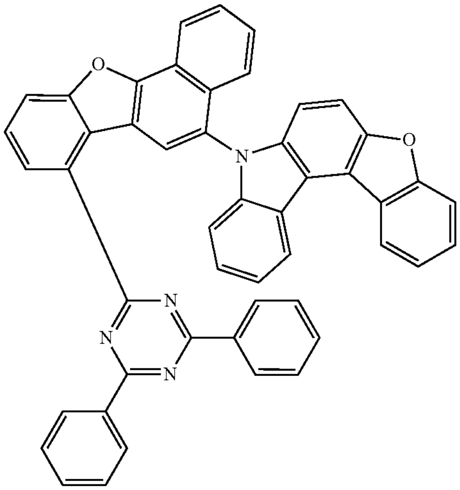
277
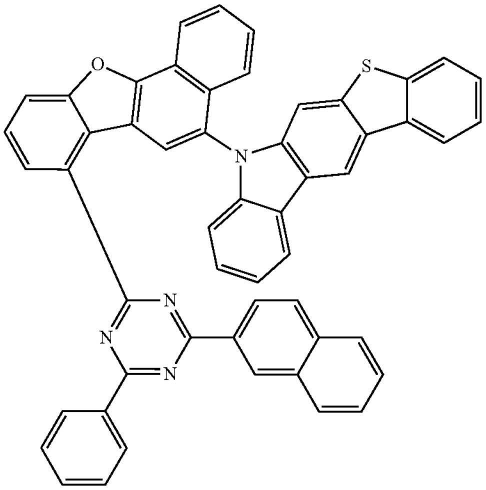

-continued
278
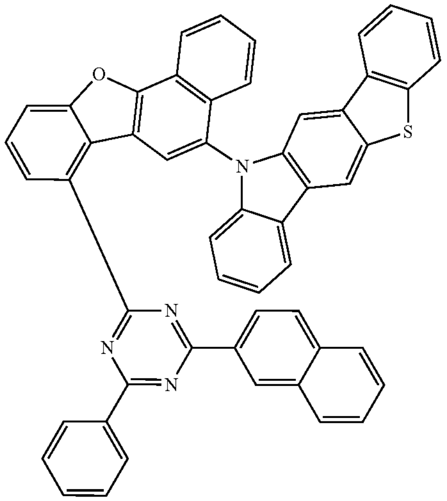
279
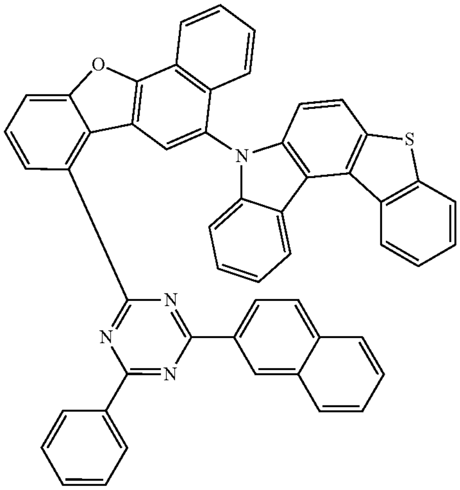
280
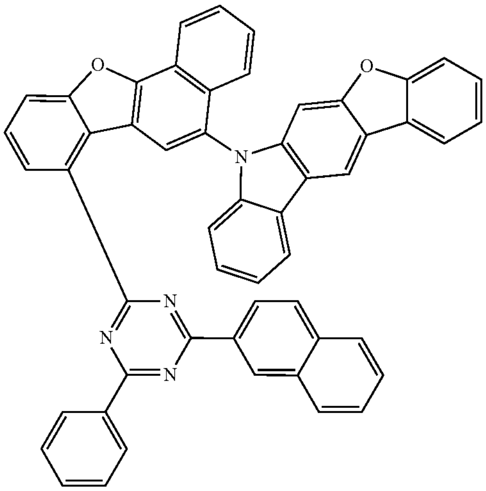
-continued
281
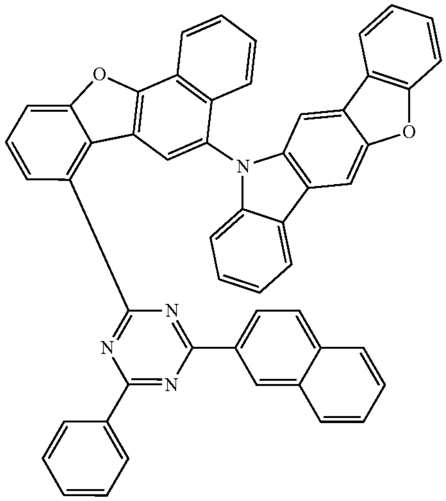
282
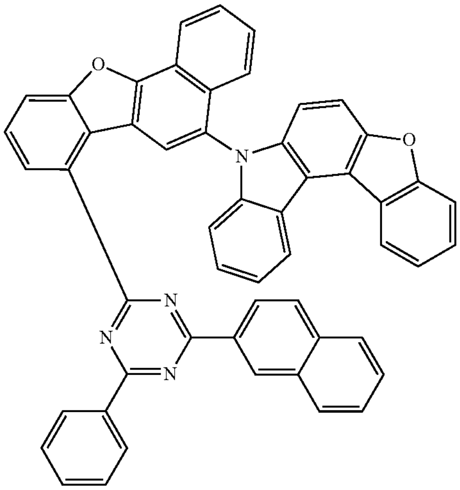
283
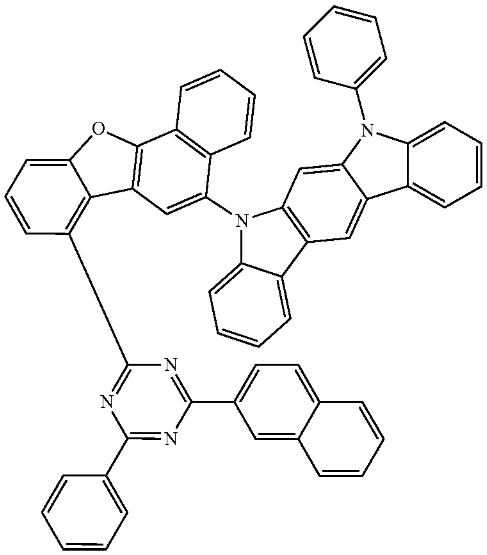

-continued
284
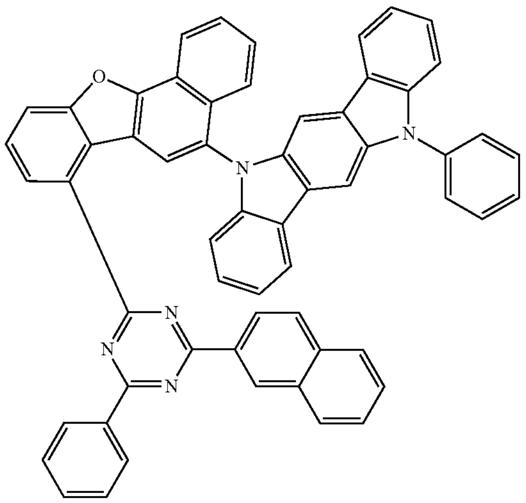
285
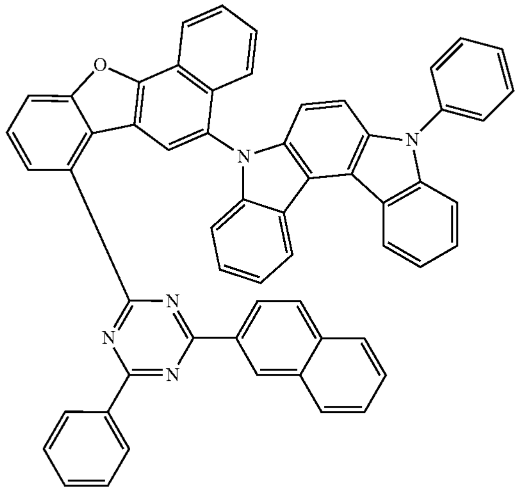
286
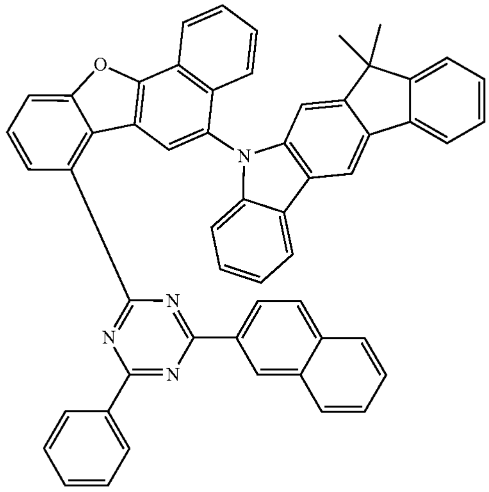
-continued
287
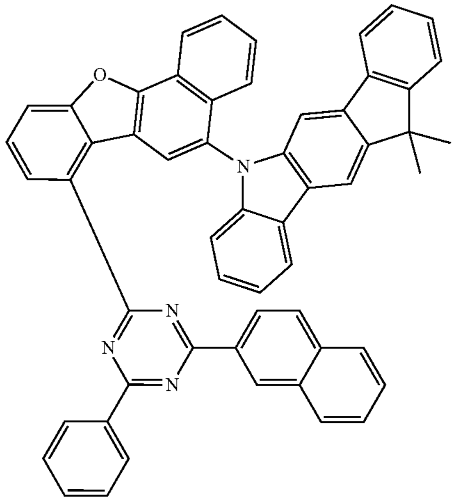
288
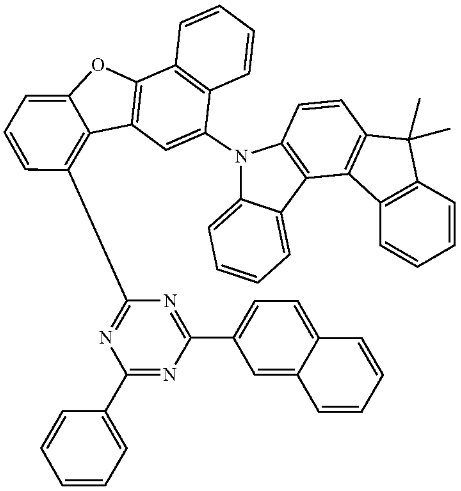
289
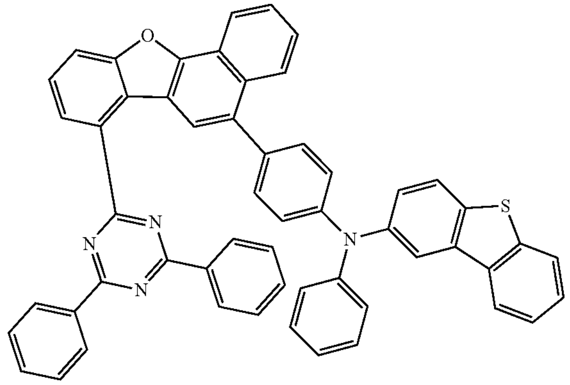

-continued
290
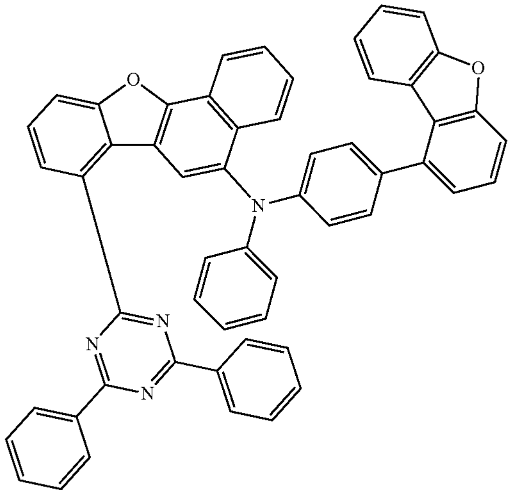
291
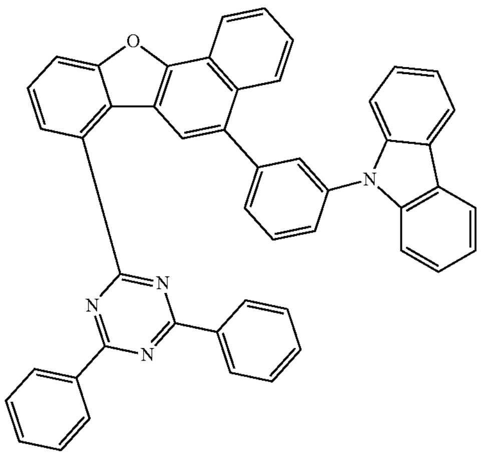
292
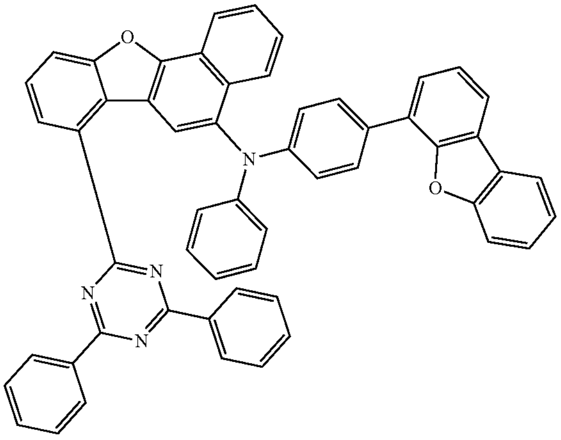
-continued
293
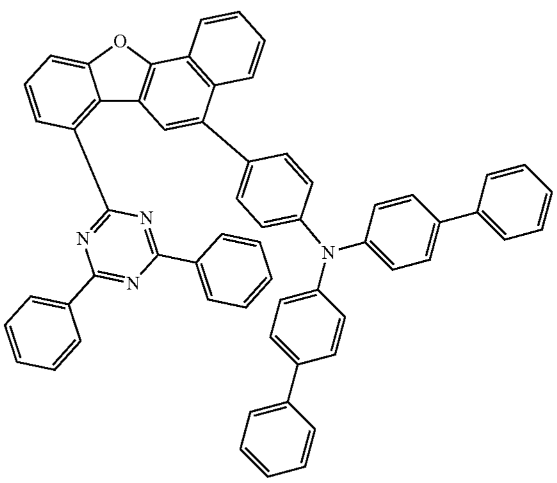
294
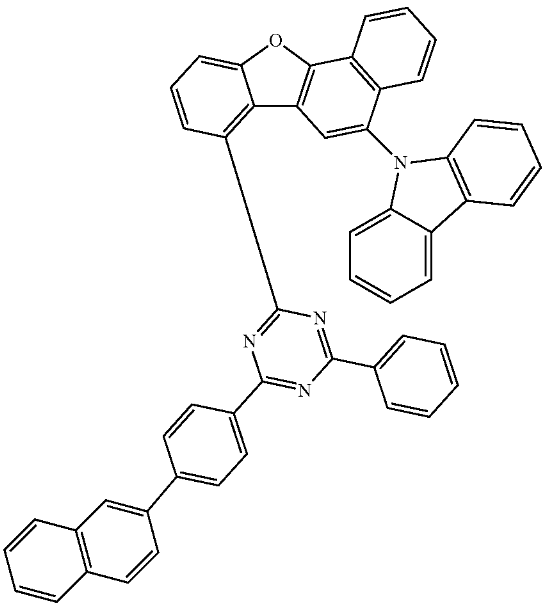
295
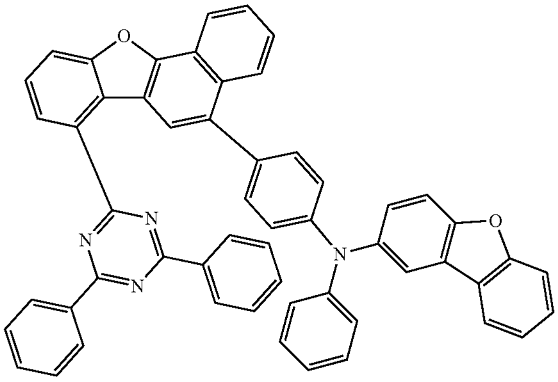

-continued

296

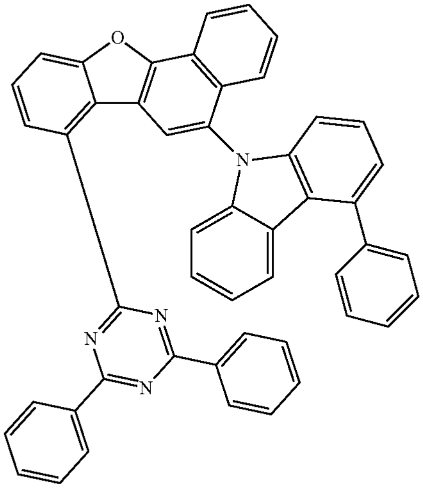

297

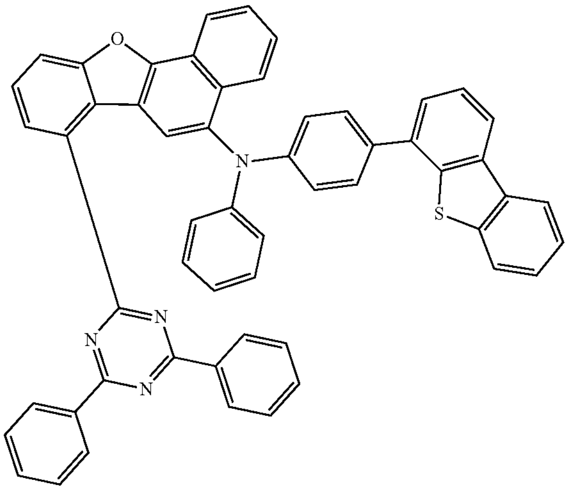

298

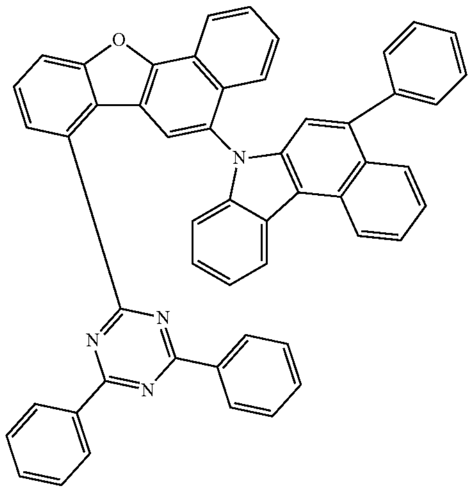

-continued

299

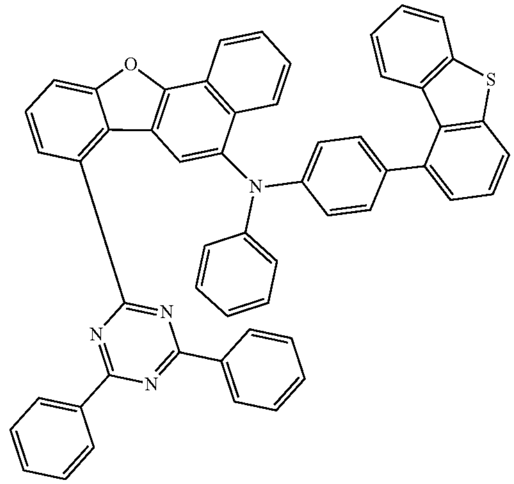

300

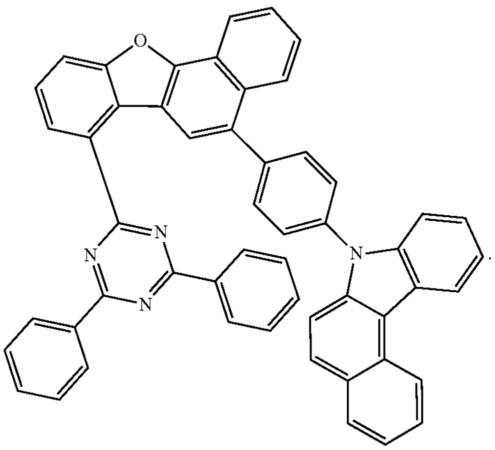

6. An organic light emitting device comprising:

a first electrode;

a second electrode; and an organic material layer provided between the first electrode and the second electrode, wherein the organic material layer includes one or more types of the heterocyclic compound of claim 1.

7. The organic light emitting device of claim 6, wherein the organic material layer includes a light emitting layer, and the light emitting layer includes one or more types of the heterocyclic compound.

8. The organic light emitting device of claim 7, wherein the light emitting layer includes a host, and the host includes one or more types of the heterocyclic compound.

9. The organic light emitting device of claim 7, wherein the light emitting layer includes a host, and the host further includes a compound of the following Chemical Formula 5:

[Chemical Formula 5]

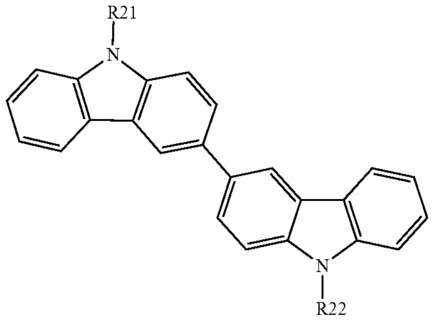

in Chemical Formula 5,

R21 and R22 are each a substituted or unsubstituted C6 to C60 aryl group.

10. The organic light emitting device of claim 6, further comprising one layer selected from the group consisting of a light emitting layer, a hole injection layer, a hole transfer layer, an electron injection layer, an electron transfer layer, an electron blocking layer and a hole blocking layer.

* * * * *